(12) United States Patent
Matsuno

(10) Patent No.: US 12,457,742 B2
(45) Date of Patent: Oct. 28, 2025

(54) THREE-DIMENSIONAL MEMORY DEVICE INCLUDING TRENCH BRIDGES AND METHODS OF FORMING THE SAME

(71) Applicant: SANDISK TECHNOLOGIES LLC, Addison, TX (US)

(72) Inventor: Koichi Matsuno, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 545 days.

(21) Appl. No.: 17/819,081

(22) Filed: Aug. 11, 2022

(65) Prior Publication Data

US 2024/0057331 A1    Feb. 15, 2024

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5226* (2013.01); *H10B 41/10* (2023.02);
(Continued)

(58) Field of Classification Search
CPC ........ H10B 43/27; H10B 41/10; H10B 41/27; H10B 41/35; H10B 43/10; H10B 43/35; H10B 43/50; H01L 23/5226
See application file for complete search history.

(56) References Cited

U.S. PATENT DOCUMENTS 5,915,167 A    6/1999 Leedy
9,543,318 B1    1/2017 Lu et al.
(Continued)

FOREIGN PATENT DOCUMENTS

KR    20200015743 A    2/2020
KR    20210143895 A    11/2021

OTHER PUBLICATIONS

ISR—Notification of Transmittal of the International Search Report and Written Opinion of the International Searching Authority for International Patent Application No. PCT/US2023025057, mailed Oct. 12, 2023, 15 pages.
(Continued)

*Primary Examiner* — Galina G Yushina
(74) *Attorney, Agent, or Firm* — THE MARBURY LAW GROUP PLLC

(57) ABSTRACT

A three-dimensional memory device includes layer stacks each of which includes a first-tier alternating stack of first insulating layers and first electrically conductive layers and a second-tier alternating stack of second insulating layers and second electrically conductive layers separated by a backside trench. Memory opening fill structures vertically extend through a respective layer stack, and includes a respective vertical stack of memory elements and a respective vertical semiconductor channel. In one embodiment, a bridge structure spans an entire width of the backside trench such that a top surface of the bridge structure is located below a top surface of the second-tier alternating stack, and a bottom surface of the bridge structure is located above a bottom surface of the first-tier alternating stack. In another embodiment, a perforated bridge structure includes a plurality of vertically-extending openings.

11 Claims, 115 Drawing Sheets

(51) Int. Cl.
  *H10B 41/10* (2023.01)
  *H10B 41/27* (2023.01)
  *H10B 41/35* (2023.01)
  *H10B 43/10* (2023.01)
  *H10B 43/35* (2023.01)

(52) U.S. Cl.
  CPC ............ *H10B 41/27* (2023.02); *H10B 41/35* (2023.02); *H10B 43/10* (2023.02); *H10B 43/35* (2023.02)

(56) References Cited

U.S. PATENT DOCUMENTS

| | | | |
|---|---|---|---|
| 9,595,387 | B2 | 3/2017 | Kiehlbauch |
| 9,679,906 | B2 | 6/2017 | Lu et al. |
| 9,768,192 | B1* | 9/2017 | Nakamura ............ H10B 43/27 |
| 10,115,681 | B1 | 10/2018 | Ariyoshi |
| 10,672,780 | B1 | 6/2020 | Kawamura et al. |
| 10,861,873 | B2 | 12/2020 | Kim et al. |
| 10,879,264 | B1 | 12/2020 | Otsu et al. |
| 10,903,237 | B1 | 1/2021 | Hosoda et al. |
| 11,081,443 | B1 | 8/2021 | Mizutani et al. |
| 11,322,440 | B2 | 5/2022 | Kubo |
| 11,342,245 | B2 | 5/2022 | Cui et al. |
| 11,355,506 | B2 | 6/2022 | Tokita et al. |
| 11,367,736 | B2 | 6/2022 | Tokita et al. |
| 11,380,707 | B2 | 7/2022 | Matsuno et al. |
| 11,398,497 | B2 | 7/2022 | Kajiwara et al. |
| 11,404,427 | B2 | 8/2022 | Otsu et al. |
| 2015/0001460 | A1 | 1/2015 | Kim et al. |
| 2017/0047334 | A1 | 2/2017 | Lu et al. |
| 2017/0148811 | A1* | 5/2017 | Zhang ................... H10B 41/27 |
| 2017/0179154 | A1* | 6/2017 | Furihata ............... H10D 89/911 |
| 2018/0261671 | A1 | 9/2018 | Matsumoto et al. |
| 2019/0006418 | A1 | 1/2019 | Sel et al. |
| 2019/0378855 | A1 | 12/2019 | Kim et al. |
| 2020/0227318 | A1 | 7/2020 | Kawasaki et al. |
| 2020/0357814 | A1* | 11/2020 | Kim ....................... H10B 43/10 |
| 2021/0057336 | A1 | 2/2021 | Shao et al. |
| 2021/0134827 | A1 | 5/2021 | Iwai et al. |
| 2021/0242128 | A1 | 8/2021 | Ito et al. |
| 2021/0327889 | A1 | 10/2021 | Makala et al. |
| 2021/0327890 | A1 | 10/2021 | Makala et al. |
| 2021/0358936 | A1 | 11/2021 | Takuma et al. |
| 2021/0358937 | A1* | 11/2021 | Yamaguchi ............ H10B 43/27 |
| 2021/0358941 | A1 | 11/2021 | Kajiwara et al. |
| 2021/0366808 | A1 | 11/2021 | Cui et al. |
| 2021/0366920 | A1 | 11/2021 | Tokita et al. |
| 2021/0366924 | A1 | 11/2021 | Tokita et al. |
| 2021/0408025 | A1 | 12/2021 | Hinoue |
| 2021/0408035 | A1* | 12/2021 | Sato ....................... H10B 41/27 |
| 2022/0102273 | A1* | 3/2022 | Kubo ................. H01L 21/76816 |
| 2022/0181348 | A1* | 6/2022 | Matsuno ................ H10B 43/27 |
| 2022/0199643 | A1* | 6/2022 | Harari ............... H01L 21/76802 |
| 2022/0223614 | A1 | 7/2022 | Takuma et al. |
| 2022/0254728 | A1 | 8/2022 | Matsuno et al. |
| 2022/0254733 | A1 | 8/2022 | Mizuno et al. |
| 2022/0254804 | A1 | 8/2022 | Yoshida |

OTHER PUBLICATIONS

Endoh et al., "Novel Ultra High-Density Memory with a Stacked-Surrounding Gate Transistor (S-SGT) Structured Cell," IEDM Proc. (2001) 33-36.

Notification of Transmittal of the International Search Report and the Written Opinion of the International Searching Authority for International Patent Application No. PCT/US2021/037270, mailed on Nov. 9, 2021, 9 pages.

USPTO Office Communication, Notice of Allowance and Fee(s) Due for U.S. Appl. No. 17/174,094, mailed on Mar. 7, 2022, 17 pages.

USPTO Office Communication, Non-Final Office Action for U.S. Appl. No. 17/174,064, mailed on Apr. 29, 2022, 23 pages.

U.S. Appl. No. 17/376,490, filed Jul. 15, 2021, SanDisk Technologies LLC.

U.S. Appl. No. 17/406,463, filed Aug. 19, 2021, SanDisk Technologies LLC.

U.S. Appl. No. 17/530,861, filed Nov. 19, 2021, SanDisk Technologies LLC.

U.S. Appl. No. 17/819,097, filed Aug. 11, 2022, SanDisk Technologies LLC.

IPRP—Notification Concerning Transmittal of International Preliminary Report on Patentability and Written Opinion of the International Searching Authority for International Patent Application No. PCT/US2024/054889, mailed on Feb. 20, 2025, 10 pages.

USPTO Office Communication, Non-Final Office Action for U.S. Appl. No. 17/819,097, mailed May 9, 2025, 19 pages.

* cited by examiner

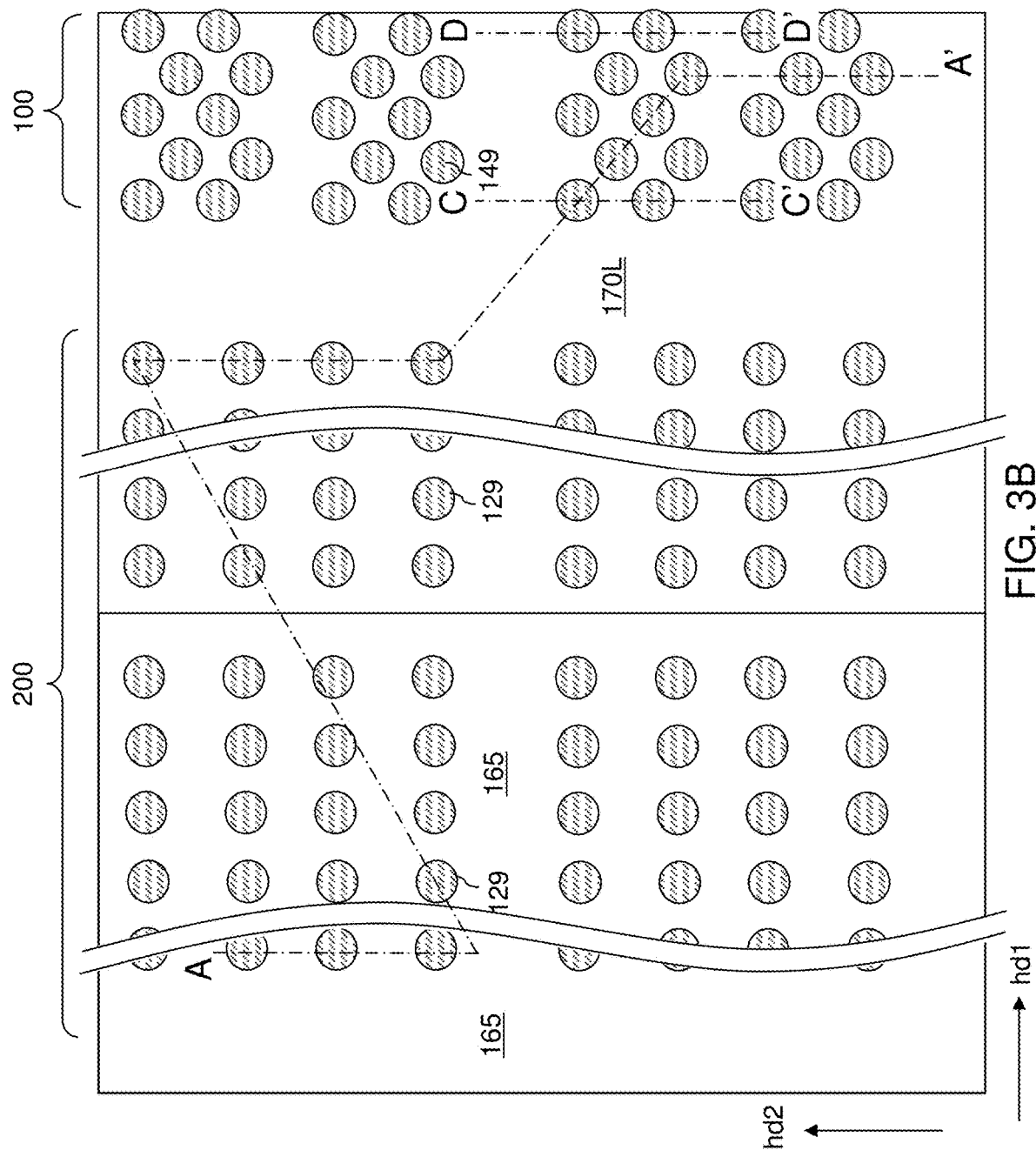

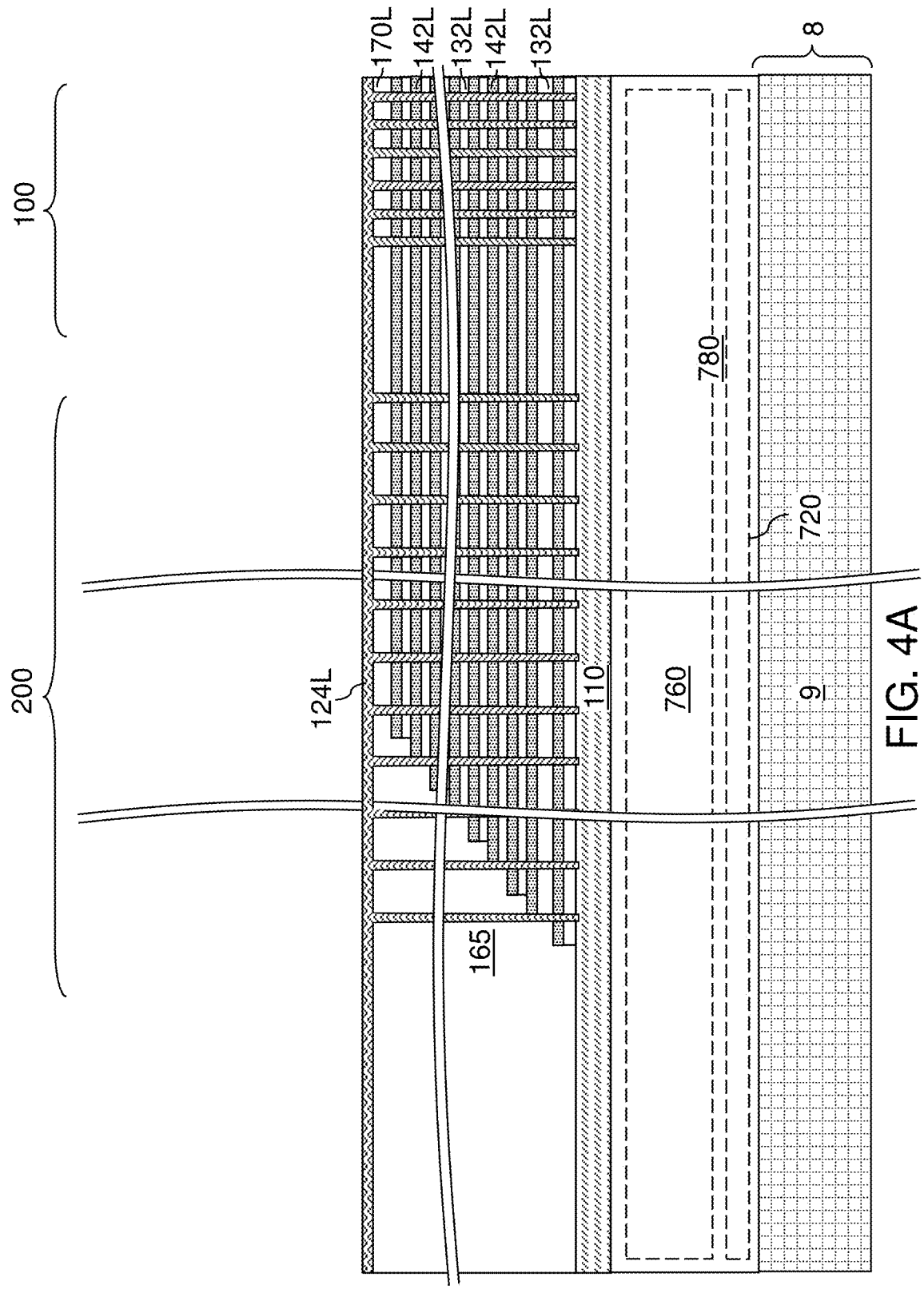

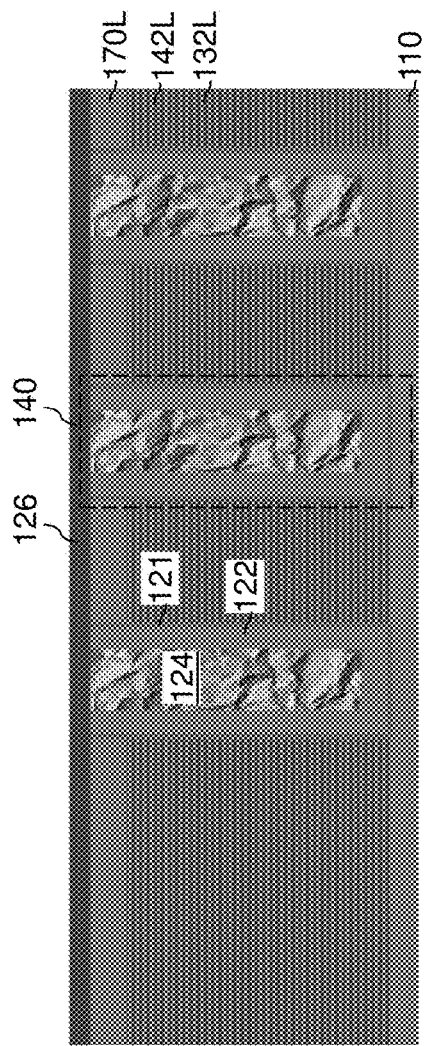
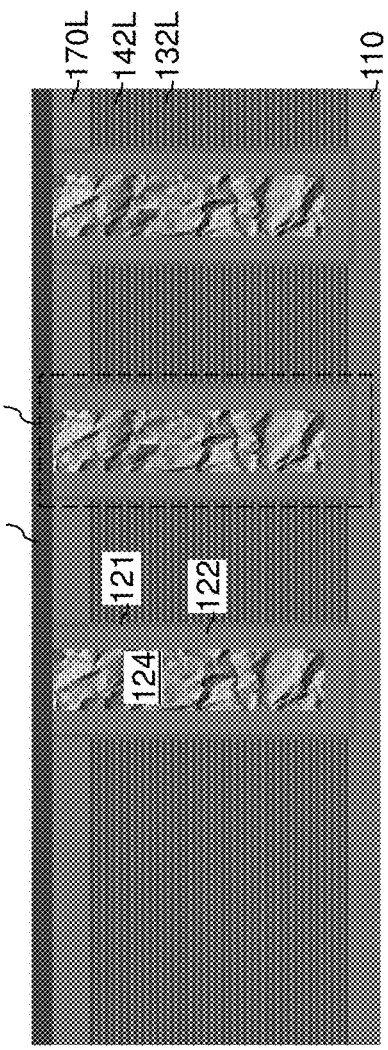
FIG. 5C
FIG. 5D

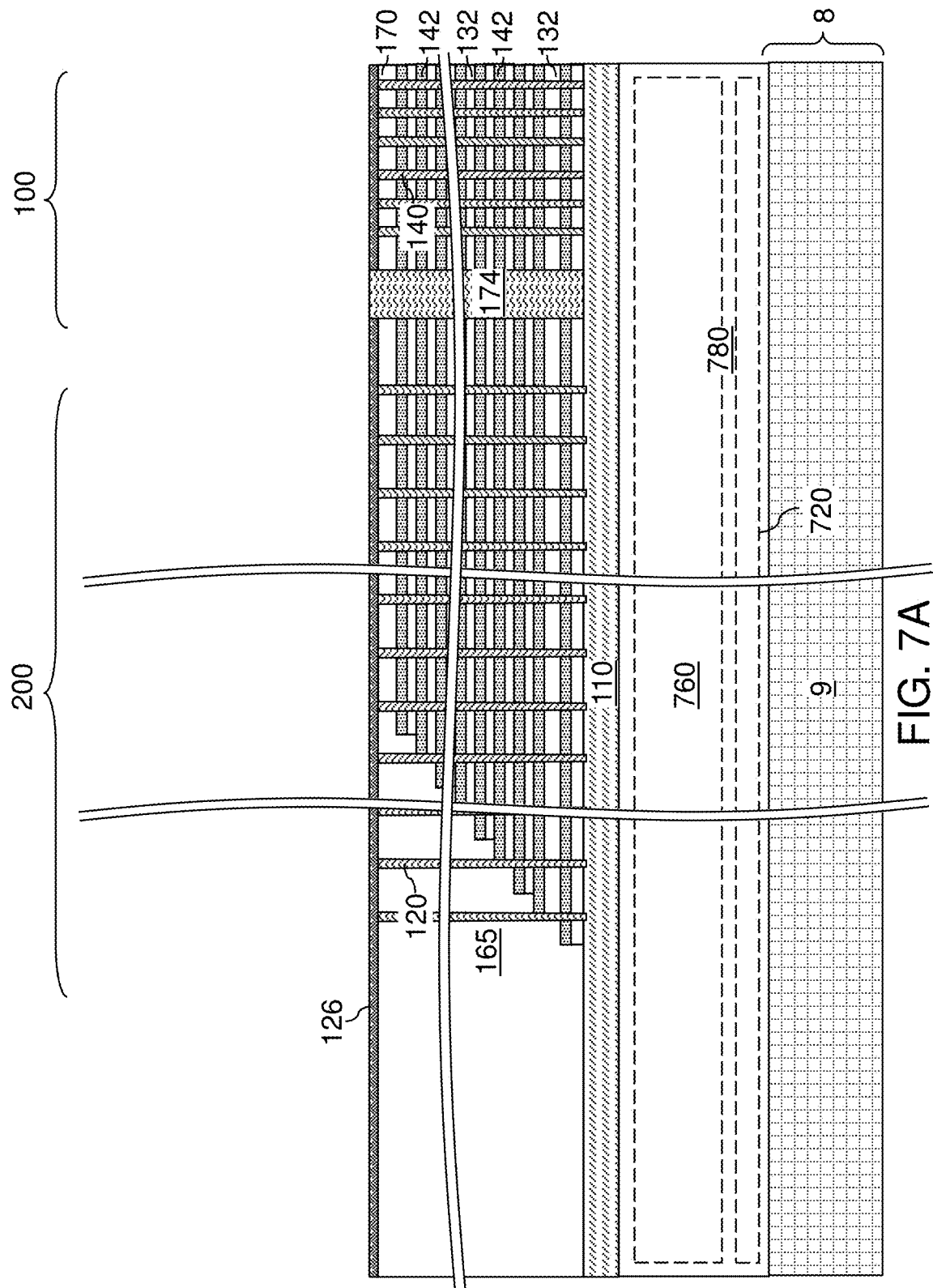

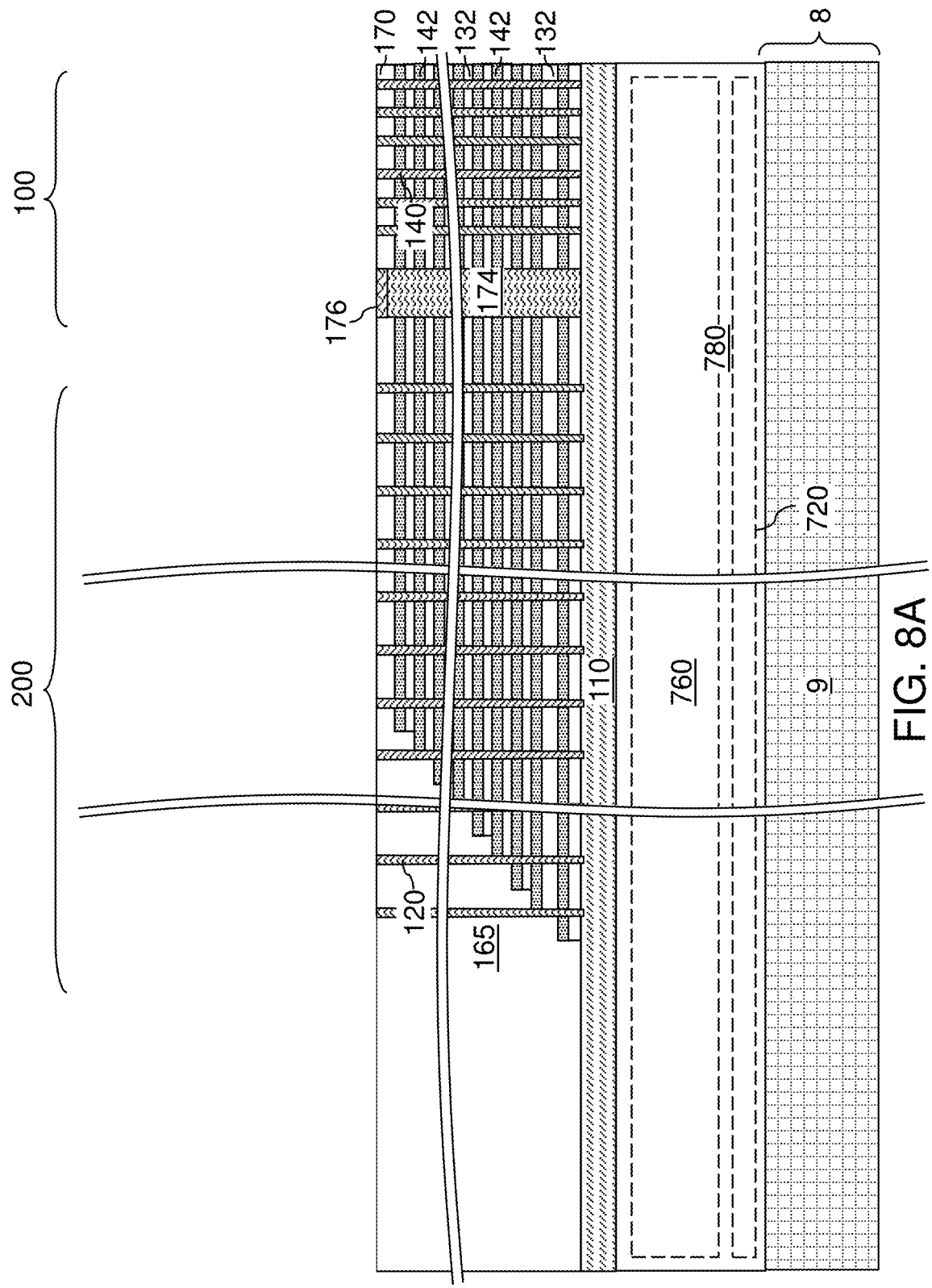

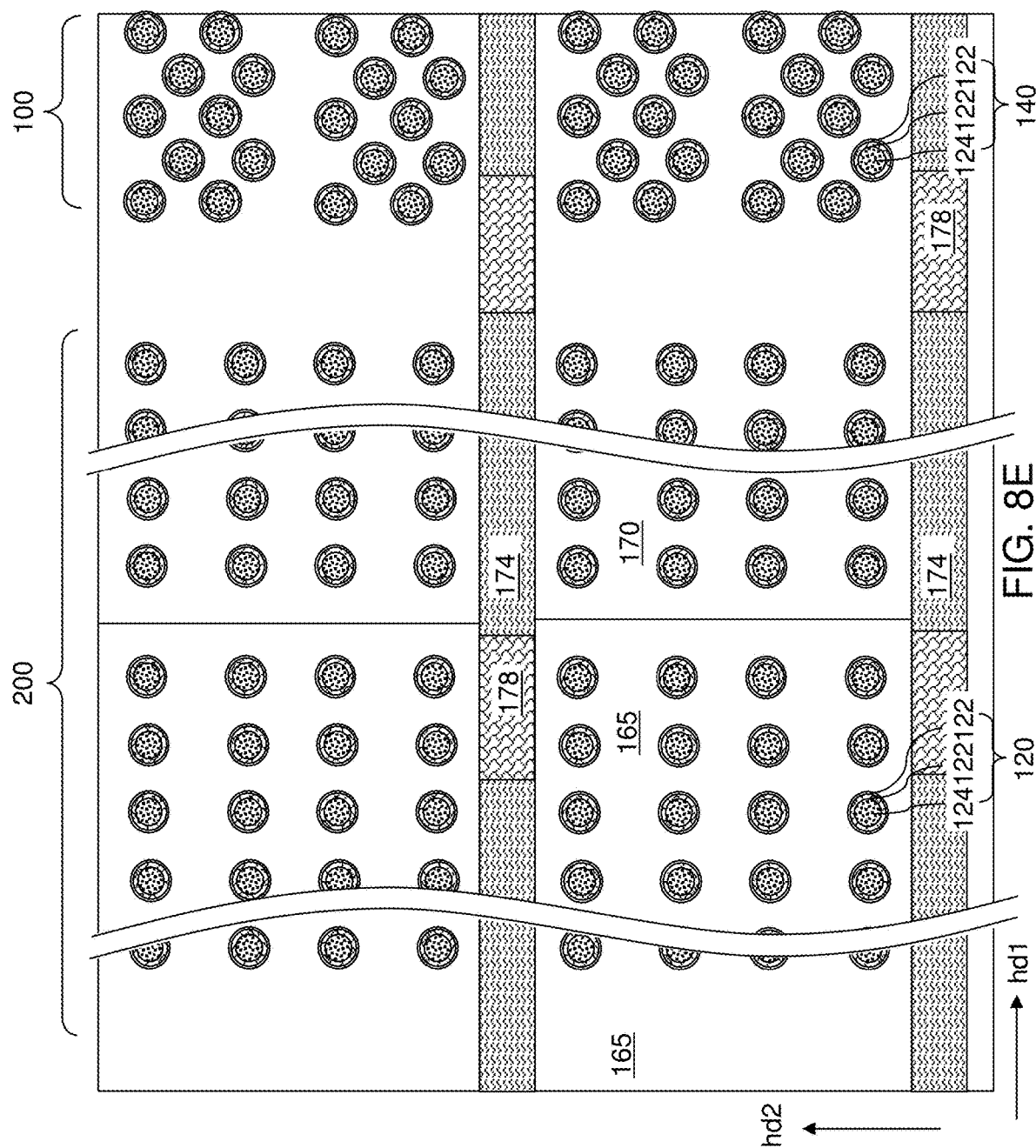

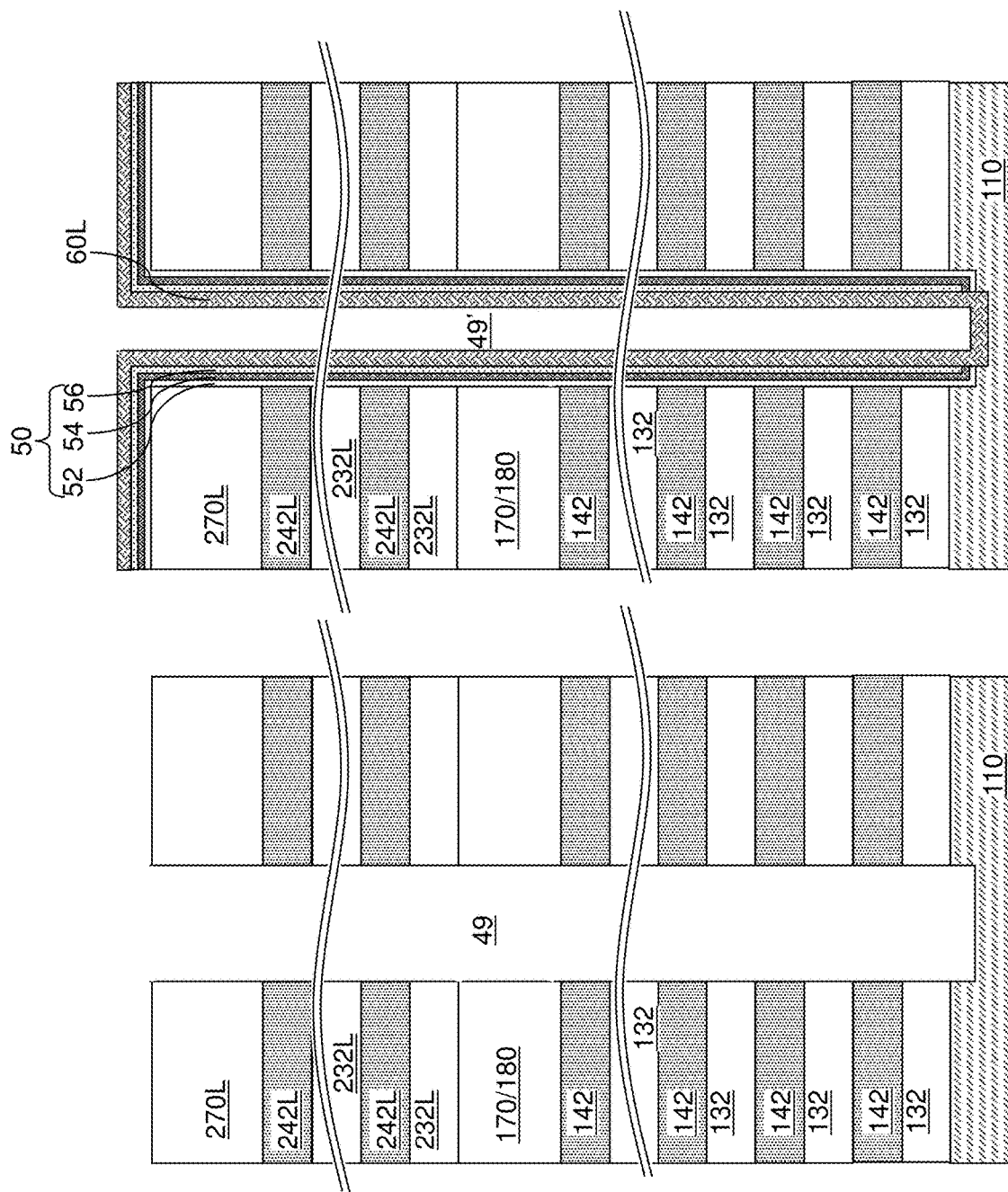

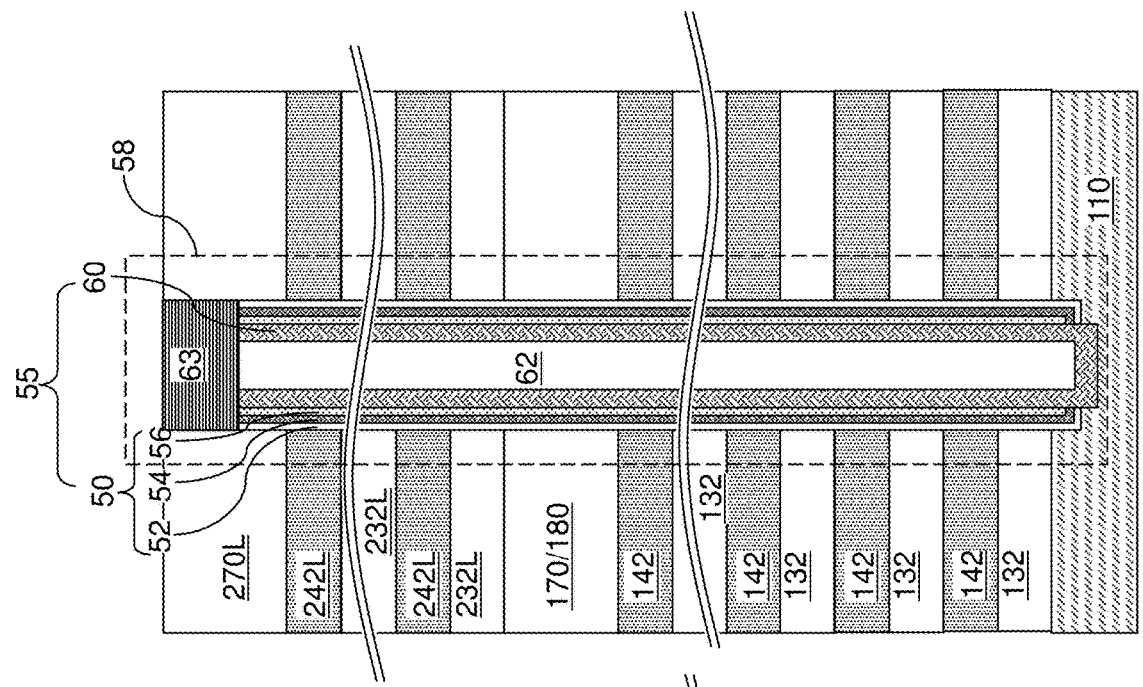
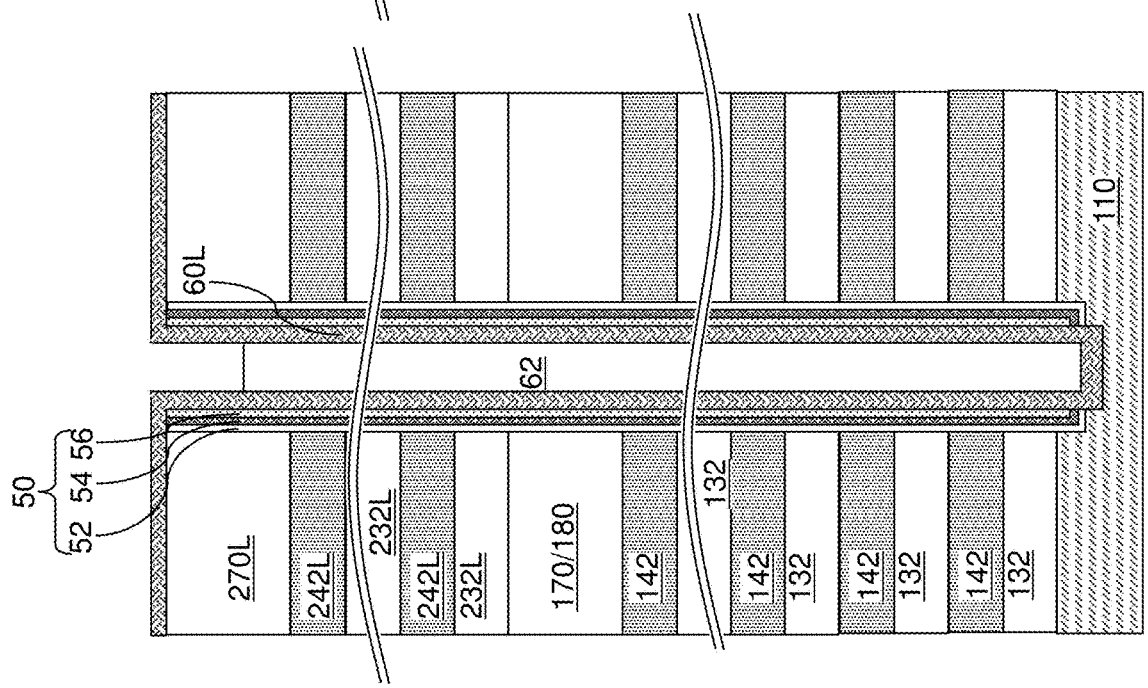

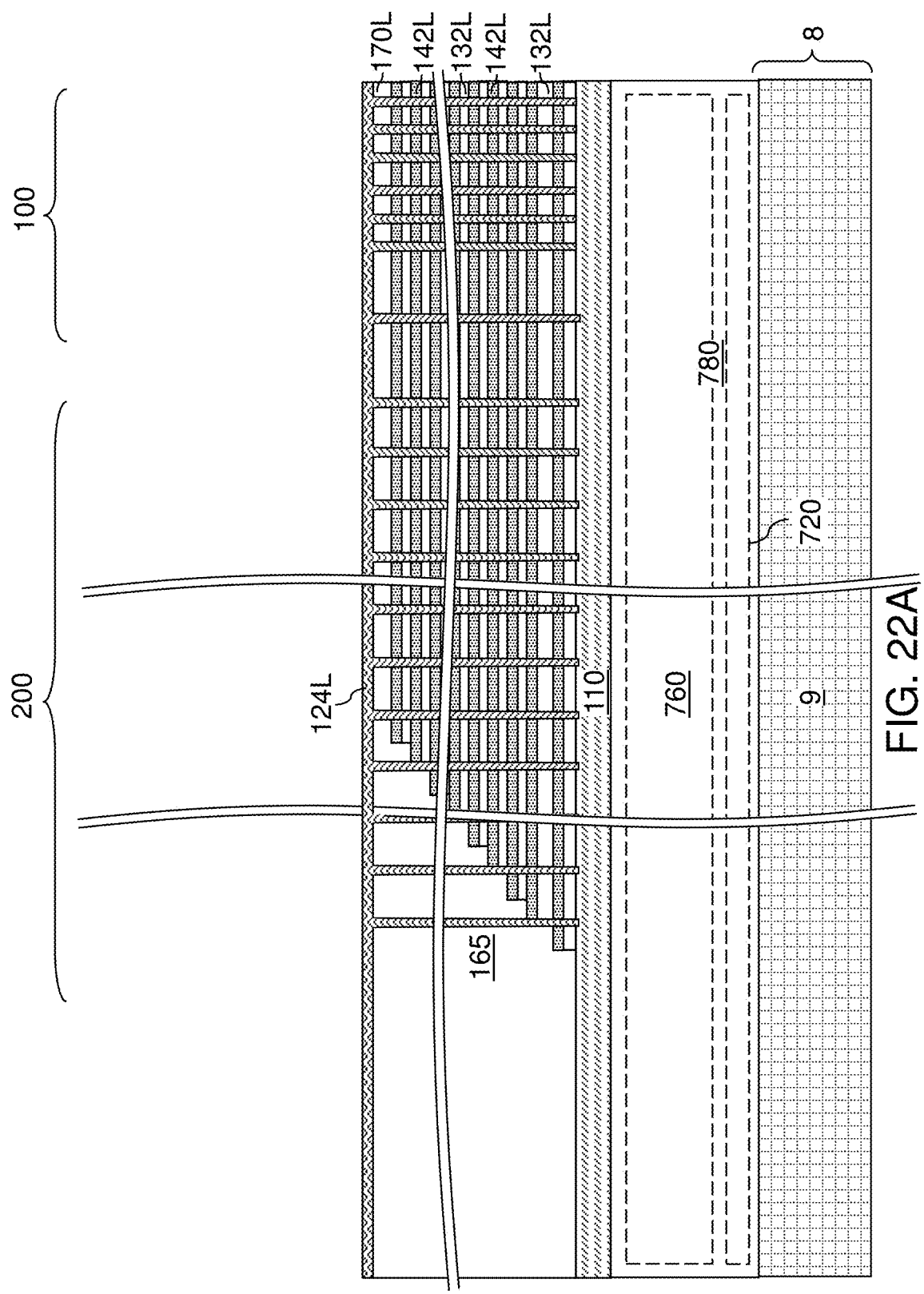

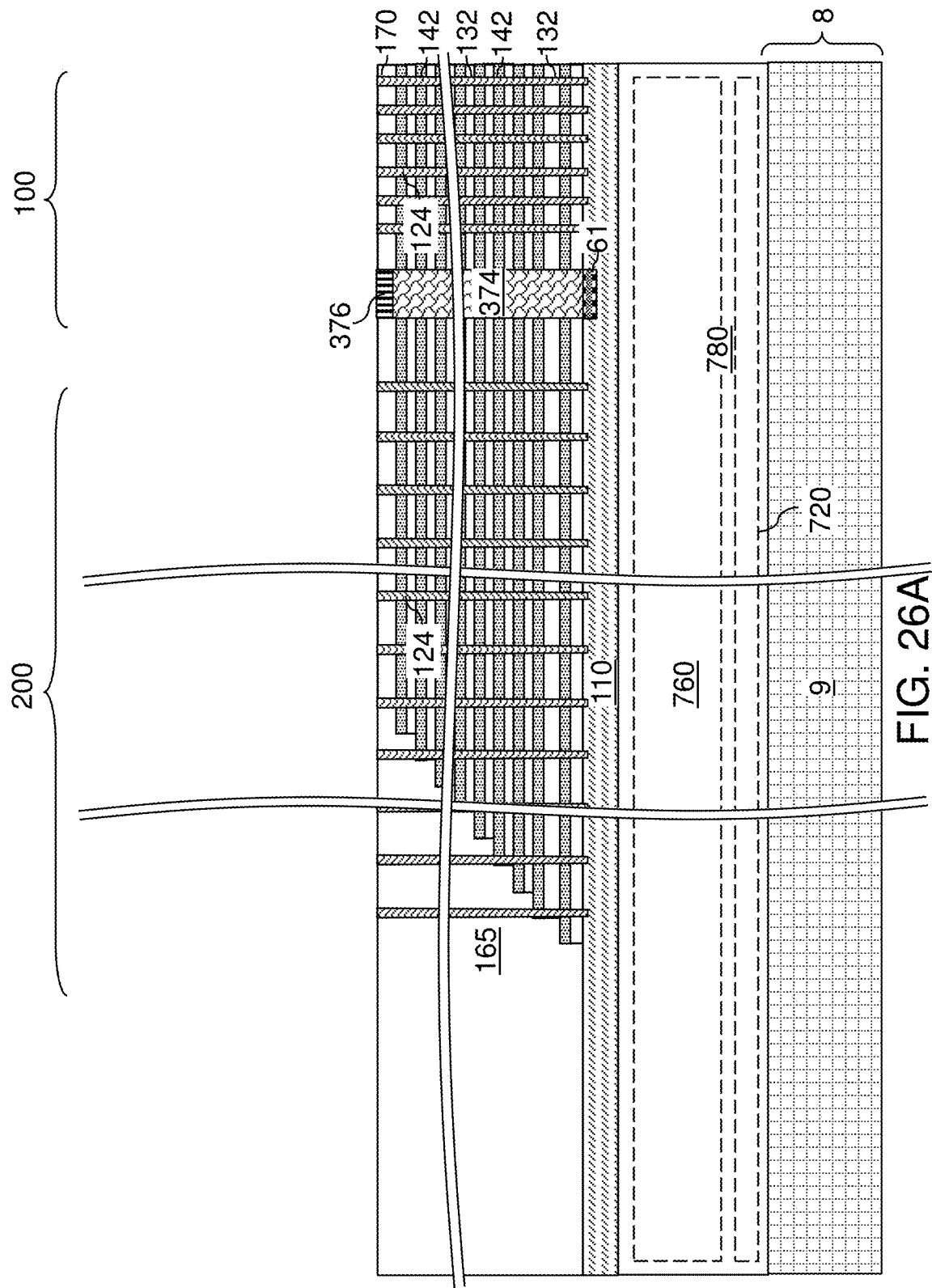

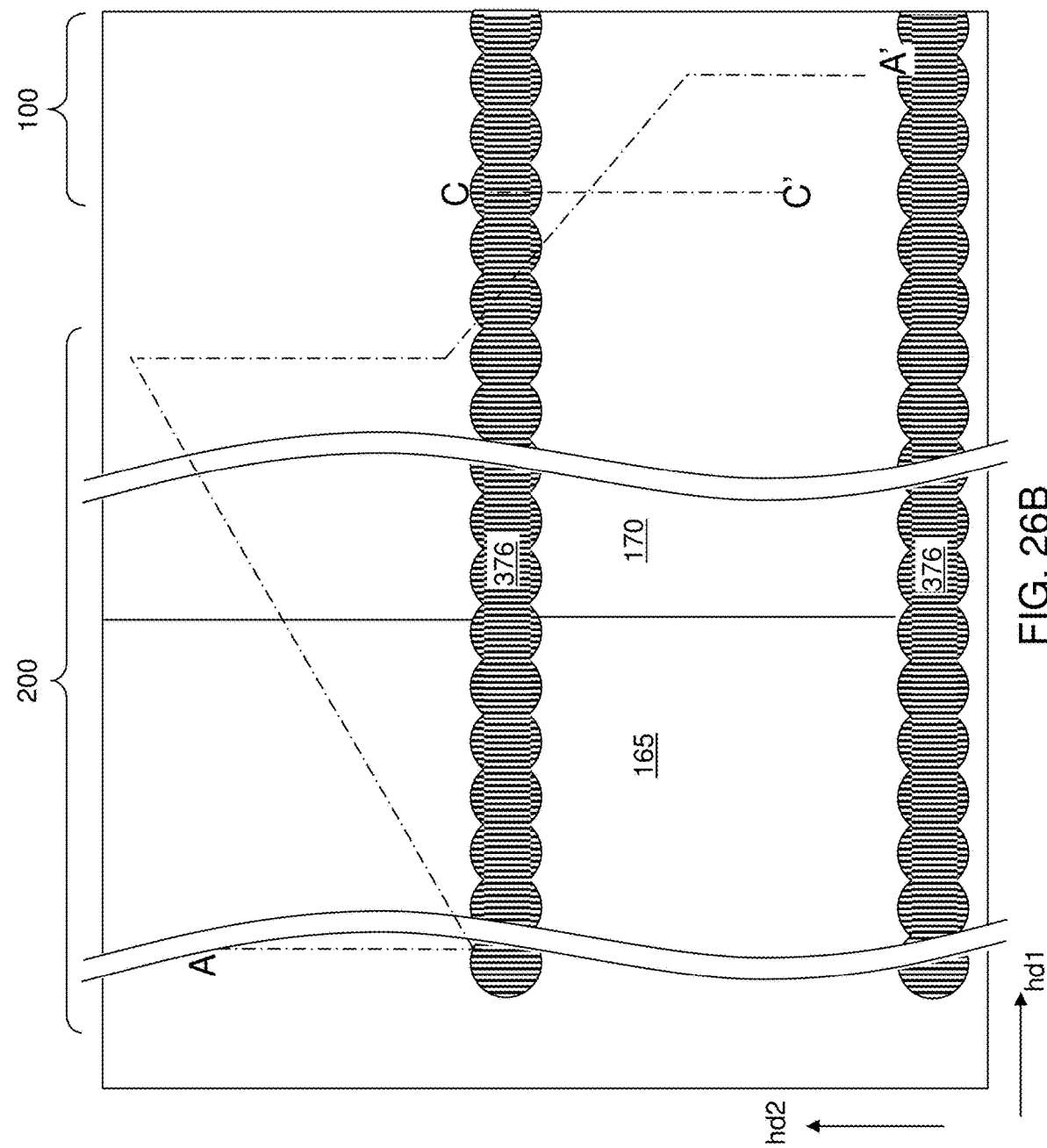

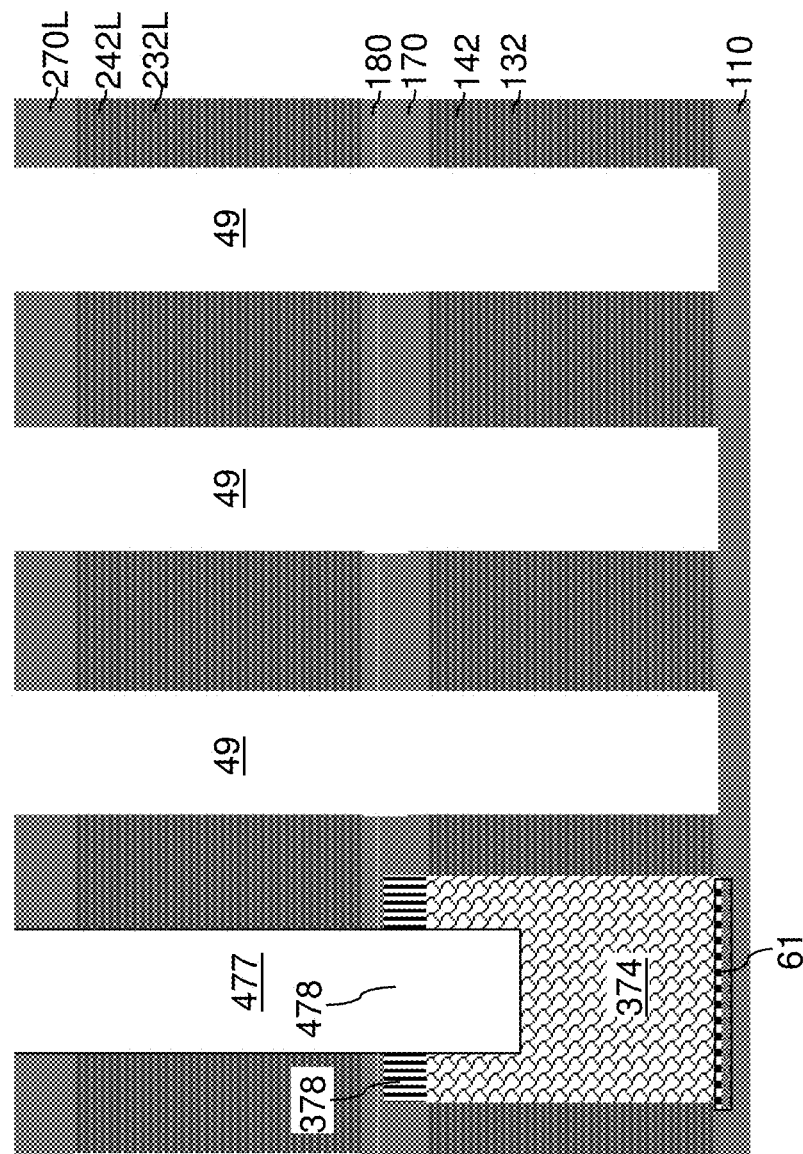

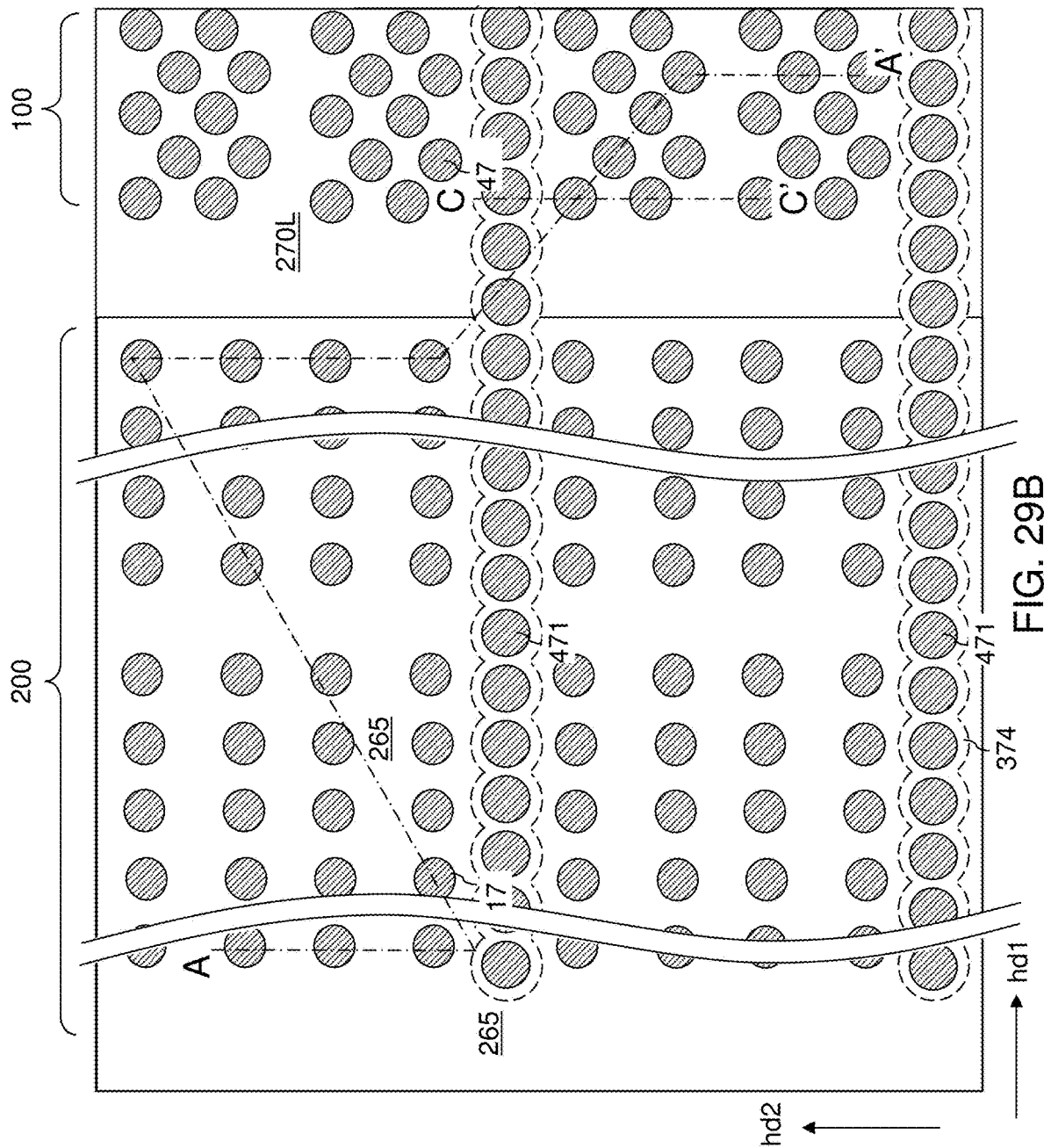

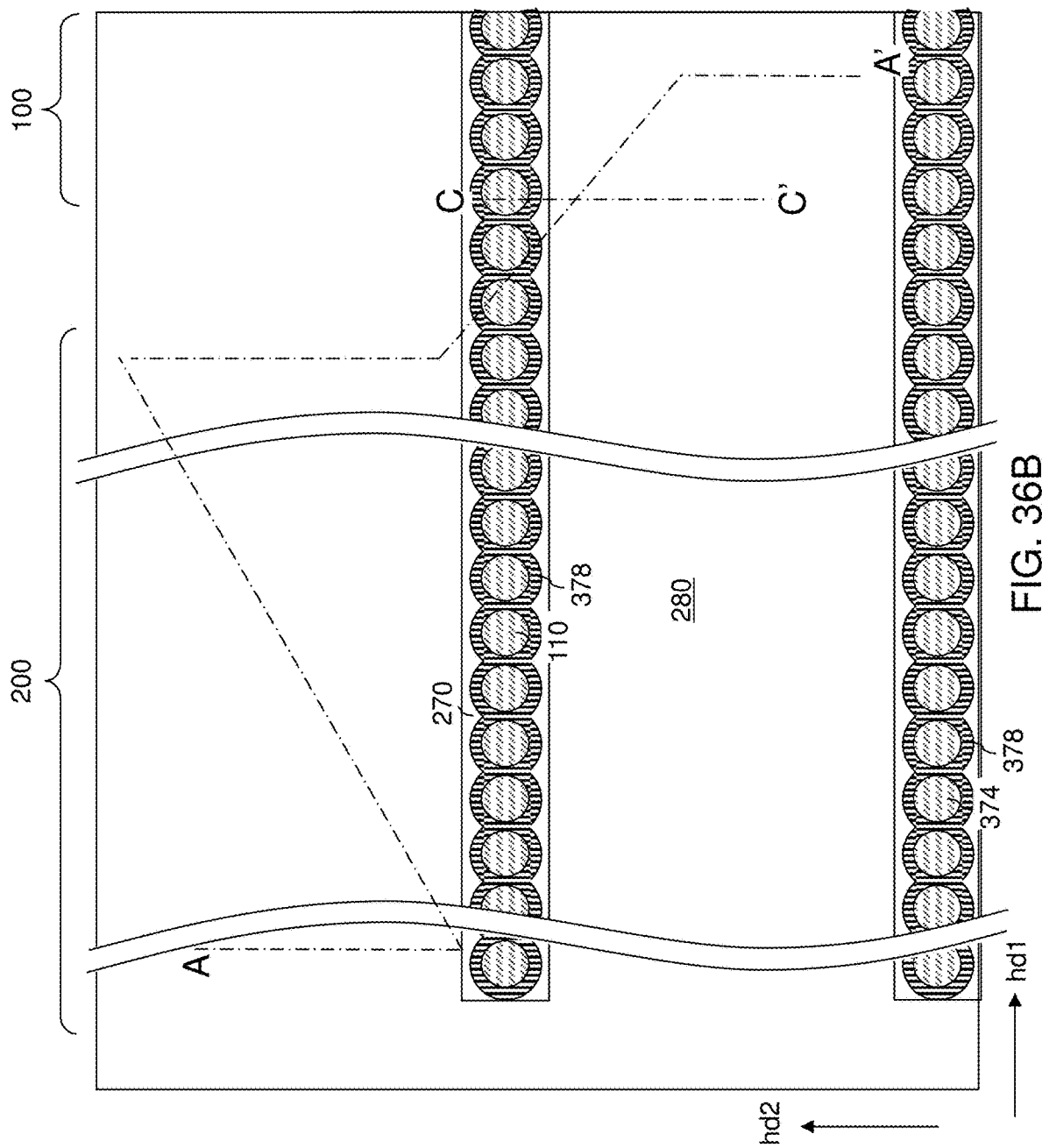

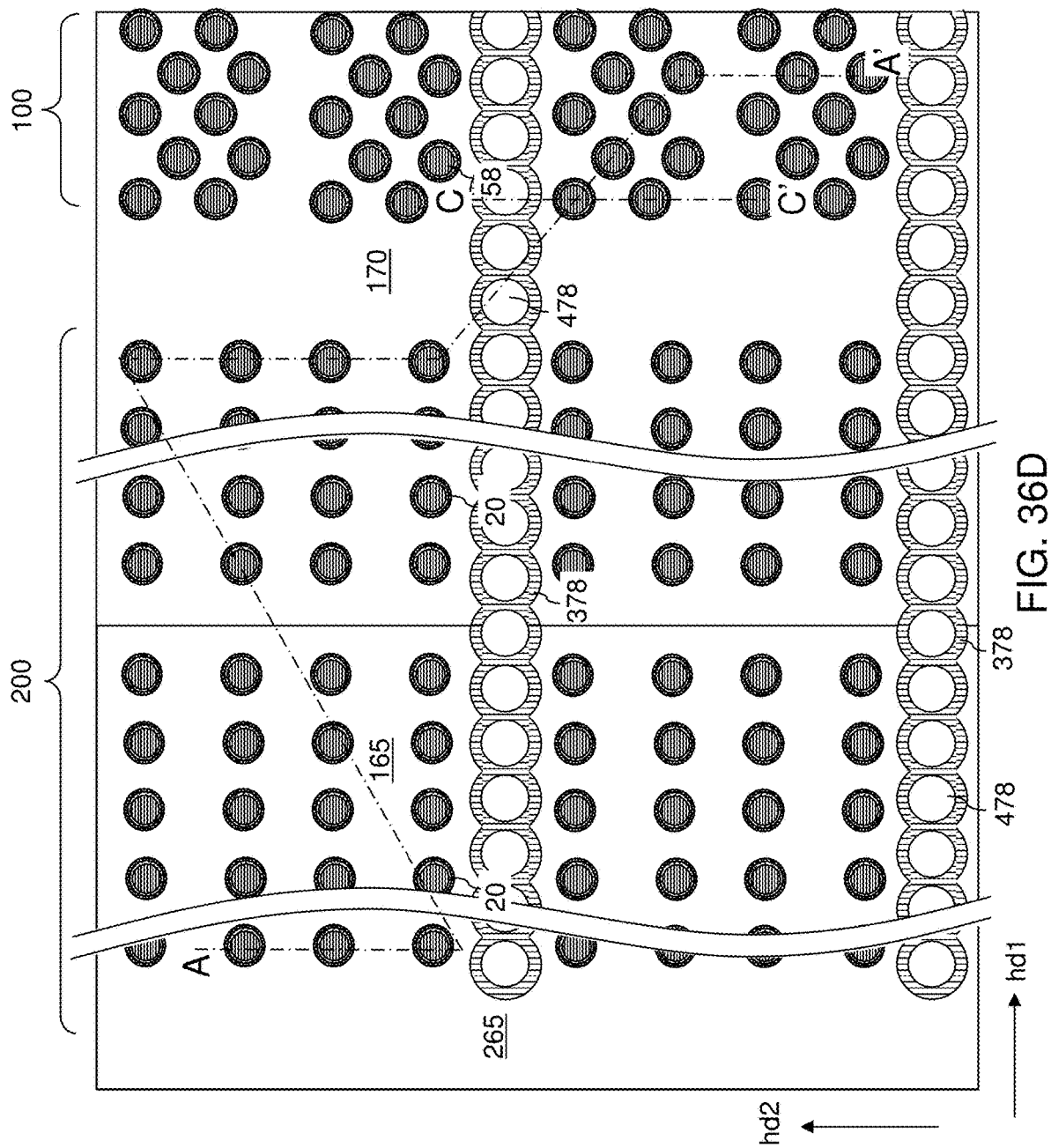

THREE-DIMENSIONAL MEMORY DEVICE INCLUDING TRENCH BRIDGES AND METHODS OF FORMING THE SAME

FIELD

The present disclosure relates generally to the field of semiconductor devices, and particularly to three-dimensional memory devices containing bridges which provide enhanced structural support for preventing stack collapse during a replacement process and methods of forming the same.

BACKGROUND

A three-dimensional memory device including three-dimensional vertical NAND strings having one bit per cell are disclosed in an article by T. Endom et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises a pair of layer stacks laterally extending along a first horizontal direction and laterally spaced from each other along a second horizontal direction by a respective one of a plurality of backside trenches, wherein each of the layer stacks comprises a first-tier alternating stack of first insulating layers and first electrically conductive layers, a first insulating cap layer located over the first-tier alternating stack, and a second-tier alternating stack of second insulating layers and second electrically conductive layers located over the first insulating cap layer, memory openings vertically extending through the pair of layer stacks, memory opening fill structures located in the respective memory openings and comprising a respective vertical stack of memory elements and a respective vertical semiconductor channel, and a bridge structure spanning an entire width of the backside trench along the second horizontal direction. A top surface of the bridge structure is located below a top surface of the second-tier alternating stack, and a bottom surface of the bridge structure is located above a bottom surface of the first-tier alternating stack.

According to another aspect of the present disclosure, a method of forming a semiconductor structure comprises forming first-tier layer stacks that laterally extend along a first horizontal direction and are laterally spaced apart from each other along a second horizontal direction by first-tier backside trenches, and wherein each of the first-tier layer stacks comprises a first-tier alternating stack of first insulating layers and first sacrificial material layers, and a first insulating cap layer overlying the first-tier alternating stack; forming a fill material stack comprising a sacrificial trench fill structure and a bridge material matrix in each of the first-tier backside trenches; forming second-tier layer stacks over the first-tier alternating stacks, wherein the second-tier layer stacks laterally extend along the first horizontal direction and are laterally spaced apart from each other along the second horizontal direction by second-tier backside trenches, and wherein each of the second-tier layer stacks comprises a second-tier alternating stack of second insulating layers and second sacrificial material layers; patterning each of the bridge material matrices into a respective plurality of bridge structures that are laterally spaced apart along the first horizontal direction; removing the sacrificial trench fill structures from blow the plurality of bridge structures; and replacing the first sacrificial material layers and the second sacrificial material layers with first electrically conductive layers and second electrically conductive layers, respectively.

According to yet another aspect of the present disclosure, a three-dimensional memory device comprises a pair of layer stacks laterally extending along a first horizontal direction and laterally spaced from each other along a second horizontal direction by a backside trench, wherein each of the pair of layer stacks comprises a first-tier alternating stack of first insulating layers and first electrically conductive layers and a second-tier alternating stack of second insulating layers and second electrically conductive layers, memory openings vertically extending through the pair of layer stacks, memory opening fill structures located in the respective memory openings and comprising a respective vertical stack of memory elements and a respective vertical semiconductor channel, and a perforated bridge structure including a plurality of vertically-extending openings located in the backside trench.

According to still another aspect of the present disclosure, a method of forming a semiconductor structure comprises forming a first vertically alternating sequence of first continuous insulating layers and first continuous sacrificial material layers; dividing the first vertically alternating sequence into first-tier alternating stacks of first insulating layers and first sacrificial material layers by forming first-tier backside trenches, wherein the first-tier alternating stacks laterally extend along a first horizontal direction and are laterally spaced apart from each other along a second horizontal direction by the first-tier backside trenches; forming a fill material stack comprising a sacrificial trench fill structure and a bridge material matrix in each of the first-tier backside trenches; forming a second vertically alternating sequence of second continuous insulating layers and second continuous sacrificial material layers over the first-tier alternating stacks and the fill material stacks; forming rows of discrete backside openings through the second vertically alternating sequence and through the bridge material matrices, wherein each of the bridge material matrices is converted into a respective perforated bridge structure through which a respective plurality of openings vertically extend; dividing the second vertically alternating sequence into second-tier alternating stacks of second insulating layers and second sacrificial material layers by laterally expanding the discrete backside openings, wherein the discrete backside openings in each of the rows merge with each other form second-tier backside trenches; and replacing the first sacrificial material layers and the second sacrificial material layers with first electrically conductive layers and second electrically conductive layers, respectively.

BRIEF DESCRIPTION OF THE DRAWINGS

FIG. 3B is a top-down view of the first exemplary structure of FIG. 3A. The vertical plane A-A' is the plane of the vertical cross-sectional view of FIG. 3A.

FIG. 4A is a vertical cross-sectional view of the first exemplary structure after formation of a sacrificial dielectric liner layer, a sacrificial semiconductor liner layer, and a sacrificial fill material layer according to the first embodiment of the present disclosure.

FIG. 5C is a vertical cross-sectional view of the first exemplary structure along the vertical plane C-C' of FIG. 5B.

FIG. 5D is a vertical cross-sectional view of the first exemplary structure along the vertical plane D-D' of FIG. 5B.

FIG. 7A is a vertical cross-sectional view of the first exemplary structure after formation of sacrificial trench fill structures according to the first embodiment of the present disclosure.

FIG. 8A is a vertical cross-sectional view of the first exemplary structure after formation of bridge material matrices and removal of the sacrificial stopping material layer according to the first embodiment of the present disclosure.

FIG. 8E is a top-down view of an alternative embodiment of the first exemplary structure according to the first embodiment of the present disclosure.

FIGS. 12A-12D illustrate sequential vertical cross-sectional views of a memory opening during formation of a memory opening fill structure according to the first embodiment of the present disclosure.

FIG. 22A is a vertical cross-sectional view of the second exemplary structure after formation of a sacrificial dielectric liner layer, a sacrificial semiconductor liner layer, and a sacrificial fill material layer according to the second embodiment of the present disclosure.

FIG. 26A is a vertical cross-sectional view of the second exemplary structure after formation of bridge material matrices and removal of the first sacrificial capping layer according to the second embodiment of the present disclosure.

FIG. 26B is a top-down view of the second exemplary structure of FIG. 26A. The vertical plane A-A' is the plane of the vertical cross-sectional view of FIG. 26A.

FIG. 28C is a vertical cross-sectional view of the second exemplary structure along the vertical plane C-C' of FIG. 28B.

FIG. 29B is a top-down view of the second exemplary structure of FIG. 29A. The vertical plane A-A' is the plane of the vertical cross-sectional view of FIG. 29A.

FIG. 36B is a top-down view of the second exemplary structure of FIG. 36A. The vertical plane A-A' is the plane of the vertical cross-sectional view of FIG. 36A.

FIG. 36D is a horizontal cross-sectional view of the second exemplary structure along the horizontal plane D-D' of FIG. 36A.

DETAILED DESCRIPTION

Figure 1:
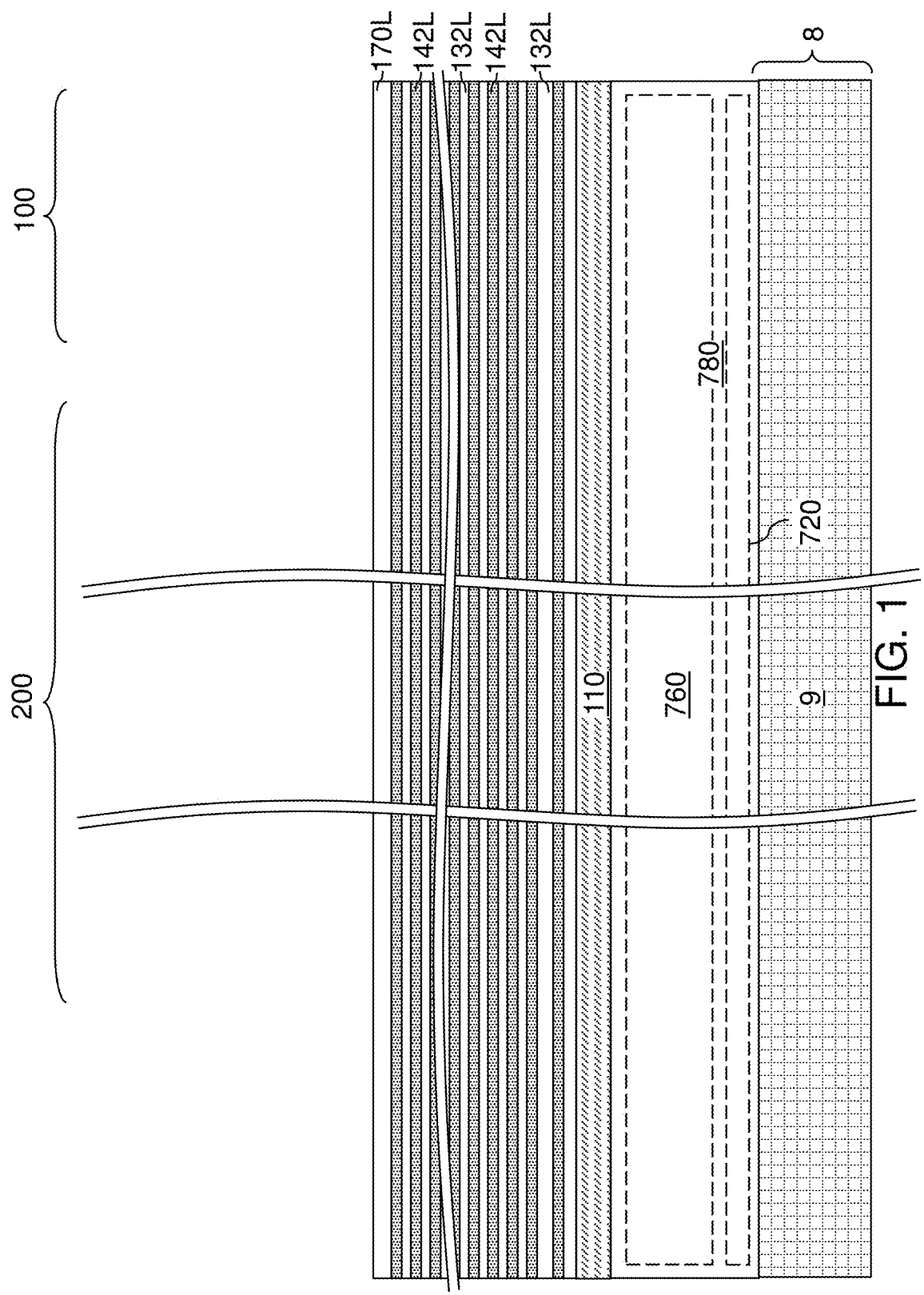
FIG. 1 is a vertical cross-sectional view of a first exemplary structure after formation of optional semiconductor devices, optional lower level dielectric layers, optional lower metal interconnect structures, a semiconductor material layer, and a first vertically alternating sequence of first continuous insulating layers and first continuous sacrificial material layers according to a first embodiment of the present disclosure.

As discussed above, the embodiments of the present disclosure are directed to three-dimensional memory devices containing bridges which provide enhanced structural support for preventing stack collapse during a replacement process and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, there above, and/or there below.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming A page is also the smallest unit that may be selected to a read operation.

Referring to FIG. 1, a first exemplary structure for formation of the exemplary semiconductor die is illustrated in a vertical cross sectional view. The first exemplary structure may comprise a memory array region 100 in which a three-dimensional memory array is subsequently formed, and a staircase region 200 in which stepped surfaces of alternating stacks of insulating layers and electrically conductive layers are subsequently formed.

Semiconductor devices 720 can be formed on a substrate semiconductor layer 9, which is provided at least within an upper portion of a substrate 8. Lower level dielectric layers 760 embedding lower-level metal interconnect structures 780 (schematically represented by a dotted area) can be formed over the substrate semiconductor layer 9.

The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

In an alternative embodiment, the semiconductor devices 720, the lower-level dielectric layers 760 and then lower-level metal interconnect structures 780 are either omitted or formed outside of the memory array region. If they are omitted, then they may be formed on a separate substrate and then bonded to memory devices to be formed in the memory array region 100 during subsequent steps.

A semiconductor material layer 110 and a first vertically alternating sequence of first continuous insulating layers 132L and first continuous sacrificial material layers 142L can be formed over the substrate 8 (and over the semiconductor devices 720, if present). The first continuous insulating layers 132L may be referred to as first insulating layers or insulating layers. The first continuous sacrificial material layers 142L may be referred to as first sacrificial material layers or sacrificial material layers. A first continuous insulating cap layer 170L can be formed over the first vertically alternating sequence. As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organ silicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

The first continuous insulating cap layer 170L includes a dielectric material that is different from the material of the first continuous sacrificial material layers 142L. For example, the first continuous insulating cap layer 170L may include silicon oxide. The thickness of the first continuous insulating cap layer 170L may be in a range from 30 nm to 600 nm, such as from 60 nm to 300 nm, although lesser and greater thicknesses may also be employed.

Figure 2:
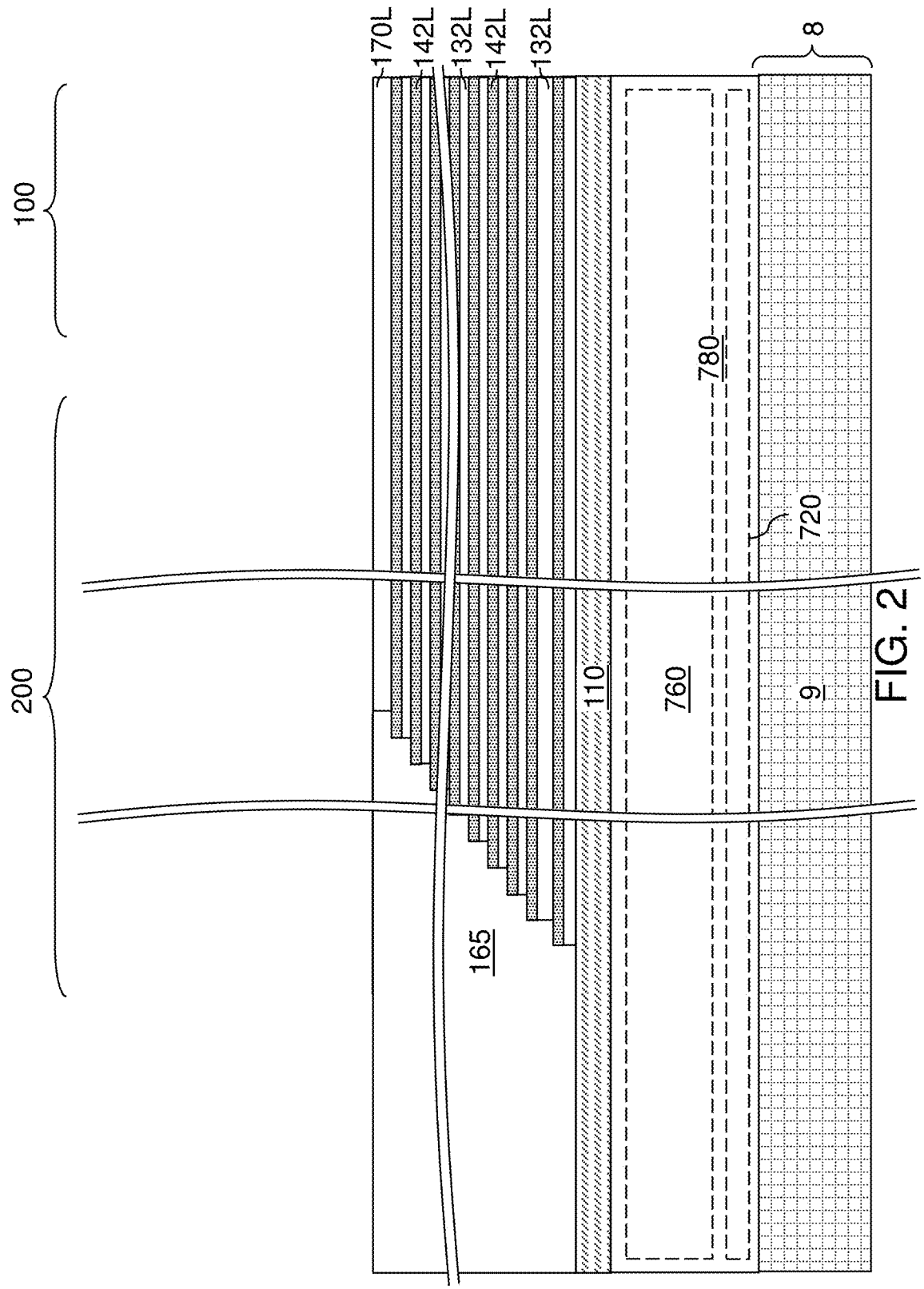
FIG. 2 is a vertical cross-sectional view of the first exemplary structure after formation of first stepped surfaces and a first-tier retro-stepped dielectric material portion according to the first embodiment of the present disclosure.
Figure 3A:
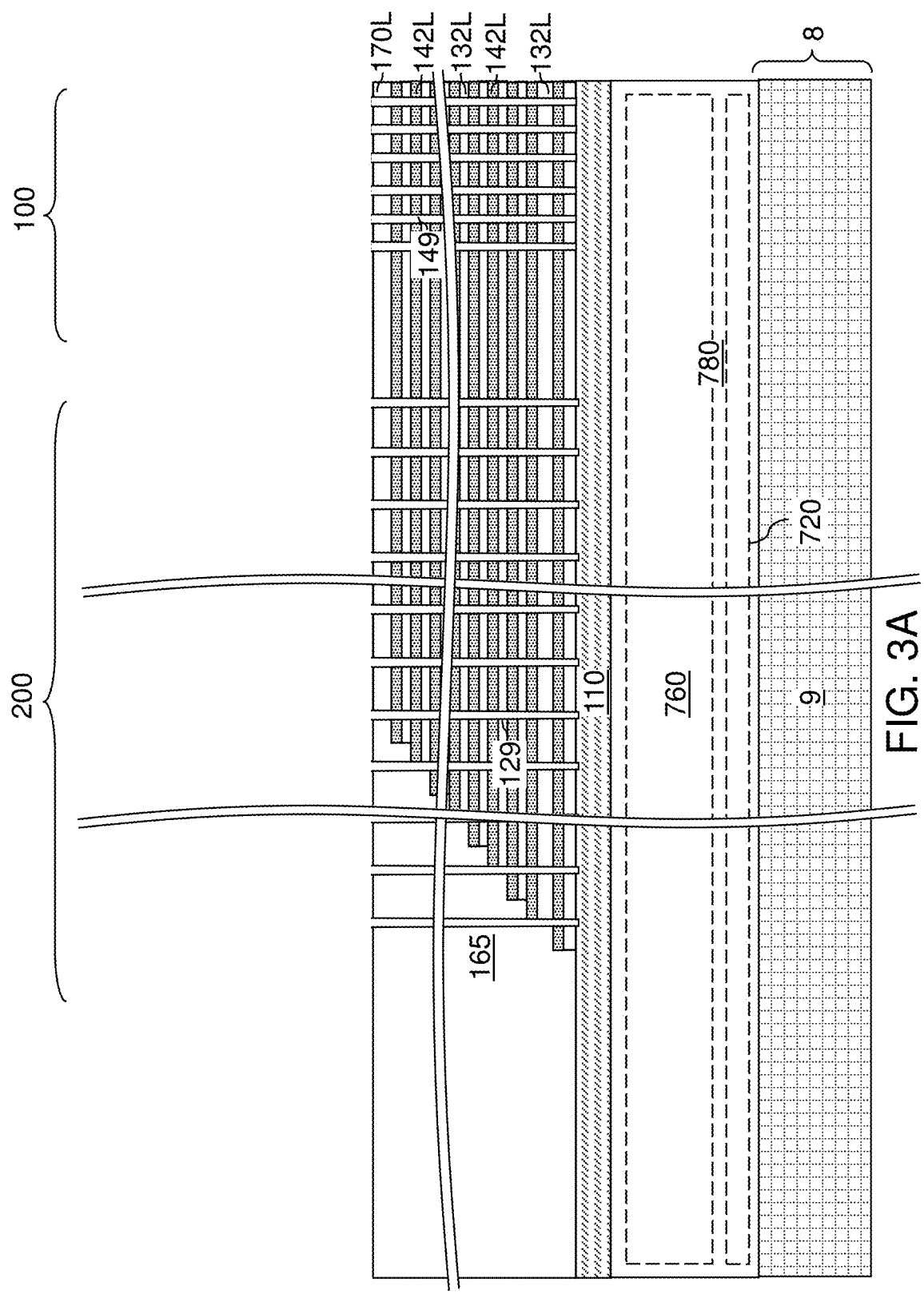
FIG. 3A is a vertical cross-sectional view of the first exemplary structure after formation of first-tier openings according to the first embodiment of the present disclosure.
Figure 3C:
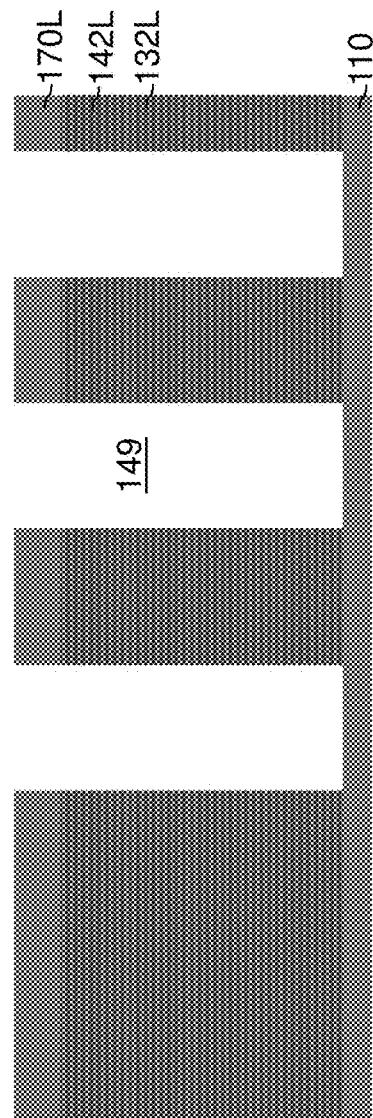
FIG. 3C is a vertical cross-sectional view of the first exemplary structure along the vertical plane C-C' of FIG. 3B.
Figure 3D:
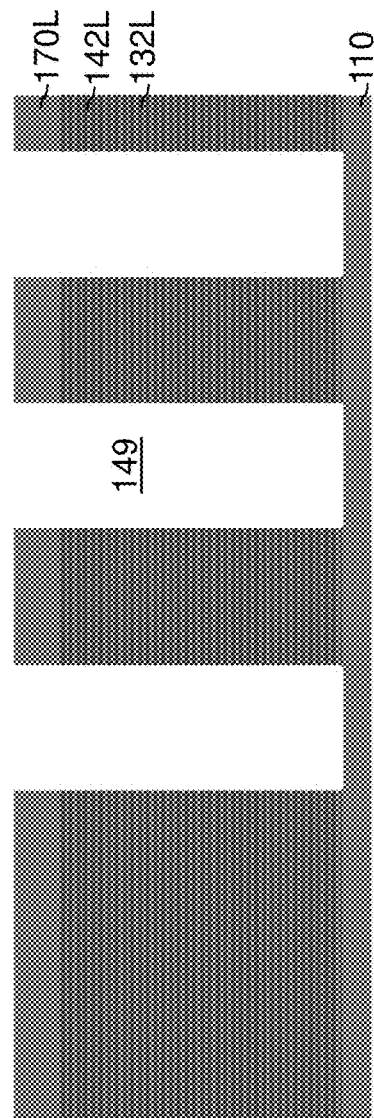
FIG. 3D is a vertical cross-sectional view of the first exemplary structure along the vertical plane D-D' of FIG. 3B.
Figure 4B:
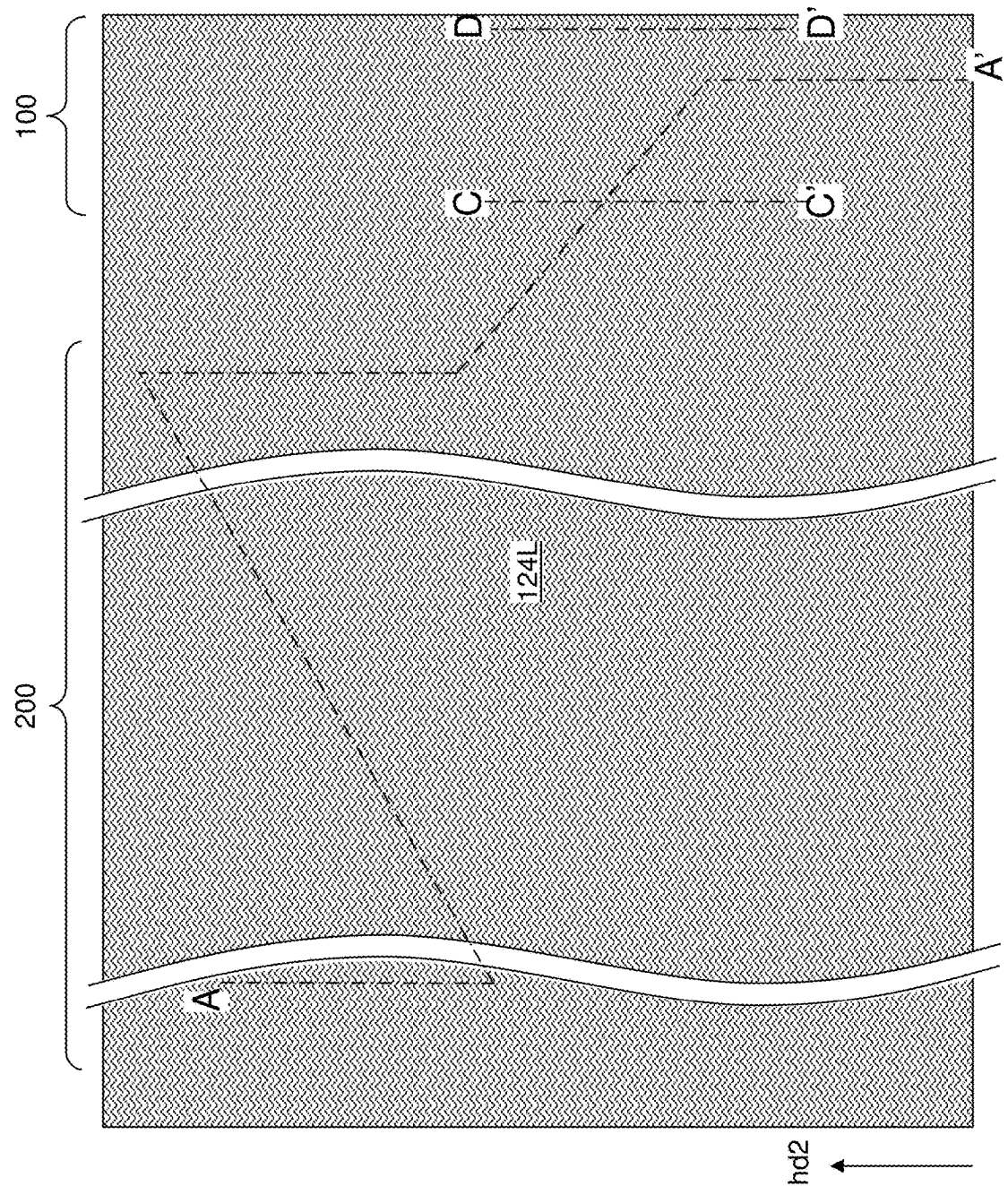
FIG. 4B is a top-down view of the first exemplary structure of FIG. 4A. The vertical plane A-A' is the plane of the vertical cross-sectional view of FIG. 4A.
Figure 4C:
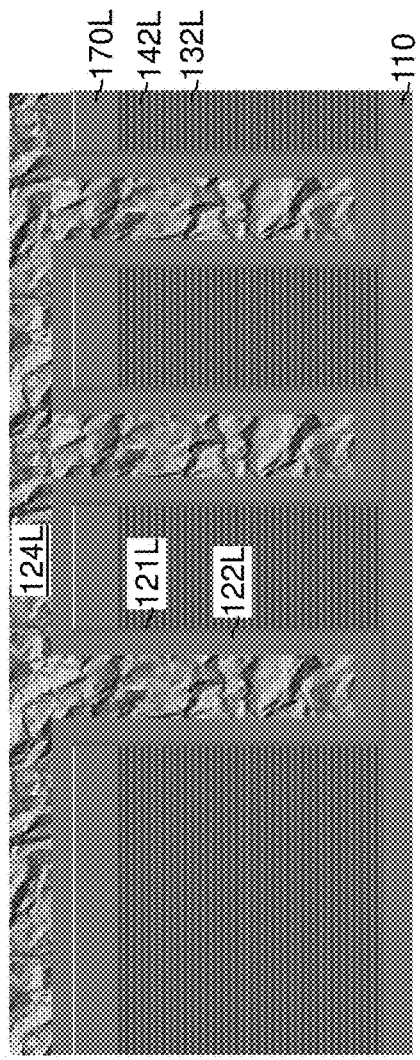
FIG. 4C is a vertical cross-sectional view of the first exemplary structure along the vertical plane C-C' of FIG. 4B.
Figure 4D:
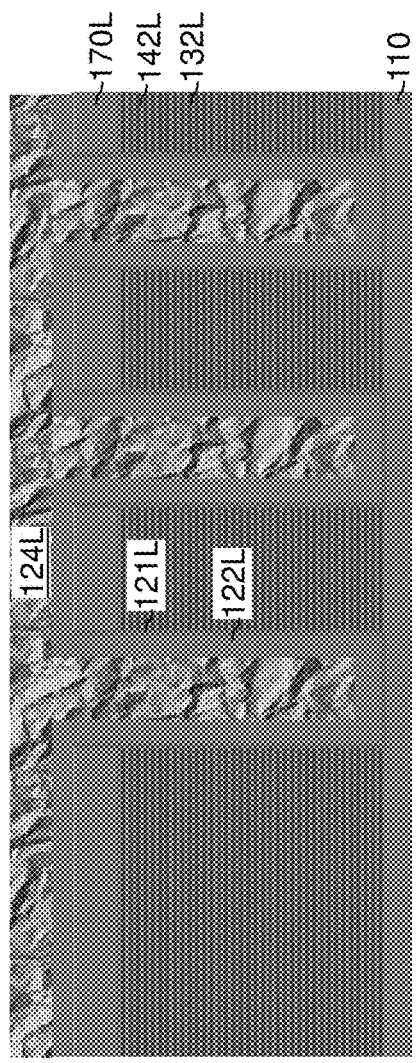
FIG. 4D is a vertical cross-sectional view of the first exemplary structure along the vertical plane D-D' of FIG. 4B.
Figure 5A:
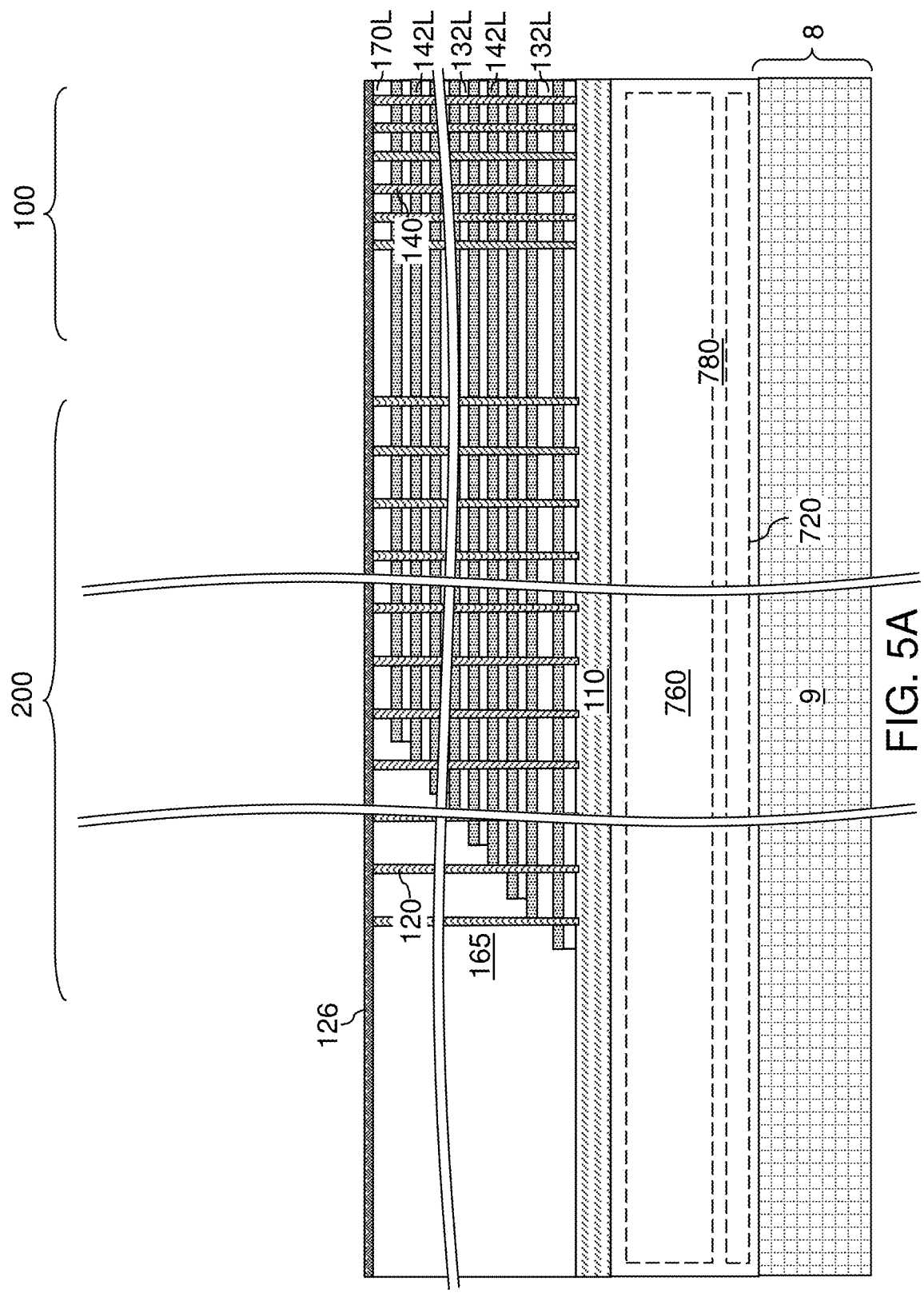
FIG. 5A is a vertical cross-sectional view of the first exemplary structure after formation of sacrificial first-tier opening fill structures and a sacrificial stopping material layer according to the first embodiment of the present disclosure.
Figure 5B:
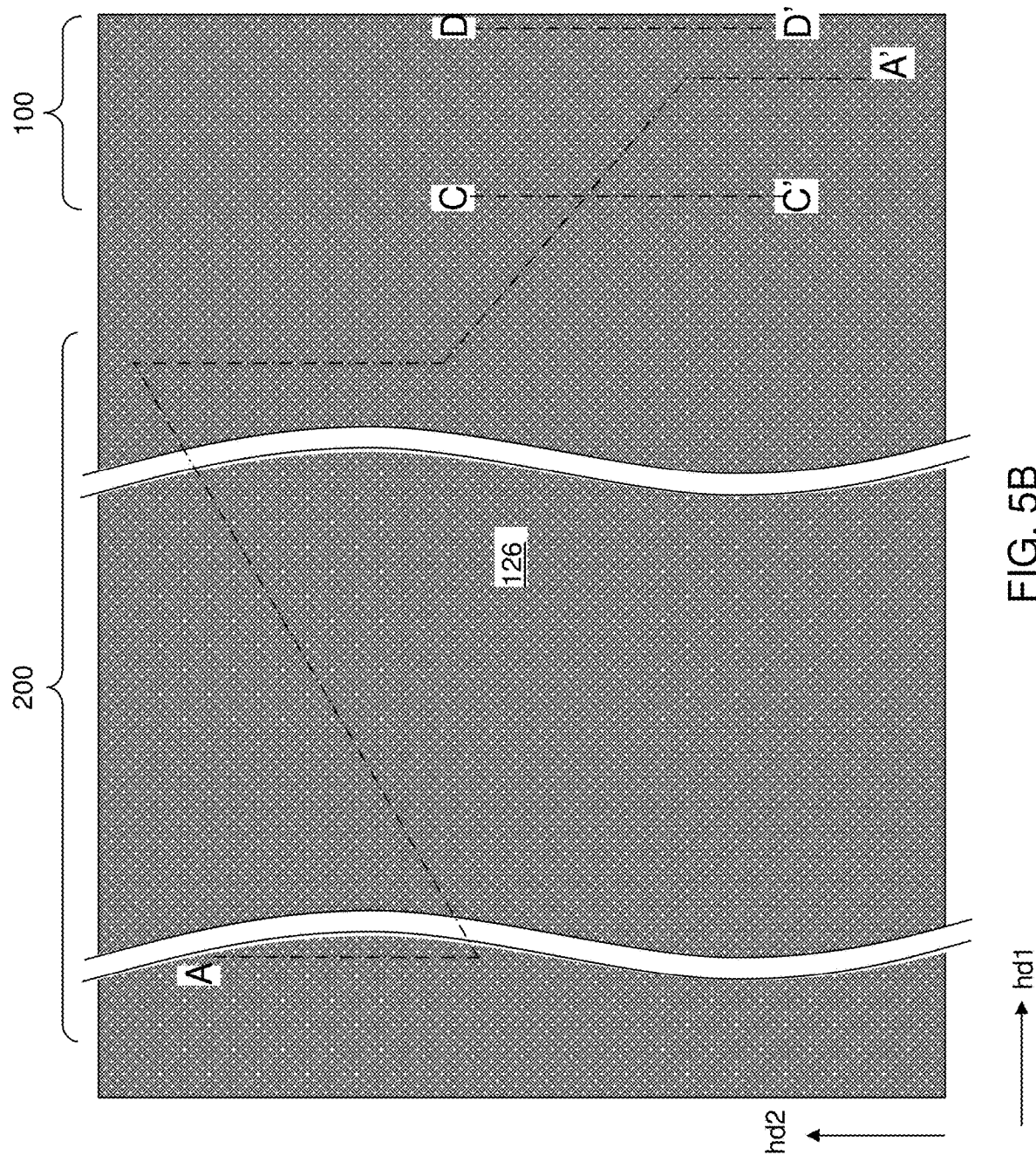
FIG. 5B is a top-down view of the first exemplary structure of FIG. 5A. The vertical plane A-A' is the plane of the vertical cross-sectional view of FIG. 5A.
Figure 6A:
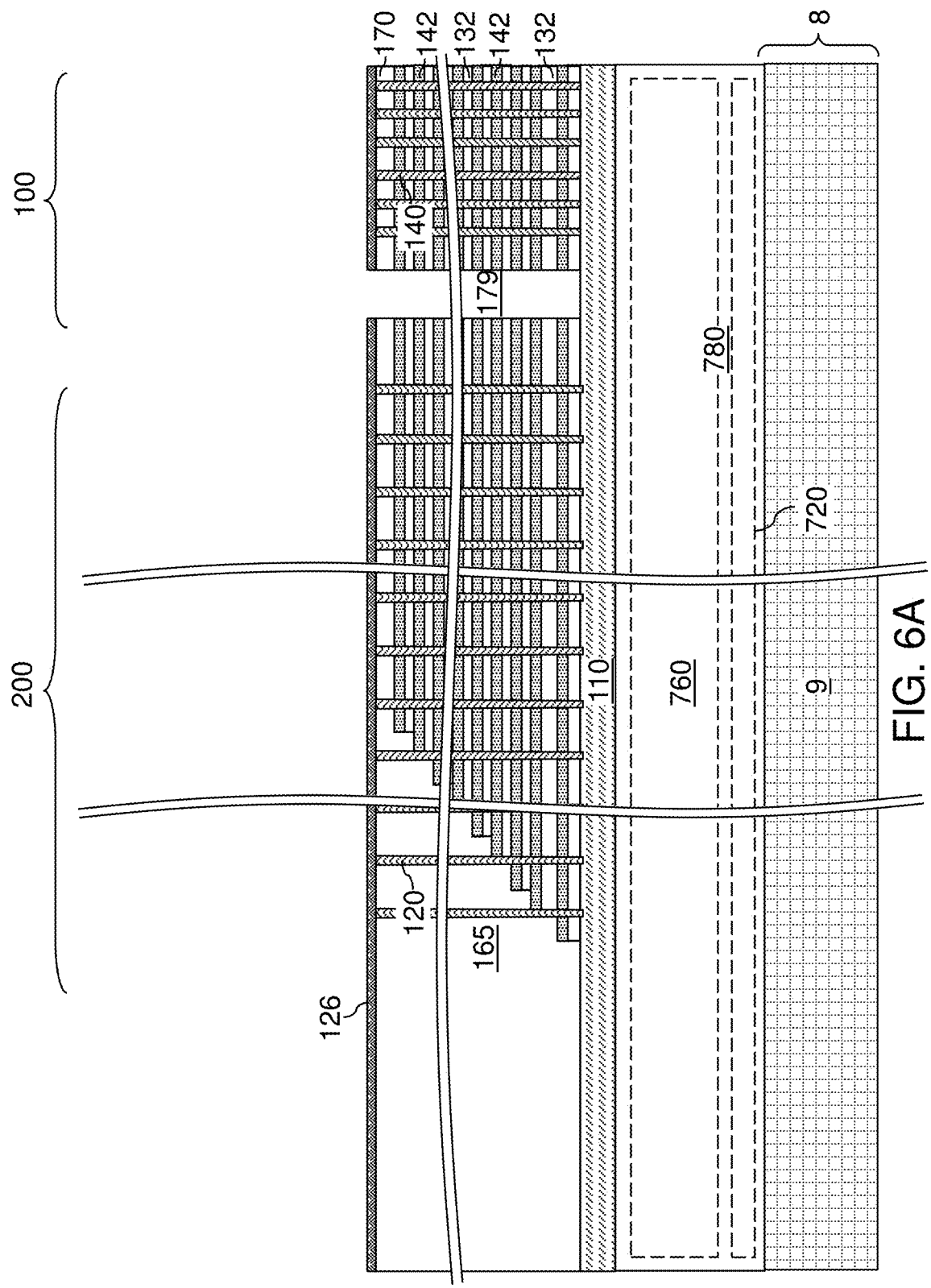
FIG. 6A is a vertical cross-sectional view of the first exemplary structure after formation of first-tier backside trenches according to the first embodiment of the present disclosure.
Figure 6B:
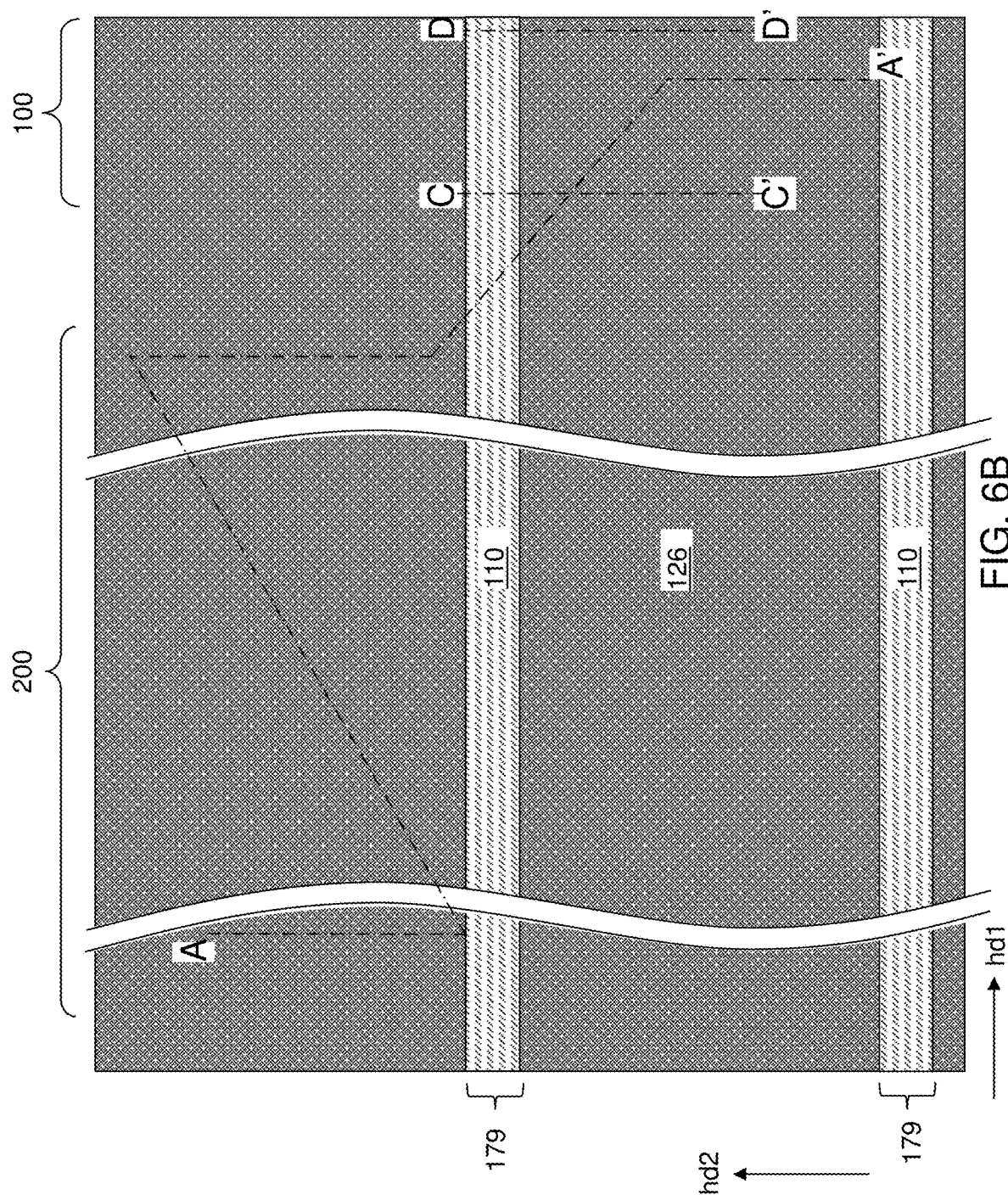
FIG. 6B is a top-down view of the first exemplary structure of FIG. 6A. The vertical plane A-A' is the plane of the vertical cross-sectional view of FIG. 6A.
Figure 6C:
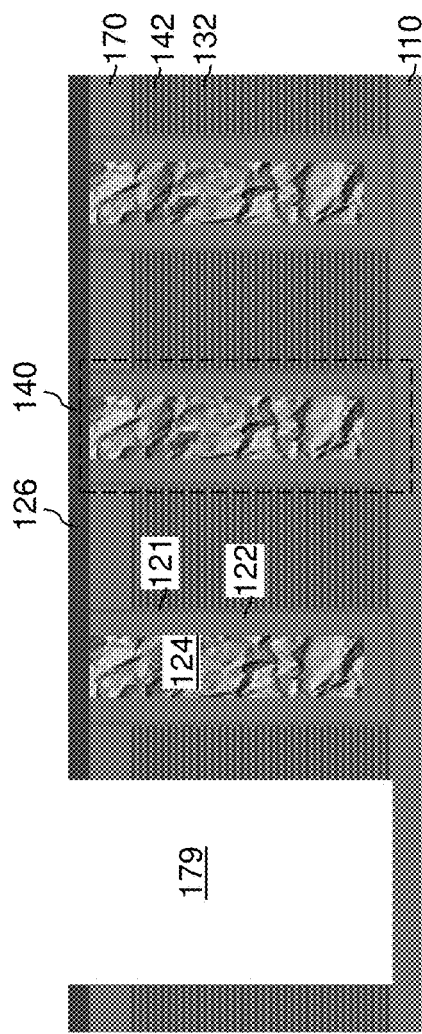
FIG. 6C is a vertical cross-sectional view of the first exemplary structure along the vertical plane C-C' of FIG. 6B.
Figure 6D:
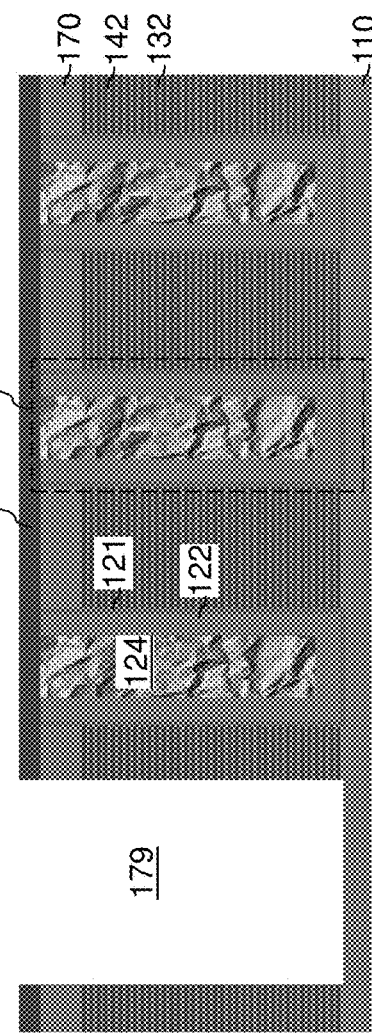
FIG. 6D is a vertical cross-sectional view of the first exemplary structure along the vertical plane D-D' of FIG. 6B.
Figure 7B:
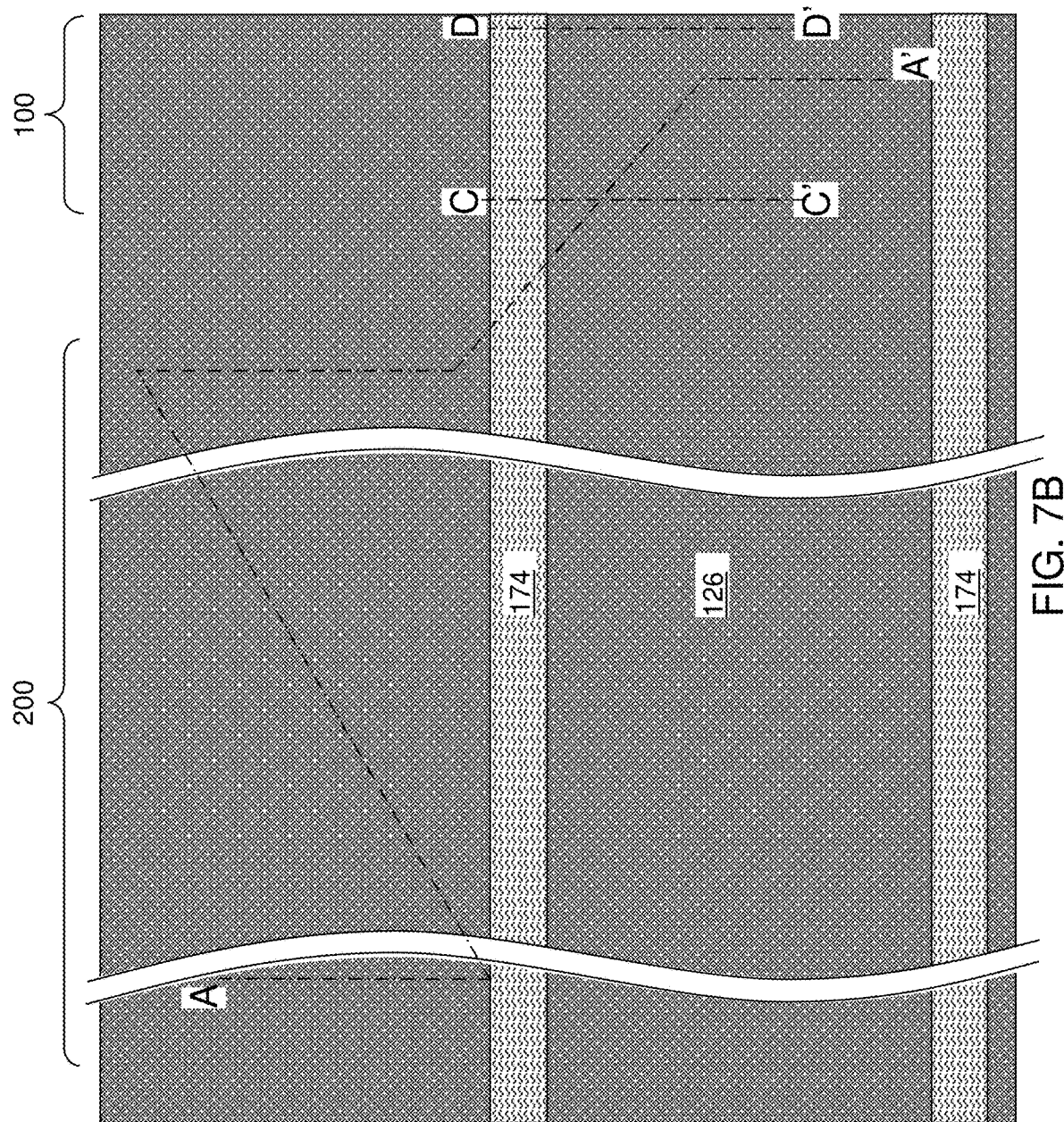
FIG. 7B is a top-down view of the first exemplary structure of FIG. 7A. The vertical plane A-A' is the plane of the vertical cross-sectional view of FIG. 7A.
Figure 7C:
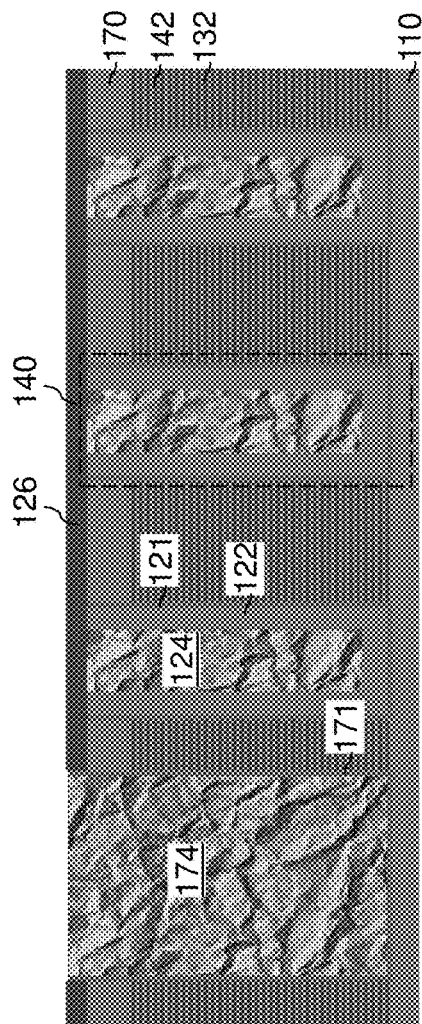
FIG. 7C is a vertical cross-sectional view of the first exemplary structure along the vertical plane C-C' of FIG. 7B.
Figure 7D:
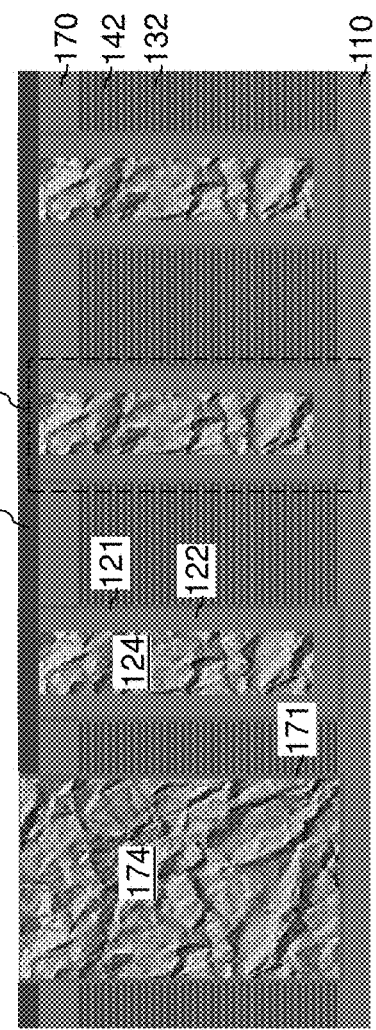
FIG. 7D is a vertical cross-sectional view of the first exemplary structure along the vertical plane D-D' of FIG. 7B.

Referring to FIG. 2, the first continuous insulating cap layer 170L can be patterned such that the first continuous insulating cap layer 170L remains in the memory array region 100, and is removed outside the memory array region 100 (e.g., in the staircase region 200). A trimmable mask layer (not shown) can be applied over the first vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having a straight edge that is perpendicular to a first horizontal direction and is parallel to the second horizontal direction.

First stepped surfaces can be formed by iteratively performing a set of layer patterning processing steps as many times as the total number of first continuous sacrificial material layers 142L within the first vertically alternating sequence less 1. The set of layer patterning processing steps comprises an anisotropic etch process that etches unmasked portions of a pair of a first continuous insulating layer 132L and a first continuous sacrificial material layer 142L, and a mask trimming process in which the trimmable mask layer is isotropically trimmed to provide shifted sidewalls that are shifted toward memory array region 100. A final anisotropic etch process can be performed after the last mask trimming process, and the trimmable mask layer can be removed, for example, by ashing. A first stepped cavity over the first stepped surfaces of the first vertically alternating sequence (132L, 142L).

A first dielectric fill material (such as undoped silicate glass (i.e., silicon oxide) or a doped silicate glass) can be deposited in the first stepped cavity. The first dielectric fill material can be planarized to remove excess portions of the first dielectric fill material from above the horizontal plane including the top surface of the first continuous insulating cap layer 170L. A remaining portion of the first dielectric fill material that fills the first stepped cavity constitutes a first-tier retro-stepped dielectric material portion 165.

Referring to FIGS. 3A-3D, various first-tier openings may be formed through the first continuous insulating cap layer 170 and the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently.

The various first-tier openings may include first-tier memory openings 149 formed in the memory array regions 100, and first-tier support openings 129 formed in the staircase region 200. Each cluster of first-tier memory openings 149 may be formed as a two-dimensional array of first-tier memory openings 149. The first-tier support openings 129 are openings that are formed in the staircase region 200, and are subsequently employed to form support pillar structures. A subset of the first-tier support openings 129 may be formed through a respective horizontal surface of the first stepped surfaces.

In one embodiment, the first-tier memory openings 149 and the first-tier support openings 129 can have a respective circular or elliptical horizontal cross-sectional shape. The lateral dimension (such as a diameter or a major axis) of each of the first-tier memory openings 149 and the first-tier support openings 129 may be in a range from 30 nm to 300 nm, such as from 60 nm to 150 nm, although lesser and greater dimensions may also be employed. In one embodiment, the first-tier memory openings 149 and/or the first-tier support openings 129 may be formed in respective rows that laterally extend along the first horizontal direction (e.g., word line direction) hd1. The rows may be laterally spaced apart from each other along the second horizontal direction (e.g., bit line direction) hd2. In one embodiment, the first-tier memory openings 149 and the first-tier support openings 129 may be formed as clusters of openings that are laterally spaced apart along the second horizontal direction hd2 by strip-shaped areas that are free of the first-tier memory openings 149 and the first-tier support openings 129. In this case, the strip-shaped areas may laterally extend along the first horizontal direction hd1.

Referring to FIGS. 4A-4D, sacrificial first-tier fill materials may be concurrently deposited in each of the first-tier openings (149, 129). For example, an optional sacrificial dielectric liner layer 121L, an optional sacrificial semiconductor liner layer 122L, and a sacrificial fill material layer 124L can be sequentially deposited. The sacrificial fill material layer 124L includes a material that may be subsequently removed selective to the material of the sacrificial semiconductor liner layer 122L. The sacrificial semiconductor liner layer 122L includes a material that may be subsequently removed selected to the material of the sacrificial dielectric liner layer 121L. In an illustrative example, the sacrificial dielectric liner layer 121L may include silicon oxide or silicon nitride, the sacrificial semiconductor liner layer 122L may include silicon or a silicon-germanium alloy in an amorphous or polycrystalline form (e.g., amorphous silicon), and the sacrificial fill material layer 124L may include a carbon-based material such as amorphous carbon or diamond-like carbon (DLC). If the sacrificial fill material layer 124L includes a carbon-based material, then the sacrificial semiconductor liner layer 122L and/or the sacrificial dielectric liner layer 121L may be omitted. In one embodiment, the sacrificial fill material layer 124L may comprise a material that may be subsequently removed by ashing, i.e., volatilization by oxidation. In another embodiment, the sacrificial fill material layer 124L may comprise a semiconductor material, such as amorphous silicon. In this case, the sacrificial dielectric liner layer 121L may be present as an etch stop layer during removal of the sacrificial fill material layer 124L selective to the material of the sacrificial dielectric liner layer 121L in a subsequent processing step. Generally, the presence or absence of, and the material selection for each of the sacrificial dielectric liner layer 121L and the sacrificial semiconductor liner layer 122L may be optimized based on the material composition of the sacrificial fill material layer 124L. The thickness of the sacrificial dielectric liner layer 121L may be in a range from 2 nm to 20 nm, although lesser and greater thicknesses may also be employed. The thickness of the sacrificial semiconductor liner layer 122L may be in a range from 4 nm to 40 nm, although lesser and greater thicknesses may also be employed. The sacrificial fill material layer 124L may fill remaining unfilled volumes of the first-tier memory openings 149 and the first-tier support openings 129.

Referring to FIGS. 5A-5D, a planarization process can be performed to remove portions of the sacrificial dielectric liner layer 121L, the sacrificial semiconductor liner layer 122L, and the sacrificial fill material layer 124L from above a horizontal plane including a top surface of the first continuous insulating cap layer 170L. The planarization process may employ a chemical mechanical polishing (CMP) process and/or at least one recess etch back process. Each remaining portion of the sacrificial dielectric liner layer 121L that remains in a first-tier opening (149, 129) is herein referred to as a sacrificial dielectric liner 121. Each remaining portion of the sacrificial semiconductor liner layer 122L that remains in a first-tier opening (149, 129) is herein referred to as a sacrificial semiconductor liner 122. Each remaining portion of the sacrificial fill material layer 124L that remains in a first-tier opening (149, 129) is herein referred to as a sacrificial fill material portion 124. Each combination of an optional sacrificial dielectric liner 121, an optional sacrificial semiconductor liner 122, and a sacrificial fill material portion 124 that fills a first-tier memory opening 149 constitutes a sacrificial first-tier memory opening fill structure 140. Each combination of an optional sacrificial dielectric liner 121, an optional sacrificial semiconductor liner 122, and a sacrificial fill material portion 124 that fills a first-tier support openings 129 constitutes a sacrificial first-tier support opening fill structure 120.

A sacrificial stopping material layer (e.g., sacrificial etch stop layer) 126 can be formed on the top surfaces of the first continuous insulating cap layer 170L, the sacrificial first-tier memory opening fill structures 140, and the sacrificial first-tier support opening fill structures 120. The sacrificial stopping material layer 126 comprises a material that may be employed as an etch stop material during a subsequent planarization (e.g., etch back) process. Further, the sacrificial stopping material layer 126 may comprise a material that may be subsequently removed selective to the material of the first continuous insulating cap layer 170L. In one embodiment, the sacrificial stopping material layer 126 may comprise silicon nitride. The thickness of the sacrificial stopping material layer 126 may be in a range from 20 nm to 100 nm, although lesser and greater thicknesses may also be employed.

Referring to FIGS. 6A-6D, a photoresist layer (not shown) can be applied over the sacrificial stopping material layer 126, and can be lithographically patterned to form elongated openings that laterally extend along the first horizontal direction hd1. The elongated openings may have a respective uniform width along the second horizontal direction hd2. In one embodiment, the elongated openings in the photoresist layer may overlie a respective strip-shaped areas that is free of the first-tier memory openings 149 and the first-tier support openings 129.

An anisotropic etch process may be performed to etch portions of the first continuous insulating cap layer 170L and the first vertically alternating sequence (132L, 142L). First-tier backside trenches 179 are formed in volumes from which materials of the first continuous insulating cap layer 170L and the first vertically alternating sequence (132L, 142L) are removed. A bottom surface of the semiconductor material layer 110 can be physically exposed underneath each of the first-tier backside trenches 179. The patterned photoresist layer can be subsequently removed, for example, by ashing.

The sacrificial stopping material layer 126 can be divided into a plurality of portions located between a respective neighboring pair of first-tier backside trenches 179. The first continuous insulating cap layer 170L can be divided into a plurality of first insulating cap layers 170 by the first-tier backside trenches 179. The first vertically alternating sequence (132L, 142L) can be divided into a plurality of first-tier alternating stacks (132, 142) of first insulating layers 132 and first sacrificial material layers 142. Each first insulating layer 132 is a patterned portion of a respective first continuous insulating layer 132L. Each first sacrificial material layer 142 is a patterned portion of a respective first continuous sacrificial material layer 142L. In one embodiment, each of the first-tier backside trenches 179 may have a respective pair of lengthwise sidewalls that laterally extend along the first horizontal direction hd1. In one embodiment. Each of the first-tier backside trenches may have a uniform width along the second horizontal direction hd2. Each contiguous combination of a first-tier alternating stack (132, 142) and a first insulating cap layer 170 constitutes a first-tier layer stack (132, 142, 170).

Generally, the first-tier backside trenches 179 can be formed through the first continuous insulating cap layer 170L and the first vertically alternating sequence (132L, 142L). The first-tier layer stacks (132, 142, 170) comprise patterned portions of the first continuous insulating cap layer 170L and the first vertically alternating sequence (132L, 142L). The first-tier layer stacks (132, 142, 170) can be formed over the semiconductor material layer 110. The first-tier layer stacks (132, 142, 170) laterally extend along the first horizontal direction hd1 and are laterally spaced apart from each other along the second horizontal direction hd2 by the first-tier backside trenches 179. Each of the first-tier layer stacks (132, 142, 170) comprises a first-tier alternating stack (132, 142) of first insulating layers 132 and first sacrificial material layers 142, and comprises a first insulating cap layer 170 overlying the first-tier alternating stack (132, 142). Each of the first-tier backside trenches 179 has a respective pair of lengthwise sidewalls that are perpendicular to the second horizontal direction hd2.

Referring to FIGS. 7A-7D, an optional sacrificial trench liner material and a sacrificial trench fill material can be deposited in the first-tier backside trenches 179. The sacrificial trench line material, if employed, may comprise silicon oxide having a thickness in a range from 1 nm to 6 nm. The sacrificial trench fill material may comprise, and/or may consist essentially of, amorphous carbon, diamond-like carbon, a silicon-germanium alloy, borosilicate glass, or organ silicate glass. In one embodiment, the sacrificial trench fill material may comprise, and/or may consist essentially of, amorphous carbon or diamond-like carbon. Portions of the optional sacrificial trench liner material and the sacrificial trench fill material that overlie the horizontal plane including the top surface of the sacrificial stopping material layer 126 can be removed by performing a planarization process. The planarization process may employ a chemical mechanical polishing process and/or at least one recess etch process. Each remaining portion of the sacrificial trench liner material that remains in a first-tier backside trench 179 constitutes a sacrificial trench liner 171. Each remaining portion of the sacrificial trench fill material that remains in a first-tier backside trench 179 constitutes a sacrificial trench fill structure 174.

Referring to FIGS. 8A-8D, the sacrificial trench fill structure 174 can be vertically recessed by performing a recess etch process. The duration of the recess etch process can be selected such that top surfaces of the sacrificial trench fill structures 174 are formed below the horizontal plane including the top surfaces of the first insulating cap layers 170. Physically exposed portions of the sacrificial trench liners 171 can be subsequently removed so that sidewall segments of the first insulating cap layers 170 are physically exposed. A line-shaped recess can be formed above each recessed top surface of the sacrificial trench fill structures 174.

A bridge material for subsequently forming bridge structures can be deposited in the line-shaped recesses that overlie the sacrificial trench fill structures 174. In one embodiment, the bridge material comprises a material providing high etch resistance to wet etch chemicals to be subsequently employed to remove cylindrical bottom portions of the memory films and the first sacrificial material layers 142. For example, in case the first sacrificial material layers 142 comprise silicon nitride, the bridge material may comprise a material providing high etch resistance to hot phosphoric acid that can be subsequently employed to remove silicon nitride in a wet etch process. In case the memory films 50 comprise silicon oxide layers, the bridge material may comprise a material providing high etch resistance to dilute hydrofluoric acid that can be subsequently employed to remove silicon oxide in the memory films 50. In one embodiment, the bridge material comprises a material having a higher Young's modulus than the materials of the first insulating layers 132 and the first insulating cap layers 170. For example, the bridge material may comprise, and/or may consist essentially of, a semiconductor material or a conductive material (such as a metal or metal alloy). In one embodiment, the bridge material comprises amorphous silicon or polysilicon. The bridge material may be doped to change etch resistance to an etch chemistry to be subsequently employed. For example, in case the sacrificial fill material layer 124L comprises amorphous silicon, the bridge material may comprise boron-doped amorphous silicon that provides high etch resistance in a wet etch process employing trimethyl-2 hydroxyethyl ammonium hydroxide (TMY) or tetramethylammonium hydroxide TMAH) which etch undoped amorphous silicon at a high etch rate. In one embodiment, the bridge material may be deposited to fill the entire volumes of the line-shaped recesses, and may be vertically recessed selective to the sacrificial stopping material layer 126 such that top surfaces of remaining portions of the bridge material are formed at, or about, the horizontal plane including the top surfaces of the first insulating cap layers 170. The recessing may be performed by CMP and/or etch back. Each portion of the bridge material that is formed in on upper region of a respective first-tier backside trench 179 is herein referred to as a bridge material matrix 176. The sacrificial stopping material layer 126 may be removed during the recessing process or during a separate selective etching step after forming the bridge matrix 176.

While the embodiment in which the vertical recess distance is the same over the entirety of the sacrificial trench fill structures 174 is described above, alternative embodiments are expressly contemplated herein in which an etch mask layer and an additional etch process are employed to increase the vertical recess distance for the sacrificial trench fill structures 174 in the staircase region 200 without increasing the vertical recess distance in the memory array region 100. In this case, each bridge material matrix 176 may be formed with a thinner portion having a first thickness located in the memory array region 100 and a thicker portion having a second thickness located in the staircase region 200. The second thickness is greater than the first thickness by 10% to 500%. Thus, each bridge material matrix 176 may have a first thickness which is similar to the thickness of layer 170 in the memory array region 100 and a greater second thickness in the staircase region 200. In another alternative embodiment, the bridge material matrix 176 is formed only in the staircase region 200 and is omitted in the memory array region 100.

A fill material stack (171, 174, 176) comprising an optional sacrificial trench liner 171, a sacrificial trench fill structure 174, and a bridge material matrix 176 can be formed in each of the first-tier backside trenches 179. In one embodiment, a touch-up chemical mechanical polishing process may be performed so that top surfaces of the fill material stacks (171, 174, 176) are formed within the horizontal plane including the top surfaces of the first insulating cap layers 170. In one embodiment, each of the bridge material matrices 176 may have a respective pair of bottom edges that are adjoined to a sidewall of a respective one of the first insulating cap layers 170.

Generally, the bridge material matrices 176 can be formed by depositing a bridge material over the sacrificial trench fill structures 174 and by removing portions of the bridge material from above a horizontal plane including top surfaces of the first insulating cap layers 170. In one embodiment, top surfaces of the bridge material matrices 176 are formed within the horizontal plane including the top surfaces of the first insulating cap layers 170. In one embodiment, the bridge material matrices 176 comprise and/or consist essentially of a semiconductor material or a conductive material. For example, the bridge material matrices 176 comprise amorphous silicon or polysilicon.

Figure 8B:
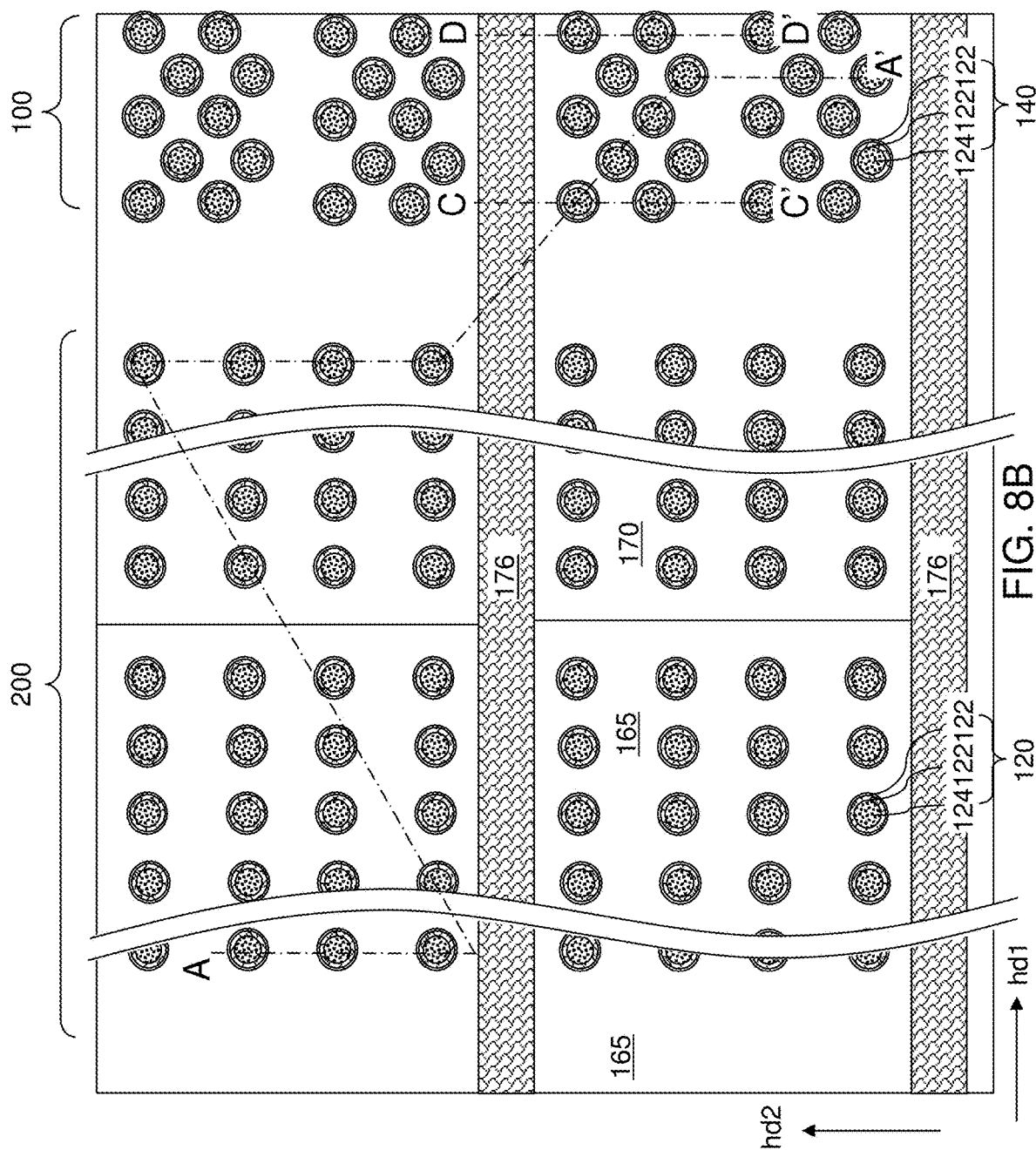
FIG. 8B is a top-down view of the first exemplary structure of FIG. 8A. The vertical plane A-A' is the plane of the vertical cross-sectional view of FIG. 8A.
Figure 8C:
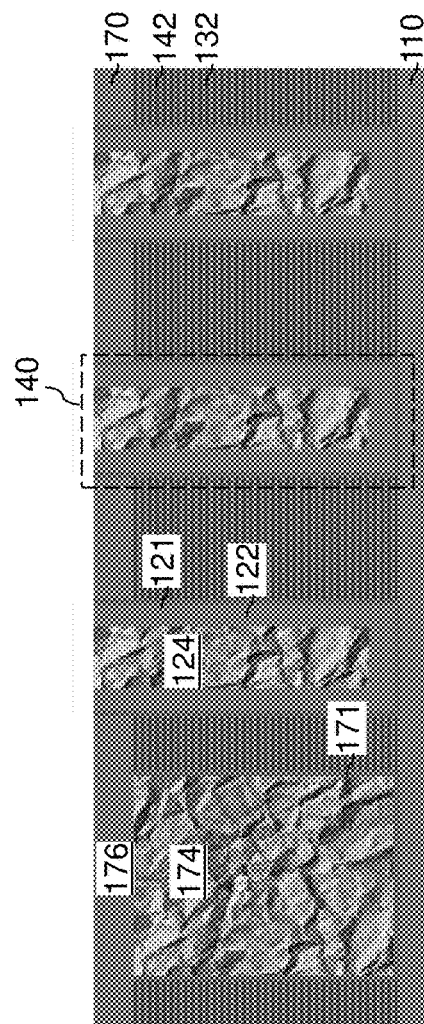
FIG. 8C is a vertical cross-sectional view of the first exemplary structure along the vertical plane C-C' of FIG. 8B.
Figure 8D:
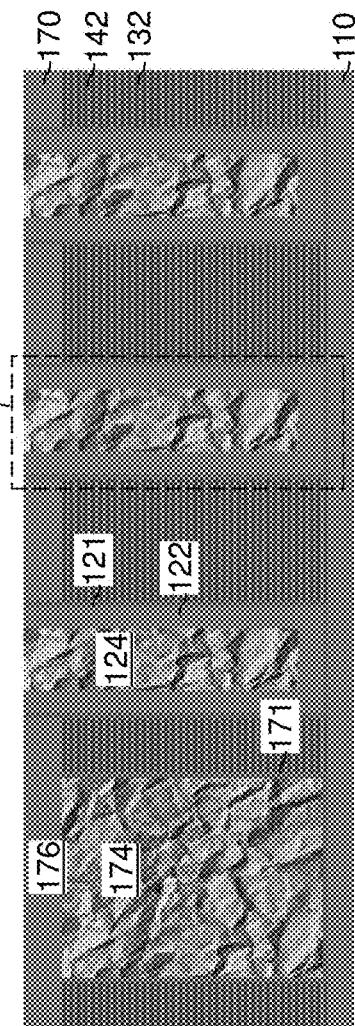
FIG. 8D is a vertical cross-sectional view of the first exemplary structure along the vertical plane D-D' of FIG. 8B.
Figure 9A:
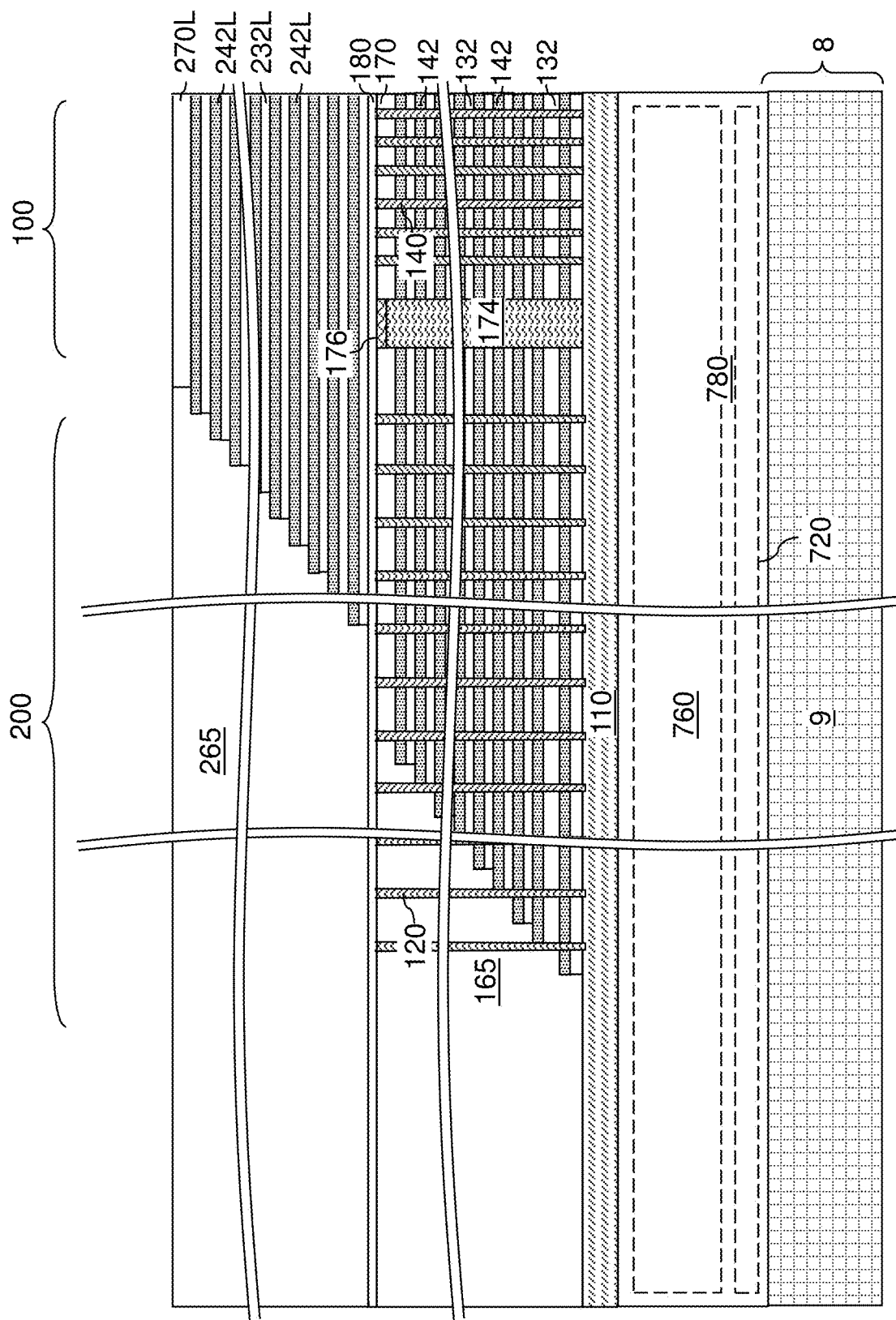
FIG. 9A is a vertical cross-sectional view of the first exemplary structure after formation of a second vertically alternating sequence of second continuous insulating layers and second continuous sacrificial material layers, second stepped surfaces, and a second-tier retro-stepped dielectric material portion according to the first embodiment of the present disclosure.
Figure 9B:
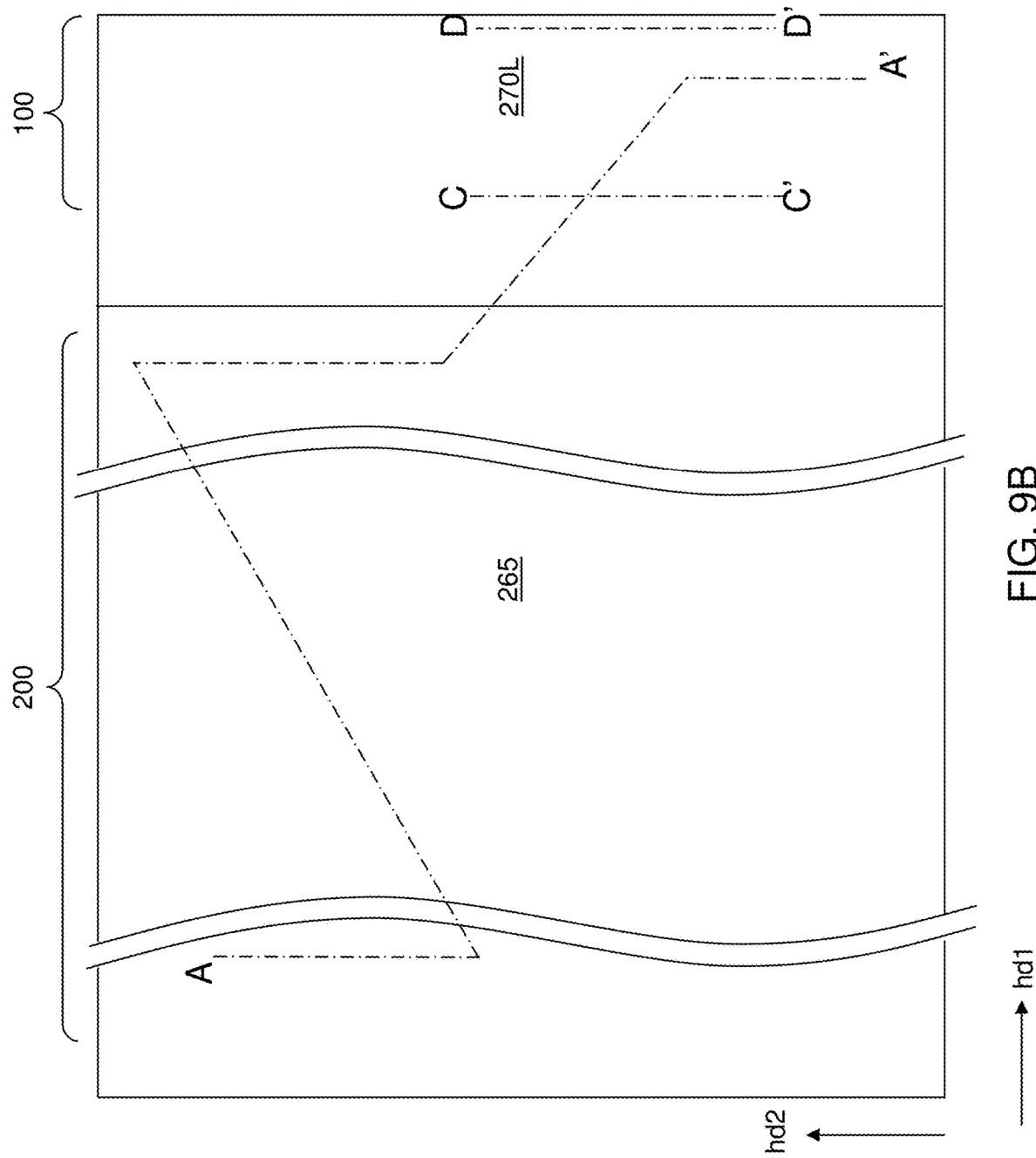
FIG. 9B is a top-down view of the first exemplary structure of FIG. 9A. The vertical plane A-A' is the plane of the vertical cross-sectional view of FIG. 9A.
Figure 9C:
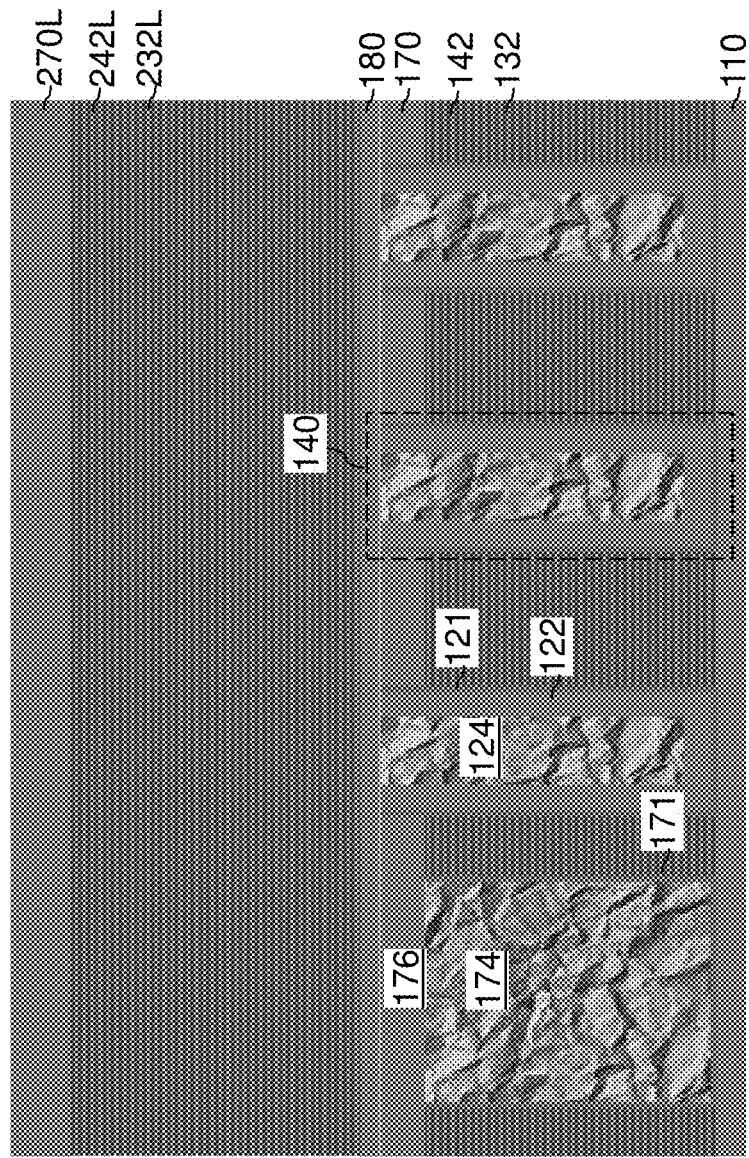
FIG. 9C is a vertical cross-sectional view of the first exemplary structure along the vertical plane C-C' of FIG. 9B.
Figure 9D:
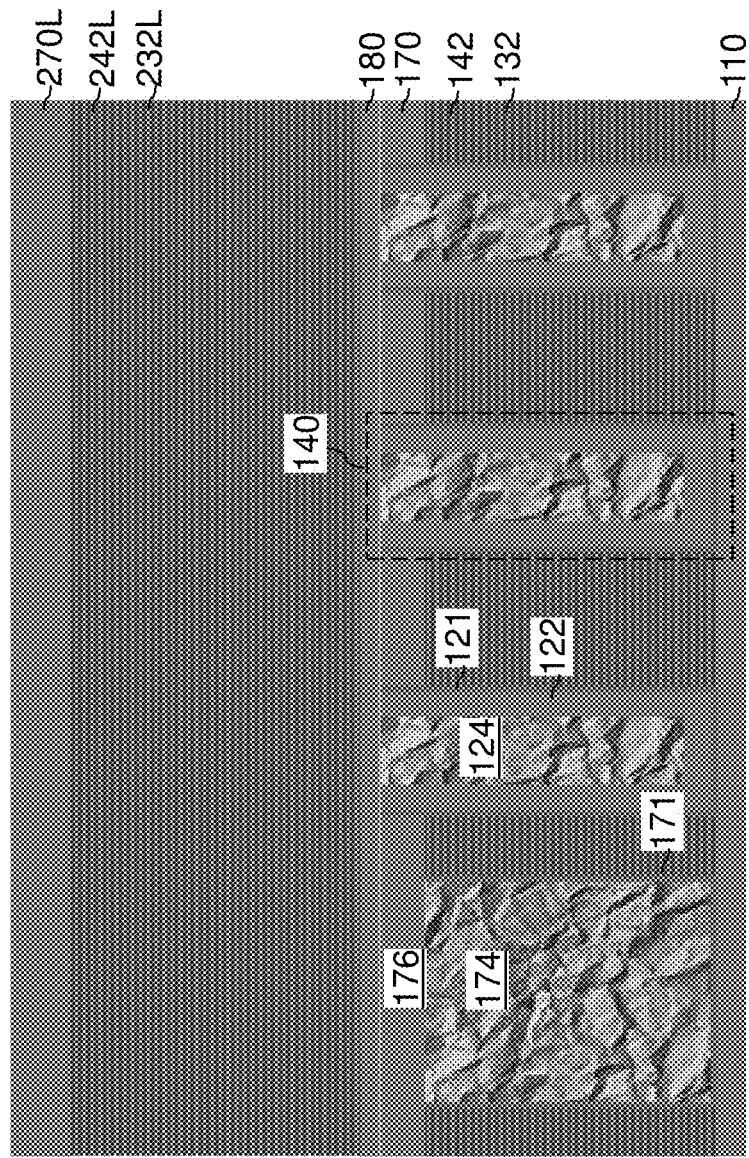
FIG. 9D is a vertical cross-sectional view of the first exemplary structure along the vertical plane D-D' of FIG. 9B.
Figure 10A:
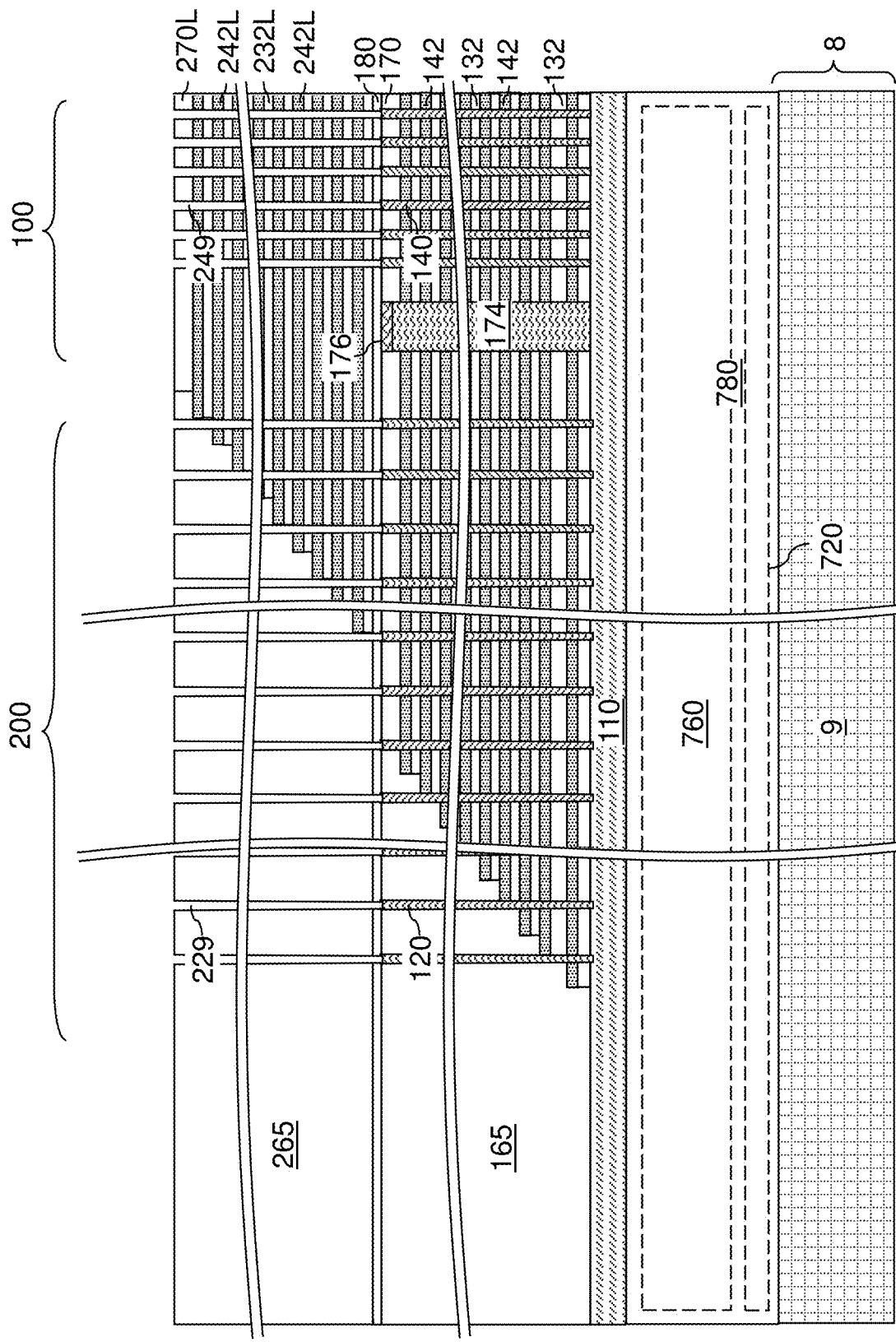
FIG. 10A is a vertical cross-sectional view of the first exemplary structure after formation of second-tier openings according to the first embodiment of the present disclosure.
Figure 10B:
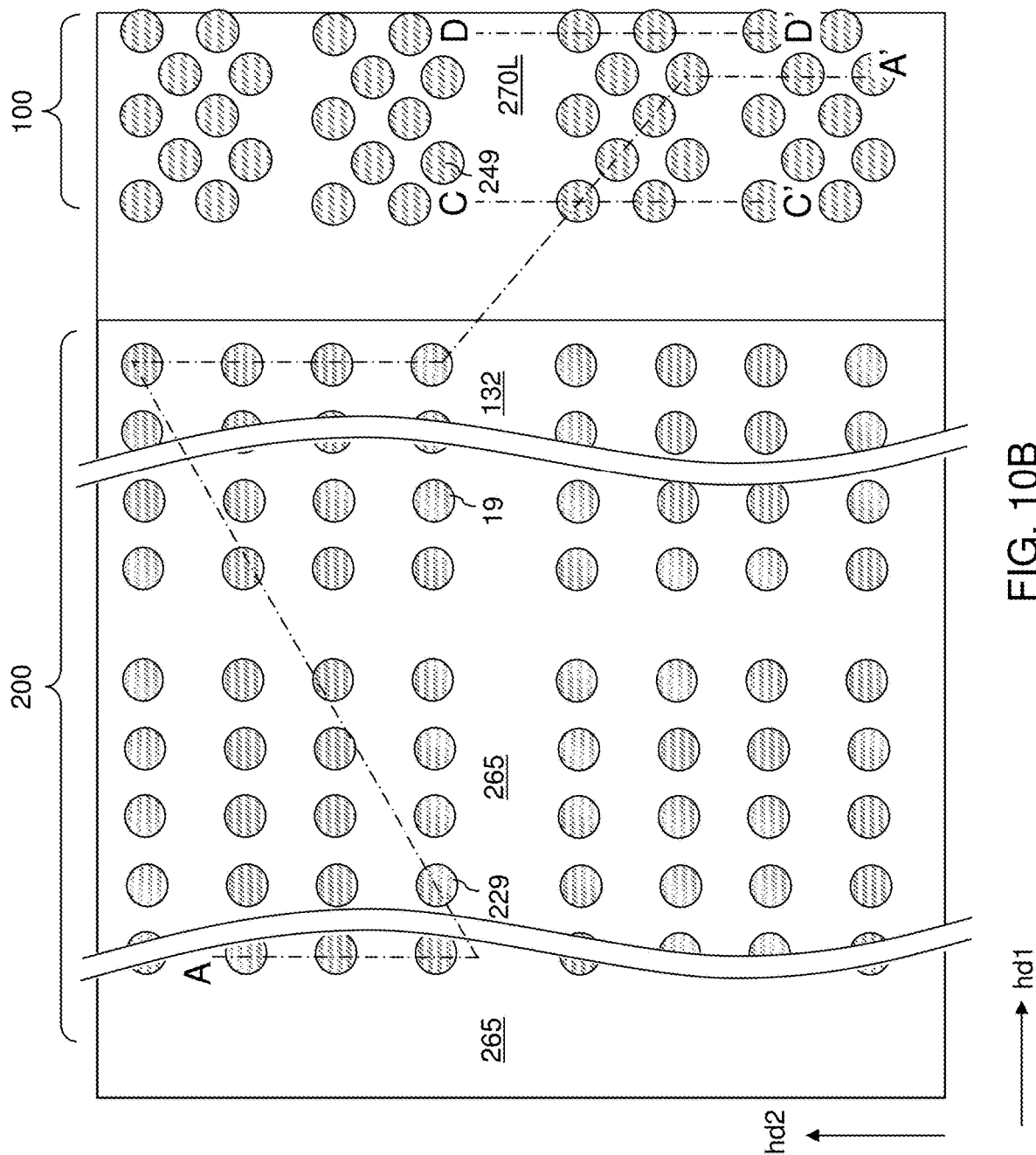
FIG. 10B is a top-down view of the first exemplary structure of FIG. 10A. The vertical plane A-A' is the plane of the vertical cross-sectional view of FIG. 10A.
Figure 10C:
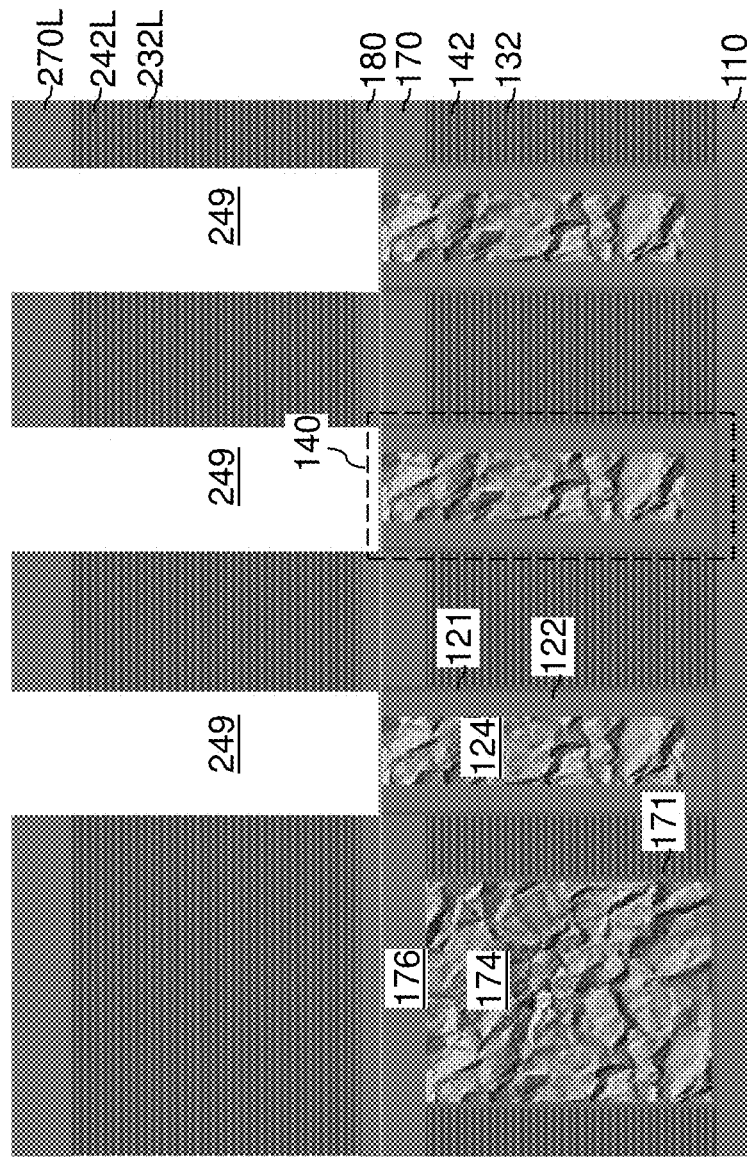
FIG. 10C is a vertical cross-sectional view of the first exemplary structure along the vertical plane C-C' of FIG. 10B.
Figure 10D:
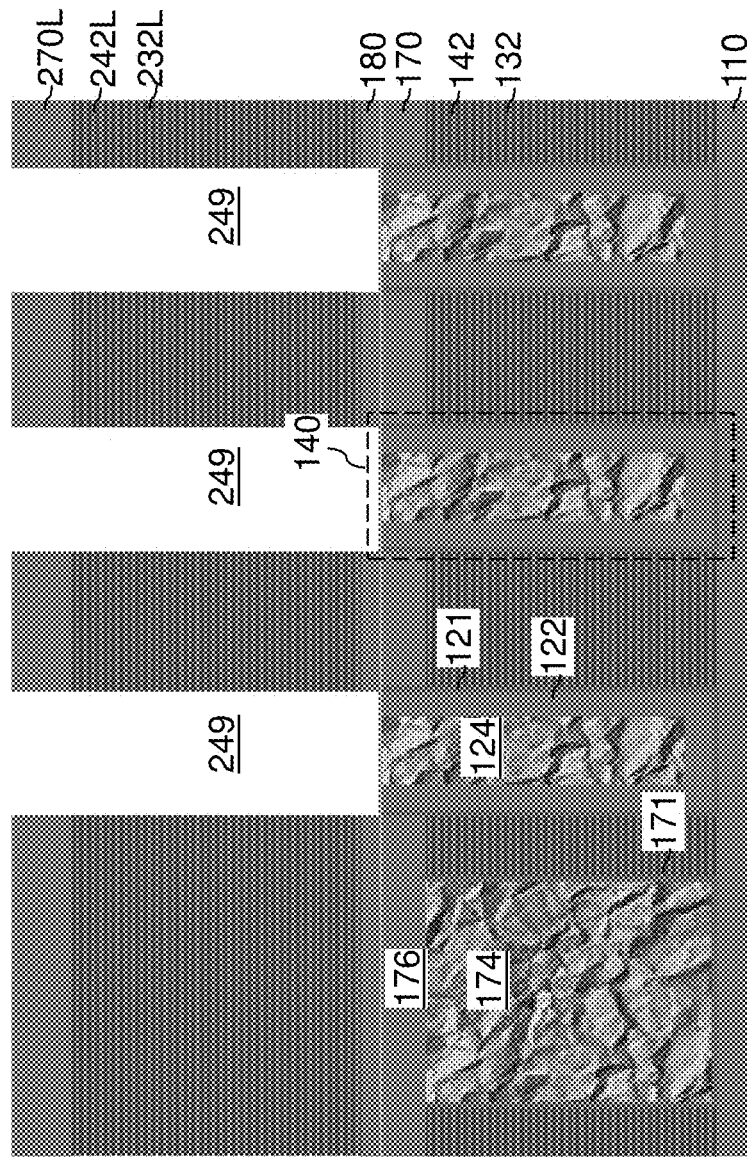
FIG. 10D is a vertical cross-sectional view of the first exemplary structure along the vertical plane D-D' of FIG. 10B.
Figure 11A:
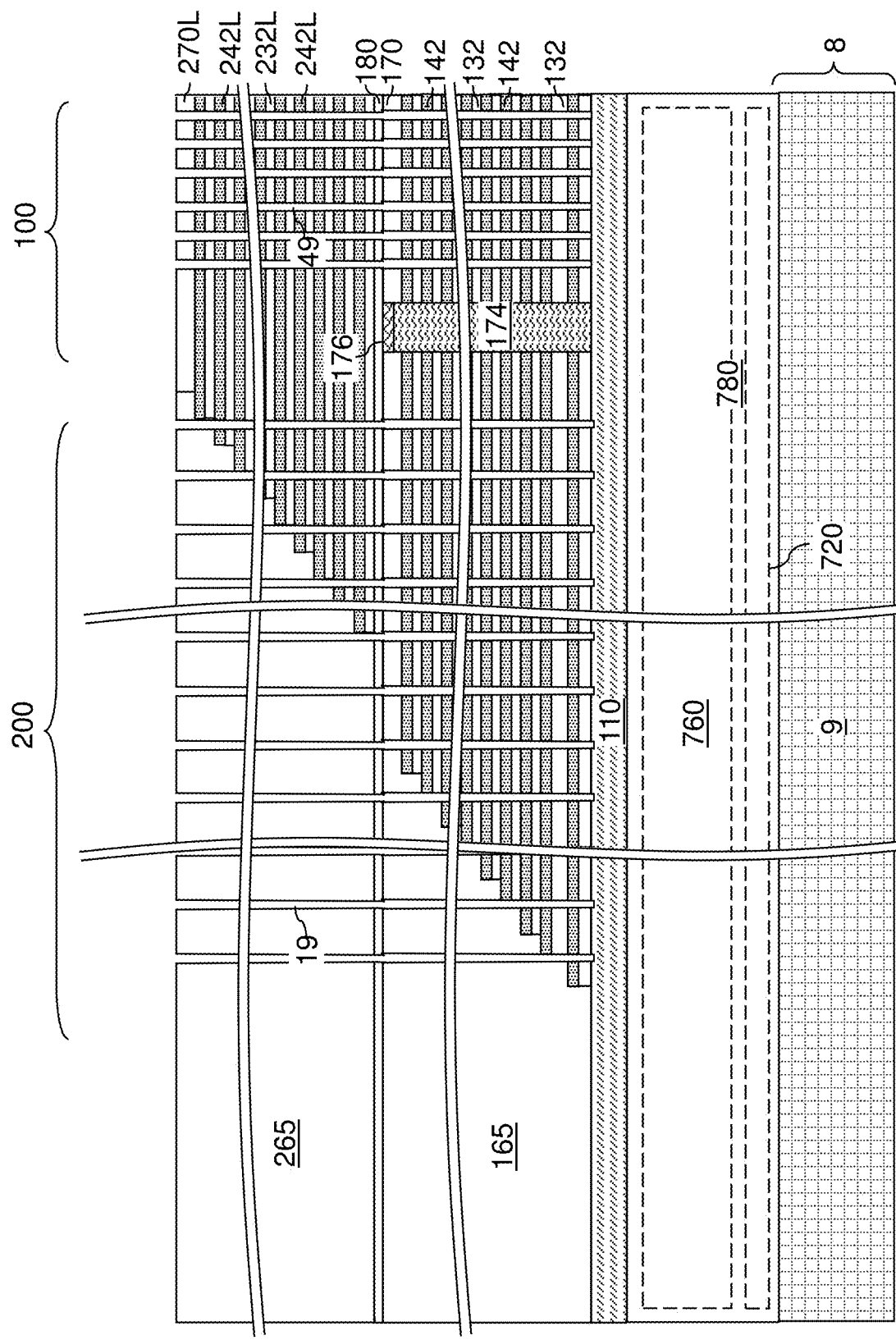
FIG. 11A is a vertical cross-sectional view of the first exemplary structure after formation of inter-tier memory openings and inter-tier support openings according to the first embodiment of the present disclosure.
Figure 11B:
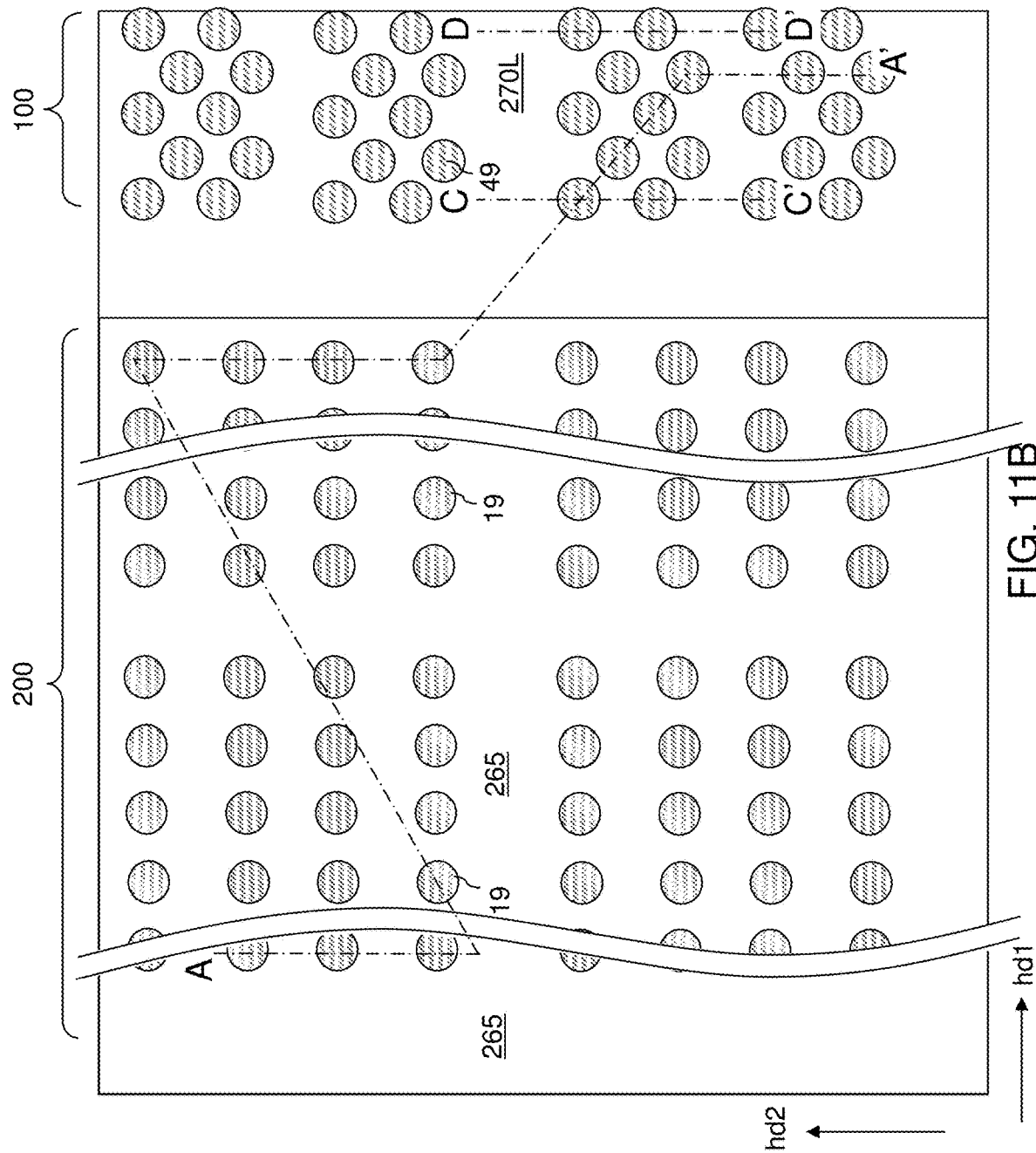
FIG. 11B is a top-down view of the first exemplary structure of FIG. 11A. The vertical plane A-A' is the plane of the vertical cross-sectional view of FIG. 11A.
Figure 11C:
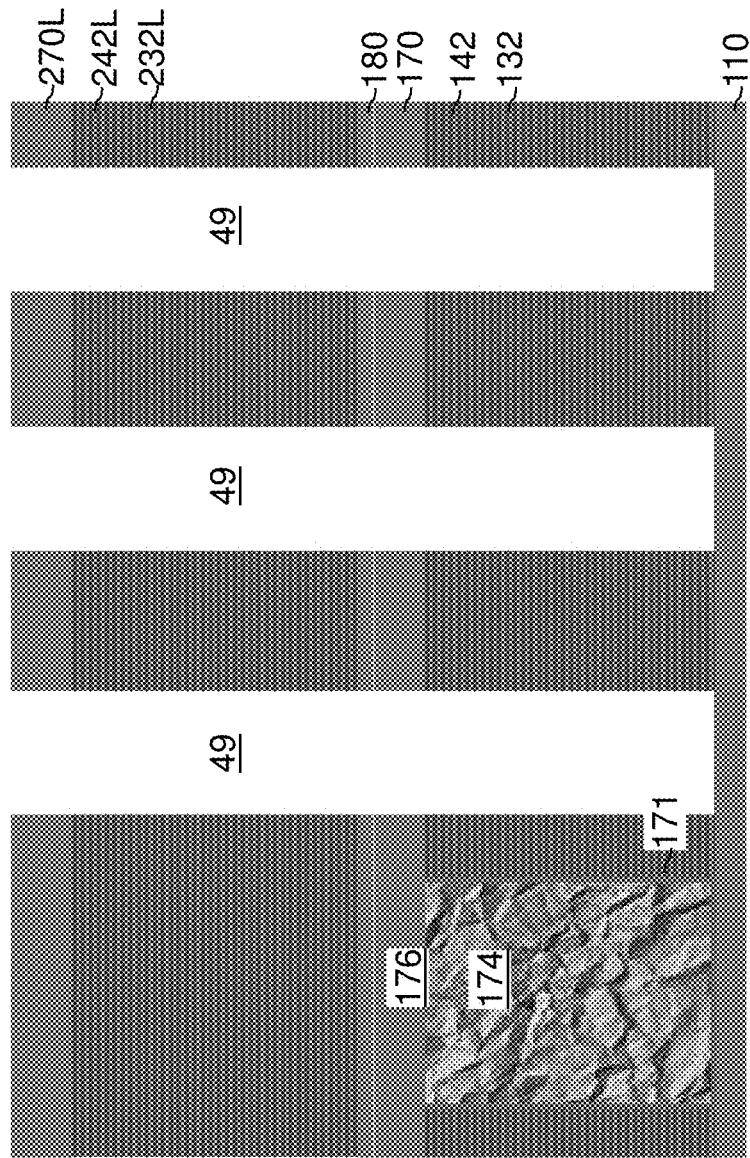
FIG. 11C is a vertical cross-sectional view of the first exemplary structure along the vertical plane C-C' of FIG. 11B.
Figure 11D:
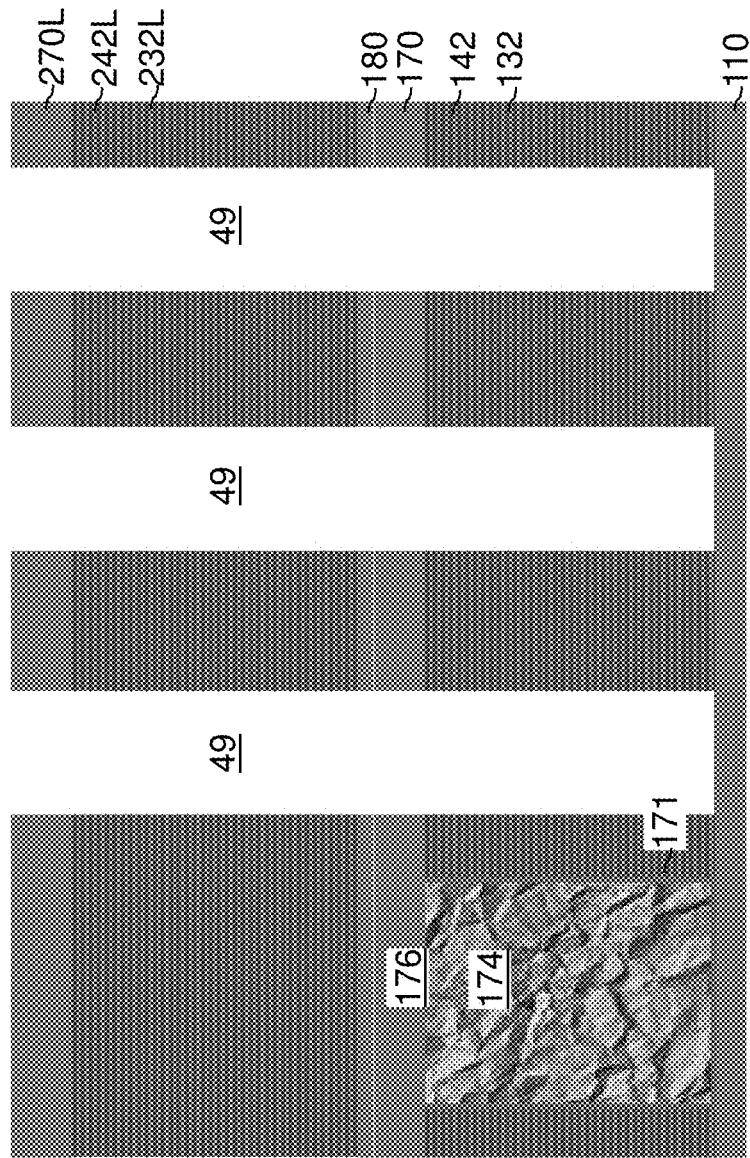
FIG. 11D is a vertical cross-sectional view of the first exemplary structure along the vertical plane D-D' of FIG. 11B.
Figure 13A:
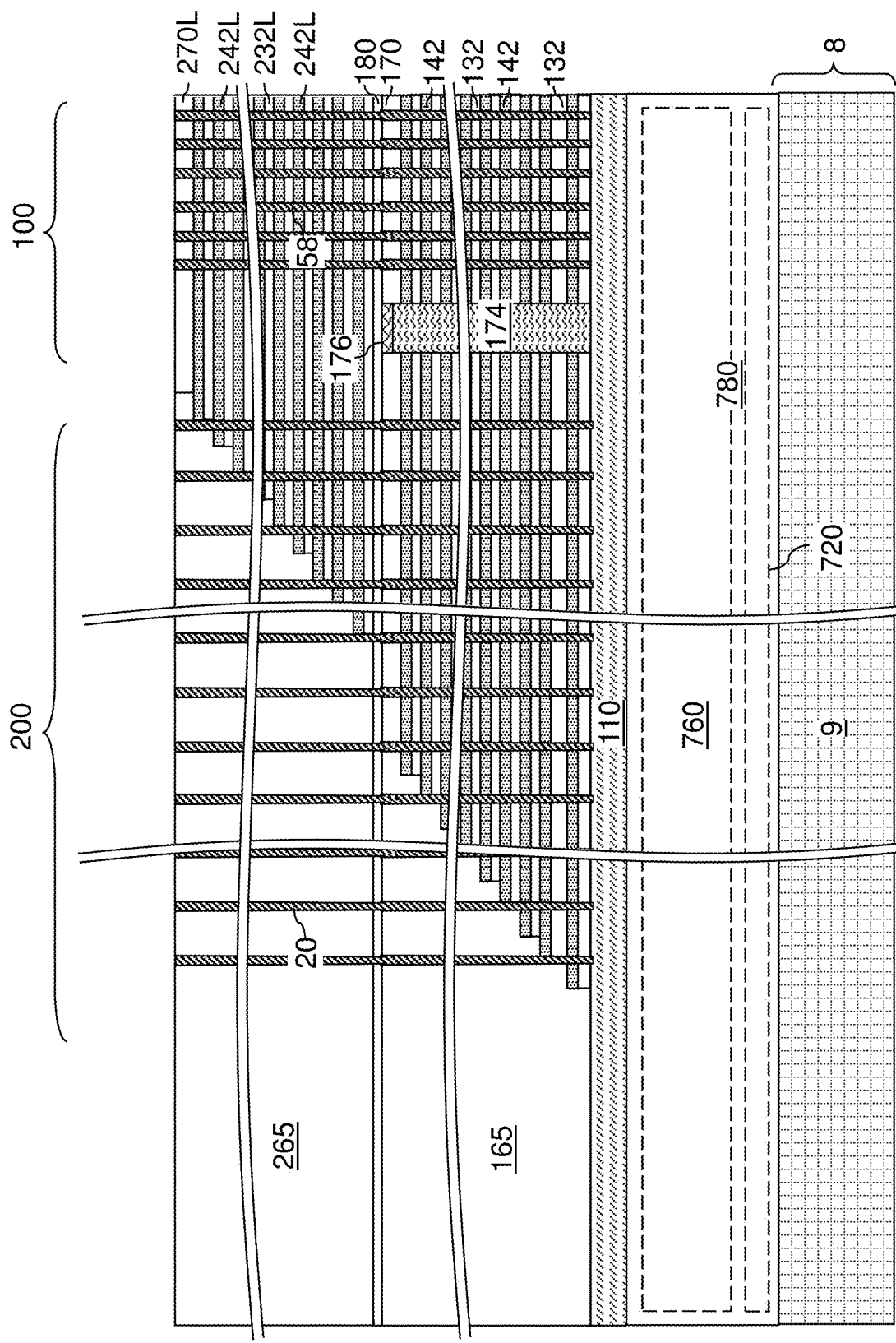
FIG. 13A is a vertical cross-sectional view of the first exemplary structure after formation of memory opening fill structures and support pillar structures according to the first embodiment of the present disclosure.
Figure 13B:
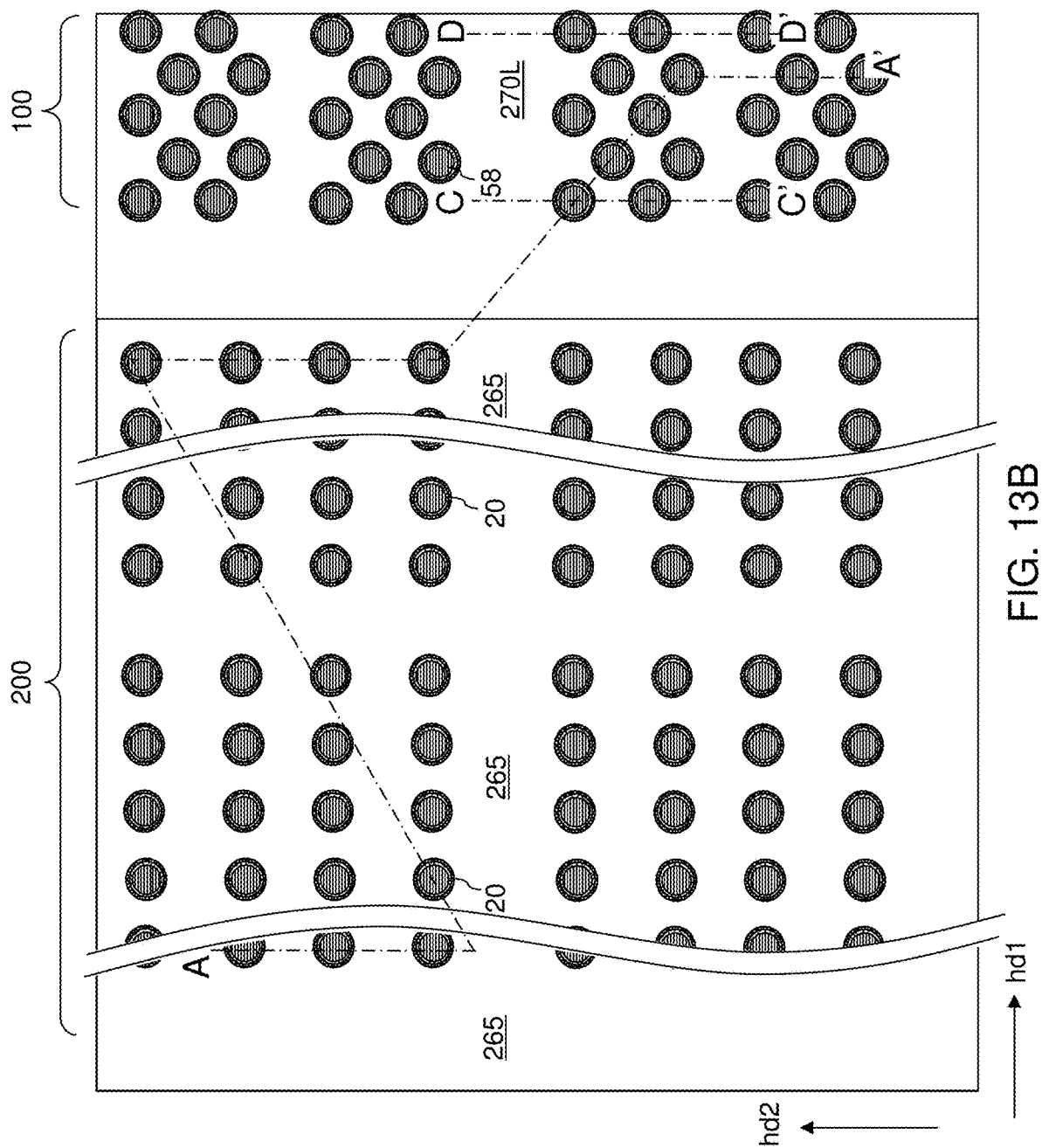
FIG. 13B is a top-down view of the first exemplary structure of FIG. 13A. The vertical plane A-A' is the plane of the vertical cross-sectional view of FIG. 13A.
Figure 13C:
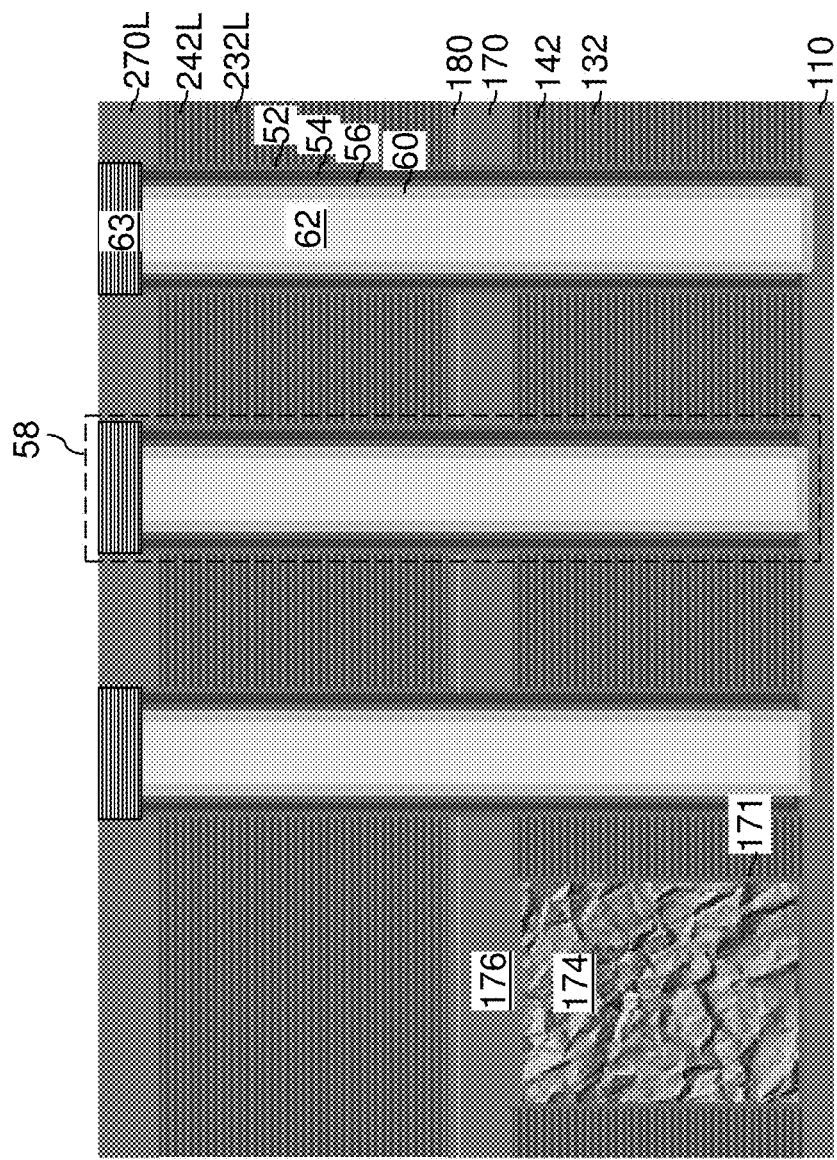
FIG. 13C is a vertical cross-sectional view of the first exemplary structure along the vertical plane C-C' of FIG. 13B.
Figure 13D:
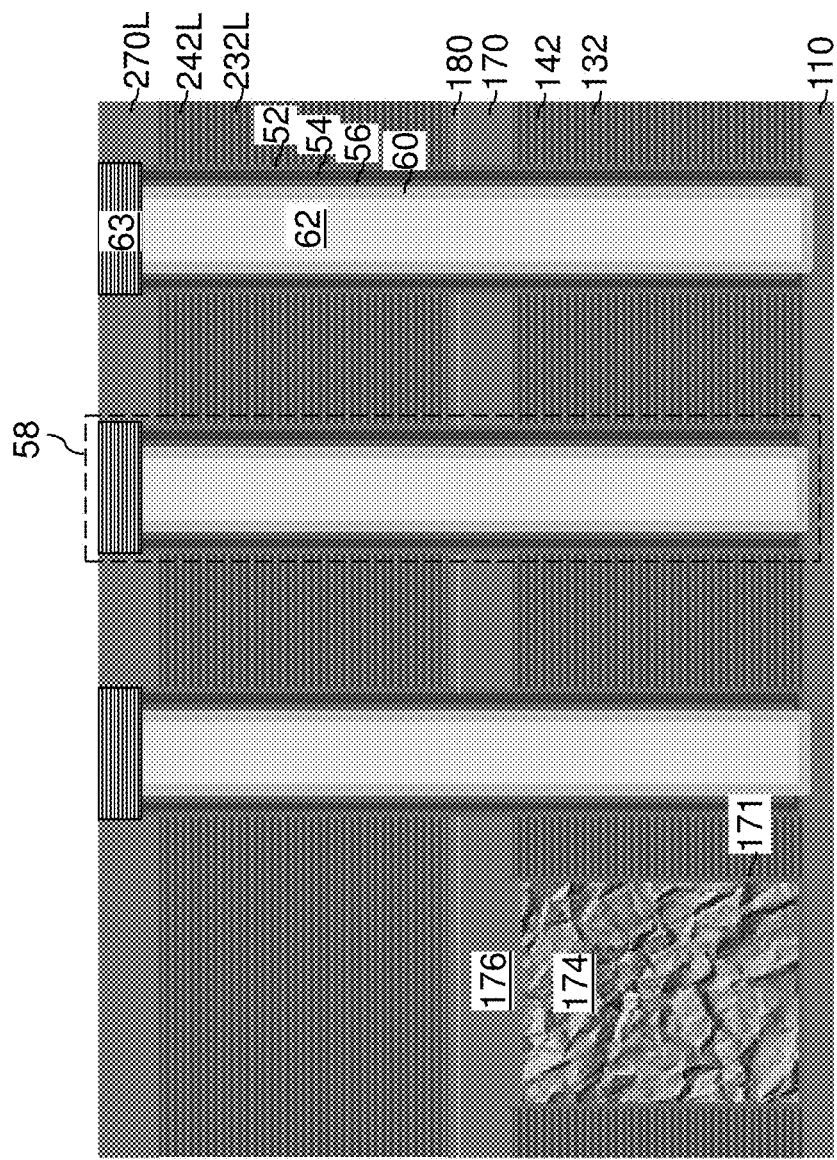
FIG. 13D is a vertical cross-sectional view of the first exemplary structure along the vertical plane D-D' of FIG. 13B.
Figure 14A:
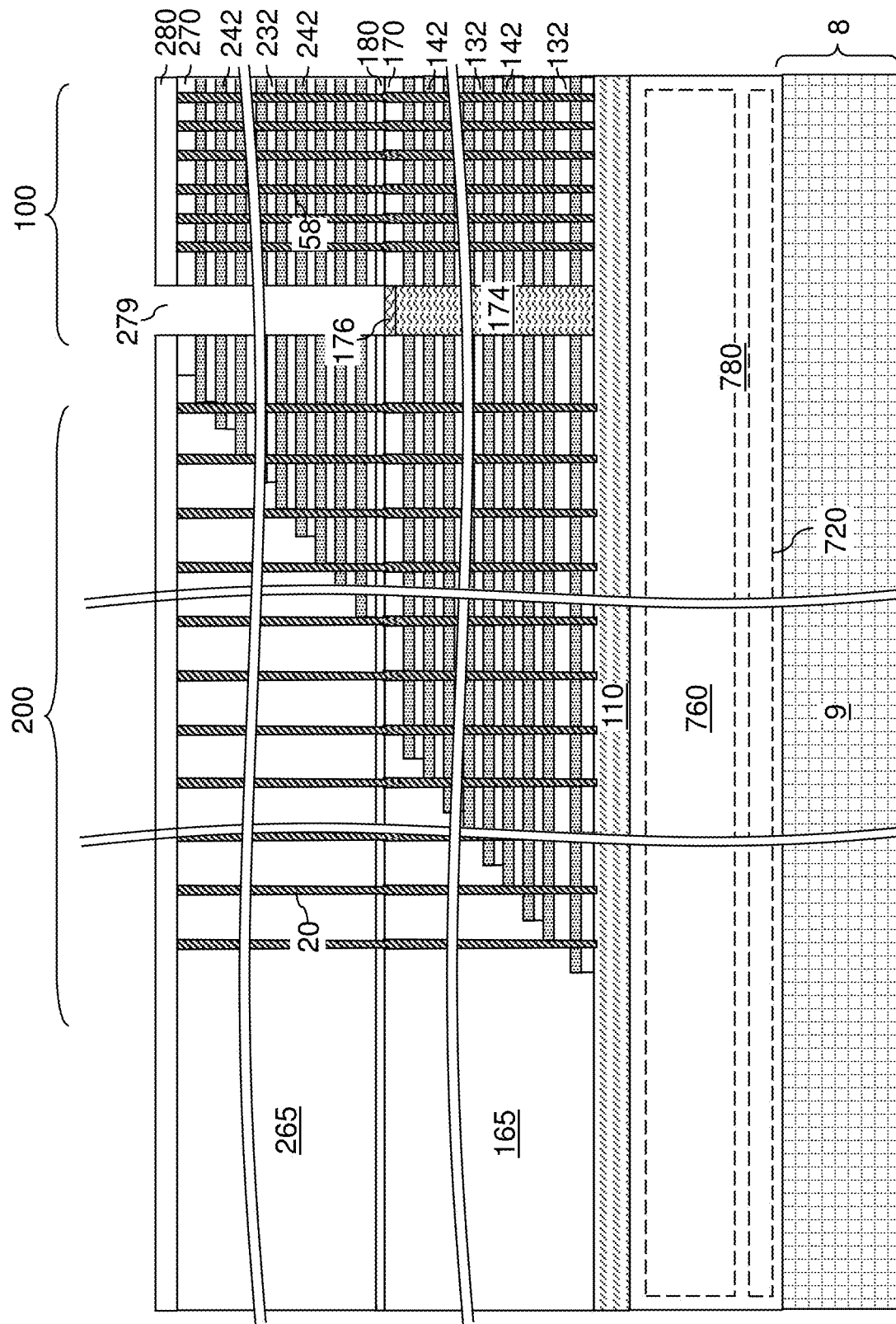
FIG. 14A is a vertical cross-sectional view of the first exemplary structure after formation of second-tier backside trenches according to the first embodiment of the present disclosure.
Figure 14B:
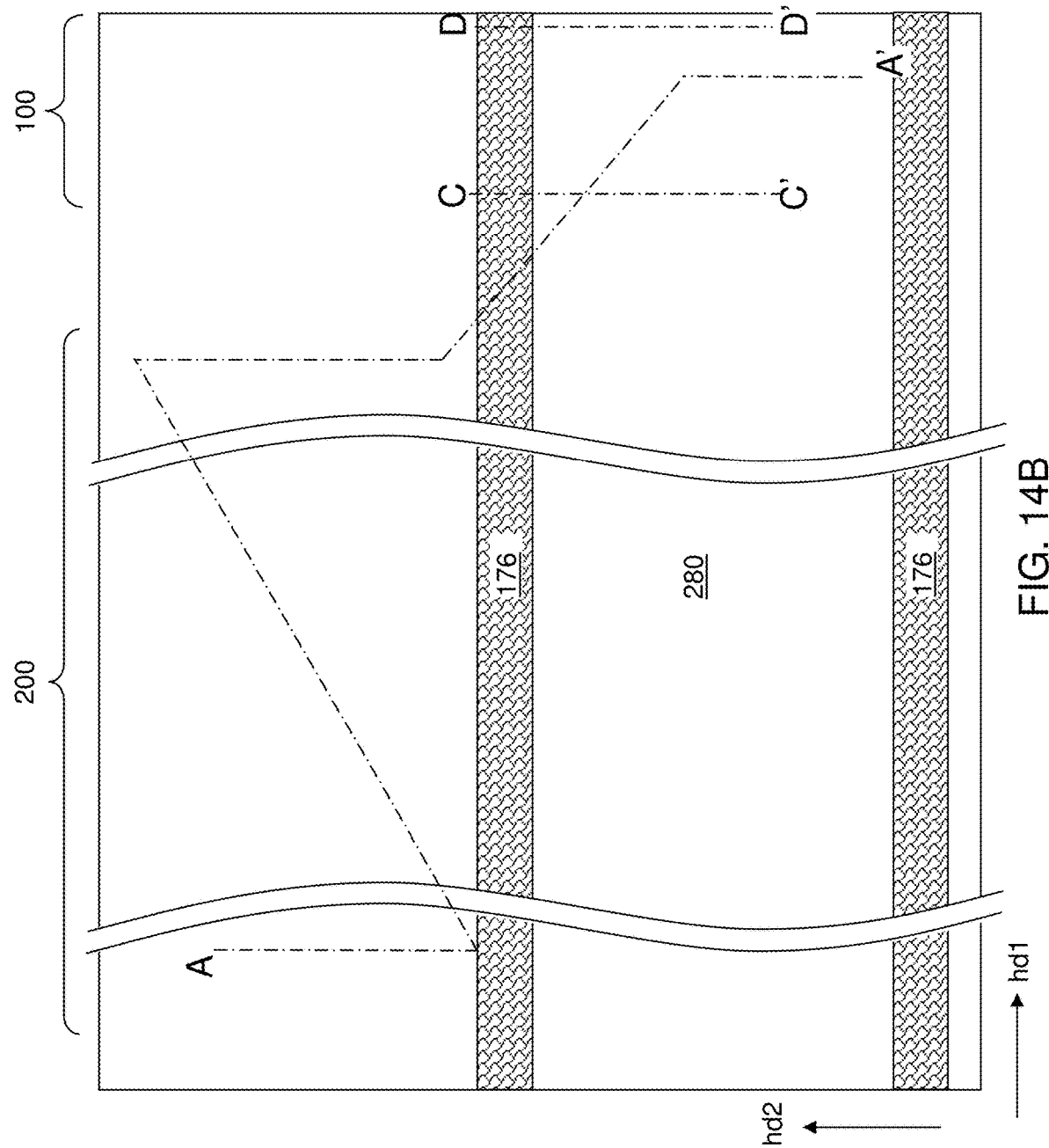
FIG. 14B is a top-down view of the first exemplary structure of FIG. 14A. The vertical plane A-A' is the plane of the vertical cross-sectional view of FIG. 14A.
Figure 14C:
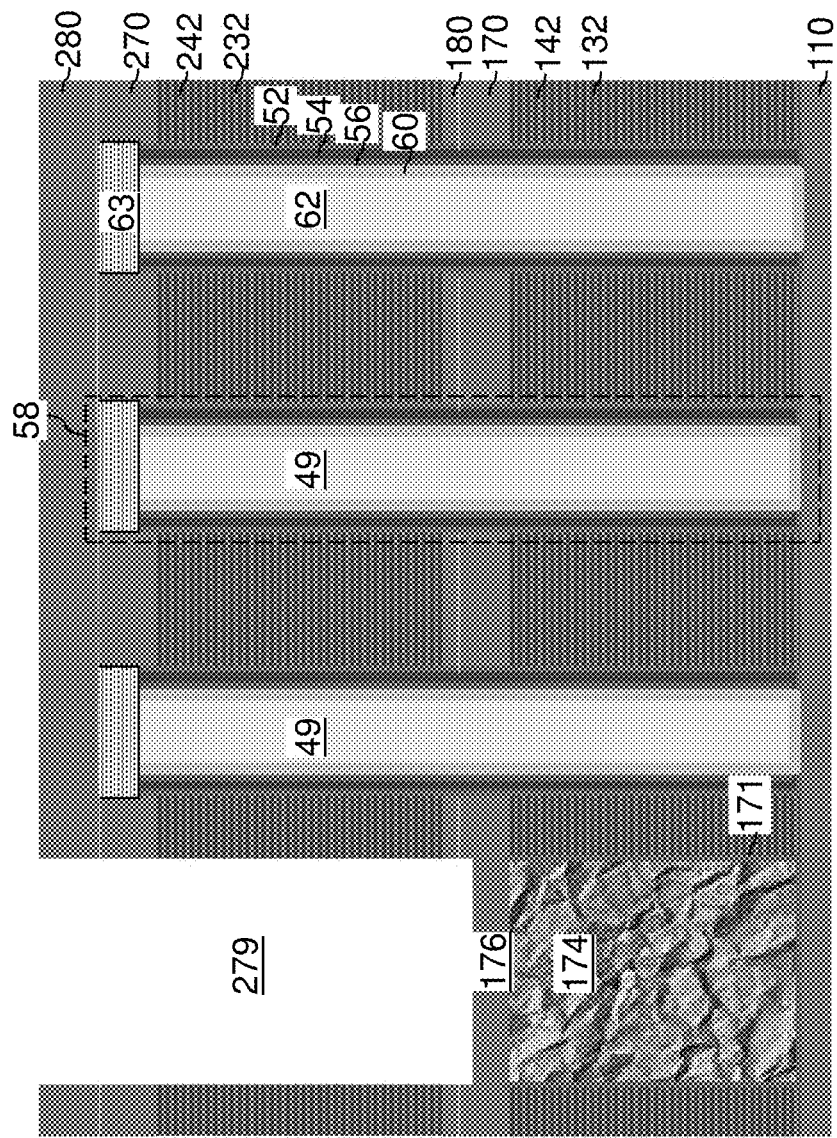
FIG. 14C is a vertical cross-sectional view of the first exemplary structure along the vertical plane C-C' of FIG. 14B.
Figure 14D:
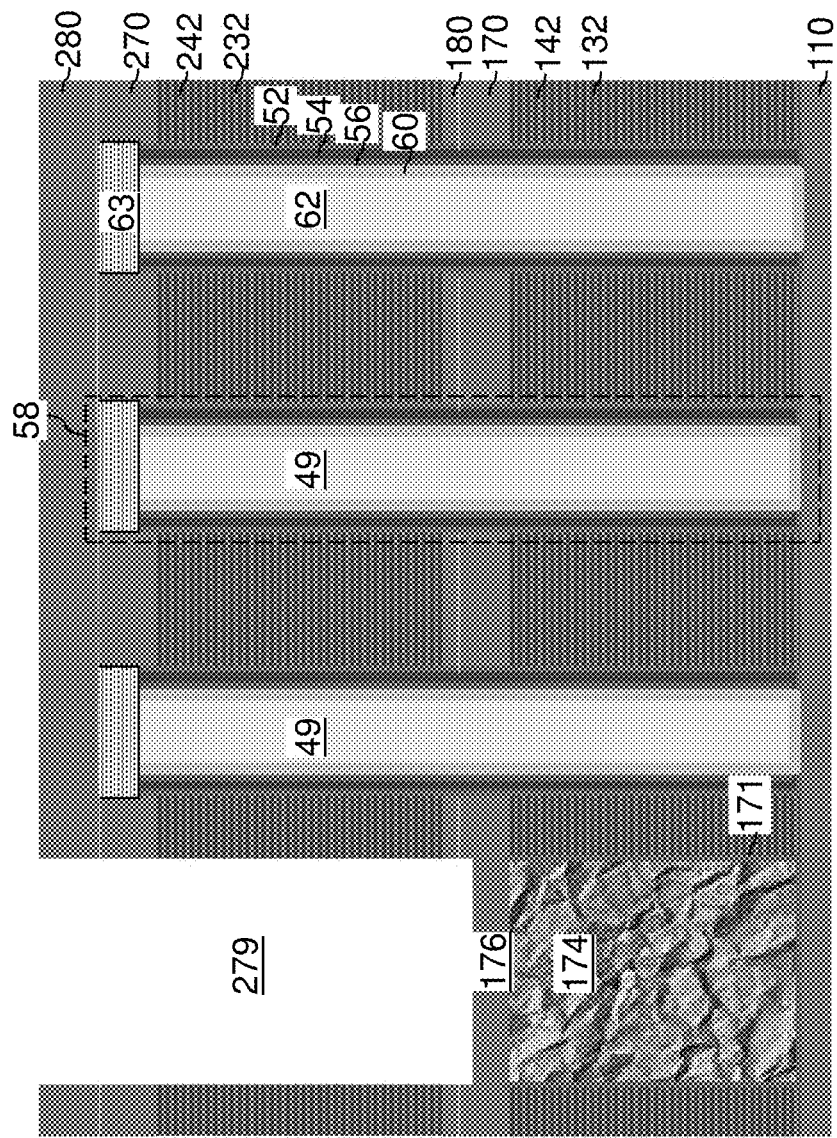
FIG. 14D is a vertical cross-sectional view of the first exemplary structure along the vertical plane D-D' of FIG. 14B.
Figure 15A:
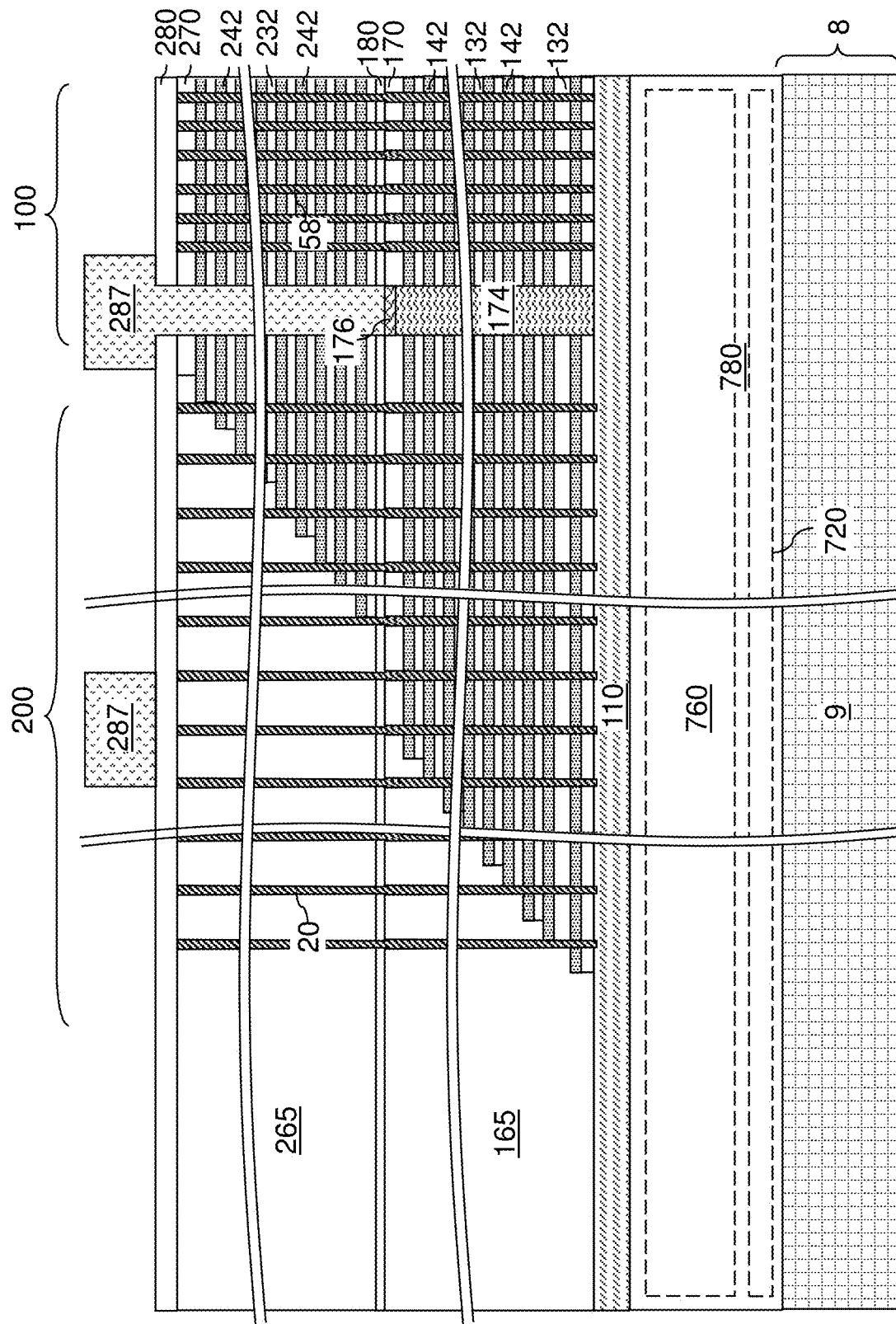
FIG. 15A is a vertical cross-sectional view of the first exemplary structure after formation of a patterned photoresist layer according to the first embodiment of the present disclosure.
Figure 15B:
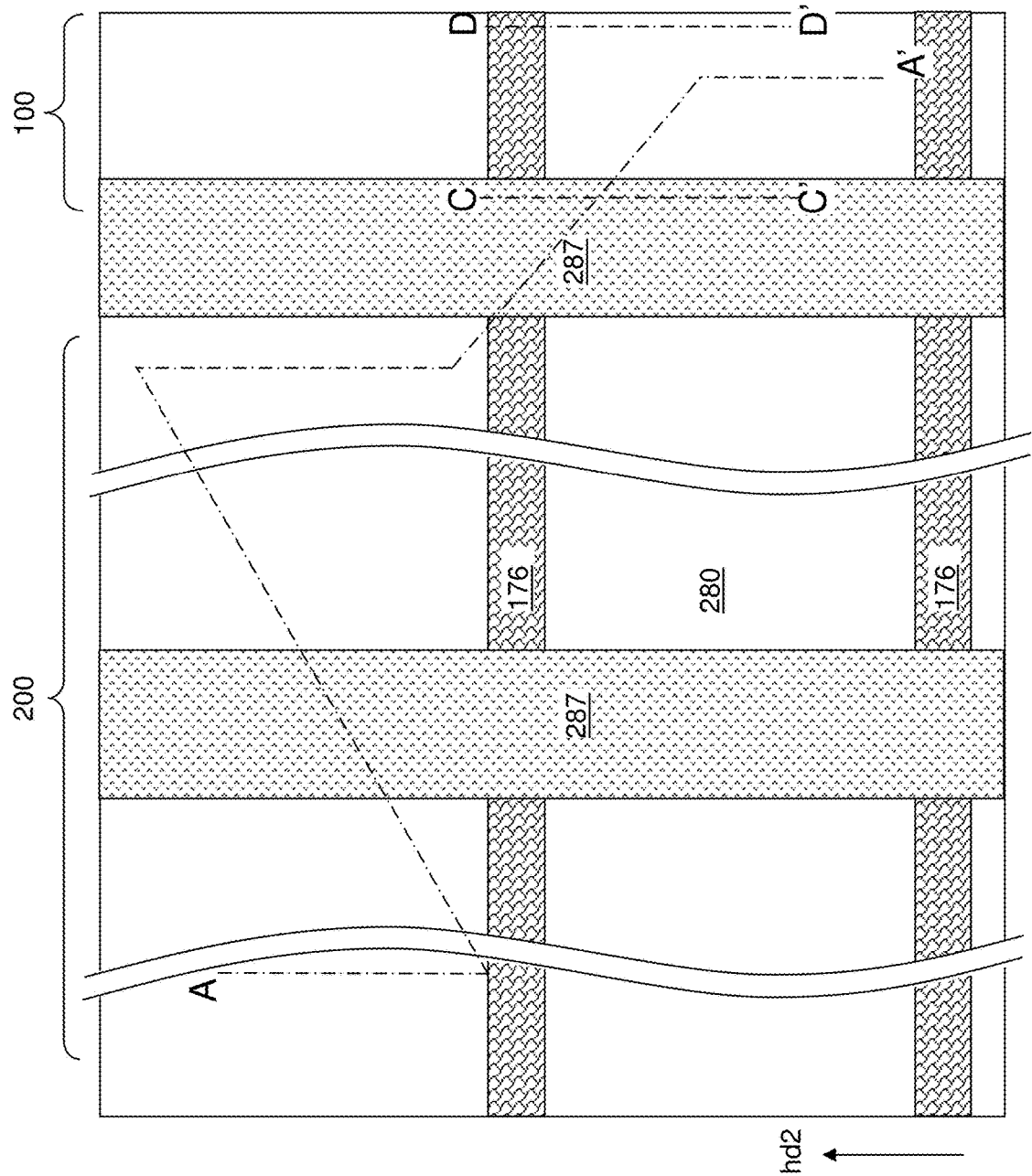
FIG. 15B is a top-down view of the first exemplary structure of FIG. 15A. The vertical plane A-A' is the plane of the vertical cross-sectional view of FIG. 15A.
Figure 15C:
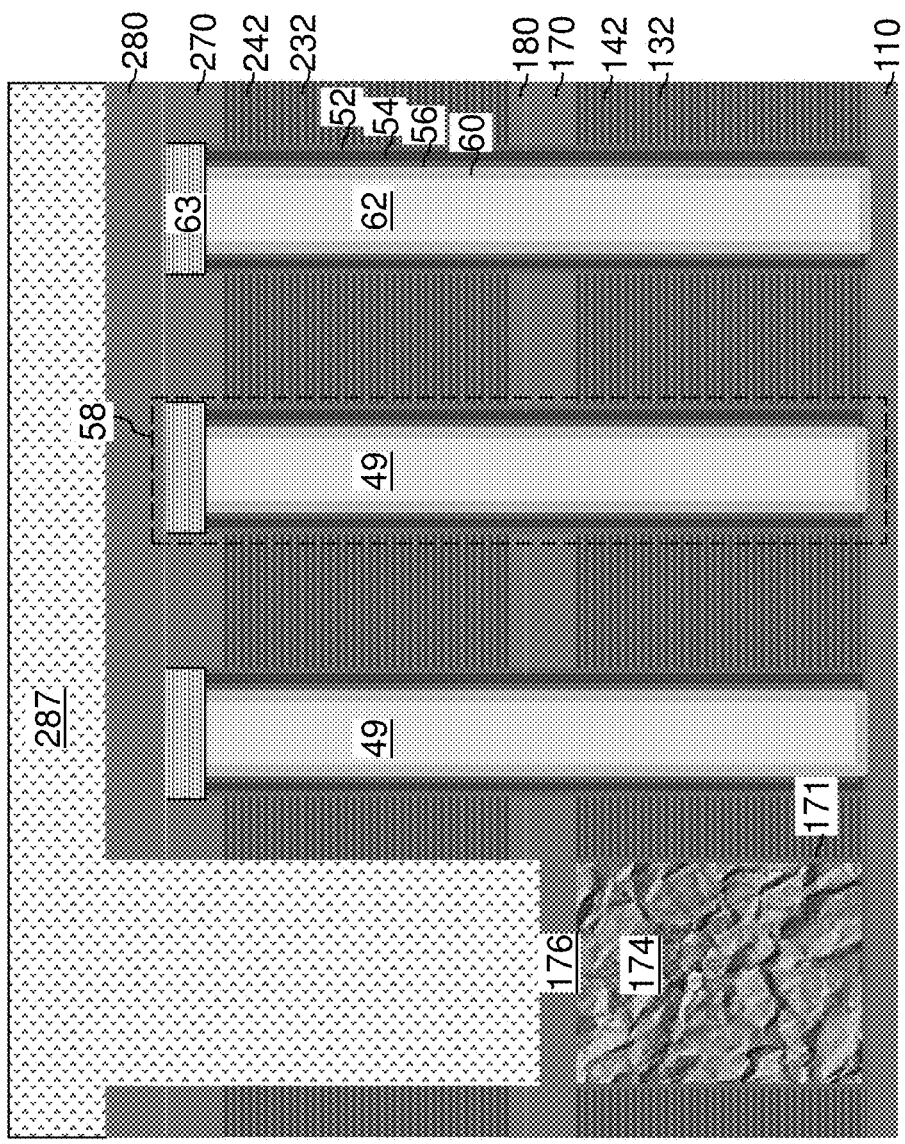
FIG. 15C is a vertical cross-sectional view of the first exemplary structure along the vertical plane C-C' of FIG. 15B.
Figure 15D:
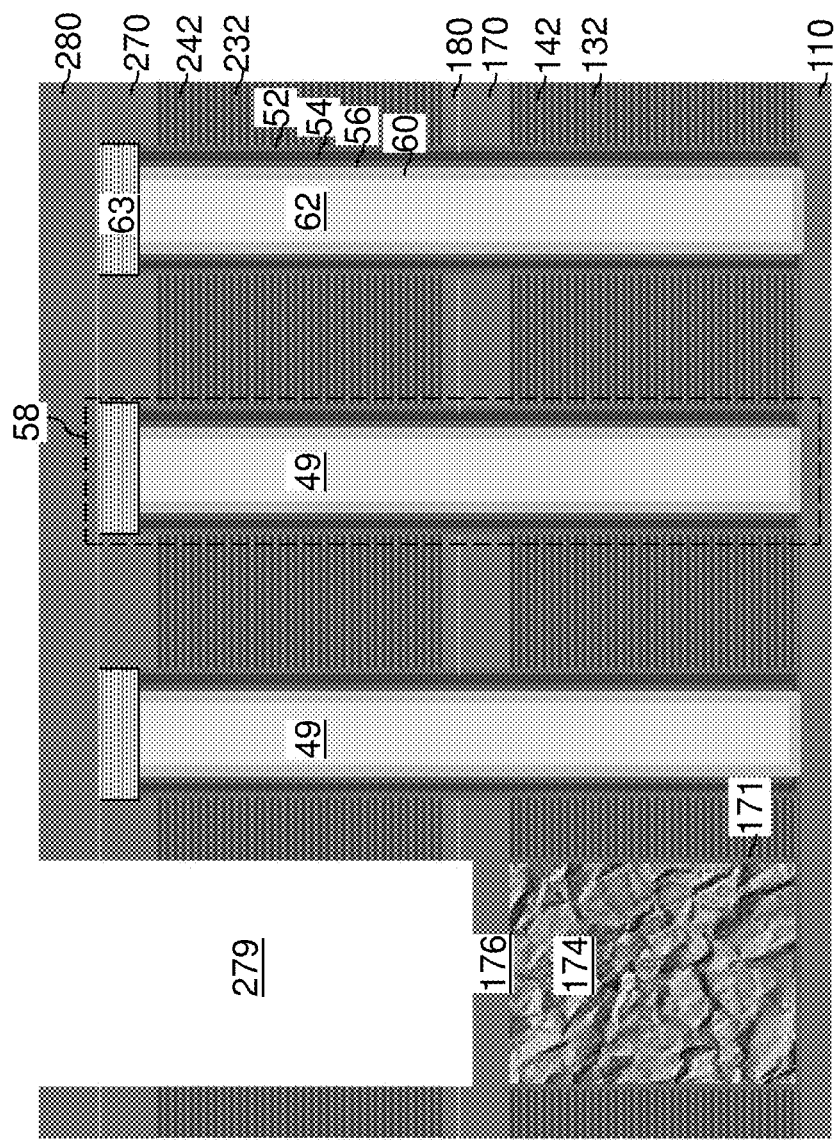
FIG. 15D is a vertical cross-sectional view of the first exemplary structure along the vertical plane D-D' of FIG. 15B.

Referring to FIG. 8E, an alternative embodiment of the first exemplary structure may be derived from the first exemplary structure illustrated in FIGS. 7A-7D by forming a patterned photoresist layer over the sacrificial trench fill structures 174. The patterned photoresist layer includes rows of openings therethrough. Each row of openings overlie a respective one of the sacrificial trench fill structures 174. A recess etch process can be performed to vertically recess the material of the sacrificial trench fill structures 174 selective to the material of the sacrificial stopping material layer 126. A row of discrete recesses can be formed in an upper region of each sacrificial trench fill structure 174. The patterned photoresist layer can be subsequently removed, for example, by ashing. A bridge material can be deposited in the rows of discrete recesses, and excess portions of the bridge material may be removed from above the horizontal plane including the top surface of the sacrificial stopping material layer 126 by a planarization process. The bridge material may be the same as in the first exemplary structure illustrated in FIGS. 8A-8D. Remaining portions of the bridge material filling each row of discrete recesses constitutes a row of bridge structures 178. Top surfaces of the bridge structures 178 may be located within a same horizontal plane as physically exposed top surface of the sacrificial trench fill structures 174.

While the embodiment is described above in which the vertical recess distance is the same across all recessed regions of the sacrificial trench fill structures 174 and all of the bridge structures 178 are formed with a same thickness, embodiments are expressly contemplated herein in which an etch mask layer and an additional etch process are employed to increase the vertical recess distance for the sacrificial trench fill structures 174 in the staircase region 200 without increasing the vertical recess distance in the memory array region 100. In this case, a first subset of the bridge structures 178 may be formed in the memory array region 100 with a first thickness, and second subset of the bridge structures 178 may be formed in the staircase region 200 with a second thickness, which may be greater than (such as 10% to 500% greater) the first thickness. Thus, each bridge structure 178 may have a first thickness which is similar to the thickness of layer 170 in the memory array region 100 and a greater second thickness in the staircase region 200. In another alternative embodiment, the bridge structures 178 are formed only in the staircase region 200 and are omitted in the memory array region 100.

Referring to FIGS. 9A-9D, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second continuous sacrificial material layers 242L includes is a sacrificial material layer that includes a dielectric material and continuously extends over the entire area of the substrate 8, and may have a uniform thickness throughout. The second continuous insulating layers 232L may be referred to as second insulating layers or as insulating layers. The second continuous sacrificial material layers 242L may be referred to as second sacrificial material layers or as sacrificial material layers. The second continuous insulating layers 232L can have the same material composition and the same thickness as the first continuous insulating layers 132L. The second continuous sacrificial material layers 242L can have the same material composition and the same thickness as the first sacrificial material layers 142L. A second continuous insulating cap layer 270L can be formed over the second vertically alternating sequence (232L, 242L). In one embodiment, the second continuous insulating cap layer 270L may comprise a same material as the second continuous insulating layers 232L.

Second stepped surfaces can be formed within the staircase region 200. The areas of the second stepped surfaces are laterally offset from the first stepped surfaces along the first horizontal direction hd1. In one embodiment, the first stepped surfaces of the first-tier alternating stacks (132, 142) may be located in an area that is not covered by the patterned portions of the second vertically alternating sequence (232L, 242L). Generally, the methods employed to form the first stepped surfaces of the first vertically alternating sequence (132L, 142L) may be performed with any needed changes to form the second stepped surfaces.

A second stepped cavity can be formed above a second stepped cavity. A second dielectric fill material (such as undoped silicate glass or a doped silicate glass) can be deposited in the second stepped cavity. The second dielectric fill material can be planarized to remove excess portions of the second dielectric fill material from above the horizontal plane including the top surface of the second continuous insulating cap layer 270L. A remaining portion of the second dielectric fill material that fills the second stepped cavity constitutes a second-tier retro-stepped dielectric material portion 265. Thus, the second-tier retro-stepped dielectric material portions 265 are formed on the second vertically alternating sequence (232L, 242L).

Referring to FIGS. 10A-10D, various second-tier openings may be formed through the second vertically alternating sequence (232L, 242L). A photoresist layer (not shown) may be applied over the second vertically alternating sequence (232L, 242L), and may be lithographically patterned to form various openings therethrough. The pattern of openings in the photoresist layer may be the same as the pattern of the first-tier openings (149, 129). The pattern of the openings in the photoresist layer can be transferred through the second vertically alternating sequence (232L, 242L) by a second anisotropic etch process to form various second-tier openings (249, 229) concurrently.

The various second-tier openings (249, 229) may include second-tier memory openings 249 formed in the memory array regions 100 on a respective one of the sacrificial first-tier memory opening fill structures 140, and second-tier support openings 229 formed in the staircase region 200 on a respective one of the sacrificial second-tier support opening fill structures 120. Each cluster of second-tier memory openings 249 may be formed as a two-dimensional array of second-tier memory openings 249. The second-tier support openings 229 comprise openings that are formed in the staircase region 200, and are subsequently employed to form support pillar structures. A subset of the second-tier support openings 229 may be formed through a respective horizontal surface of the second stepped surfaces.

Referring to FIGS. 11A-11D, the sacrificial first-tier memory opening fill structures 140 and the sacrificial first-tier support opening fill structures 120 can be removed from underneath the second-tier memory openings 249 and the second-tier support openings 149 by performing a sequence of etch processes. For example, the sacrificial fill material portions 124 within the sacrificial first-tier memory opening fill structures 140 and the sacrificial first-tier support opening fill structures 120 may be removed by a first etch process, which may comprise an anisotropic etch process or an isotropic etch process. The first etch process may be selective to the material of the optional sacrificial semiconductor liners 122, if present. If the sacrificial semiconductor liners 122 are present, a second etch process may be performed to remove the sacrificial semiconductor liners 122. For example, the second etch process may comprise an isotropic etch process that etches the semiconductor material of the sacrificial semiconductor liners 122 selective to the material of the optional sacrificial dielectric liners 121, if present. If the sacrificial dielectric liners 121 are present, a third etch process such as an isotropic etch process may be performed to remove the sacrificial dielectric liners 121.

Each contiguous combination of a volume of a second-tier memory opening 249 and an underlying first-tier memory opening 149 constitutes an inter-tier memory opening, which is also referred to as a memory opening 49. Each contiguous combination of a volume of a second-tier support opening 229 and an underlying first-tier support opening 129 constitutes an inter-tier support opening, which is also referred to as a support opening 19. Generally, the memory openings 49 and the support openings 19 can be formed through the second vertically alternating sequence (232L, 242L) and through the first-tier layer stacks (132, 142, 170).

FIGS. 12A-12D illustrate sequential vertical cross-sectional views of a memory opening during formation of a memory opening fill structure according to the first embodiment of the present disclosure.

Referring to FIG. 12A, an inter-tier memory opening, i.e., a memory opening 49, extending through the second vertically alternating sequence (232L, 242L) and the first vertically alternating sequence (132L, 142L) and into the semiconductor material layer 110 is illustrated.

Referring to FIG. 12B, a stack of layers including a blocking dielectric layer 52, a memory material layer 54, and an optional dielectric material liner 56 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242L). In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. Generally, the memory material layer 54 may include a vertical stack of memory elements located at levels of the sacrificial material layers (142, 242L).

The optional dielectric material liner 56, if present, includes a dielectric material. In one embodiment, the dielectric material liner 56 may comprises a tunneling dielectric layer through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 may include a stack of a first silicon oxide layer, a silicon oxynitride layer, and a second silicon oxide layer, which is commonly known as an ONO stack. In one embodiment, the dielectric material liner 56 may include a silicon oxide layer that is substantially free of carbon or a silicon oxynitride layer that is substantially free of carbon. The thickness of the dielectric material liner 56 may be in a range from 2 nm to 20 nm, although lesser and greater thicknesses may also be used. The stack of the blocking dielectric layer 52, the memory material layer 54, and the dielectric material liner 56 constitutes a memory film 50 that stores memory bits.

An anisotropic etch process can be performed to remove horizontal portions of the dielectric material liner 56, the memory material layer 54, and the blocking dielectric layer 52. A surface of the semiconductor material layer 110 can be physically exposed at the bottom of each cavity within each memory opening 49.

A semiconductor channel material layer 60L can be subsequently deposited. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' may be present in the volume of each inter-tier memory opening 49 that is not filled with the deposited material layers (52, 54, 56, 60L).

Referring to FIG. 12C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organ silicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second continuous insulating cap layer 270L may be removed, for example, by a recess etch. The recess etch continues until top surfaces of the remaining portions of the dielectric core layer are recessed to a height between the top surface and bottom surfaces of the second continuous insulating cap layer 270L. Each remaining portion of the dielectric core layer constitutes a dielectric core 62.

Referring to FIGS. 12D and 13A-13D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material and the semiconductor channel material layer 60L that overlie the horizontal plane including the top surface of the second continuous insulating cap layer 270L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A dielectric material liner 56 is surrounded by a memory material layer 54, and laterally surrounds a vertical semiconductor channel 60. Each adjoining set of a blocking dielectric layer 52, a memory material layer 54, and an optional dielectric material liner 56 collectively constitute a memory film 50, which may store information in data bits with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within an inter-tier memory opening 49 constitutes a memory stack structure 55. The memory stack structure 55 is a combination of a vertical semiconductor channel 60, a dielectric material liner 56, a plurality of memory elements comprising portions of the memory material layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Generally, memory opening fill structures 58 can be formed in the memory openings 49. Each of the memory opening fill structures 58 comprises a respective vertical stack of memory elements (e.g. portions of layer 54) and a respective vertical semiconductor channel 60. A support pillar structure 20 may be formed in each support opening 19 concurrently with formation of the memory opening fill structures 58. In one embodiment, the support pillar structures 20 may comprise a same set of structural elements as the memory opening fill structures 58. In one embodiment, top surfaces of the memory opening fill structures 58 and top surfaces of the support pillar structures 20 may be formed within the horizontal plane including the top surface of the second continuous insulating cap layer 270L.

Referring to FIGS. 14A-14D, a contact-level dielectric layer 280 can be deposited over the second insulating cap layer 270, the second retro-stepped dielectric material portion 265, the memory opening fill structures 58, and the support pillar structures 20. A photoresist layer (not shown) can be applied over the contact-level dielectric layer 280, and can be lithographically patterned to form elongated openings that laterally extend along the first horizontal direction hd1. The elongated openings may have the same areas as the first-tier backside trenches 179, i.e., as the fill material stacks (171, 174, 176) that fill the first-tier backside trenches 179.

An anisotropic etch process may be performed to etch unmasked portions of the contact-level dielectric layer 280, the second continuous insulating cap layer 270L, and the second vertically alternating sequence (232L, 242L). Second-tier backside trenches 279 are formed in volumes from which materials of the contact-level dielectric layer 280L, the second continuous insulating cap layer 270L, and the second vertically alternating sequence (232L, 242L) are removed. A top surface of a bridge material matrix 176 can be physically exposed underneath each of the second-tier backside trenches 279. The bridge material matrix 176 acts as an etch stop during the etch process. The patterned photoresist layer can be subsequently removed, for example, by ashing.

The contact-level dielectric layer 280 can be divided into a plurality of portions located between a respective neighboring pair of second-tier backside trenches 279. The second continuous insulating cap layer 270L can be divided into a plurality of second insulating cap layers 270 by the second-tier backside trenches 279. The second vertically alternating sequence (232L, 242L) can be divided into a plurality of second-tier alternating stacks (232, 242) of second insulating layers 232 and second sacrificial material layers 242. Each second insulating layer 232 is a patterned portion of a respective second continuous insulating layer 232L. Each second sacrificial material layer 242 is a patterned portion of a respective second continuous sacrificial material layer 242L. In one embodiment, each of the second-tier backside trenches 279 may have a respective pair of lengthwise sidewalls that laterally extend along the first horizontal direction hd1. In one embodiment. Each of the second-tier backside trenches may have a uniform width along the second horizontal direction hd2. Each contiguous combination of a second-tier alternating stack (232, 242) and a second insulating cap layer 270 constitutes a second-tier layer stack (232, 242, 270).

The second-tier backside trenches 279 can be formed through the second continuous insulating cap layer 270L and the second vertically alternating sequence (232L, 242L). The second-tier layer stacks (232, 242, 270) comprise patterned portions of the second continuous insulating cap layer 270L and the second vertically alternating sequence (232L, 242L). The second-tier layer stacks (232, 242, 270) can be formed over the first-tier layer stacks (132, 142, 270). The second-tier layer stacks (232, 242, 270) laterally extend along the first horizontal direction hd1 and are laterally spaced apart among one another along a second horizontal direction hd2 by the second-tier backside trenches 179. Each of the second-tier layer stacks (232, 242, 270) comprises a second-tier alternating stack (232, 242) of second insulating layers 232 and second sacrificial material layers 234, and comprises a second insulating cap layer 270 overlying the second-tier alternating stack (232, 242). Each of the second-tier backside trenches 279 has a respective pair of lengthwise sidewalls that are perpendicular to the second horizontal direction hd2.

Generally, the second-tier backside trenches 279 can be formed through the second vertically alternating sequence (232L, 242L). The second-tier layer stacks (232, 242, 270) comprise patterned portions of the second vertically alternating sequence (232L, 242L). Each of the second-tier backside trenches 279 has a respective second uniform width along the second horizontal direction hd2, and has a respective pair of lengthwise sidewalls that are perpendicular to the second horizontal direction hd2. The second-tier layer stacks (232, 242, 270) laterally extend along the first horizontal direction hd1 and are laterally spaced apart from each other along the second horizontal direction hd2 by second-tier backside trenches 279. Each of the second-tier layer stacks (232, 242, 270) comprises a second-tier alternating stack (232, 242) of second insulating layers 232 and second sacrificial material layers 242.

A plurality of layer stacks (132, 142, 170, 180, 232, 242, 270, 280) can be formed over a semiconductor material layer 110. The layer stacks (132, 142, 170, 180, 232, 242, 270, 280) laterally extend along the first horizontal direction hd1, and are laterally spaced among one another along the second horizontal direction hd2 by the fill material stacks (171, 174, 176) and the second-tier backside trenches 279. Each of the layer stacks (132, 142, 170, 180, 232, 242, 270, 280) comprises a first-tier alternating stack (132, 142) of first insulating layers 132 and first electrically conductive layers 142, a first insulating cap layer 170, an inter-tier dielectric layer 180, a second-tier alternating stack (232, 242) of second insulating layers 232 and second electrically conductive layers 242, a second insulating cap layer 270, and a contact-level dielectric layer 280. Each inter-level dielectric layer 180 may contact a top surface of a respective first-tier retro-stepped dielectric material portion 165, a top surface of a respective first insulating cap layer 170, a bottom surface of a respective second-tier retro-stepped dielectric material portion 265, and a bottom surface of a respective second-tier alternating stack (232, 242).

In one embodiment, each memory opening 49 vertically extends through a respective first-tier alternating stack (132, 142), a respective first insulating cap layer 170, a respective second-tier alternating stack (232, 242), and a respective second insulating cap layer 270. Memory opening fill structures 58 can be formed in the memory openings 49. Each of the memory opening fill structures 58 comprises a respective vertical stack of memory elements and a respective vertical semiconductor channel 60. Each first-tier retro-stepped dielectric material portion 165 may contact stepped surfaces of a respective one of the first-tier alternating stacks (132, 142). Each second-tier retro-stepped dielectric material portions 265 may contact stepped surfaces of a respective one of the second-tier alternating stacks (232, 242). In one embodiment, each top surface of the first-tier retro-stepped dielectric material portions 165 may be located within the horizontal plane including the top surfaces of the first insulating cap layers 170.

Referring to FIGS. 15A-15D, a photoresist layer can be applied over the second-tier alternating stacks (232, 246) and in the second-tier backside trenches 279, and can be lithographically patterned to form a patterned photoresist layer 287. In one embodiment, the patterned photoresist layer 287 may comprise a plurality of photoresist material strips that laterally extend along the second horizontal direction hd2 and are laterally spaced apart along the first horizontal direction hd1. The percentage of the areas of the top surfaces of the fill material stacks (171, 174, 176) that are covered by the patterned photoresist layer 287 relative to the total area of the top surfaces of the fill material stacks (171, 174, 176) may be in a range from 1% to 50%, such as from 2% to 30%, and/or from 4% to 20%, although lesser and greater percentages may also be employed. The width of each photoresist material strip along the first horizontal direction hd1 may be in a range from 50 nm to 2,000 nm, such as from 100 nm to 1,000 nm, and/or from 200 nm to 500 nm, although lesser and greater widths may also be employed.

Referring to FIGS. 16A-16D, an etch process can be performed to remove portions of the bridge material matrices 176 that are not covered by the patterned photoresist layer 287. The etch process may comprise an anisotropic etch process or an isotropic etch process. Each bridge material matrix 176 can be divided into a plurality of discrete material portions including the bridge material. Remaining portions of the bridge material matrices 176 are herein referred to as bridge structures 178. A row of bridge structures 178 arranged along the first horizontal direction hd1 can be formed within an upper portion of each first-tier backside trench 179. Generally, each of the bridge material matrices 176 may be patterned into a respective plurality of bridge structures 178 that are laterally spaced part along the first horizontal direction hd1. In one embodiment, a one-dimensional periodic array of bridge structures 178 may be formed within each first-tier backside trench 179.

Figure 16A:
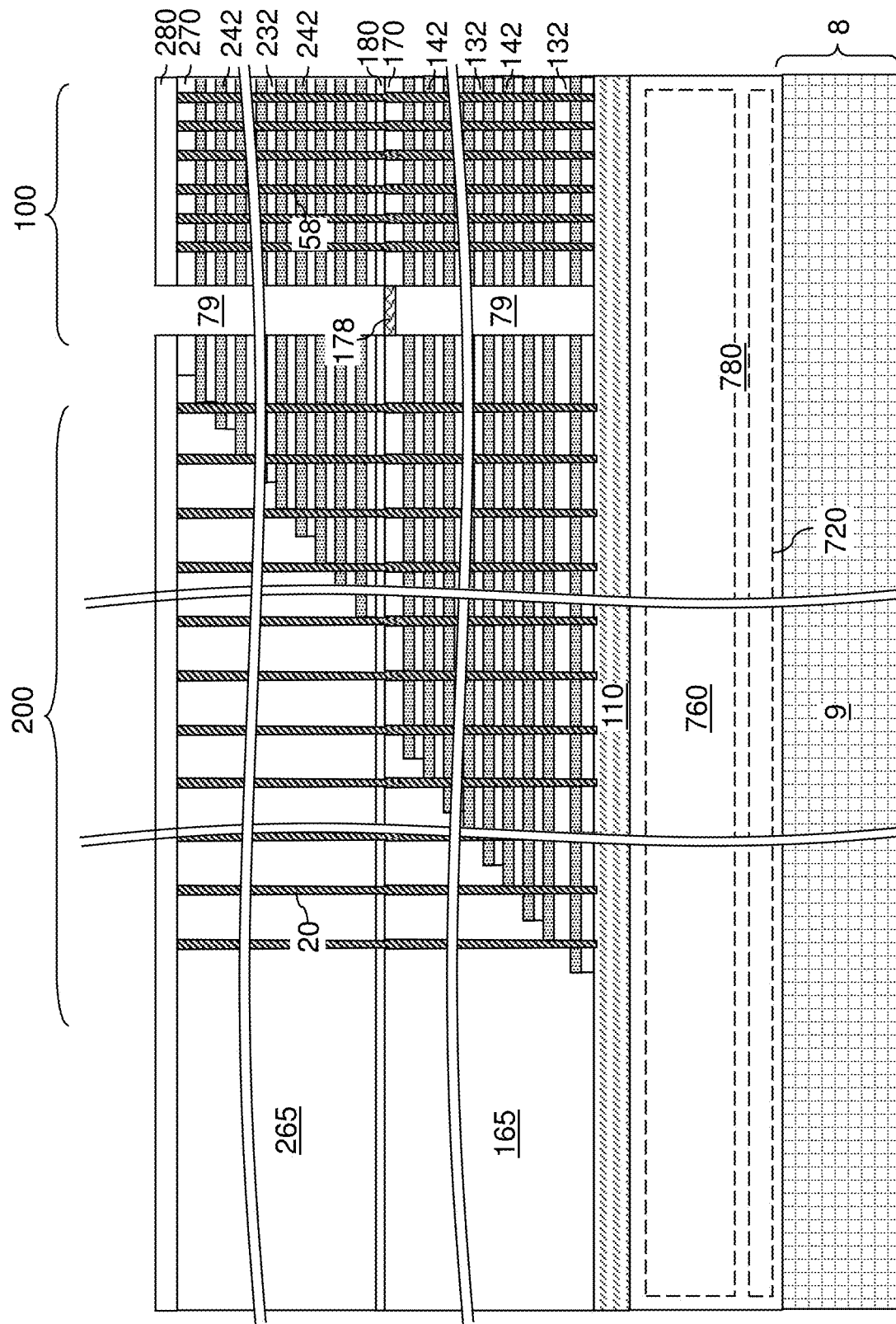
FIG. 16A is a vertical cross-sectional view of the first exemplary structure after patterning the bridge material matrices into bridge structures and removal of the sacrificial trench fill structures according to the first embodiment of the present disclosure.
Figure 16B:
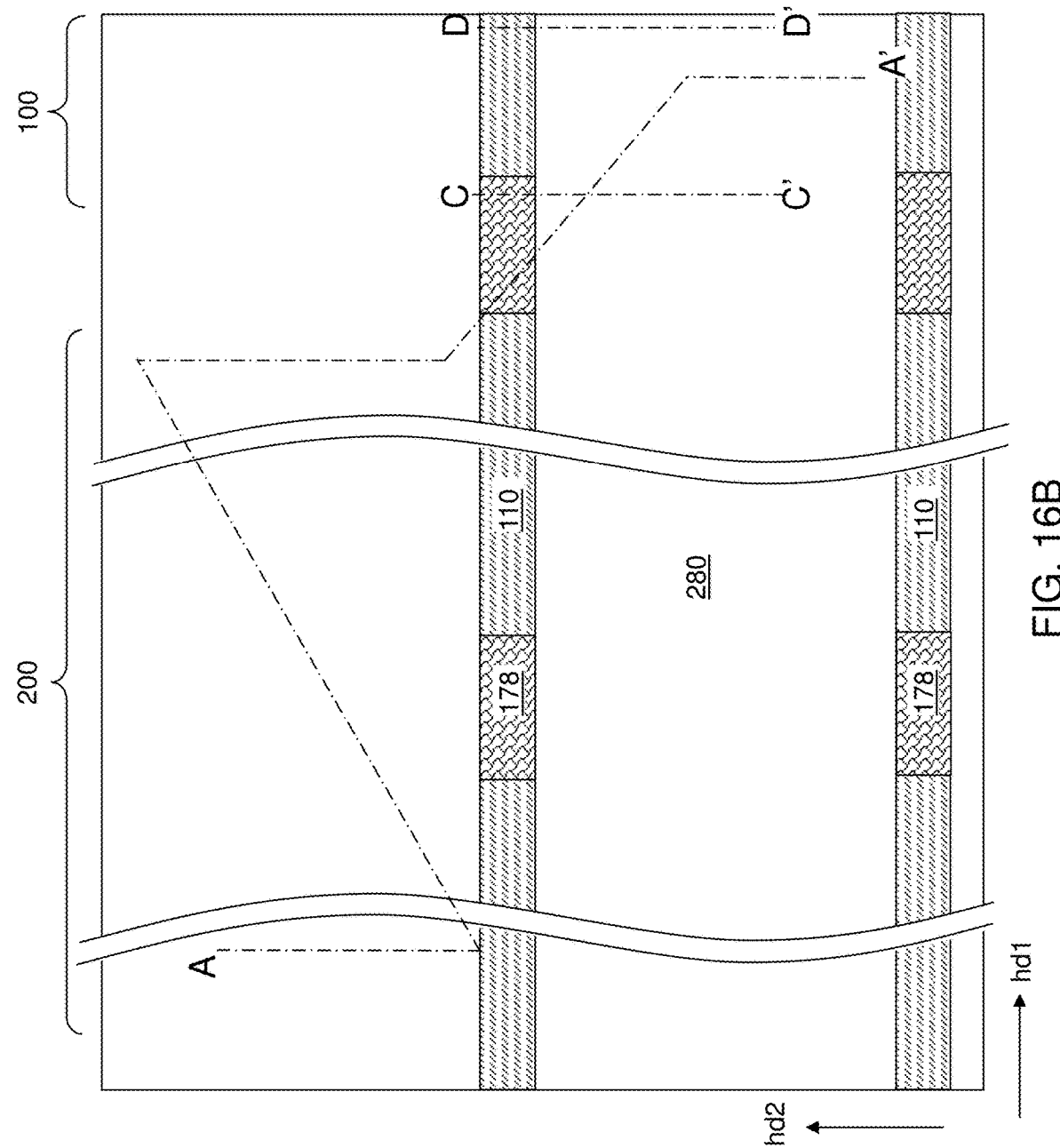
FIG. 16B is a top-down view of the first exemplary structure of FIG. 16A. The vertical plane A-A' is the plane of the vertical cross-sectional view of FIG. 16A.
Figure 16C:
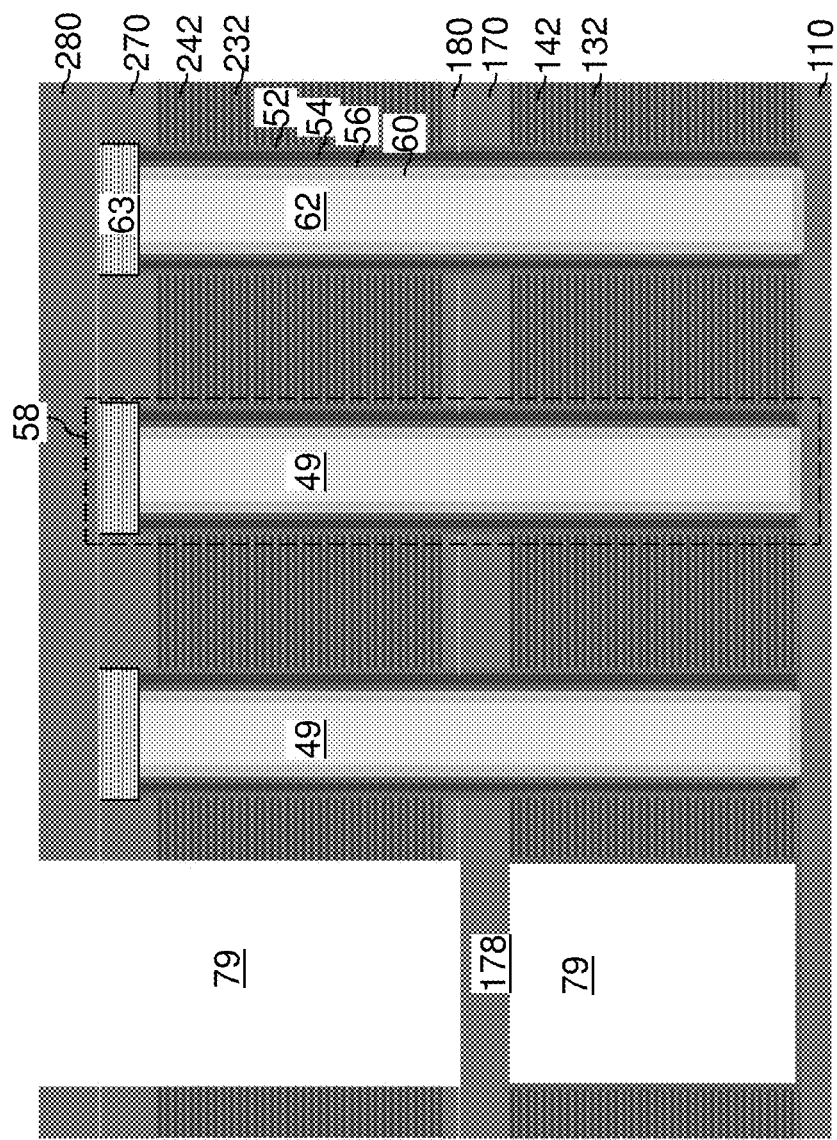
FIG. 16C is a vertical cross-sectional view of the first exemplary structure along the vertical plane C-C' of FIG. 16B.
Figure 16D:
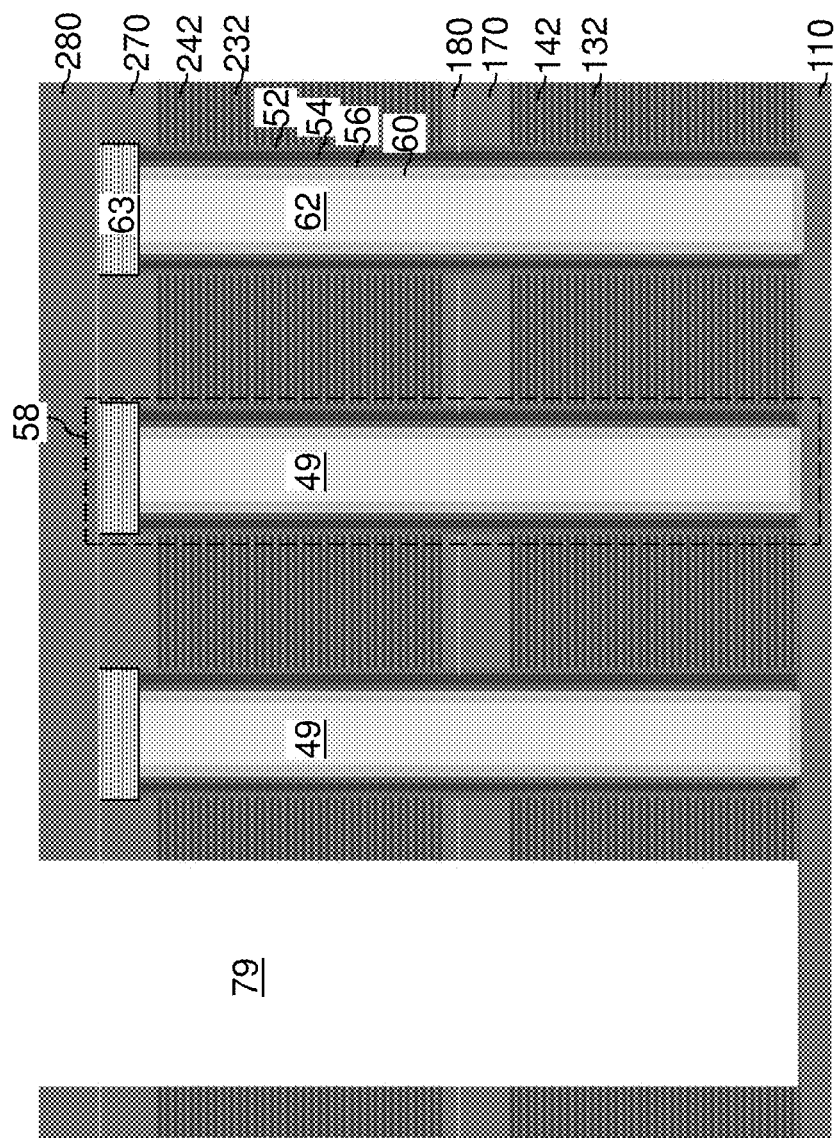
FIG. 16D is a vertical cross-sectional view of the first exemplary structure along the vertical plane D-D' of FIG. 16B.

Subsequently, the sacrificial trench fill structures 174 may be removed. In one embodiment, the sacrificial trench fill structures 174 comprises a carbon-based material, such as amorphous carbon. In this case, the sacrificial trench fill structures 174 may be removed by performing an ashing process. Alternatively, the sacrificial trench fill structures 174 may be removed by selective etching, such as isotropic etching. For example, if the sacrificial trench fill structures 174 comprises amorphous silicon, a wet etch process employing TMAH or TMY may be employed to remove the sacrificial trench fill structures 174. Subsequently, the sacrificial trench liners 171, if present, may be removed by performing an isotropic etch process. Each contiguous union of a volume of a second-tier backside trench 279 and a volume of a respective underlying first-tier backside trench 179 is herein referred to as a backside trench 79, which is also referred to as an inter-tier backside trench 79. A row of bridge structures 178 can be formed within each backside trench 79. The bridge structures 178 span the width of each respective backside trench 79 along the second horizontal direction hd2 and are free hanging (i.e., not supported from below) above the bottom of the respective backside trench 79, as shown in FIG. 16C.

In one embodiment, each of the bridge structures 178 may have a respective top surface located within the horizontal plane including the top surfaces of the first insulating cap layers 170. In one embodiment, each of the bridge structures 178 may have a respective pair of first sidewalls that contact sidewalls of a respective pair of first insulating cap layers 170, and laterally extends along the first horizontal direction. The first sidewalls of the bridge structures 178 may be vertical or substantially vertical. In one embodiment, each of the bridge structures 178 may have a respective pair of second sidewalls that are physically exposed to a void within a respective backside trench 79, and is parallel to the second horizontal direction hd2. In one embodiment, the bridge structures 178 may be patterned from the bridge material matrices 176 employing an anisotropic etch process, and the second sidewalls of the bridge structures 178 may be perpendicular to the first horizontal direction hd1. In one embodiment, each of the first sidewalls of the plurality of bridge structures 178 has a respective bottom edge that is adjoined to a sidewall of a respective one of the first insulating cap layers 170. In one embodiment, each of the plurality of bridge structures 178 comprises a semiconductor material (e.g., amorphous silicon or polysilicon) or a conductive material.

In case an alternative embodiment of the first exemplary structure illustrated in FIG. 8E is employed in lieu of the first exemplary structure illustrated in FIGS. 8A-8D, portions of the sacrificial trench fill structures 174 may be removed after formation of the second-tier backside trenches 279 at the processing steps of FIGS. 14A-14D. In this case, the sacrificial trench fill structures 174 may be removed selective to the bridge structures 178 by performing the processing steps of FIGS. 16A-16D to provide a structure illustrated in FIGS. 16A-16D. In other words, the processing steps of FIGS. 15A-15D may be omitted.

Figure 17:
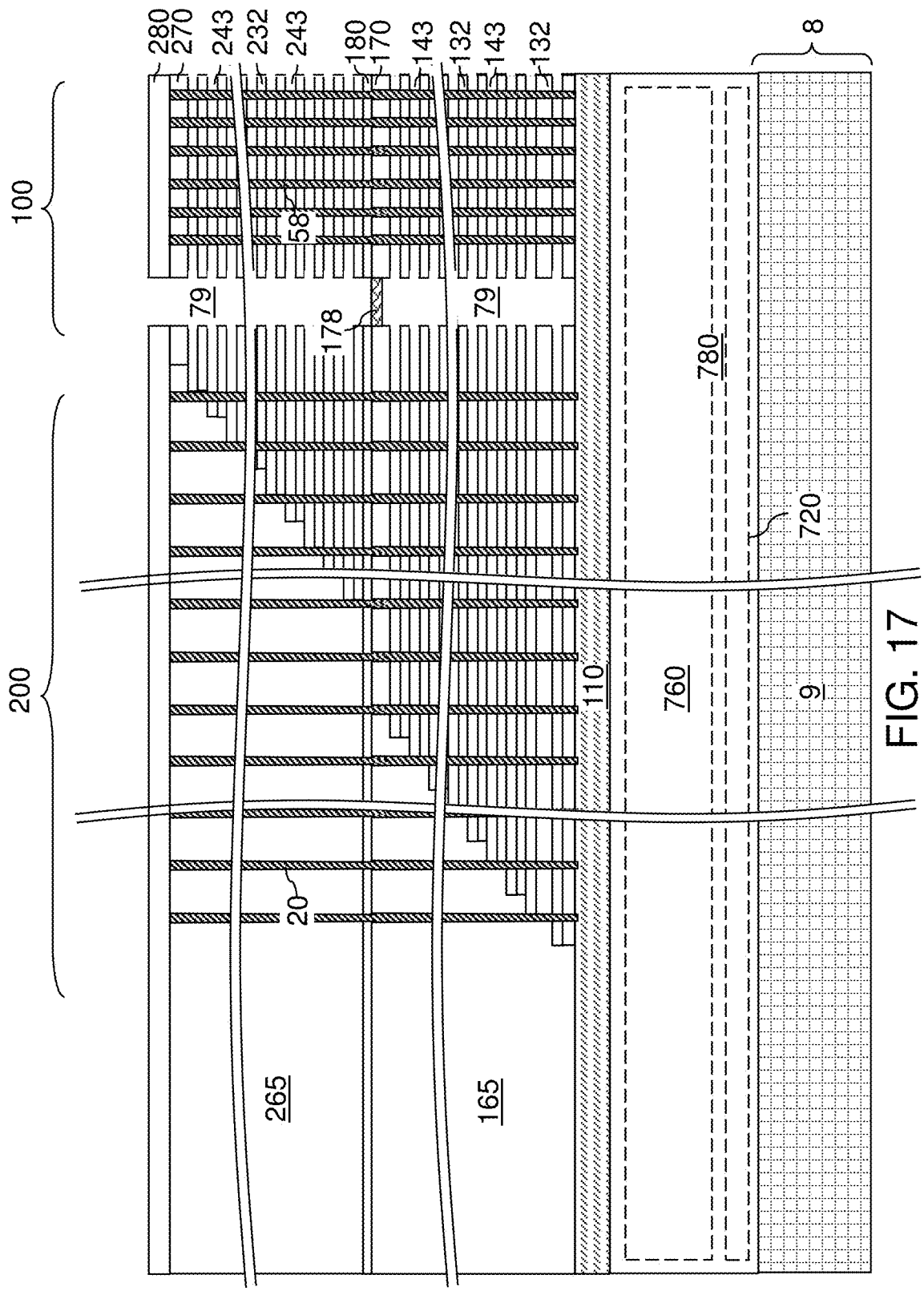
FIG. 17 is a vertical cross-sectional view of the first exemplary structure after formation of backside recesses according to the first embodiment of the present disclosure.

Referring to FIG. 17, an isotropic etch process can be employed to remove the sacrificial material layers (142, 242) selective to the insulating layers (132, 232), outermost layers of the support pillar structures 20, outermost layers of the memory stack structures 58 (such as the blocking dielectric layers 52), and the semiconductor material layer 110. In one embodiment, an etchant that selectively etches the materials of the sacrificial material layers (142, 242) with respect to the materials the insulating layers (132, 232), the first blocking dielectric layers 52, and the semiconductor material layer 110 may be introduced into the backside trenches 79 during the isotropic etch process. For example, the sacrificial material layers (142, 242) may include silicon nitride, the materials of the insulating layers (132, 232) and the blocking dielectric layers 52 may include silicon oxide materials, and the isotropic etch process may employ hot phosphoric acid.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the semiconductor material layer 110. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The support pillar structures 20 are physically exposed to the backside recesses (143, 243) after the isotropic etch process. The support pillar structures 20 vertically support the insulating layers (132, 232). The bridge structures 178 laterally support the insulating layers (132, 232), and prevent or reduce the insulating layers (132, 232) from toppling or leaning into the backside trenches 79 while the backside recesses (143, 243) are present in the first exemplary structure.

Figure 18:
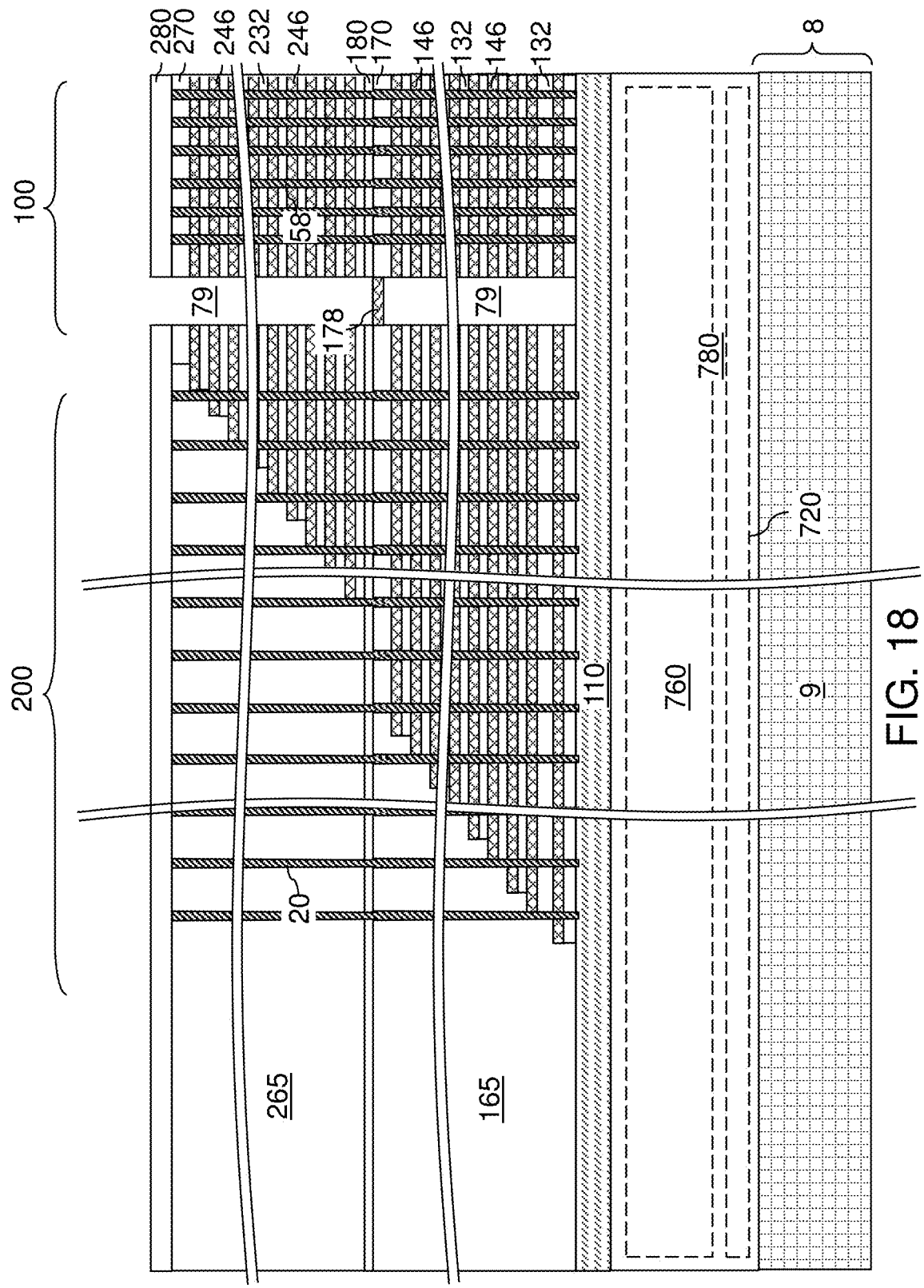
FIG. 18 is a vertical cross-sectional view of the first exemplary structure after formation of electrically conductive layers according to the first embodiment of the present disclosure.

Referring to FIG. 18, a backside blocking dielectric layer (not shown) may be optionally deposited in peripheral portions of the backside recesses (143, 243) by a conformal deposition process. In one embodiment, the backside blocking dielectric layer comprises a dielectric metal oxide such as aluminum oxide.

At least one electrically conductive material may be deposited in the backside recesses (143, 243) by performing at least one conformal deposition process. In one embodiment, the at least one conductive material may include at least one metallic material, i.e., an electrically conductive material that includes at least one metal element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, MoN or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79, and from above the contact-level dielectric layer by an anisotropic process and/or an isotropic etch process. Each remaining portion of the deposited metallic material in the first backside recesses constitutes a first electrically conductive layer 146. Each remaining portion of the deposited metallic material in the second backside recesses constitutes a second electrically conductive layer 246.

A subset of the electrically conductive layers (146, 246) may comprise word lines for the memory elements. One or more topmost and bottommost electrically conductive layers may comprise select gate electrodes. The semiconductor devices 720 (if present) may comprise driver circuit transistors, such as word line switch devices configured to control a voltage to respective word lines, and/or bit line driver devices, such as sense amplifiers, configured to control a voltage to bit lines to be formed over the memory opening fill structures 58.

Referring to FIGS. 19A-19D, an optional ion implantation process may be performed to implant dopants of the second conductivity type into portions of the semiconductor material layer 110 that are not masked by overlying structures. Surface portions of the semiconductor material layer 110 that underlie the backside trenches 79 and are not masked by a respective overlying bridge structure 178 can be converted into source regions 61 having a doping of the second conductivity type. Surface portions of the semiconductor material layer 110 located between the source regions 61 and the vertical semiconductor channels 60 of the memory opening fill structures 58 constitute horizontal semiconductor channels.

An insulating material can be conformally deposited, for example, by a chemical vapor deposition process, and can be subsequently anisotropically etched to remove horizontally-extending portions of the deposited insulating material that are not masked by an overlying structure. The thickness of the deposited insulating material can be less than one-half of the width of each backside trench 79, and may be in a range from 1% to 30% of the width of each backside trench 79. In one embodiment, the insulating material may comprise a silicon-oxide based material such as undoped silicate glass or a doped silicate glass. Each remaining portion of the deposited insulating material that remains in a respective backside trench 79 constitutes an insulating spacer 74.

Figure 19A:
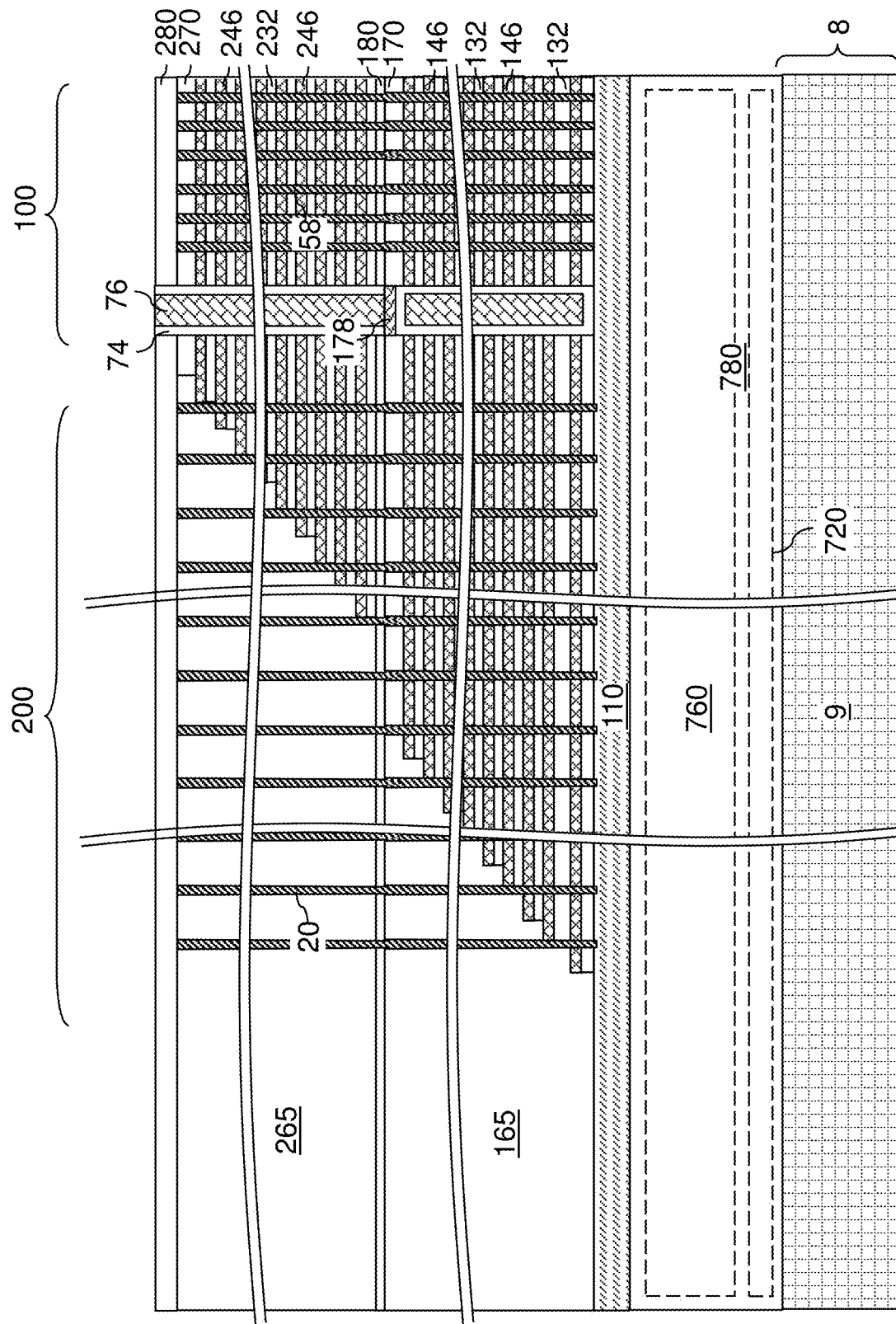
FIG. 19A is a vertical cross-sectional view of the first exemplary structure after formation of source regions and backside trench fill structures according to the first embodiment of the present disclosure.
Figure 19B:
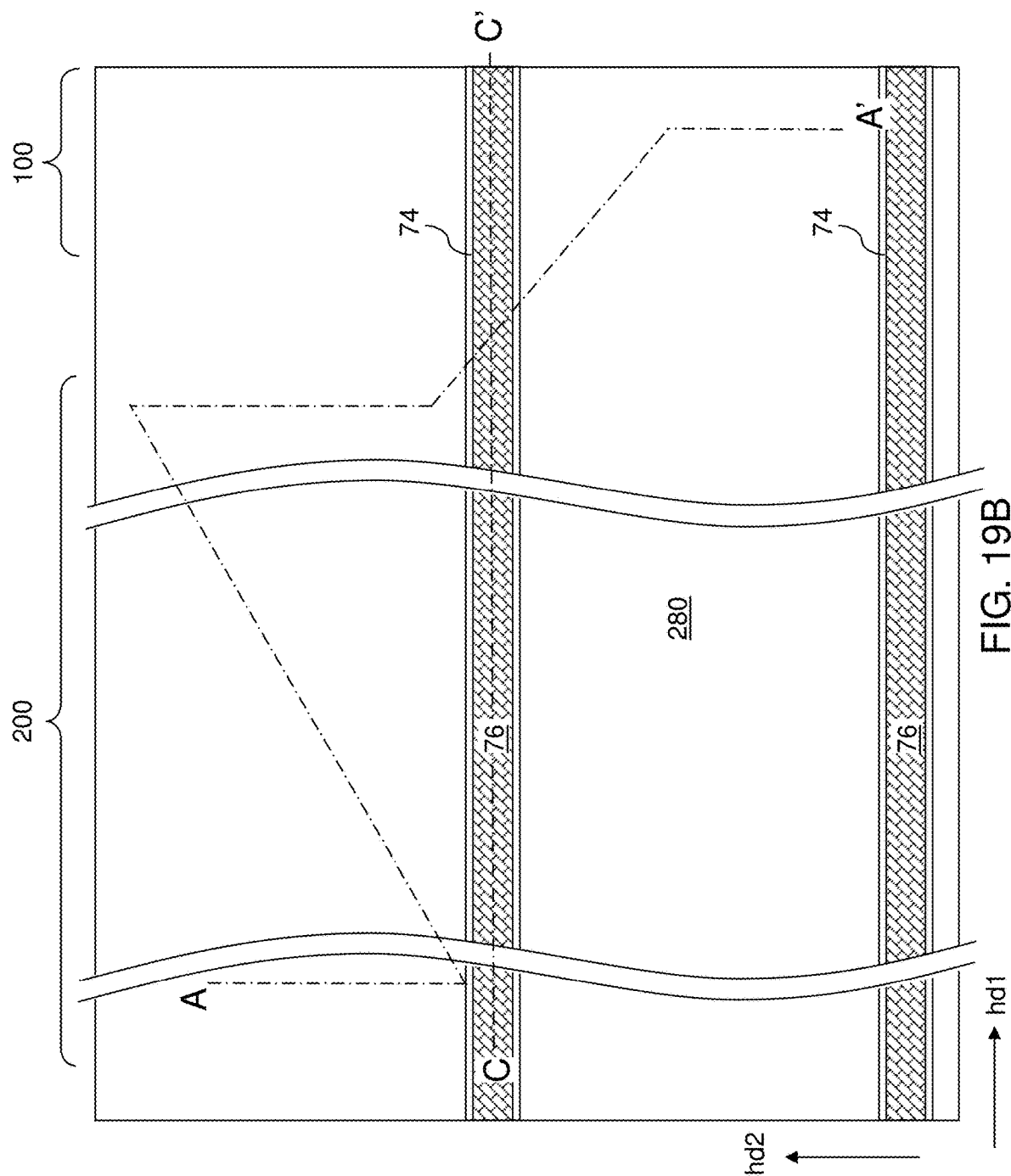
FIG. 19B is a top-down view of the first exemplary structure of FIG. 19A. The vertical plane A-A' is the plane of the vertical cross-sectional view of FIG. 19A.
Figure 19C:
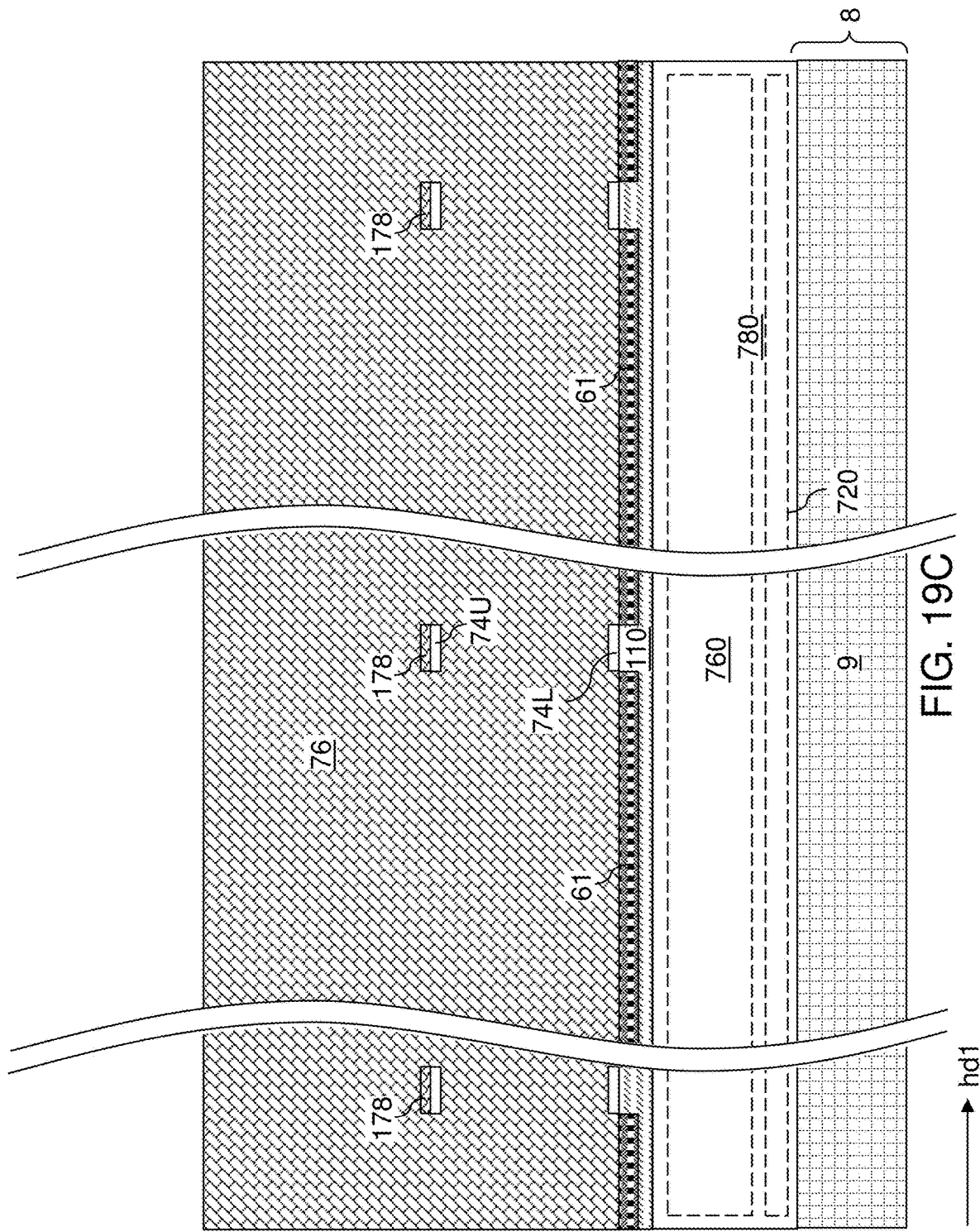
FIG. 19C is a vertical cross-sectional view of the first exemplary structure along the vertical plane C-C' of FIG. 19B.

In one embodiment shown in FIG. 19C, each insulating spacer 74 comprises a plurality of upper insulating bridge portions 74U contacting a bottom surface of a respective one of the plurality of bridge structures 178. In one embodiment, the plurality of upper insulating bridge portions 74U has a same width along the first horizontal direction hd1 as the respective overlying one of the plurality of bridge structures 178, and has a vertical thickness that is the same as a lateral thickness of vertically-extending portions of the insulating spacer 74. In one embodiment, the insulating spacer 74 comprises a plurality of lower insulating bridge portions 74L contacting a respective top surface segment of the semiconductor material layer 110.

At least one conductive material can be conformally deposited in unfilled volumes of the backside trenches 79. The at least one conductive material may comprise a metallic liner material (such as a conductive metallic nitride material) and at least one metallic fill material. Excess portions of the at least one conductive material can be removed from above the horizontal plane including the top surface of the contact-level dielectric layer 280 by a planarization process, which may employ a chemical mechanical polishing process and/or a recess etch process. Each remaining portion of the at least one conductive material in a respective backside trench 79 constitutes a backside contact via structure 76. One or more materials that fill the space of the backside trench 79 after formation of the bridge structures 178 is herein referred to as a backside trench fill structure (74, 76).

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact a side of the lower portion of the semiconductor channel 60.

Each backside trench fill structure (74, 76) may optionally comprise a backside contact via structure 76 embedding a plurality of bridge structures 178. Each backside trench fill structure (74, 76) further comprises an insulating spacer 74 contacting lengthwise sidewalls of a pair of layer stacks (132, 146, 170, 180, 232, 246, 270, 280) and laterally surrounding a respective backside contact via structure 76 (if present). Each of the plurality of bridge structures 178 comprises a respective pair of first sidewalls that contact the first insulating cap layers 170 within the plurality of layer stacks (132, 146, 170, 180, 232, 246, 270, 280), and comprises a respective top surface within a horizontal plane including top surfaces of the first insulating cap layers 170.

In one embodiment, each backside contact via structure 76 contacts a plurality of source regions 61 that are embedded within the semiconductor material layer 110. In one embodiment, the plurality of source regions 61 can be laterally spaced apart from each other by portions of the semiconductor material layer 110 that underlie, and contact, the plurality of lower insulating bridge portions of the insulating spacer 74. In one embodiment, each backside contact via structure 76 vertically extends from a first horizontal plane including a top surface of the semiconductor material layer 110 and to a second horizontal plane including top surfaces of the contact-level dielectric layers 280 of the layer stacks (132, 146, 170, 180, 232, 246, 270, 280). In one embodiment, each of the plurality of bridge structures 178 comprises a respective pair of second sidewalls that are perpendicular to the first horizontal direction hd1 and contact respective sidewall surface segments of the backside contact via structure 76. In one embodiment, each of the top surfaces of the plurality of bridge structures 178 contacts a respective bottom surface segment of the backside contact via structure 76.

Figure 20:
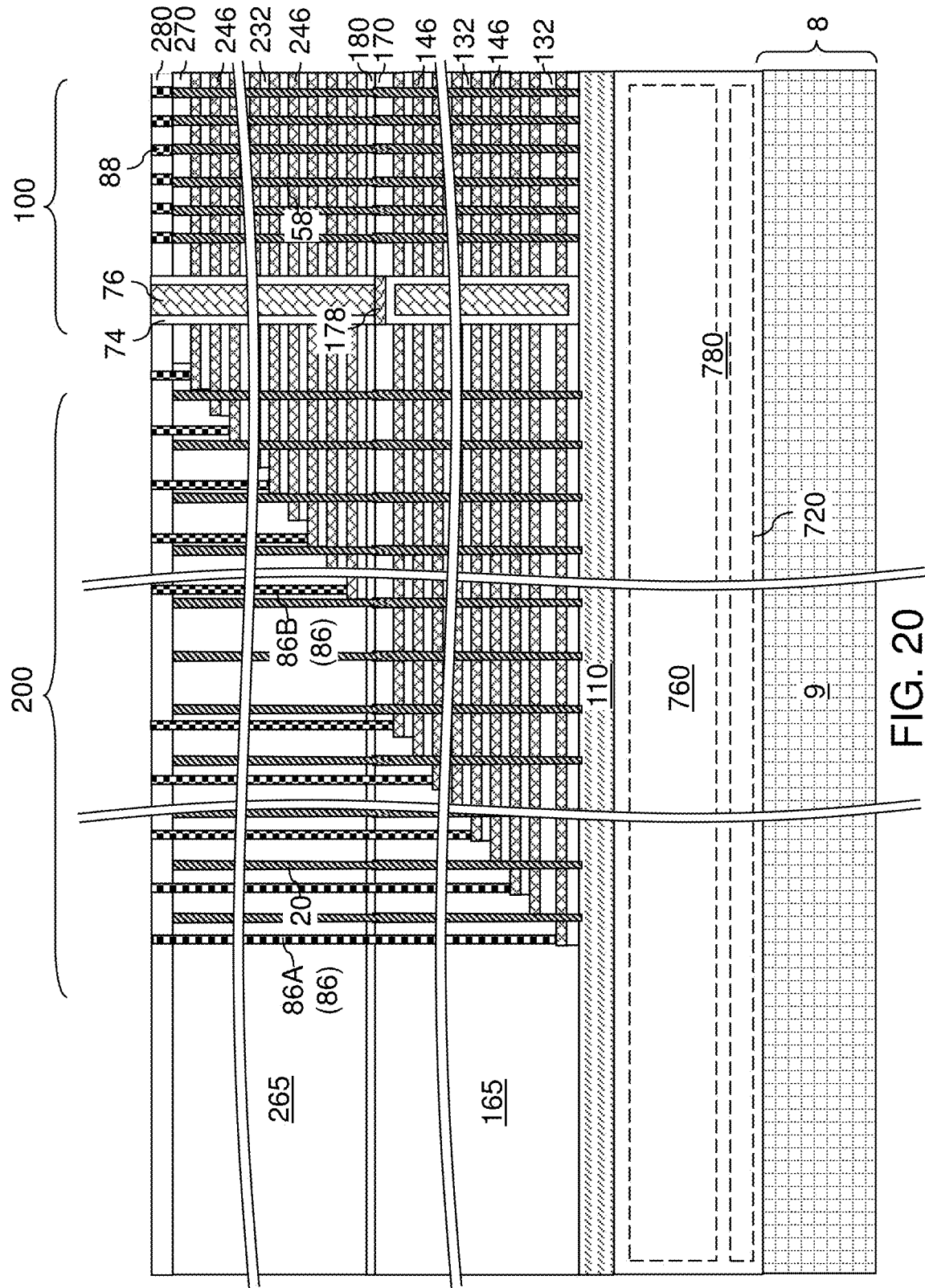
FIG. 20 is a vertical cross-sectional view of the first exemplary structure after formation of various contact via structures according to the first embodiment of the present disclosure.

Referring to FIG. 20, various additional contact via structures (88, 86) may be formed. The additional contact via structures (88, 86) may comprise drain contact via structures 88 that are formed through the contact-level dielectric layer 280 directly on a top surface of a respective one of the drain regions 63 in the memory opening fill structures 58. Further, the additional contact via structures (88, 86) may comprise layer contact via structures 86 that are formed through a contact-level dielectric layer 280 and a second retro-stepped dielectric material portion 265 and optionally through a first retro-stepped dielectric material portion 165, and directly on a top surface of a respective electrically conductive layer (146, 246). In one embodiment, a subset of the electrically conductive layers (146, 246) may be employed as word lines, and a subset of the layer contact via structures 86 that contact the word lines can be word line contact via structures. Additional dielectric material layers (which are also referred to as upper-level dielectric material layers) and additional metal interconnect structures (e.g., bit lines in electrical contact with the drain contact via structures 88) may be formed above the contact-level dielectric material layers 280.

Figure 21A:
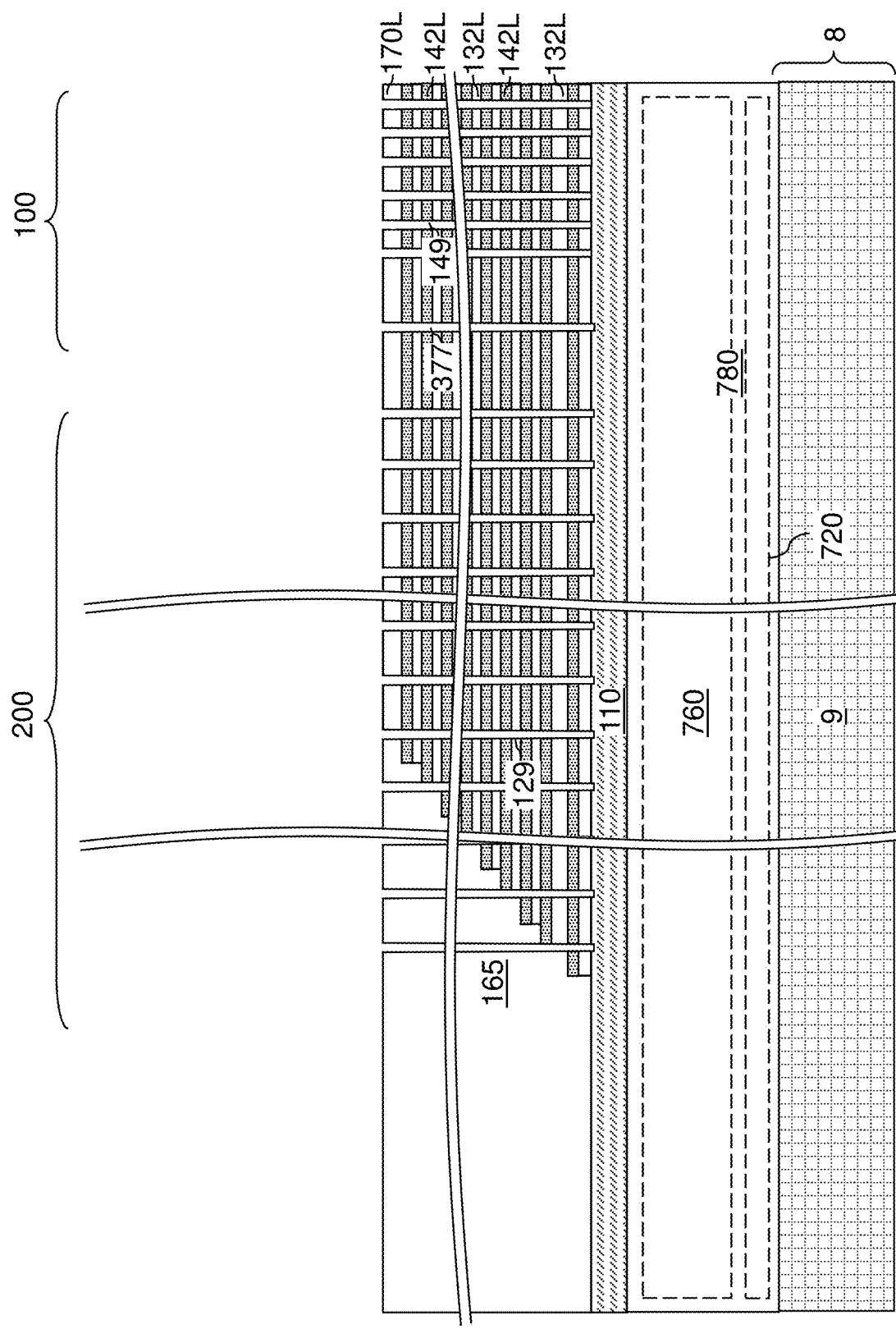
FIG. 21A is a vertical cross-sectional view of a second exemplary structure after formation of first-tier openings that include first-tier backside openings according to a second embodiment of the present disclosure.
Figure 21B:
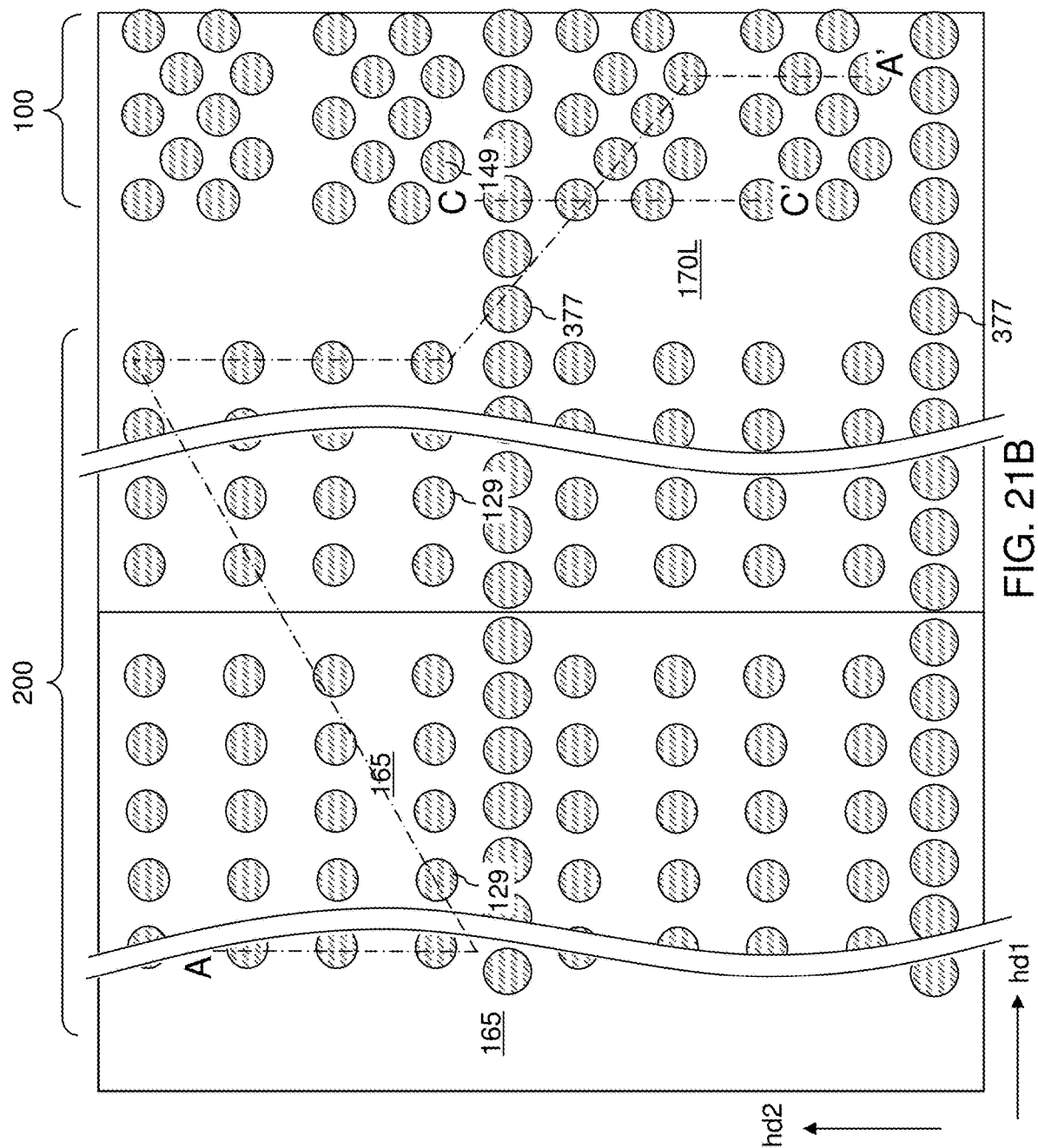
FIG. 21B is a top-down view of the second exemplary structure of FIG. 21A. The vertical plane A-A' is the plane of the vertical cross-sectional view of FIG. 21A.
Figure 21C:
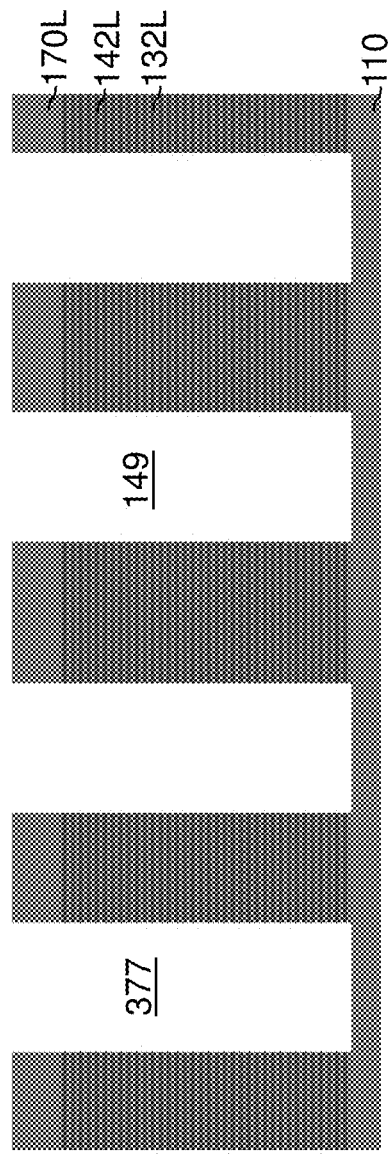
FIG. 21C is a vertical cross-sectional view of the second exemplary structure along the vertical plane C-C' of FIG. 21B.

Referring to FIGS. 21A-21C, a second exemplary structure according to a second embodiment of the present disclosure may be derived from the first exemplary structure illustrated in FIGS. 3A-3D by performing additional openings through the first vertically alternating sequence (132L, 142L) concurrently with formation of the first-tier memory openings 149 and the first-tier support openings 129. Specifically, the additional openings are formed in the strip-shaped areas that are free of the first-tier openings (149, 249) in the first exemplary structure illustrated in FIGS. 3A-3C. The additional openings that are formed in the second exemplary structure are herein referred to as first-tier backside openings 377. In an alternative embodiment, the first-tier backside openings 377 may be formed prior to or after formation of the first-tier memory openings 149 and the first-tier support openings 129. In this case, a combination of additional lithographic patterning processes and an additional anisotropic etch process may be performed to form the first-tier backside openings 377 prior to or after formation of the first-tier memory openings 149 and the first-tier support openings 129.

The first-tier backside openings 377 can be formed as rows of first-tier backside openings 377 that are arranged along the first horizontal direction hd1. Each row of first-tier backside openings 377 can be formed within a respective strip area located between neighboring clusters of memory openings 149 and between neighboring clusters of support openings 129. The lateral dimension (such as diameter) of each of the first-tier backside openings 377 may be in a range from 50% to 200%, such as from 80% to 125% of the lateral dimension (such as a diameter) of each of the first-tier memory openings 149. The lateral spacing between neighboring pairs of first-tier backside openings 377 within each row of first-tier backside openings 377 may be in a range from 5% to 100%, such as from 10% to 60%, and/or from 20% to 40%, of the lateral dimension of each first-tier backside opening 377.

In one embodiment, the first-tier memory openings 149, the first-tier support openings 129, and the first-tier backside openings 377 may be simultaneously formed, for example, by applying and patterning photoresist layer over the first continuous insulating cap layer 170L to form discrete openings therein, and by transferring the pattern of the openings in the photoresist layer through the first continuous insulating cap layer 170L and the first vertically alternating sequence (132L, 142L) by performing a first anisotropic etch process. Rows of discrete first-tier backside openings 377, rows of first-tier memory openings 149, and rows of first-tier support openings 129 can be formed through the first vertically alternating sequence (132L, 142L) by performing the first anisotropic etch process.

Figure 22B:
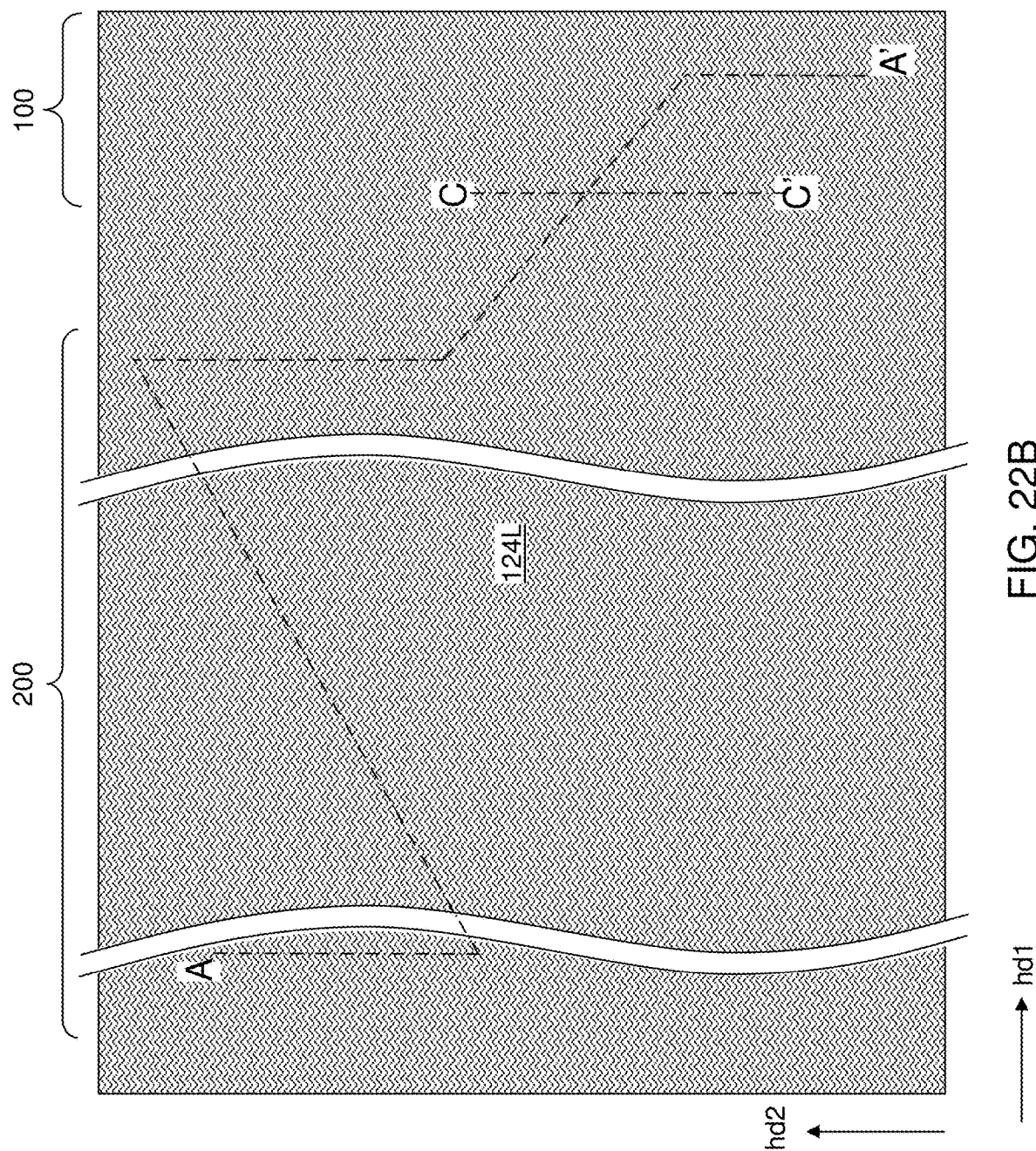
FIG. 22B is a top-down view of the second exemplary structure of FIG. 22A. The vertical plane A-A' is the plane of the vertical cross-sectional view of FIG. 22A.
Figure 22C:
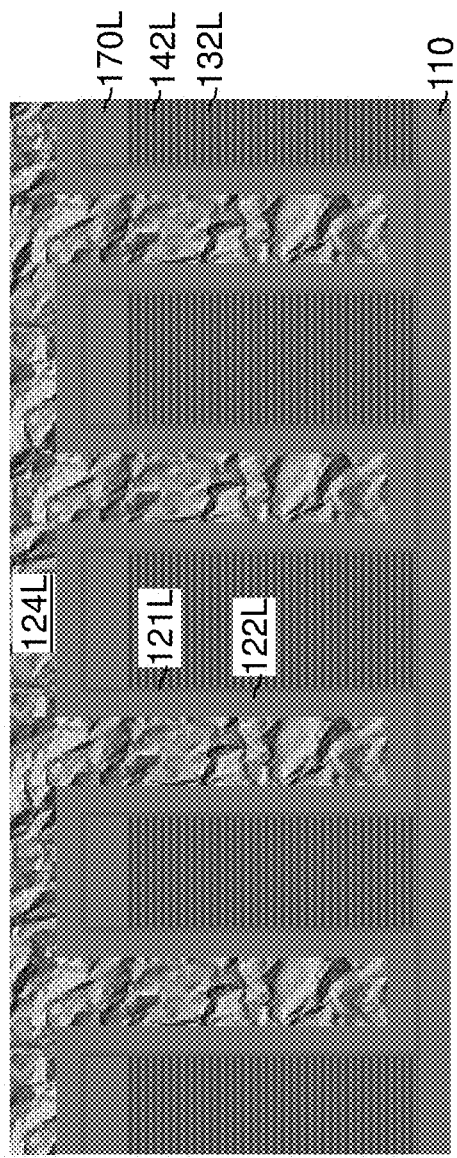
FIG. 22C is a vertical cross-sectional view of the second exemplary structure along the vertical plane C-C' of FIG. 22B.

Referring to FIGS. 22A-22C, sacrificial first-tier fill materials may be concurrently deposited in each of the first-tier openings (149, 129, 377). For example, an optional sacrificial dielectric liner layer 121L, an optional sacrificial semiconductor liner layer 122L, and a sacrificial fill material layer 124L can be sequentially deposited. The sacrificial fill material layer 124L includes a material that may be subsequently removed selective to the material of the sacrificial semiconductor liner layer 122L. The sacrificial semiconductor liner layer 122L includes a material that may be subsequently removed selected to the material of the sacrificial dielectric liner layer 121L. In an illustrative example, the sacrificial dielectric liner layer 121L may include silicon oxide, the sacrificial semiconductor liner layer 122L may include silicon or a silicon-germanium alloy in an amorphous or polycrystalline form, and the sacrificial fill material layer 124L may include a carbon based material, such as amorphous silicon or diamond-like carbon (DLC). In one embodiment, the sacrificial fill material layer 124L may comprise a material that may be subsequently removed by ashing, i.e., volatilization by oxidation. The thickness of the sacrificial dielectric liner layer 121L may be in a range from 2 nm to 20 nm, although lesser and greater thicknesses may also be employed. The thickness of the sacrificial semiconductor liner layer 122L may be in a range from 4 nm to 40 nm, although lesser and greater thicknesses may also be employed. The sacrificial fill material layer 124L may fill remaining unfilled volumes of the first-tier memory openings 149, the first-tier support openings 129, and the first-tier backside openings 377.

Figure 23A:
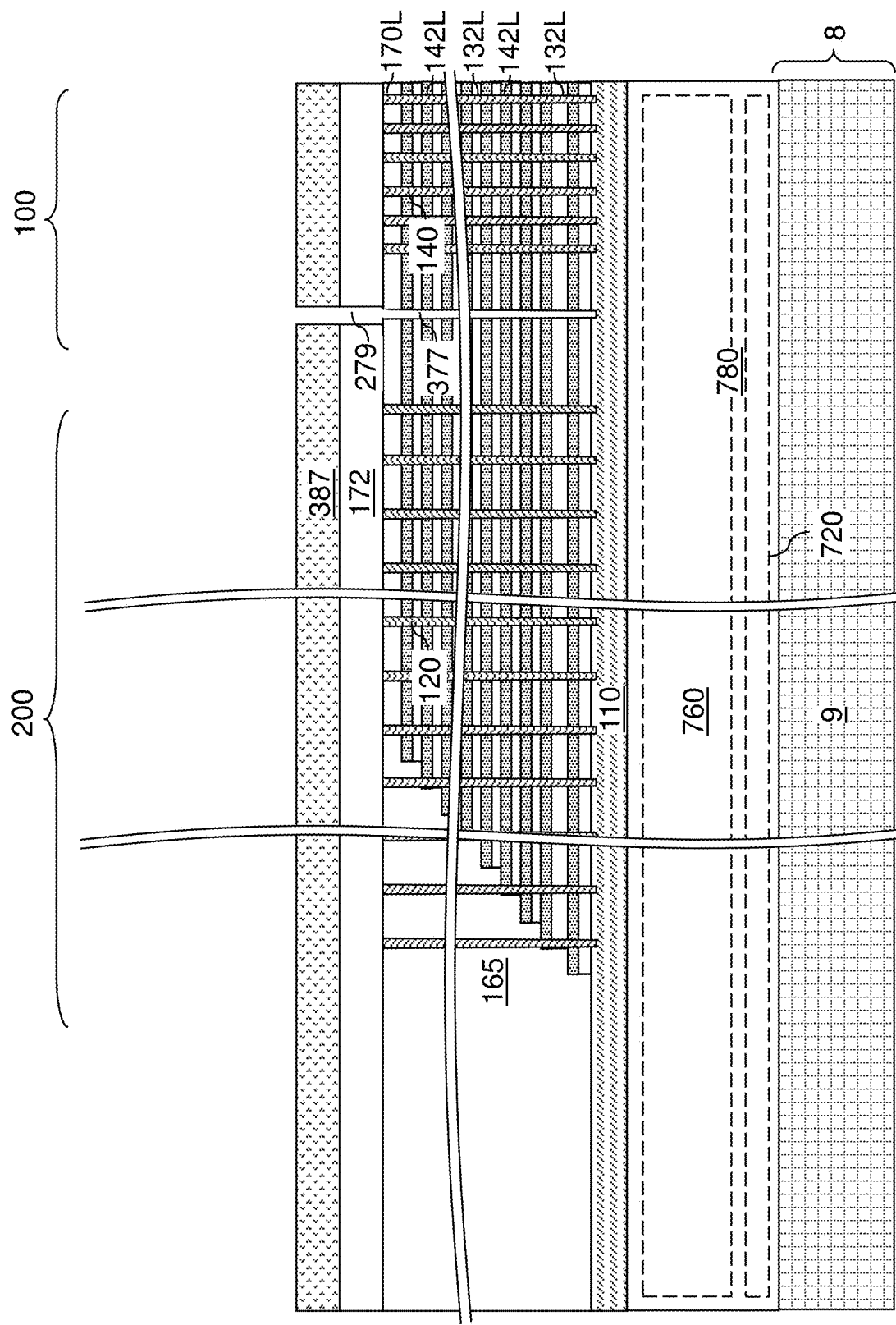
FIG. 23A is a vertical cross-sectional view of the second exemplary structure after formation and patterning of a first sacrificial capping layer and removal of sacrificial backside opening fill structures according to the second embodiment of the present disclosure.
Figure 23B:
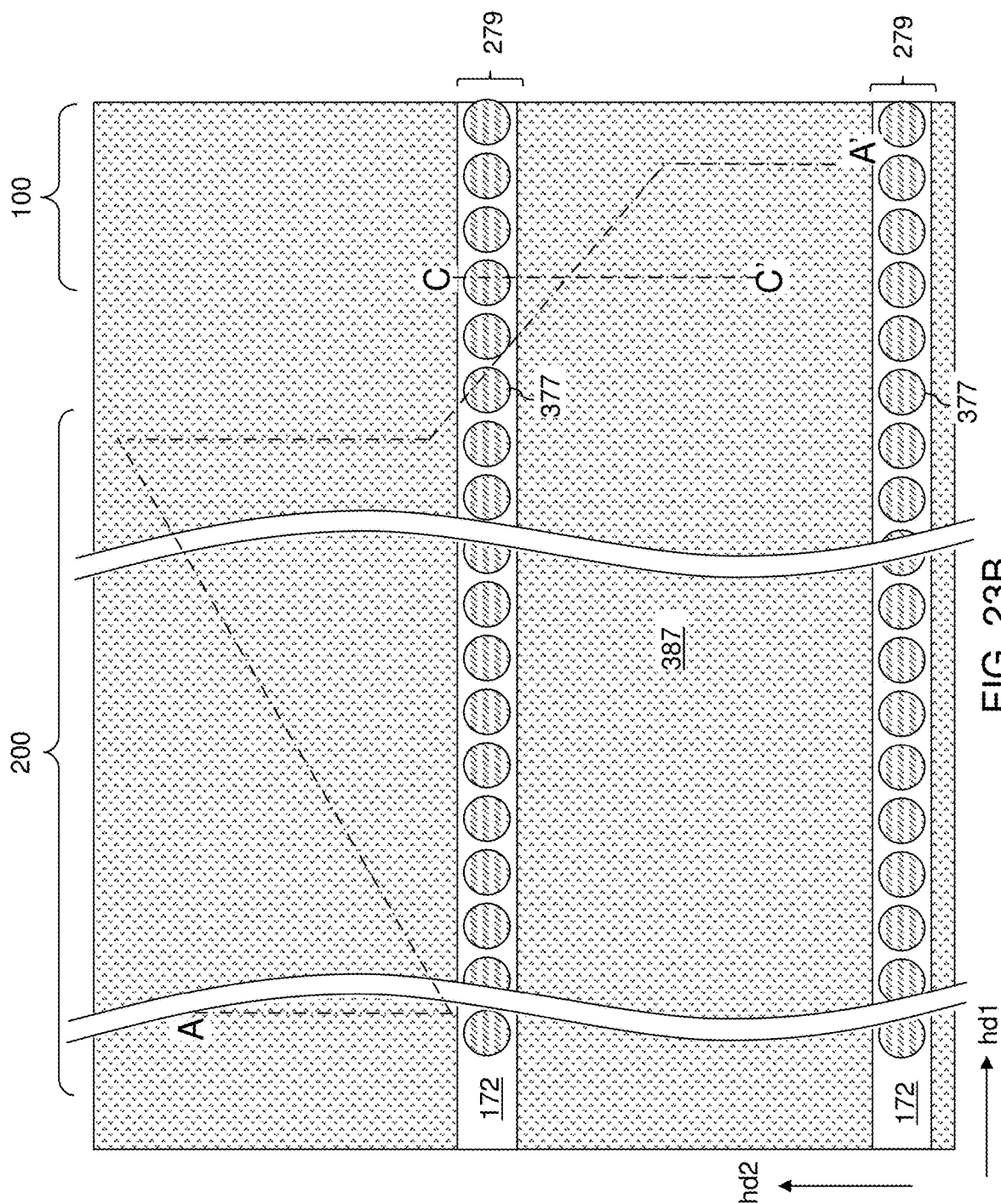
FIG. 23B is a top-down view of the second exemplary structure of FIG. 23A. The vertical plane A-A' is the plane of the vertical cross-sectional view of FIG. 23A.
Figure 23C:
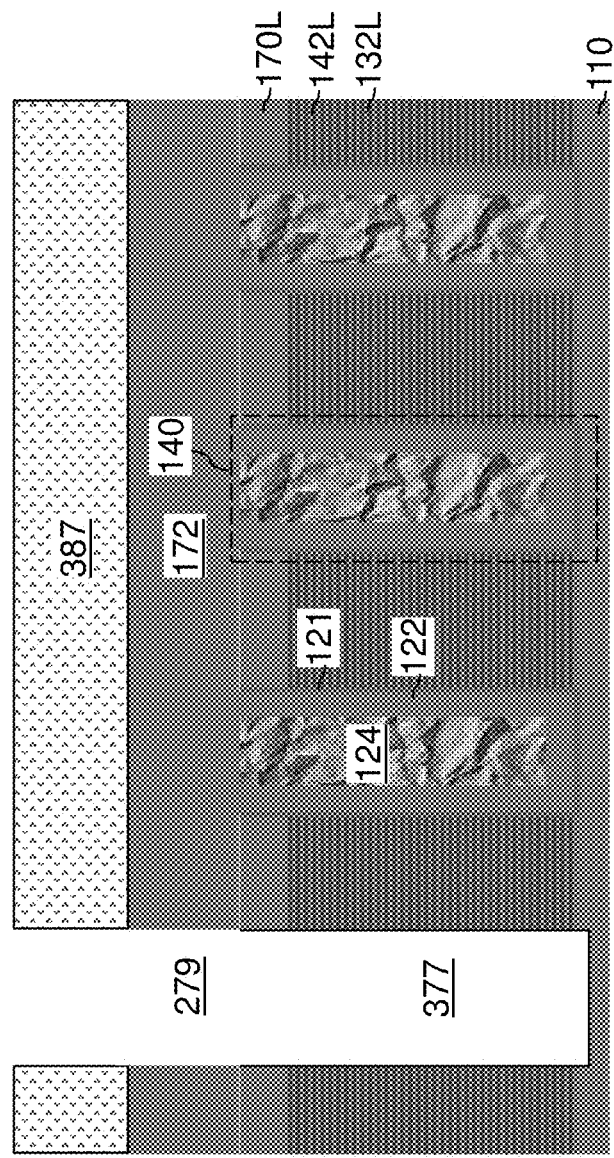
FIG. 23C is a vertical cross-sectional view of the second exemplary structure along the vertical plane C-C' of FIG. 23B.

Referring to FIGS. 23A-23C, a planarization process can be performed to remove portions of the sacrificial dielectric liner layer 121L, the sacrificial semiconductor liner layer 122L, and the sacrificial fill material layer 124L from above a horizontal plane including a top surface of the first continuous insulating cap layer 170L. The planarization process may employ a chemical mechanical polishing (CMP) process and/or at least one recess etch (i.e., etch back) process. Each remaining portion of the sacrificial dielectric liner layer 121L that remains in a first-tier opening (149, 129, 377) is herein referred to as a sacrificial dielectric liner 121. Each remaining portion of the sacrificial semiconductor liner layer 122L that remains in a first-tier opening (149, 129, 377) is herein referred to as a sacrificial semiconductor liner 122. Each remaining portion of the sacrificial fill material layer 124L that remains in a first-tier opening (149, 129, 377) is herein referred to as a sacrificial fill material portion 124. Each combination of an optional sacrificial dielectric liner 121, an optional sacrificial semiconductor liner 122, and a sacrificial fill material portion 124 that fills a first-tier memory opening 149 constitutes a sacrificial first-tier memory opening fill structure 140. Each combination of an optional sacrificial dielectric liner 121, an optional sacrificial semiconductor liner 122, and a sacrificial fill material portion 124 that fills a first-tier support openings 129 constitutes a sacrificial first-tier support opening fill structure 120. Each combination of an optional sacrificial dielectric liner 121, an optional sacrificial semiconductor liner 122, and a sacrificial fill material portion 124 that fills a first-tier memory opening 149 constitutes a sacrificial first-tier backside opening fill structure.

A first sacrificial capping layer 172 may be deposited over the first continuous insulating cap layer 170L and the first-tier retro-stepped dielectric material portion 165. The first sacrificial capping layer 172 may include a dielectric material such as silicon oxide, and may have a thickness in a range from 100 nm to 500 nm, although lesser and greater thicknesses may also be employed. In one embodiment, the first sacrificial capping layer 172 may comprise the same material as the first continuous insulating layers 132L or as the first continuous sacrificial material layers 142L. For example, the first sacrificial capping layer 172 may comprise silicon oxide, silicon nitride or a bilayer of a silicon nitride etch stop layer and a silicon oxide capping layer. Generally, the thickness of the first sacrificial capping layer 172 may be greater than one half of the lateral spacing between neighboring pairs of sacrificial first-tier backside opening fill structures.

A photoresist layer 387 can be applied over the first sacrificial capping layer 172, and can be lithographically patterned to form elongated openings that overlie a respective row of sacrificial first-tier backside opening fill structures. In one embodiment, the elongated openings in the photoresist layer 387 may have a uniform width along the second horizontal direction hd2 that is greater than the lateral dimensions of the underlying sacrificial first-tier backside opening fill structures along the second horizontal direction hd2. An anisotropic etch process can be performed to remove portions of the first sacrificial capping layer 172 that are not masked by the patterned photoresist layer 187. The first sacrificial capping layer 172 may be divided into a plurality of first sacrificial capping layers 172 that are laterally spaced apart from each other by line trenches 279. Each of the line trenches 279 may overlie a respective row of sacrificial first-tier backside opening fill structures.

Subsequently, the sacrificial first-tier backside opening fill structures can be removed from underneath the line trenches 279 between the first sacrificial capping layers by performing a sequence of etch processes. For example, the sacrificial fill material portions 124 within the sacrificial first-tier backside opening fill structure may be removed by a first etch process, which may comprise an anisotropic etch process or an isotropic etch process. The first etch process may be selective to the material of the optional sacrificial semiconductor liners 122, if present. If the sacrificial semiconductor liners 122 are present, a second etch process may be performed to remove the sacrificial semiconductor liners 122. For example, the second etch process may comprise an isotropic etch process that etches the semiconductor material of the sacrificial semiconductor liners 122 selective to the material of the optional sacrificial dielectric liners 121, if present. If the sacrificial dielectric liners 121 are present, a third etch process such as an isotropic etch process may be performed to remove the sacrificial dielectric liners 121. Voids are formed within each of the first-tier backside openings 377. A row of first-tier backside openings 377 underlies each line trench between neighboring pairs of first sacrificial capping layers 172. The photoresist layer 387 can be subsequently removed, for example, by ashing.

Figure 24A:
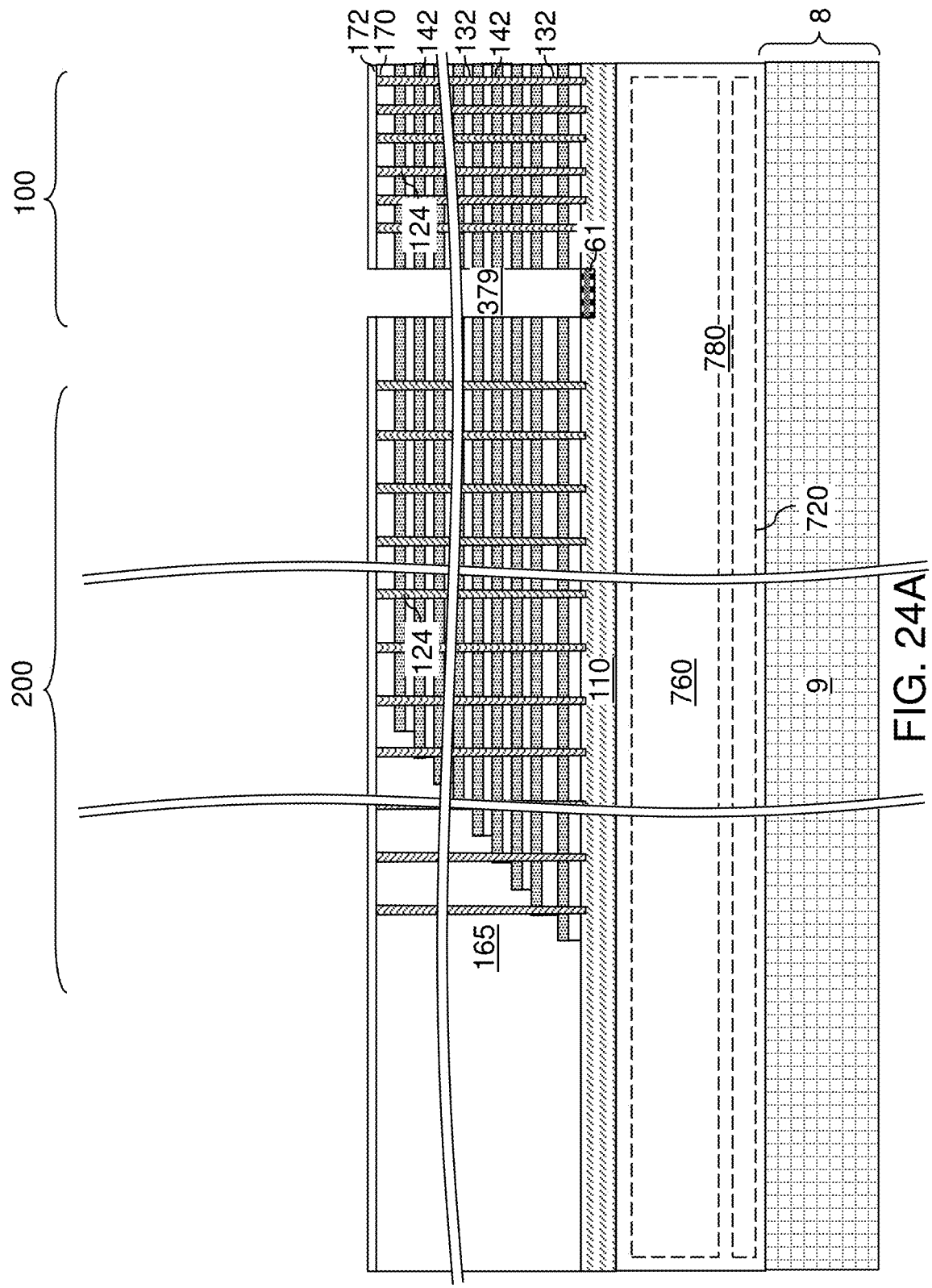
FIG. 24A is a vertical cross-sectional view of the second exemplary structure after formation and first-tier backside trenches according to the second embodiment of the present disclosure.
Figure 24B:
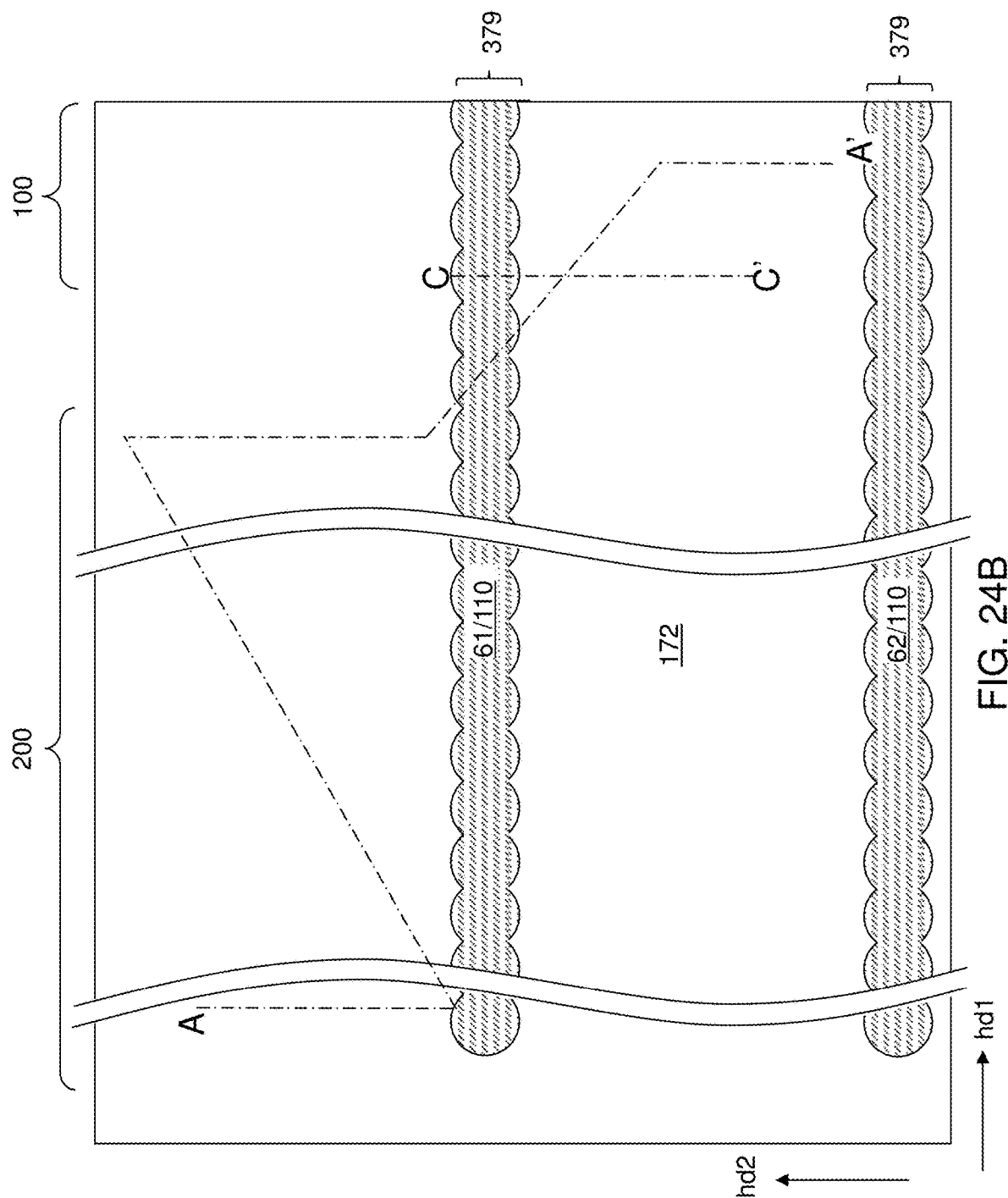
FIG. 24B is a top-down view of the second exemplary structure of FIG. 24A. The vertical plane A-A' is the plane of the vertical cross-sectional view of FIG. 24A.
Figure 24C:
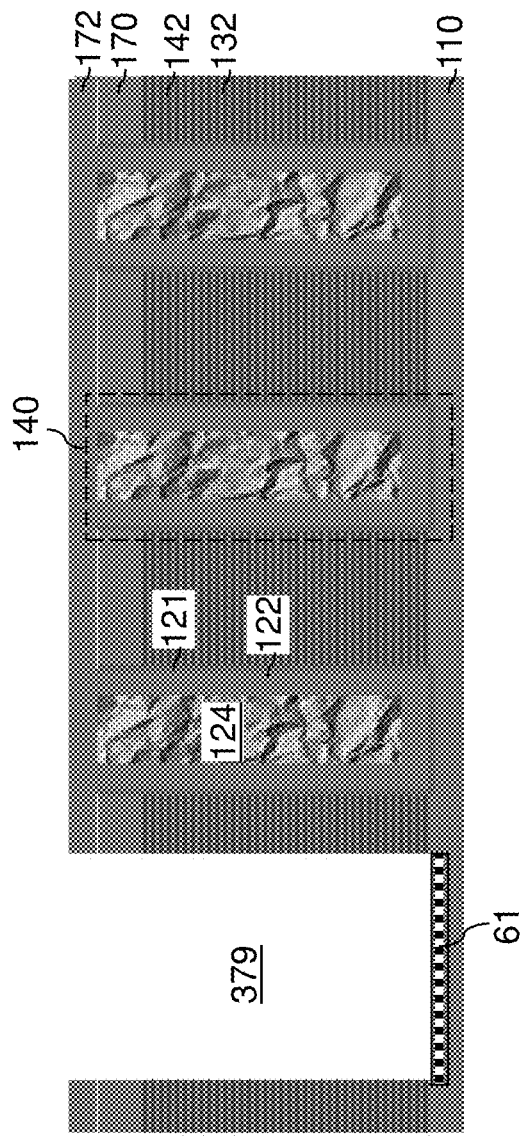
FIG. 24C is a vertical cross-sectional view of the second exemplary structure along the vertical plane C-C' of FIG. 24B.

Referring to FIGS. 24A-24C, a sequence of isotropic etch steps can be performed to laterally recess portions of the first vertically alternating sequence (132L, 142L) that are proximal to the first-tier backside openings 377. For example, a first isotropic etch step can be performed to laterally recess physically exposed sidewalls of the first continuous insulating layers 132L and the first continuous insulating cap layer 170L from around the first-tier backside openings 377, and a second isotropic etch step can be performed to laterally recess physically exposed sidewalls of the first continuous sacrificial material layers 142L. In an illustrative example, the first continuous insulating layers 132L comprise silicon oxide and the first continuous sacrificial material layers 142L comprise silicon nitride. In this case, the first isotropic etch step may be a wet etch step employing dilute hydrofluoric acid, and the second isotropic etch step may be a wet etch step employing hot phosphoric acid. The duration of the first isotropic etch step and the duration of the second isotropic etch step may be selected such that neighboring pairs of first-tier backside openings 377 merge within each row of first-tier backside openings 377 to form a respective first-tier backside trench 379. The first sacrificial capping layers 172 can be collaterally recessed during the first isotropic etch step and/or during the second isotropic etch step.

Generally, the first-tier backside openings 377 can be laterally expanded by at least one isotropic etch step. The discrete first-tier backside openings 377 in each row merge with each other to form the first-tier backside trenches 379. The first vertically alternating sequence (132L, 142L) can be divided into first-tier alternating stacks (132, 142) of first insulating layers 132 and first sacrificial material layers 142 by formation of the first-tier backside trenches 379. The first-tier alternating stacks (132, 146) laterally extend along a first horizontal direction hd1, and are laterally spaced apart from each other along a second horizontal direction hd2 by the first-tier backside trenches 379. The first continuous insulating cap layer 170L can be divided into a plurality of first insulating cap layers 170 overlying a respective one of the first-tier alternating stacks (132, 146). Each first-tier backside trench 379 may comprise a pair of laterally-undulating sidewalls that generally extend along the first horizontal direction hd1 and include a respective set of vertically-straight and laterally convex sidewall segments that are adjoined to each other. As used herein, a "laterally-undulating" element refers to an element of which a lateral extent has a modulation upon translation along a lengthwise direction that is perpendicular to the direction of the lateral extent. In one embodiment, dopants of the second conductivity can be implanted into physically exposed surface portions of the semiconductor material layer 110 that underlie the first-tier backside openings 379 to form optional source regions 61.

Figure 25A:
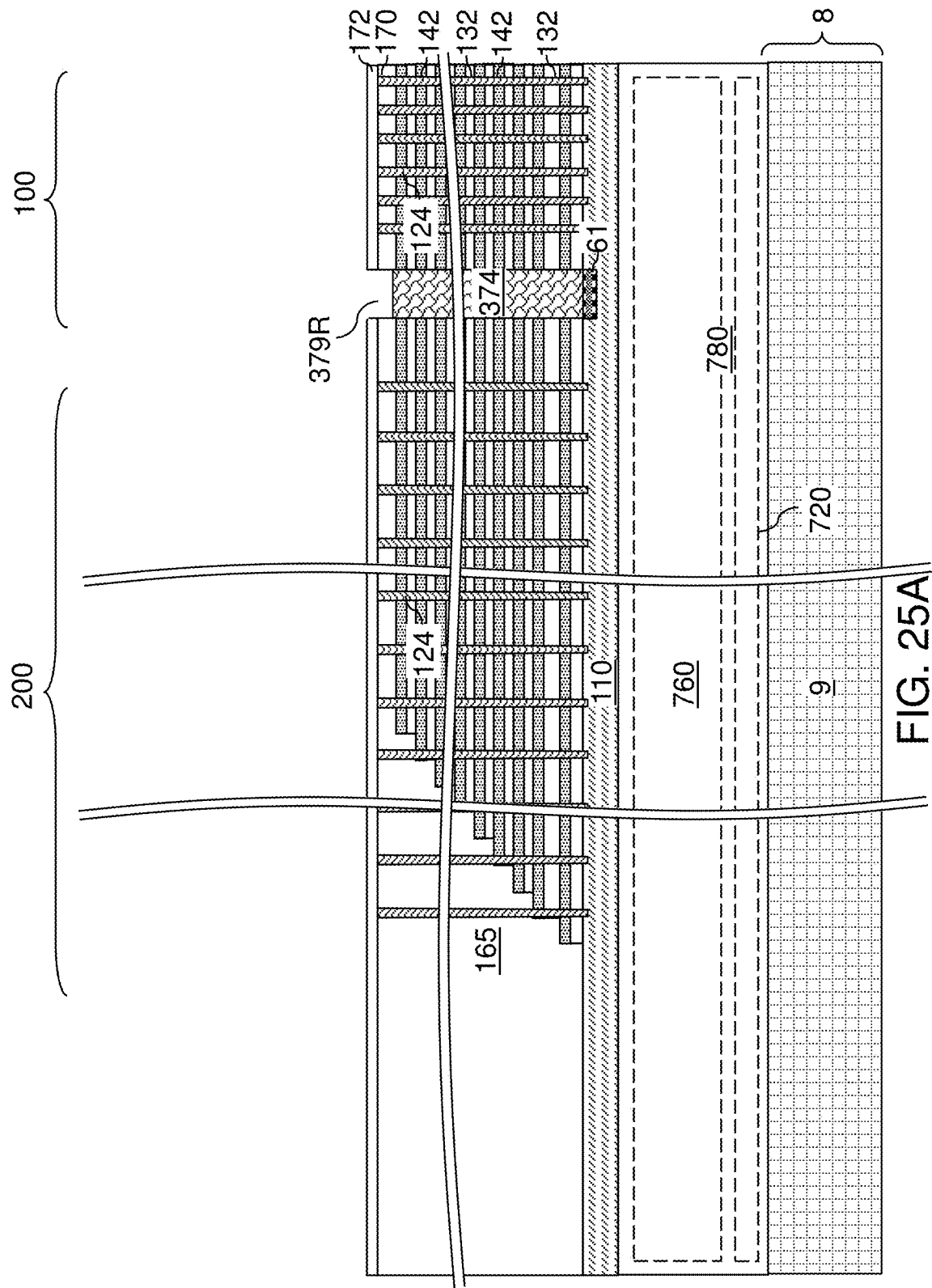
FIG. 25A is a vertical cross-sectional view of the second exemplary structure after formation of sacrificial trench fill structures according to the second embodiment of the present disclosure.
Figure 25B:
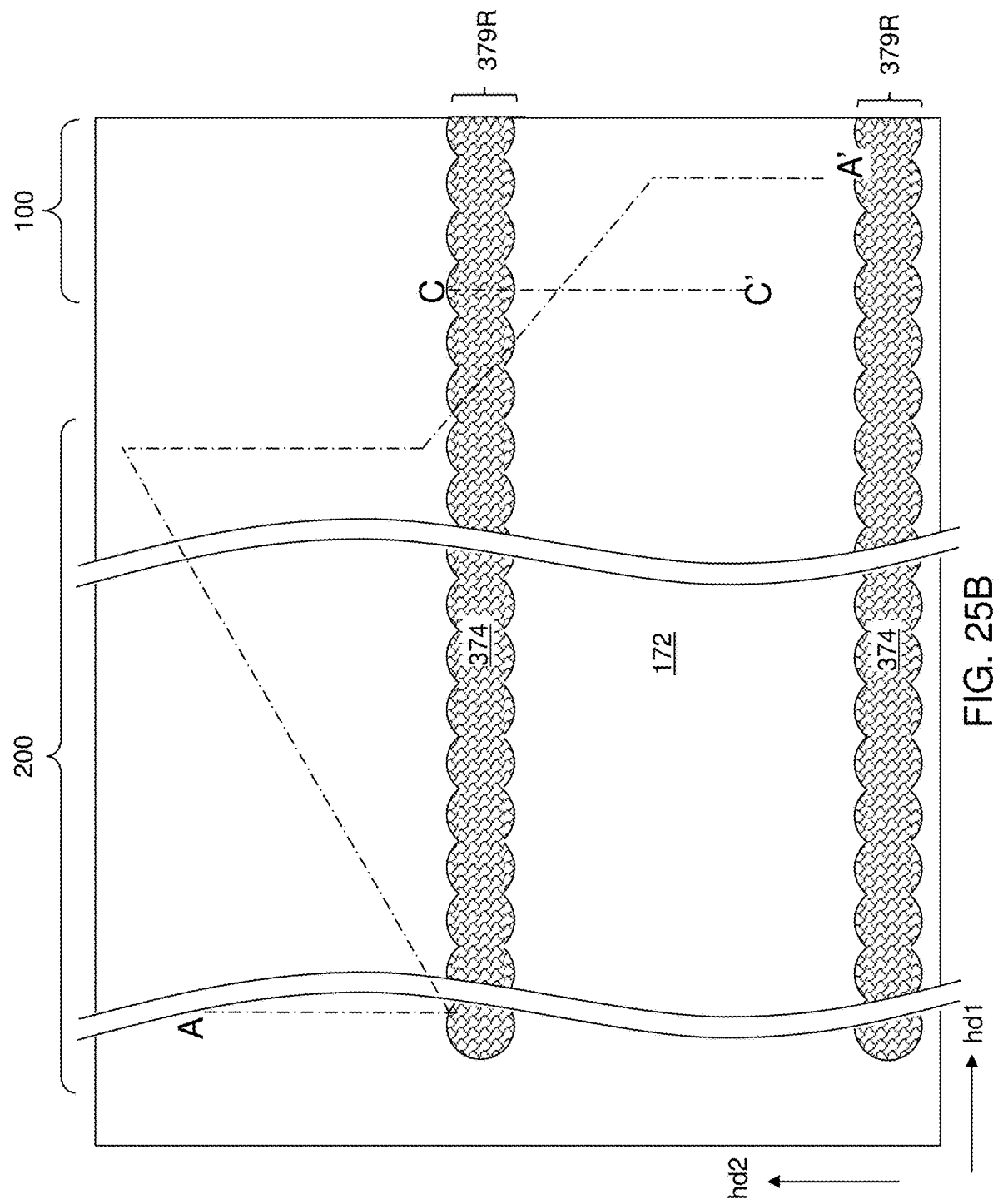
FIG. 25B is a top-down view of the second exemplary structure of FIG. 25A. The vertical plane A-A' is the plane of the vertical cross-sectional view of FIG. 25A.
Figure 25C:
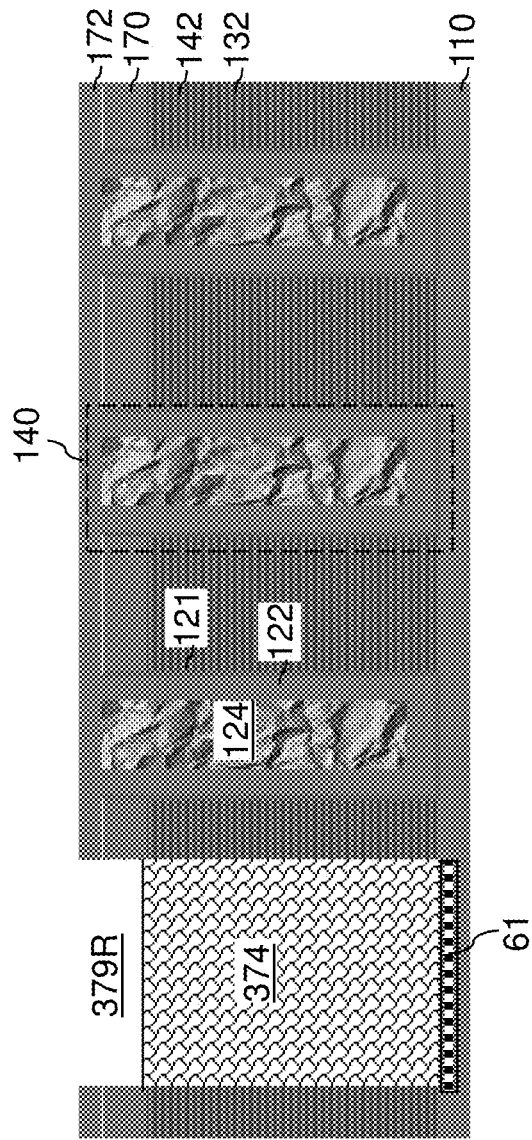
FIG. 25C is a vertical cross-sectional view of the second exemplary structure along the vertical plane C-C' of FIG. 25B.

Referring to FIGS. 25A-25C, an optional sacrificial trench liner material (not shown) and a sacrificial trench fill material can be deposited in the first-tier backside trenches 379. If employed, the sacrificial trench liner material may comprise silicon oxide having a thickness in a range from 1 nm to 6 nm. The sacrificial trench fill material may comprise amorphous silicon, a silicon-germanium alloy, borosilicate glass, or organ silicate glass. In one embodiment, the sacrificial trench fill material comprises, and/or consists essentially of, undoped amorphous silicon. Portions of the optional sacrificial trench liner material and the sacrificial trench fill material that overlie the horizontal plane including the top surfaces of the first sacrificial capping layers 172 can be removed by performing a planarization process. The planarization process may employ a chemical mechanical polishing process and/or at least one recess etch process. In case a sacrificial trench liner material is employed, each remaining portion of the sacrificial trench liner material that remains in a first-tier backside trench 379 constitutes a sacrificial trench liner (not shown). Each remaining portion of the sacrificial trench fill material that remains in a first-tier backside trench 379 constitutes a sacrificial trench fill structure 374.

The sacrificial trench fill structure 374 can be vertically recessed by performing a recess etch process. The duration of the recess etch process can be selected such that top surfaces of the sacrificial trench fill structures 374 are formed below the horizontal plane including the top surfaces of the first insulating cap layers 170 and above the horizontal plane including the bottom surfaces of the first insulating cap layer 170. An elongated recess 379R having a laterally-undulating width can be formed above each recessed top surface of the sacrificial trench fill structures 374.

Figure 26C:
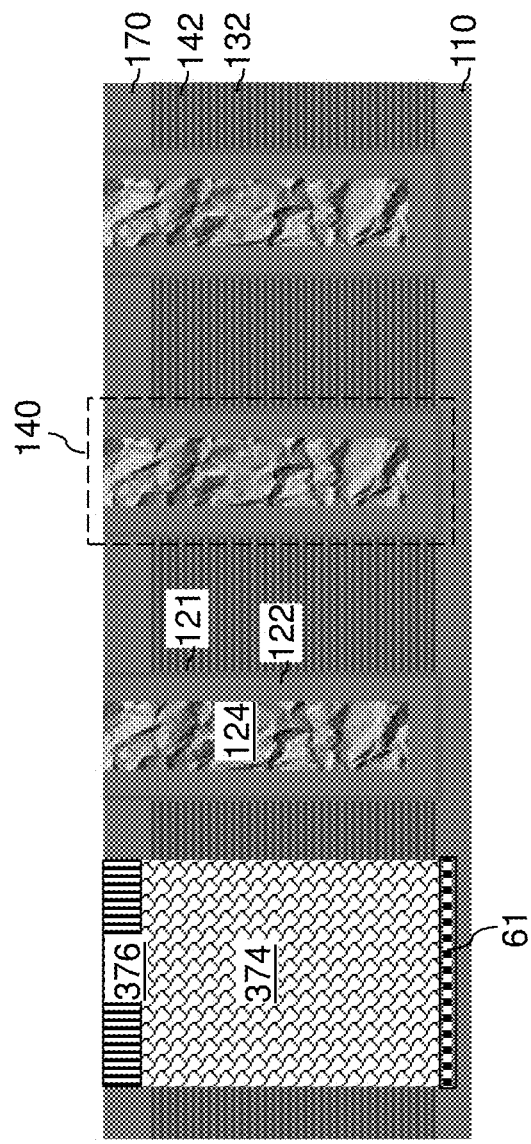
FIG. 26C is a vertical cross-sectional view of the second exemplary structure along the vertical plane C-C' of FIG. 26B.

Referring to FIGS. 26A-26C, a bridge material for subsequently forming bridge structures can be deposited in the line-shaped recesses 379R that overlie the sacrificial trench fill structures 374. In one embodiment, the bridge material comprises a material providing high etch resistance to wet etch chemicals to be subsequently employed to remove cylindrical bottom portions of the memory films and the first sacrificial material layers 142. For example, in case the first sacrificial material layers 142 comprise silicon nitride, the bridge material may comprise a material providing high etch resistance to hot phosphoric acid that can be subsequently employed to remove silicon nitride in a wet etch process. In case the memory films 50 comprise silicon oxide layers, the bridge material may comprise a material providing high etch resistance to dilute hydrofluoric acid that can be subsequently employed to remove silicon oxide in the memory films 50. In one embodiment, the bridge material may comprise a material having a higher Young's modulus than the materials of the first insulating layers 132 and the first insulating cap layers 170. For example, the bridge material may comprise, and/or may consist essentially of, a semiconductor material or a conductive material (such as a metallic material). In one embodiment, the bridge material comprises a heavily doped silicon material such as a boron-doped amorphous silicon. The bridge material may be doped to change etch resistance to an etch chemistry to be subsequently employed. For example, in case the sacrificial fill material layer 124L comprises amorphous silicon, the bridge material may comprise boron-doped amorphous silicon that provides high etch resistance in a wet etch process employing trimethyl-2 hydroxyethyl ammonium hydroxide (TMY) or tetramethylammonium hydroxide (TMAH) which etch undoped amorphous silicon at a high etch rate. In one embodiment, the bridge material may be deposited to fill the entire volumes of the line-shaped recesses 379R, and may be vertically recessed selective to the first sacrificial capping layer 172 such that top surfaces of remaining portions of the bridge material are formed at or about the horizontal plane including the top surfaces of the first insulating cap layers 170. Each portion of the bridge material that is formed in upper region 379R of a respective first-tier backside trench 379 is herein referred to as a bridge material matrix 376. The first sacrificial capping layer 172 may be subsequently removed, for example, by selective etching.

While the embodiment is described above in which the vertical recess distance is the same over the entirety of the sacrificial trench fill structures 374, embodiments are expressly contemplated herein in which an etch mask layer and an additional etch process are employed to increase the vertical recess distance for the sacrificial trench fill structures 374 in the staircase region 200 without increasing the vertical recess distance in the memory array region 100. In this case, each bridge material matrix 376 may be formed with a thinner portion having a first thickness in the memory array region 100 and, and a thicker portion having a second thickness in the staircase region 200. The second thickness is greater (e.g., 10% to 500% greater) than first thickness. Thus, each bridge material matrix 376 may have a first thickness which is similar to the thickness of layer 170 in the memory array region 100 and a greater second thickness in the staircase region 200. In another alternative embodiment, the bridge material matrix 376 is formed only in the staircase region 200 and is omitted in the memory array region 100.

A fill material stack (374, 376) comprising an optional sacrificial trench liner (not shown), a sacrificial trench fill structure 374, and a bridge material matrix 376 can be formed in each of the first-tier backside trenches 379. In one embodiment, a touch-up chemical mechanical polishing process may be performed so that top surfaces of the fill material stacks (374, 376) are formed within the horizontal plane including the top surfaces of the first insulating cap layers 170. In one embodiment, each of the bridge material matrices 376 may have a respective pair of laterally-undulating sidewalls that generally extend along the first horizontal direction hd1, and comprising a plurality of vertically-straight and laterally convex sidewall segments that are adjoined to each other. The laterally-undulating sidewalls of the bridge material matrices 376 may contact a laterally-undulating sidewall of a respective first insulating cap layer 170 including a respective plurality of vertically-straight and laterally concave surface segments that are adjoined to each other. In one embodiment, each of the bridge material matrices 376 may have a respective pair of bottom edges that are adjoined to a sidewall of a respective one of the first insulating cap layers 170 and laterally extending generally along the first horizontal direction hd1 with a lateral undulation along the second horizontal direction hd2.

Generally, the bridge material matrices 376 can be formed by depositing a bridge material over the sacrificial trench fill structures 374 and by removing portions of the bridge material from above a horizontal plane including top surfaces of the first insulating cap layers 170. In one embodiment, top surfaces of the bridge material matrices 376 are formed within the horizontal plane including the top surfaces of the first insulating cap layers 170. In one embodiment, the bridge material matrices 376 comprise and/or consist essentially of a semiconductor material or a metallic material. Each sacrificial trench fill structure 374 comprises a pair of laterally-undulating sidewalls including a respective set of vertically-straight and laterally convex sidewall segments that are adjoined to each other, and are vertically coincident with a respective laterally-undulating sidewall of a respective overlying bridge material matrix 376.

Figure 26D:
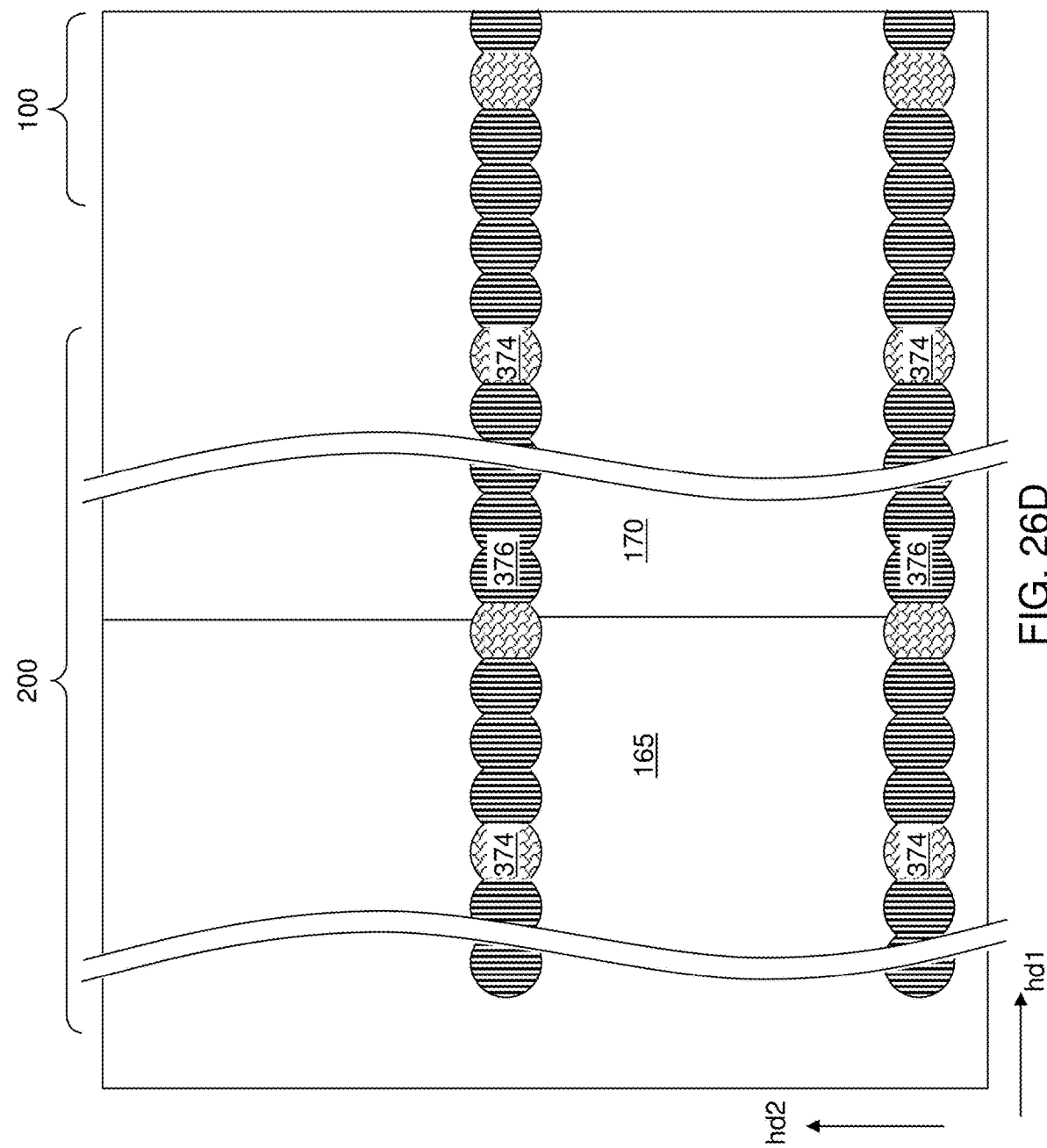
FIG. 26D is a top-down view of an alternative embodiment of the second exemplary structure

Referring to FIG. 26D, an alternative embodiment of the second exemplary structure can be derived from the second exemplary structure illustrated in FIGS. 25A-25C by forming rows of vertical recesses in an upper portion of each of the sacrificial trench fill structure 374. The bridge material described with reference to FIGS. 26A-26C may be deposited in the rows of vertical recesses, and excess portions of the bridge material may be removed from above the horizontal plane including the top surface of the first insulating cap layer 170 by performing a planarization process. In this case, a plurality of bridge material matrices 376 that are laterally spaced apart along the first horizontal direction hd1 may be formed in an upper portion of each of the sacrificial trench fill structures 374.

While the embodiment is described above in which the vertical recess distance is the same across all recessed regions of the sacrificial trench fill structures 374 and all of the bridge material matrices 376 are formed with a same thickness, embodiments are expressly contemplated herein in which an etch mask layer and an additional etch process are employed to increase the vertical recess distance for the sacrificial trench fill structures 374 in the staircase region 200 without increasing the vertical recess distance in the memory array region 100. In this case, a first subset of the bridge material matrices 376 may be formed in the memory array region 100 with a first thickness, and second subset of the bridge material matrices 376 may be formed in the staircase region 200 with a second thickness, which may be greater than (e.g., 10% to 500% greater) the first thickness. Thus, each bridge material matrix 376 may have a first thickness which is similar to the thickness of layer 170 in the memory array region 100 and a greater second thickness in the staircase region 200. In another alternative embodiment, the bridge material matrices 376 are formed only in the staircase region 200 and are omitted in the memory array region 100.

Figure 27A:
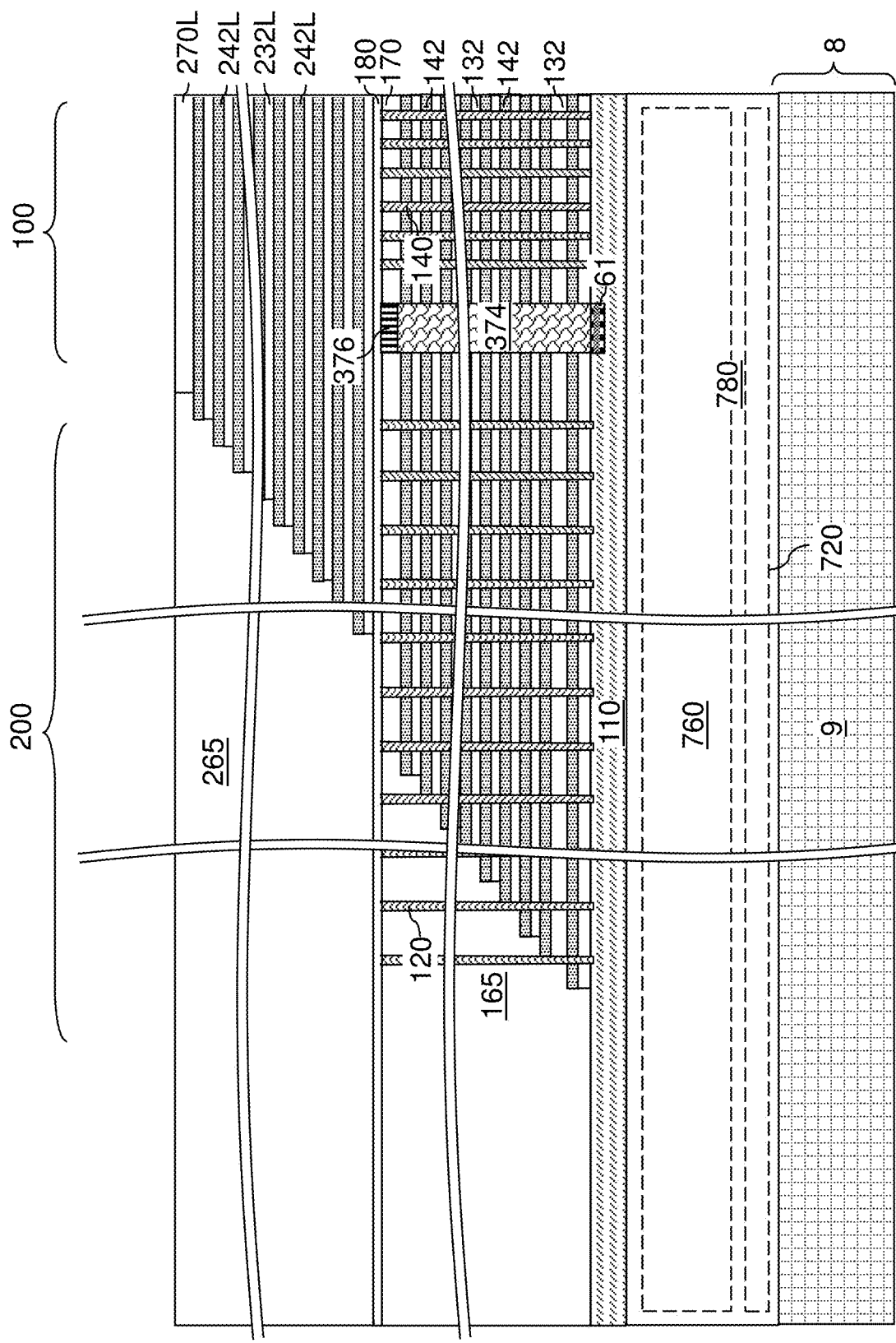
FIG. 27A is a vertical cross-sectional view of the second exemplary structure after formation of a second vertically alternating sequence of second continuous insulating layers and second continuous sacrificial material layers, second stepped surfaces, and a second-tier retro-stepped dielectric material portion according to the second embodiment of the present disclosure.
Figure 27B:
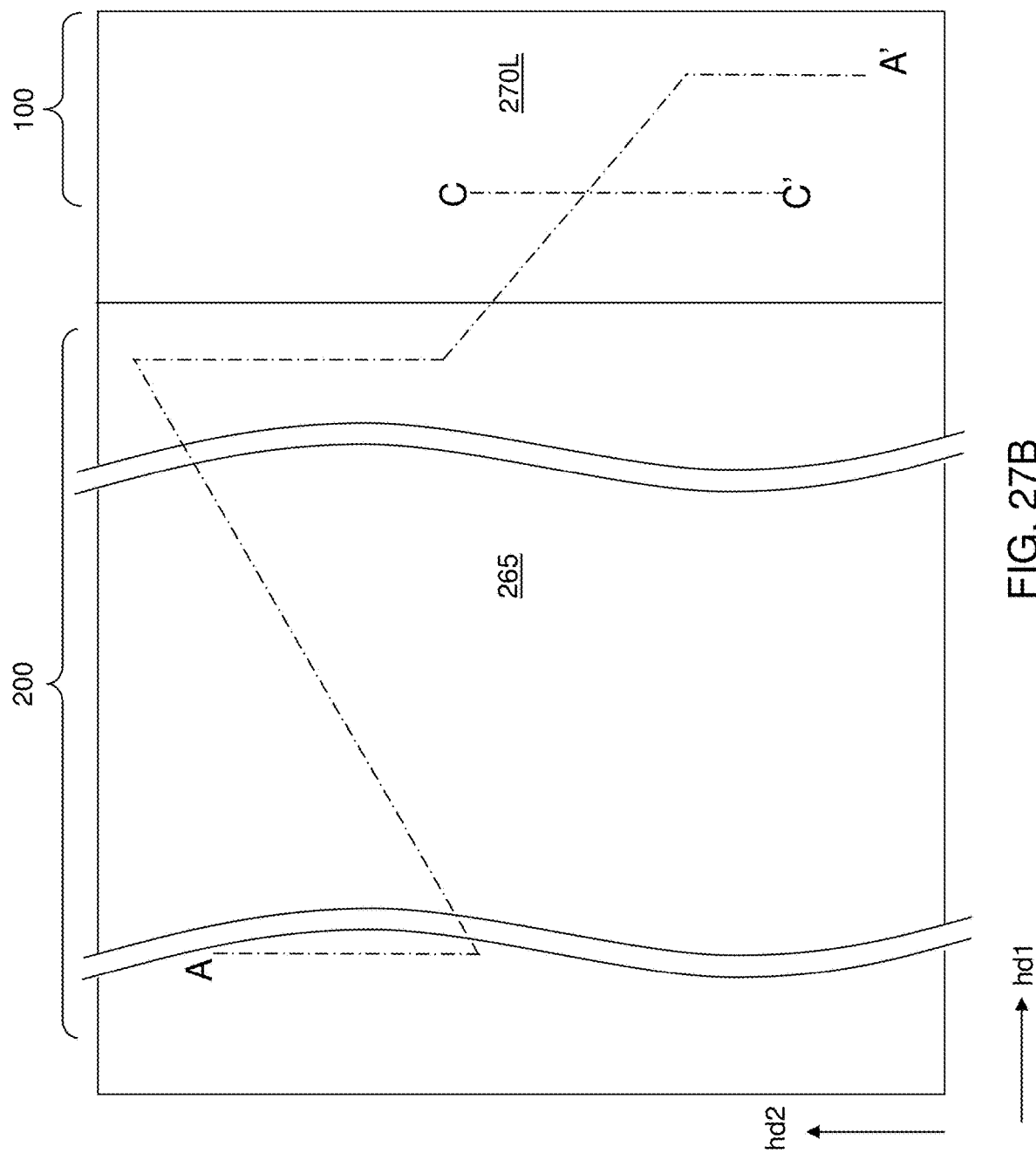
FIG. 27B is a top-down view of the second exemplary structure of FIG. 27A. The vertical plane A-A' is the plane of the vertical cross-sectional view of FIG. 27A.
Figure 27C:
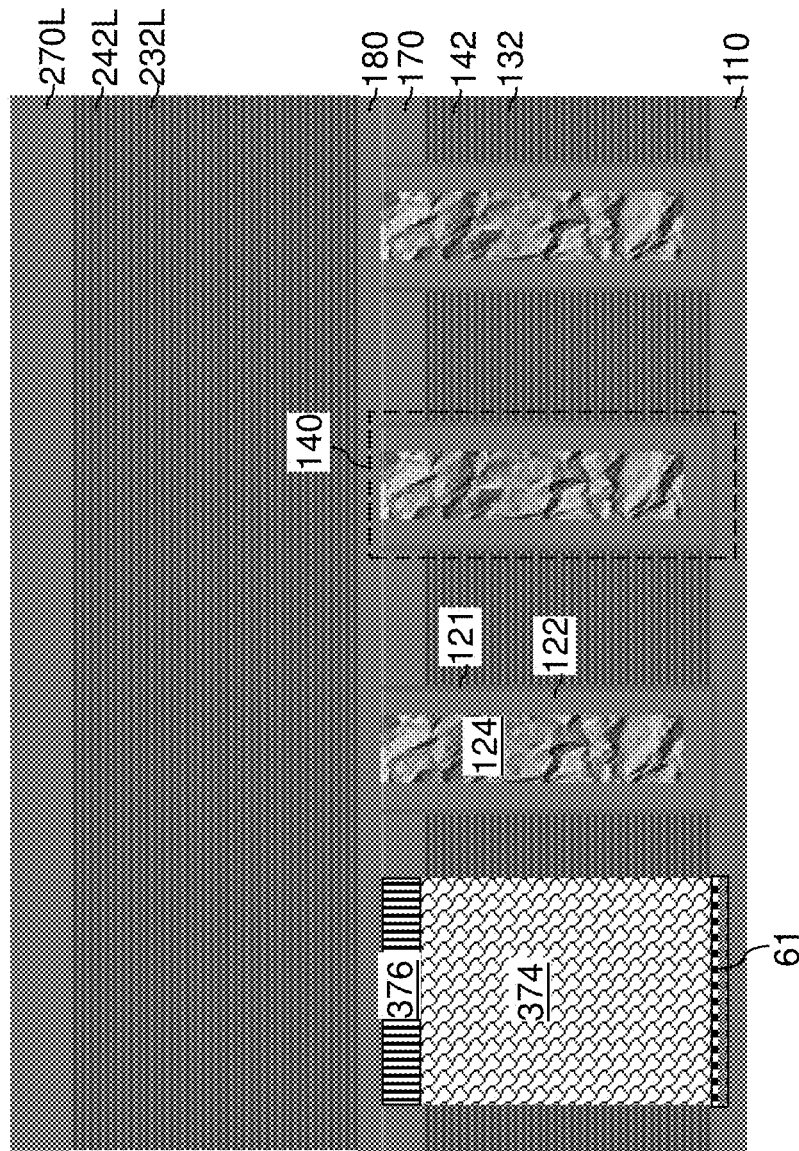
FIG. 27C is a vertical cross-sectional view of the second exemplary structure along the vertical plane C-C' of FIG. 27B.

Referring to FIGS. 27A-27C, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second continuous sacrificial material layers 242L includes is a sacrificial material layer that includes a dielectric material and continuously extends over the entire area of the substrate 8, and may have a uniform thickness throughout. The second continuous insulating layers 232L may be referred to as second insulating layers or as insulating layers. The second continuous sacrificial material layers 242L may be referred to as second sacrificial material layers or as sacrificial material layers. The second continuous insulating layers 232L can have the same material composition and the same thickness as the first continuous insulating layers 132L. The second continuous sacrificial material layers 242L can have the same material composition and the same thickness as the first sacrificial material layers 142L. A second continuous insulating cap layer 270L can be formed over the second vertically alternating sequence (232L, 242L). In one embodiment, the second continuous insulating cap layer 270L may comprise a same material as the second continuous insulating layers 232L.

Second stepped surfaces can be formed within the staircase region 200. The areas of the second stepped surfaces are laterally offset from the first stepped surfaces along the first horizontal direction hd1. In one embodiment, the first stepped surfaces of the first-tier alternating stacks (132, 142) can be formed in an area that is not covered by patterned portions of the second vertically alternating sequence (232L, 242L). Generally, the methods employed to form the first stepped surfaces of the first vertically alternating sequence (132L, 142L) may be performed with any needed changes to form the second stepped surfaces.

A second stepped cavity can be formed above a second stepped cavity. A second dielectric fill material (such as undoped silicate glass or a doped silicate glass) can be deposited in the second stepped cavity. The second dielectric fill material can be planarized to remove excess portions of the second dielectric fill material from above the horizontal plane including the top surface of the second continuous insulating cap layer 270L. A remaining portion of the second dielectric fill material that fills the second stepped cavity constitutes a second-tier retro-stepped dielectric material portion 265. Thus, the second-tier retro-stepped dielectric material portions 265 are formed on the second vertically alternating sequence (232L, 242L).

Figure 28A:
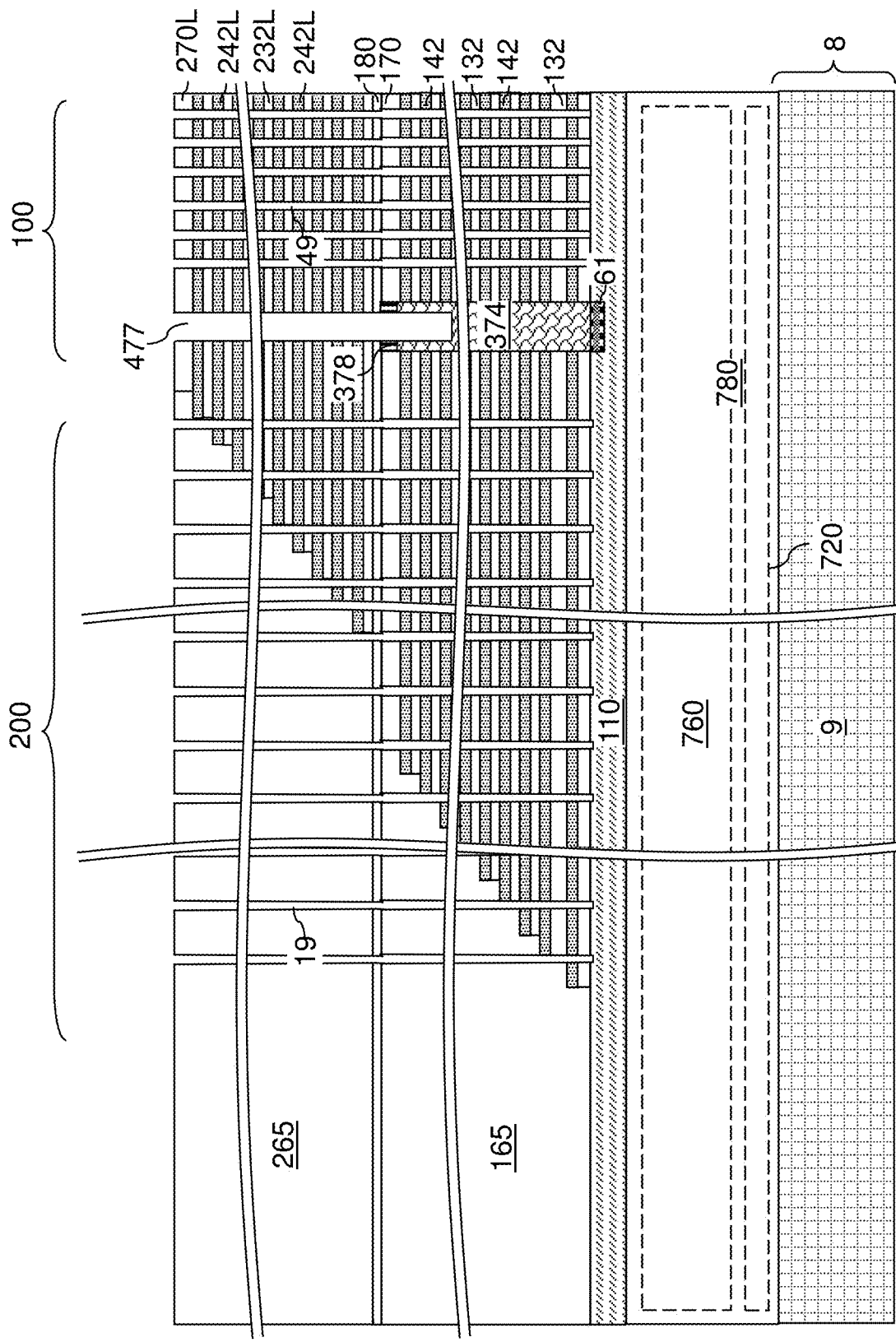
FIG. 28A is a vertical cross-sectional view of the second exemplary structure after formation of second-tier openings including second-tier backside openings and after patterning the bridge material matrices into perforated bridge structures according to the second embodiment of the present disclosure.
Figure 28B:
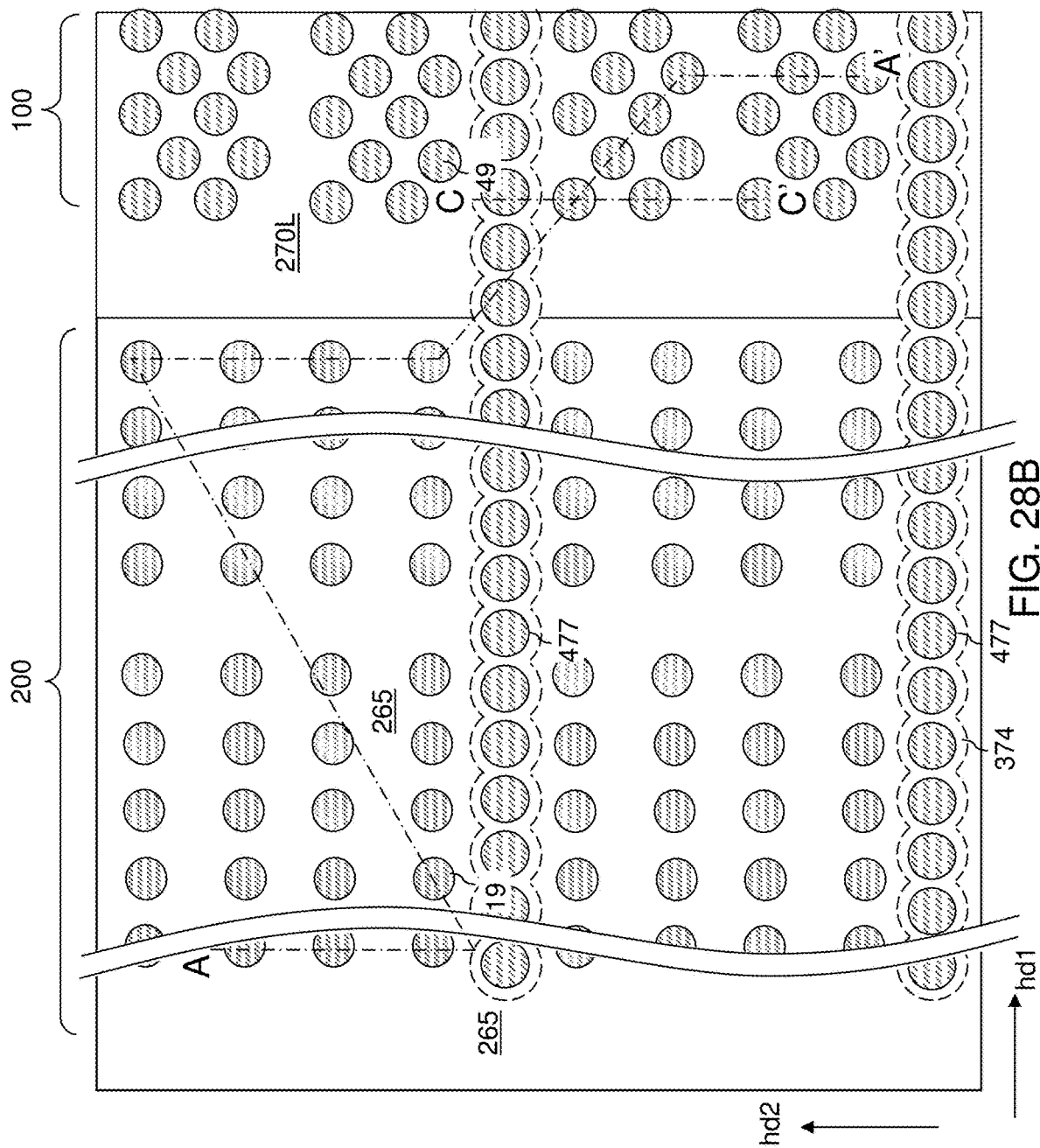
FIG. 28B is a top-down view of the second exemplary structure of FIG. 28A. The vertical plane A-A' is the plane of the vertical cross-sectional view of FIG. 28A.

Referring to FIGS. 28A-28C, various second-tier openings may be formed through the second vertically alternating sequence (232L, 242L). A photoresist layer (not shown) may be applied over the second vertically alternating sequence (232L, 242L), and may be lithographically patterned to form various openings therethrough. The pattern of openings in the photoresist layer may be the same as the pattern of the first-tier openings (149, 129, 377). The pattern of the openings in the photoresist layer can be transferred through the second vertically alternating sequence (232L, 242L) by a second anisotropic etch process to concurrently form various second-tier openings (249, 229, 477).

The various second-tier openings may include second-tier memory openings formed in the memory array regions 100 on a respective one of the sacrificial first-tier memory opening fill structures 140, second-tier support openings formed in the staircase region 200 on a respective one of the sacrificial second-tier support opening fill structures 120, and second-tier backside openings 477 that are formed in the same area as a respective first-tier backside opening 377. Each cluster of second-tier memory openings may be formed as a two-dimensional array of second-tier memory openings. The second-tier support openings comprise openings that are formed in the staircase region 200, and are subsequently employed to form support pillar structures. A subset of the second-tier support openings may be formed through a respective horizontal surface of the second stepped surfaces.

Each of the second-tier backside openings 477 can be formed through a respective bridge material matrix 376 and into a respective sacrificial trench fill structure 374. For example, the second anisotropic etch process may comprise an etch step that etches the materials of the second vertically alternating sequence (232L, 242L), and an additional etch step that etches the material of the bridge material matrices 376. As discussed above, the pattern of the first-tier backside openings 377 includes rows of discrete openings that are arranged along the first horizontal direction hd1. As such, a row of discrete openings can be formed through each bridge material matrix 376, and each bridge material matrix 376 can be converted into a perforated structure which is herein referred to as a perforated bridge structure 378 hereafter. The perforated bridge structure 378 contains a plurality of vertically-extending openings 478 therethrough. Each vertically-extending opening 478 is portion of opening 477 at the level of the perforated bridge structure 378.

Subsequently, the sacrificial first-tier memory opening fill structures 140 and the sacrificial first-tier support opening fill structures 120 can be removed from underneath the second-tier memory openings and the second-tier support openings by performing a sequence of etch processes. For example, the sacrificial fill material portions 124 within the sacrificial first-tier memory opening fill structures 140 and the sacrificial first-tier support opening fill structures 120 may be removed by a first etch process, which may comprise an anisotropic etch process or an isotropic etch process. The first etch process may be selective to the material of the optional sacrificial semiconductor liners 122, if present. If the sacrificial semiconductor liners 122 are present, a second etch process may be performed to remove the sacrificial semiconductor liners 122. For example, the second etch process may comprise an isotropic etch process that etches the semiconductor material of the sacrificial semiconductor liners 122 selective to the material of the optional sacrificial dielectric liners 121, if present. If the sacrificial dielectric liners 121 are present, a third etch process such as an isotropic etch process may be performed to remove the sacrificial dielectric liners 121. The second-tier backside openings 477 may be collaterally expanded underneath the perforated bridge structures 378 during removal of the sacrificial first-tier memory opening fill structures 140 and the sacrificial first-tier support opening fill structures 120.

Each contiguous combination of a volume of a second-tier memory opening and an underlying first-tier memory opening 149 constitutes an inter-tier memory opening 49, which is also referred to as a memory opening 49. Each contiguous combination of a volume of a second-tier support opening and an underlying first-tier support opening 129 constitutes an inter-tier support opening 19, which is also referred to as a support opening 19. Generally, the memory openings 49 and the support openings 19 can be formed through the second vertically alternating sequence (232L, 242L) and through the first-tier layer stacks (132, 142, 170).

Generally, rows of discrete backside openings 477 can be formed through the second vertically alternating sequence (232L, 242L) and through the bridge material matrices 376. Each of the bridge material matrices 376 can be converted into a respective perforated bridge structure 378 through which a respective plurality of openings vertically extends. The second-tier memory openings and the second-tier support openings may be formed during formation of the rows of discrete backside openings 477 over areas of the first-tier memory openings and the first-tier support openings, i.e., during the second anisotropic etch process.

Figure 29A:
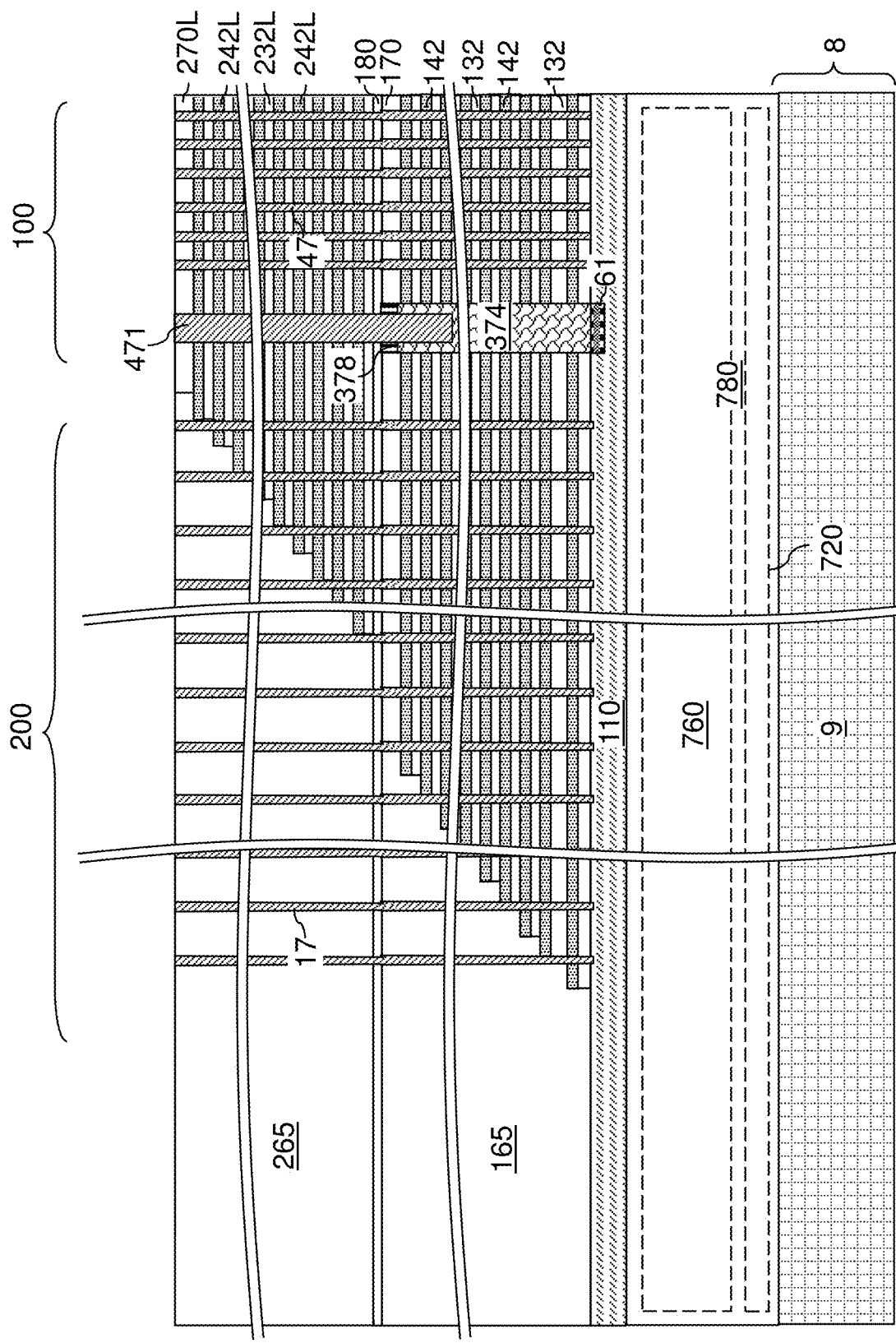
FIG. 29A is a vertical cross-sectional view of the second exemplary structure after formation of second-tier sacrificial opening fill structures according to the second embodiment of the present disclosure.
Figure 29C:
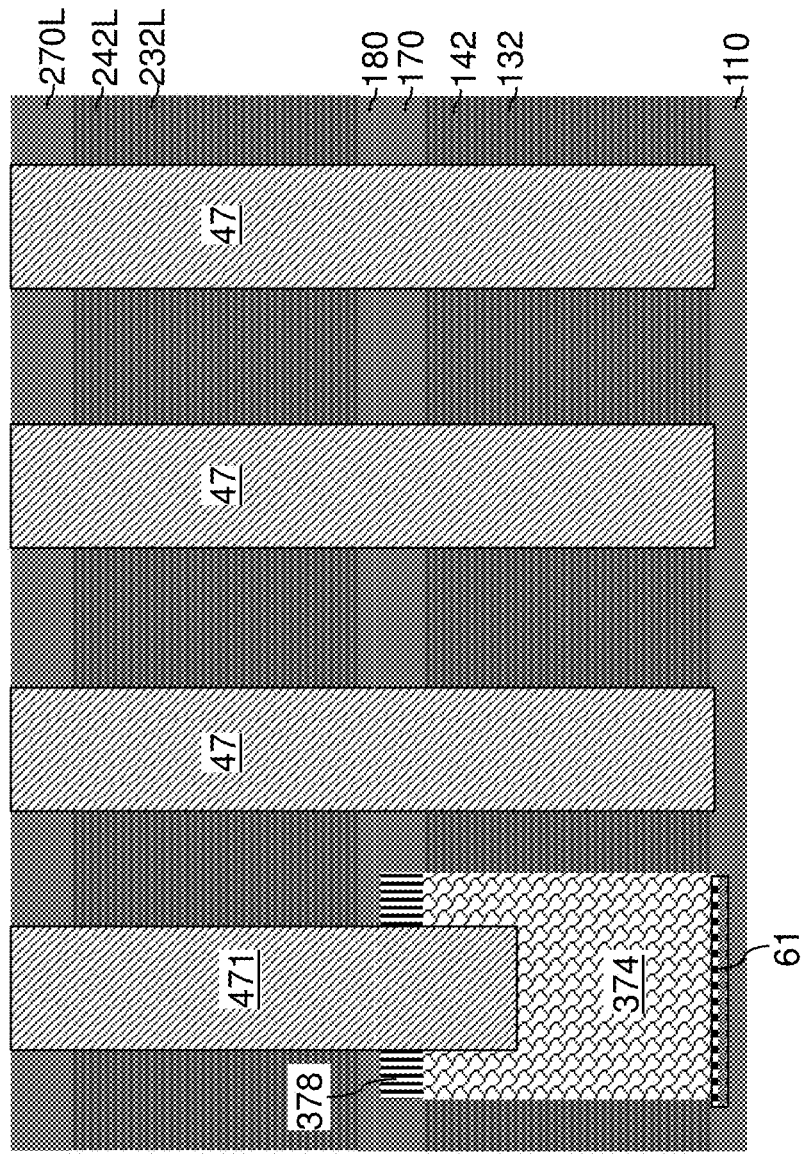
FIG. 29C is a vertical cross-sectional view of the second exemplary structure along the vertical plane C-C' of FIG. 29B.

Referring to FIGS. 29A-29C, at least one sacrificial fill material can be deposited in the inter-tier memory openings 49, the inter-tier support openings 19, and the second-tier backside openings 477. In an illustrative example, the at least one sacrificial fill material may comprise a carbon-based material, such as a material consisting essentially of carbon, such as amorphous carbon or diamond-like carbon (DLC). Excess portions of the at least one sacrificial fill material can be removed from above the horizontal plane including a top surface of the second continuous insulating cap layer 270L by performing a planarization process such as a recess etch process. Each remaining portion of the at least one sacrificial fill material filling a respective inter-tier memory opening 49 constitutes a sacrificial memory opening fill structure 47. Each remaining portion of the at least one sacrificial fill material filling a respective inter-tier support opening 19 constitutes a sacrificial support opening fill structure 17. Each remaining portion of the at least one sacrificial fill material filling a respective second-tier backside opening 477 constitutes a sacrificial backside opening fill structure 471.

Figure 30A:
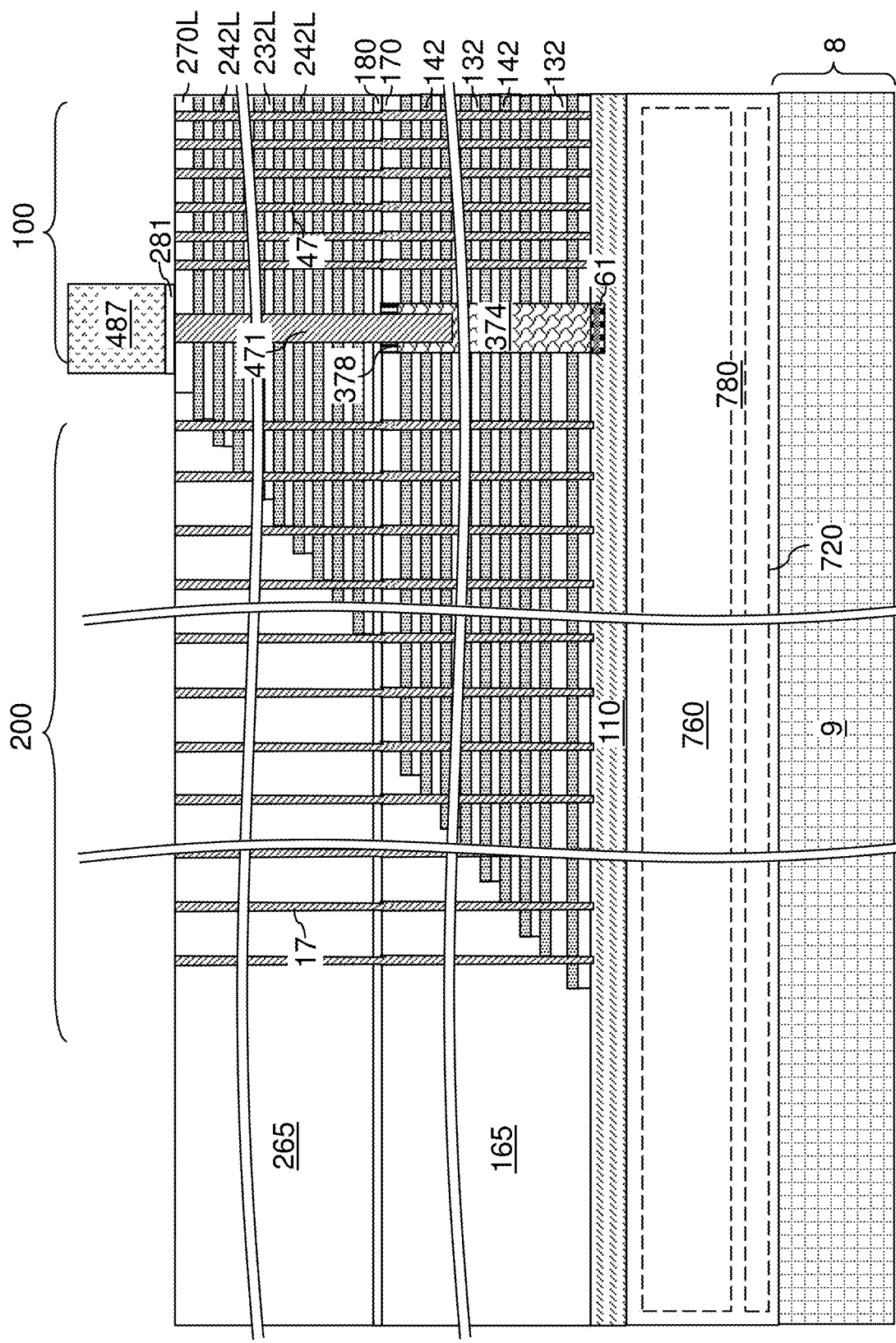
FIG. 30A is a vertical cross-sectional view of the second exemplary structure after formation of a second sacrificial capping layer and a patterned photoresist layer, and patterning of the second sacrificial capping layer according to the second embodiment of the present disclosure.
Figure 30B:
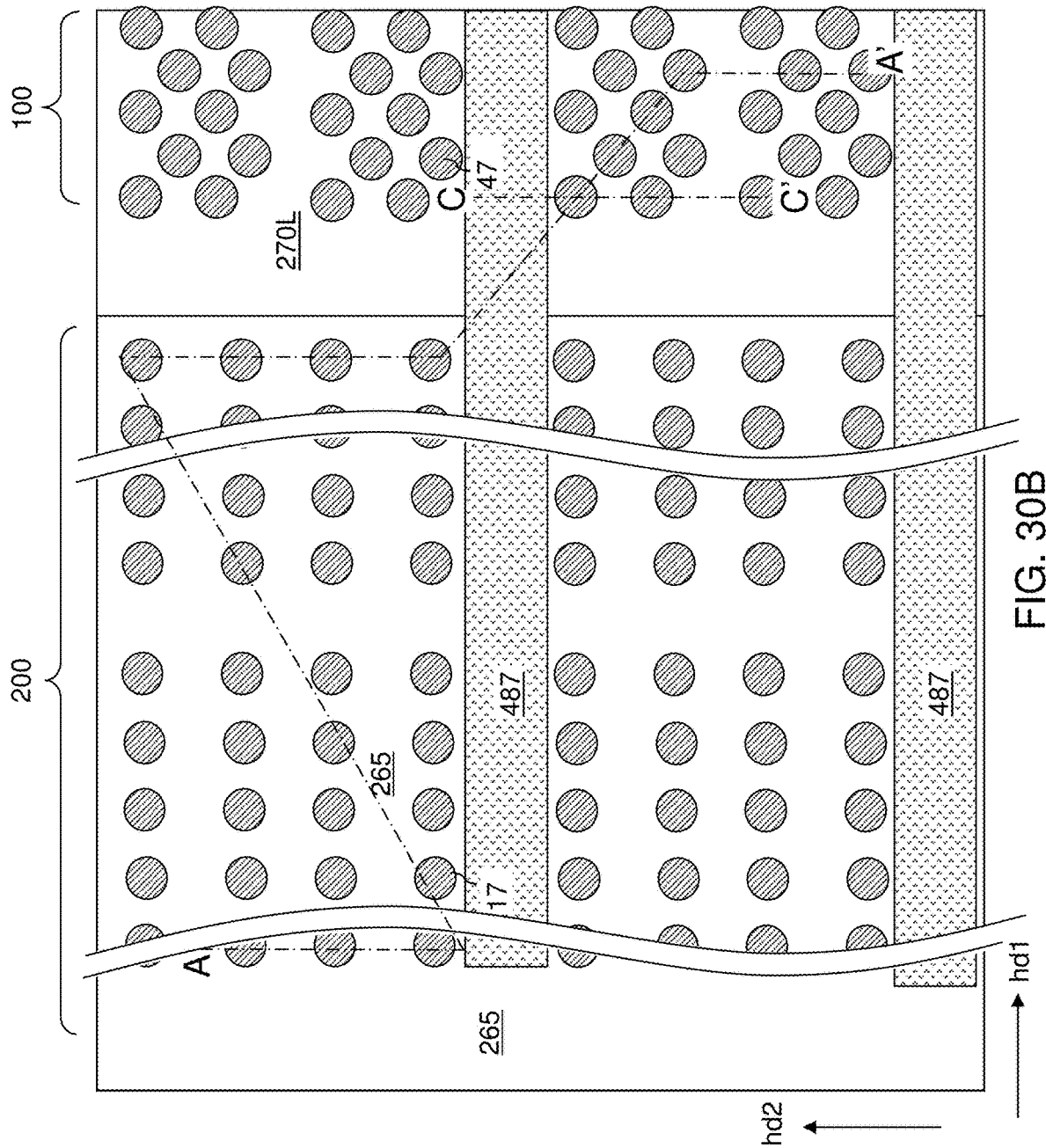
FIG. 30B is a top-down view of the second exemplary structure of FIG. 30A. The vertical plane A-A' is the plane of the vertical cross-sectional view of FIG. 30A.
Figure 30C:
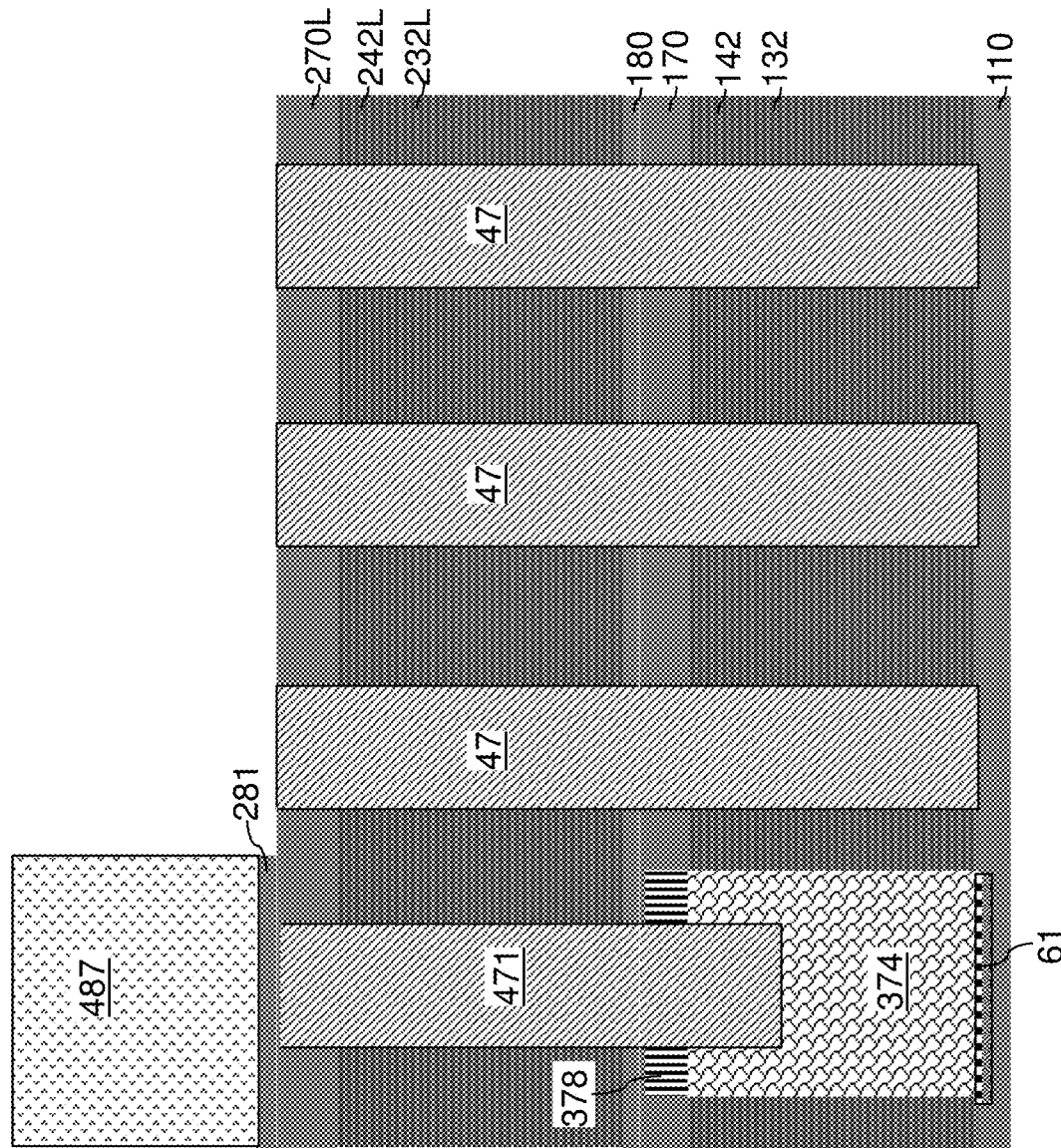
FIG. 30C is a vertical cross-sectional view of the second exemplary structure along the vertical plane C-C' of FIG. 30B.

Referring to FIGS. 30A-30C, a second sacrificial capping layer 281 can be deposited over the second continuous insulating cap layer 270L and the various sacrificial fill structures (47, 17, 471). The second sacrificial capping layer 281 may comprise a dielectric material such as silicon oxide, and may have a thickness in a range from 20 nm to 200 nm, although lesser and greater thicknesses may also be employed.

A photoresist layer can be applied over the second sacrificial capping layer 281, and can be lithographically patterned to form a patterned photoresist layer 487. The patterned photoresist layer 487 may cover the sacrificial backside opening fill structures 471 without covering the sacrificial memory opening fill structures 47 or the sacrificial support opening fill structures 17. An etch process can be performed to etch unmasked portions of the second sacrificial capping layer 281. Thus, top surfaces of the sacrificial memory opening fill structures 47 or the sacrificial support opening fill structures 17 can be physically exposed, while the sacrificial backside opening fill structures 471 are covered by the second sacrificial capping layer 281. The patterned photoresist layer 487 can be subsequently removed, for example, by ashing.

Figure 31A:
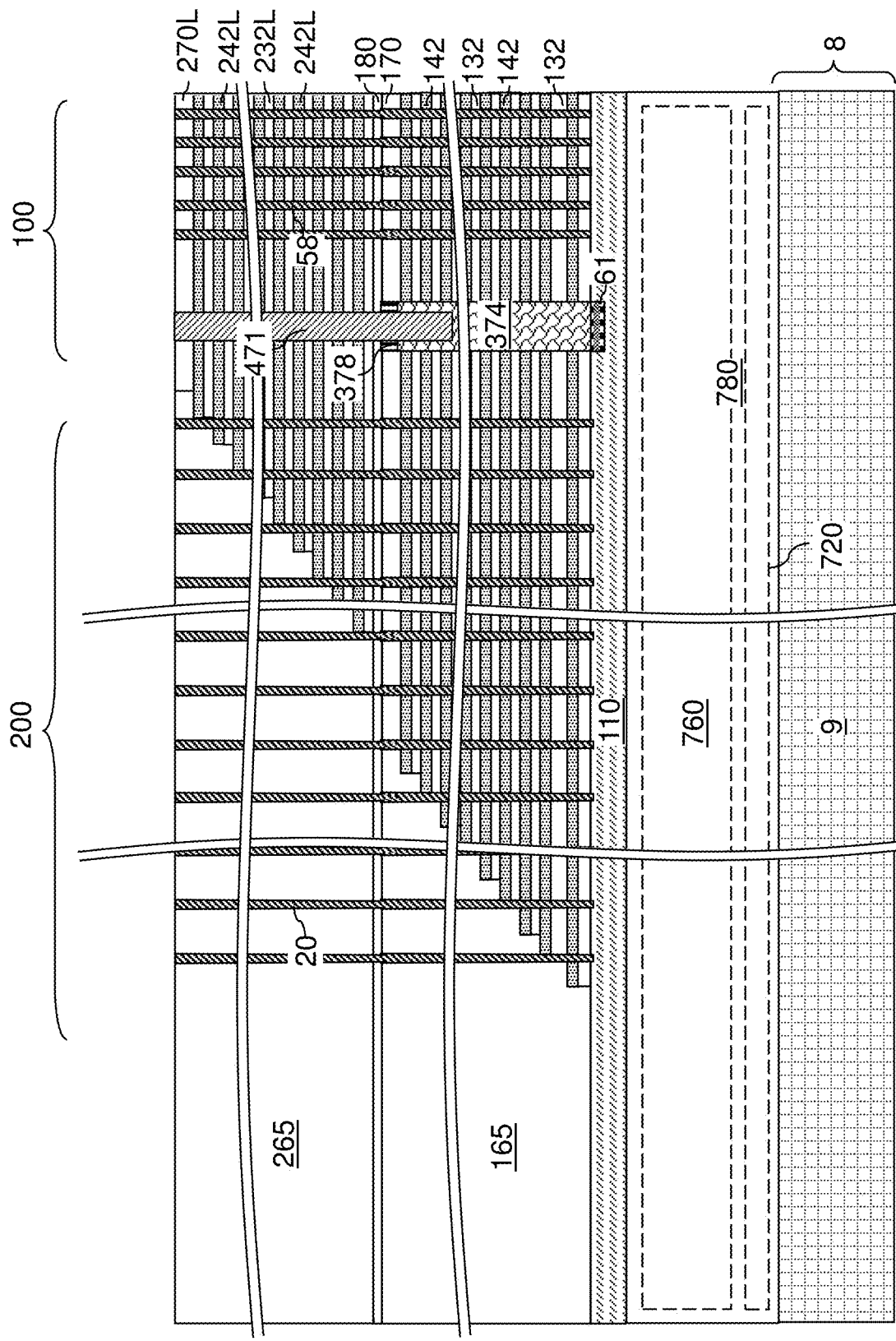
FIG. 31A is a vertical cross-sectional view of the second exemplary structure after formation of memory opening fill structures and support pillar structures according to the second embodiment of the present disclosure.
Figure 31B:
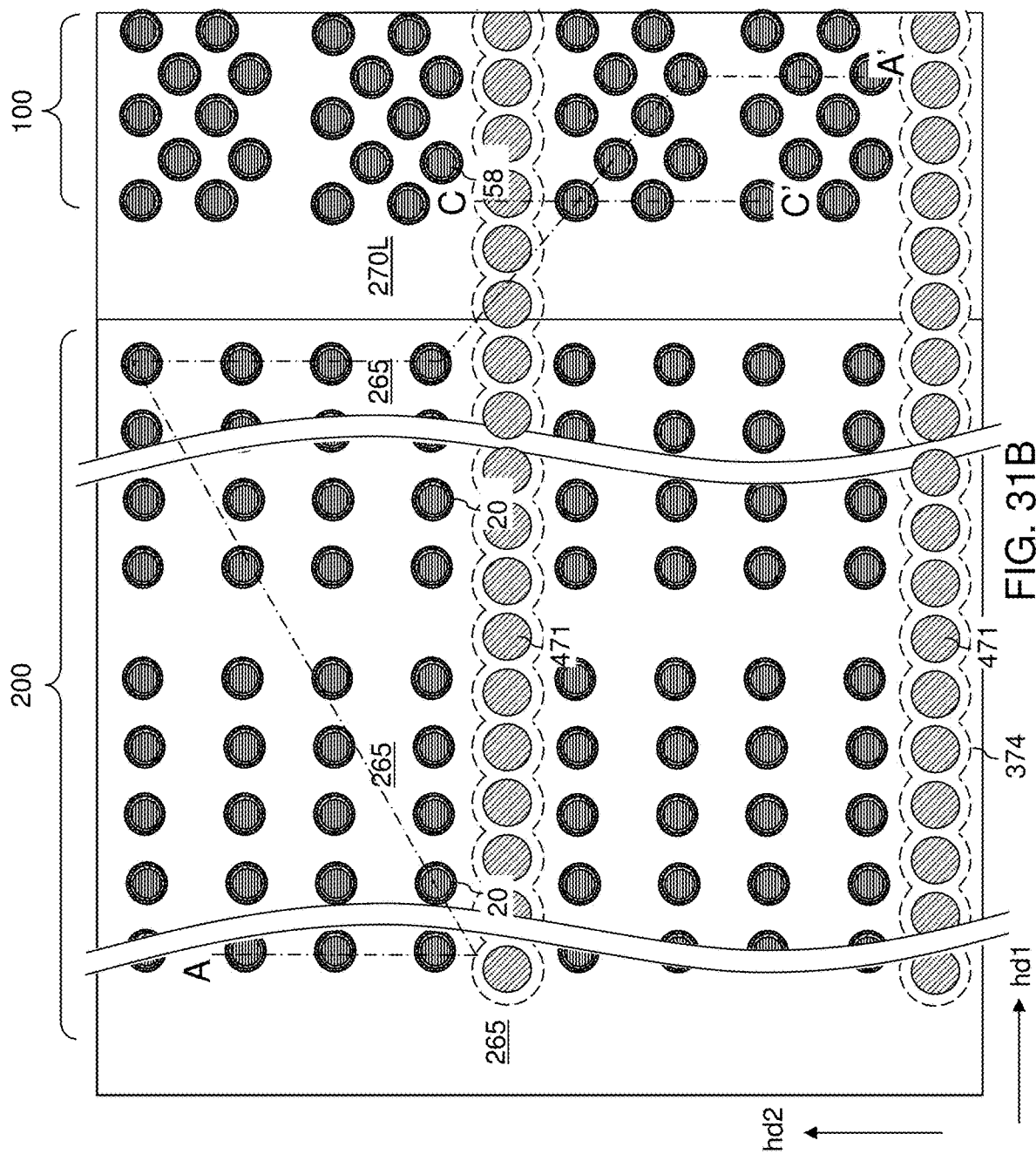
FIG. 31B is a top-down view of the second exemplary structure of FIG. 31A. The vertical plane A-A' is the plane of the vertical cross-sectional view of FIG. 31A.
Figure 31C:
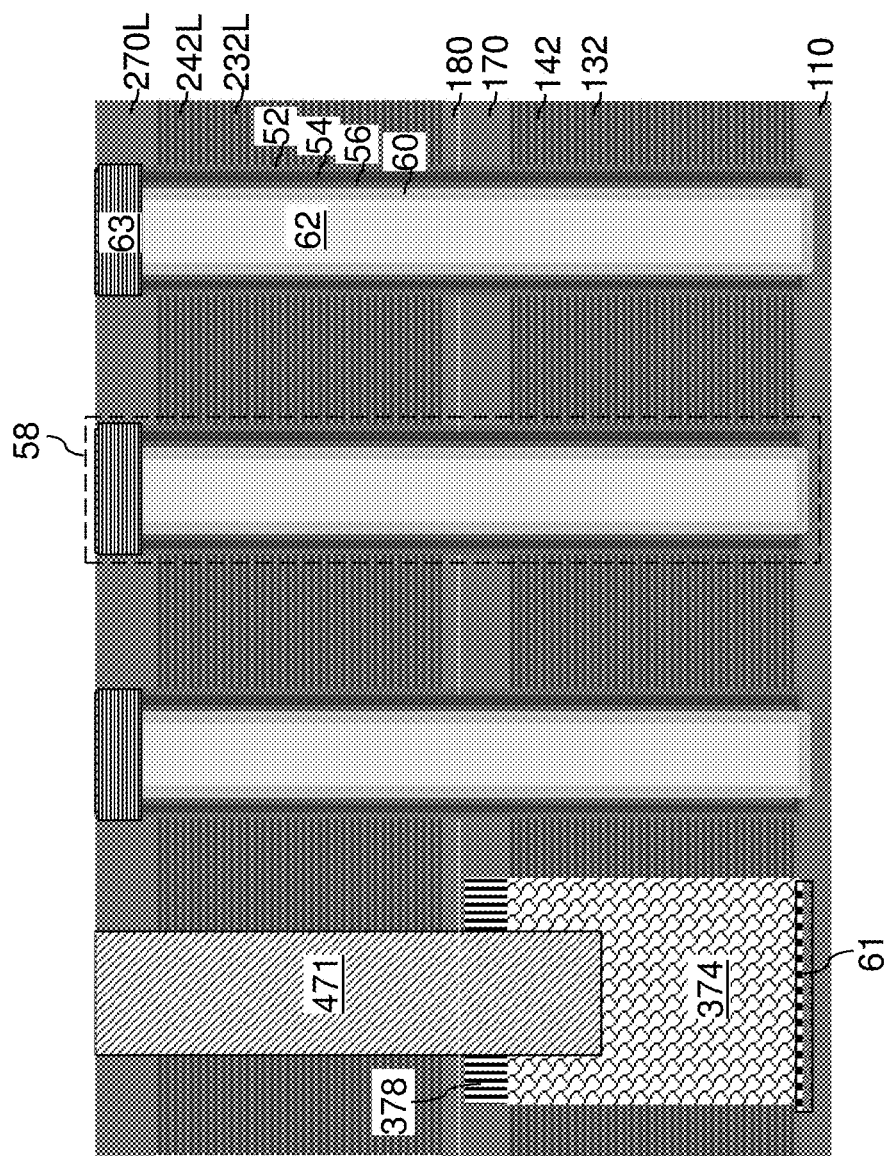
FIG. 31C is a vertical cross-sectional view of the second exemplary structure along the vertical plane C-C' of FIG. 31B.

Referring to FIGS. 31A-31C, the sacrificial fill materials of the sacrificial memory opening fill structures 47 and the sacrificial support opening fill structures 17 can be removed selective to the materials of the second vertically alternating sequence (232L, 242L), the first-tier alternating stacks (132, 142), the retro-stepped dielectric material portions (165, 265), the first insulating cap layers 170, the inter-tier insulating layers 180, the second continuous insulating cap layer 270L, and the semiconductor material layer 110. For example, if the sacrificial memory opening fill structures 47 and the sacrificial support opening fill structures 17 comprise amorphous carbon or diamond-like carbon, an ashing process can be performed to remove the sacrificial fill materials of the sacrificial memory opening fill structures 47 or the sacrificial support opening fill structures 17. Voids are formed in the inter-tier memory openings 49 and in the inter-tier support openings 19. The second sacrificial capping layer 281 protects the sacrificial backside opening fill structures 471 during removal of the sacrificial memory opening fill structures 47 and the sacrificial support opening fill structures 17.

The processing steps of FIGS. 12B-12D can be subsequently performed to form memory opening fill structures 58 in the inter-tier memory openings 49 and to form support pillar structures 20 in the inter-tier support openings 19. The second sacrificial capping layer 281 can be removed during a planarization process that is performed to remove excess portions of the deposited doped semiconductor material (i.e., the material of the drain regions 63) and the semiconductor channel material layer 60L that overlie the horizontal plane including the top surface of the second continuous insulating cap layer 270L.

Generally, a memory opening fill structure 58 can be formed within each contiguous combination of volumes of the first-tier memory openings and volumes of the second-tier memory openings. Each of the memory opening fill structures 58 comprises a respective vertical stack of memory elements (e.g., portions of the memory material layer 54) and a respective vertical semiconductor channel 60.

Figure 32A:
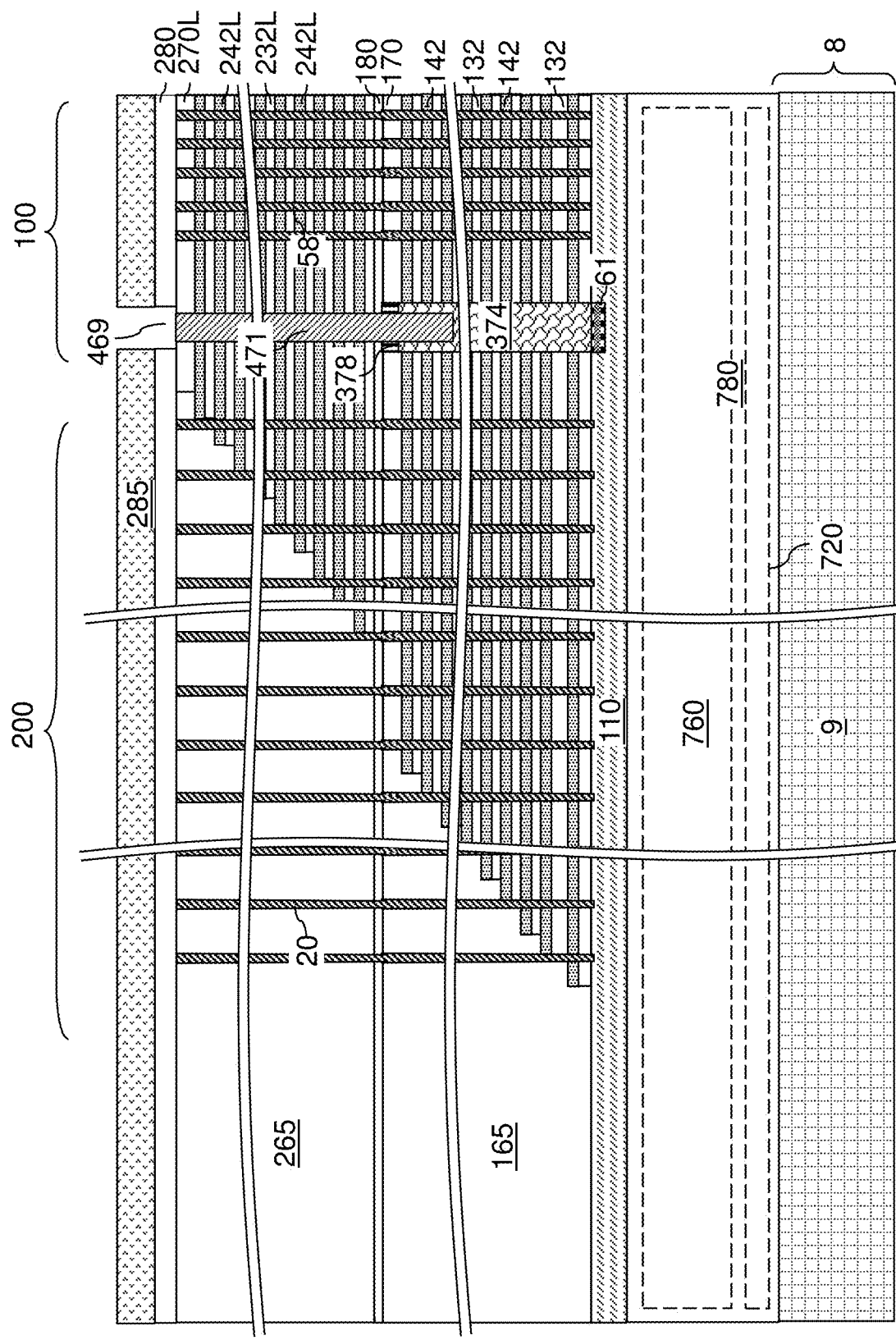
FIG. 32A is a vertical cross-sectional view of the second exemplary structure after deposition and patterning of a contact-level dielectric layer according to the second embodiment of the present disclosure.
Figure 32B:
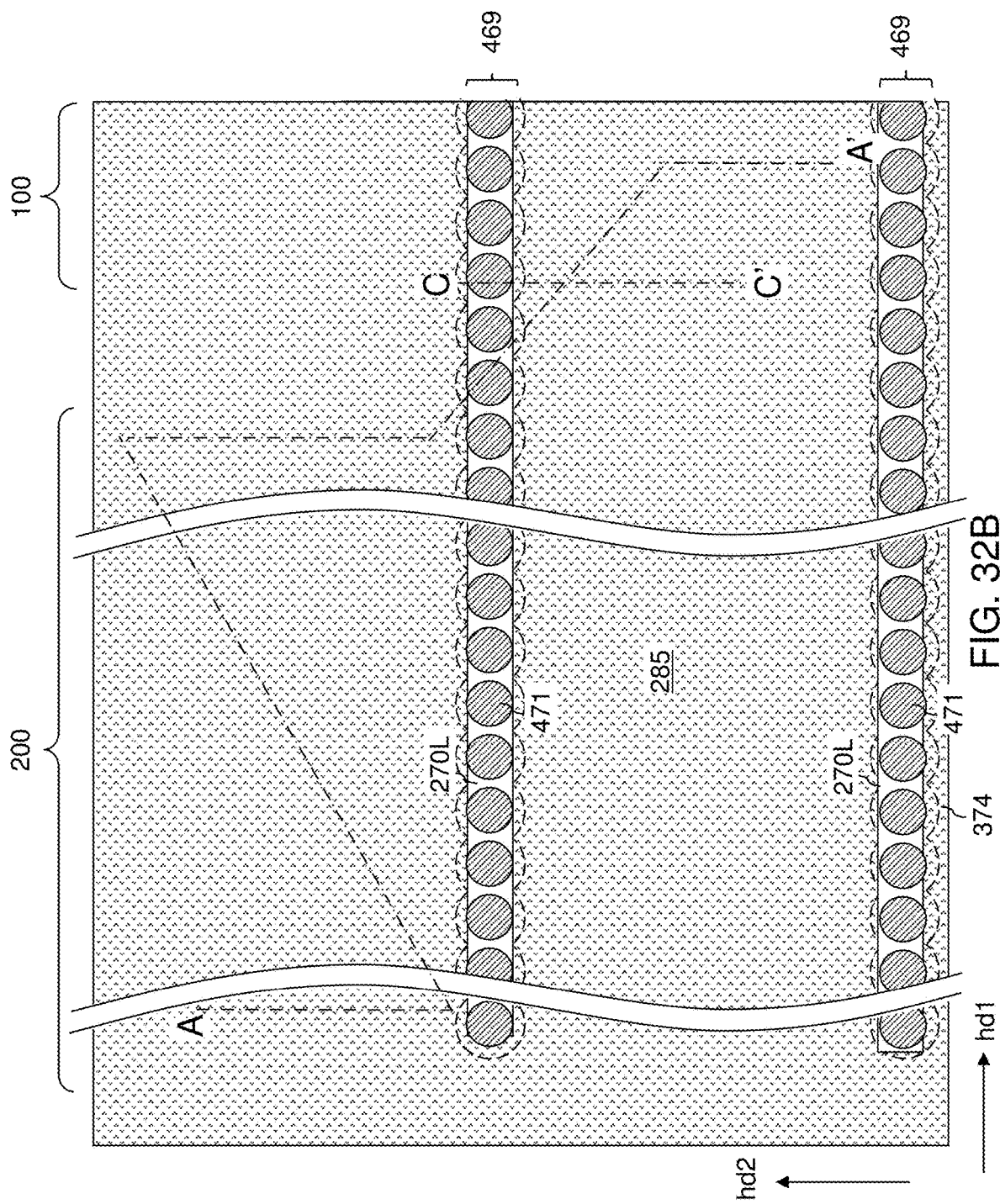
FIG. 32B is a top-down view of the second exemplary structure of FIG. 32A. The vertical plane A-A' is the plane of the vertical cross-sectional view of FIG. 32A.
Figure 32C:
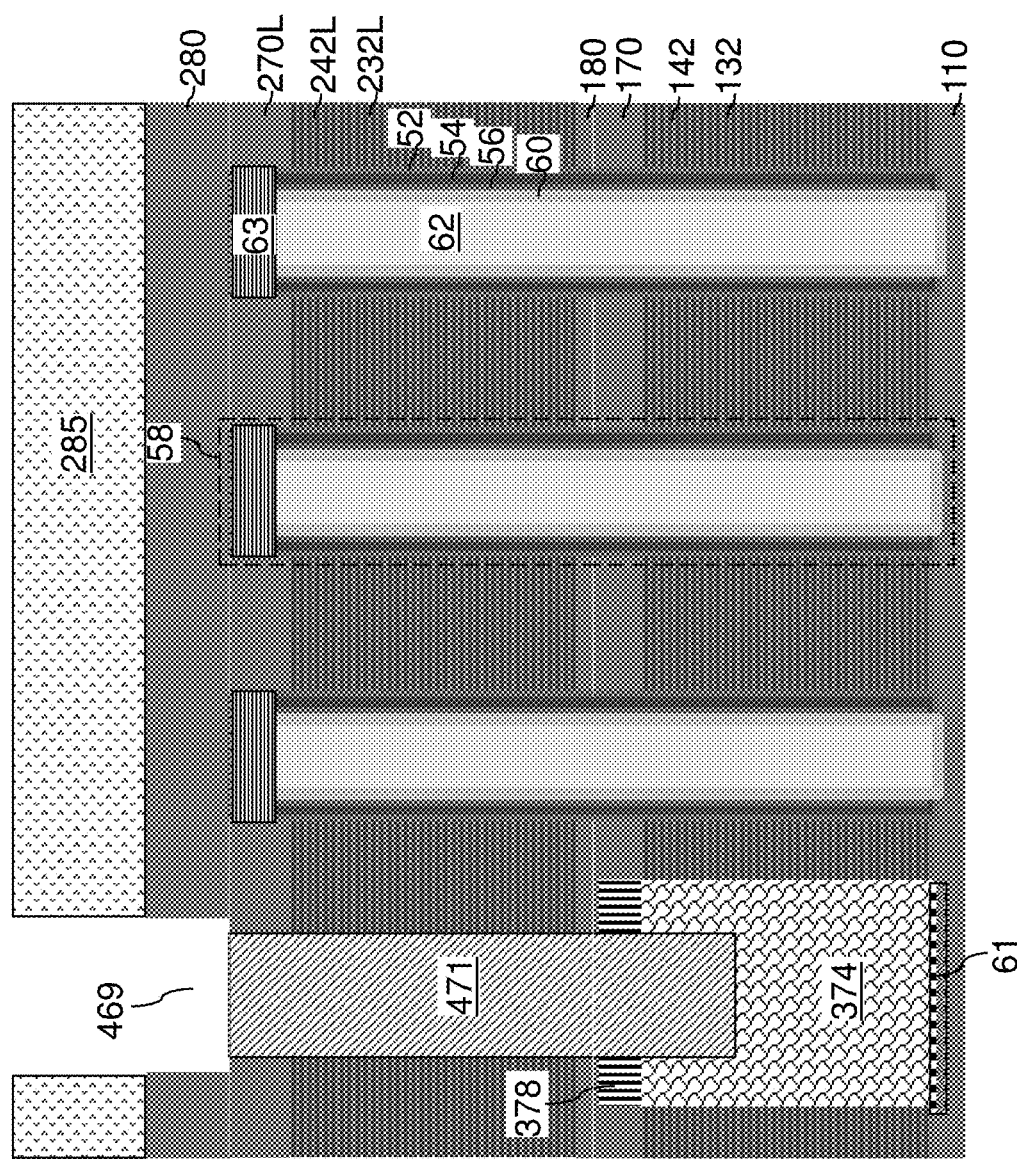
FIG. 32C is a vertical cross-sectional view of the second exemplary structure along the vertical plane C-C' of FIG. 32B.

Referring to FIGS. 32A-32C, a contact-level dielectric layer 280 can be deposited over the second continuous insulating cap layer 270L, the second retro-stepped dielectric material portions 265, the memory opening fill structures 58, and the support pillar structures 20. A photoresist layer 285 can be applied over the contact-level dielectric layer 280, and can be lithographically patterned to form elongated openings that laterally extend along the first horizontal direction hd1. The elongated openings may be formed over a rectangular area that includes the areas of respective row of sacrificial backside opening fill structures 471.

An anisotropic etch process may be performed to etch unmasked portions of the contact-level dielectric layer 280. Line trenches 469 are formed over the rows of the sacrificial backside opening fill structures 471 between a respective pair of patterned portions of the contact-level dielectric layer 280. Top surfaces of a row of sacrificial backside opening fill structures 471 can be physically exposed underneath each line trench 469. The photoresist layer 285 may be subsequently removed, for example, by ashing.

Figure 33A:
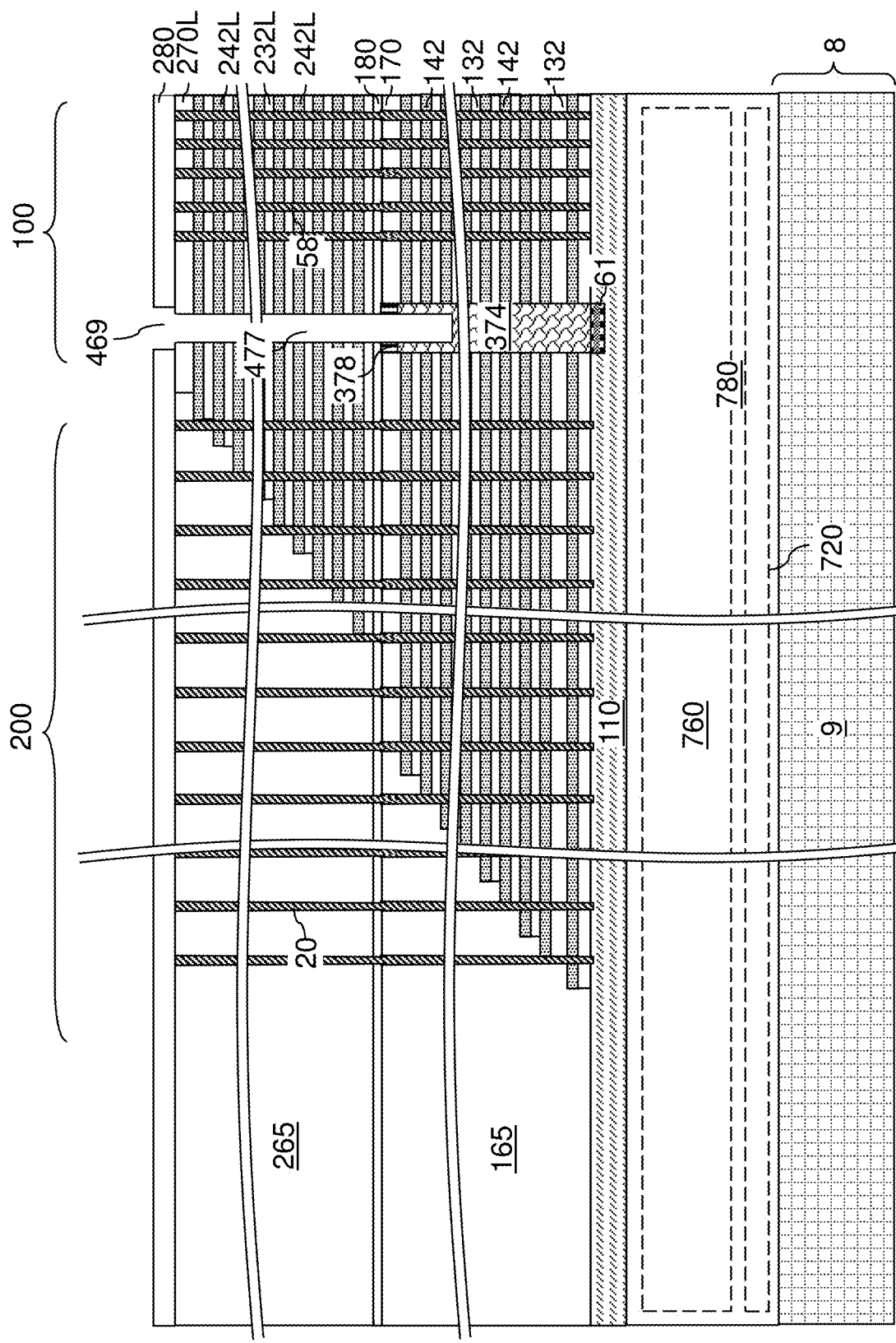
FIG. 33A is a vertical cross-sectional view of the second exemplary structure after removal of the second-tier backside opening fill structures according to the second embodiment of the present disclosure.
Figure 33B:
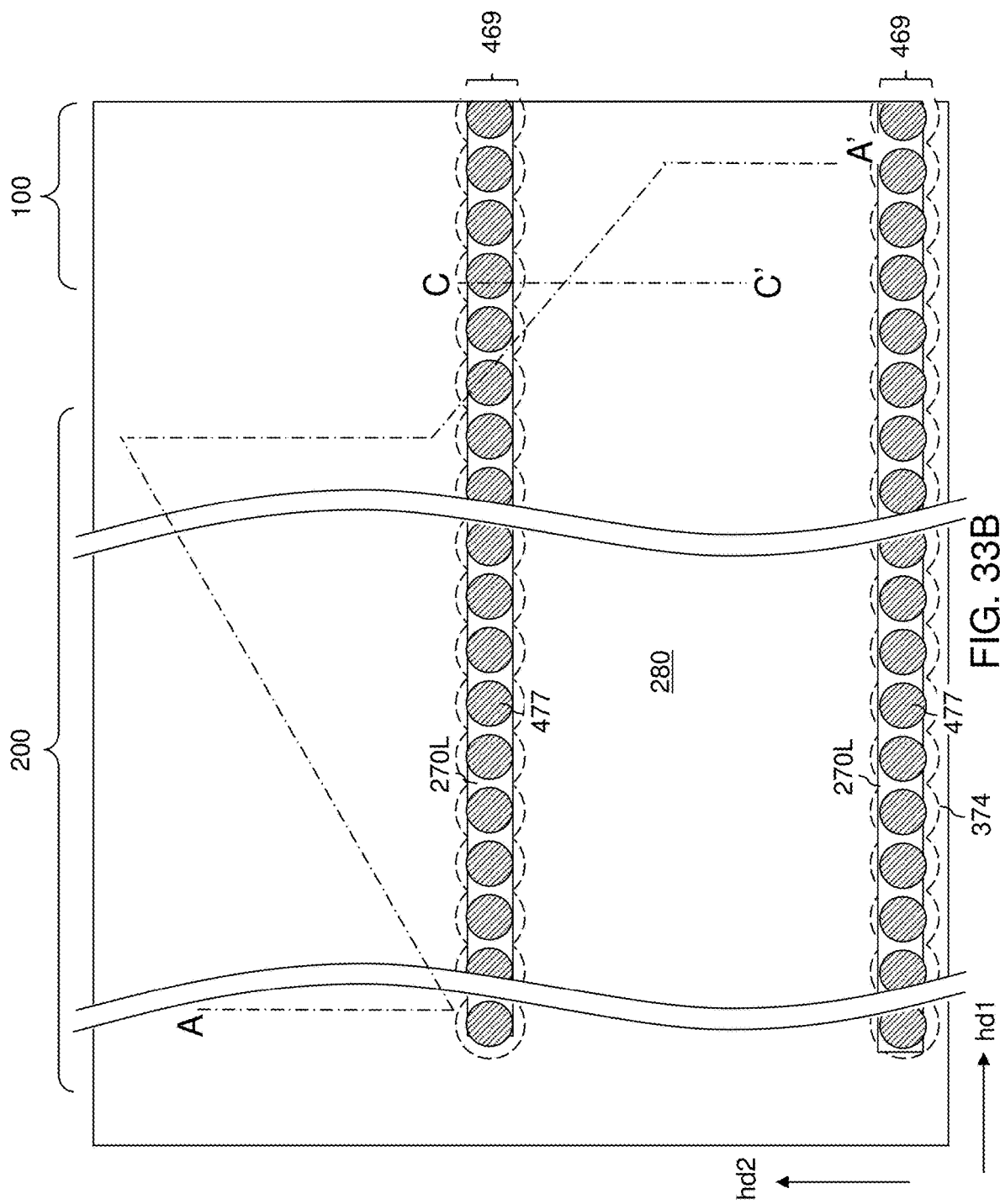
FIG. 33B is a top-down view of the second exemplary structure of FIG. 33A. The vertical plane A-A' is the plane of the vertical cross-sectional view of FIG. 33A.
Figure 33C:
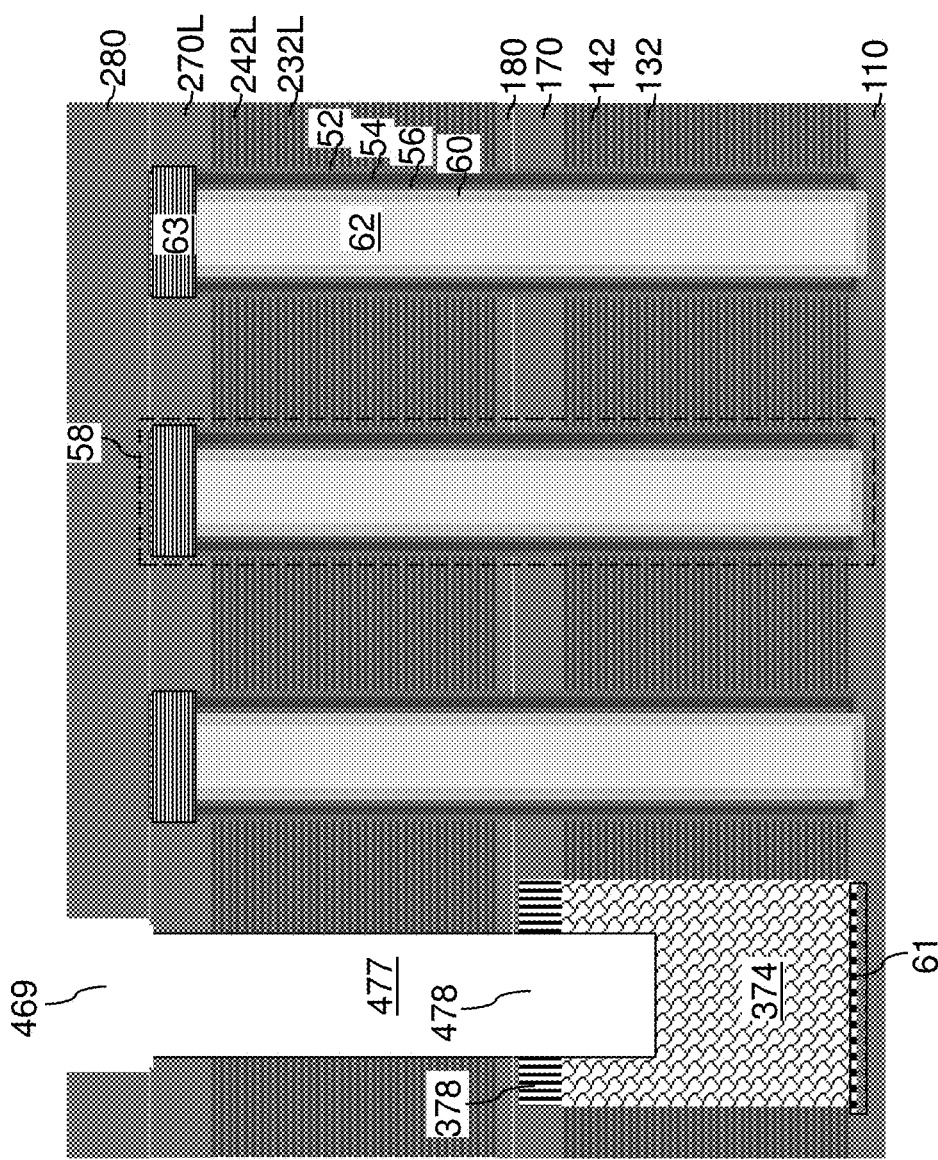
FIG. 33C is a vertical cross-sectional view of the second exemplary structure along the vertical plane C-C' of FIG. 33B.

Referring to FIGS. 33A-33C, the sacrificial backside opening fill structures 471 can be selectively removed through the line trenches 469 without removing the sacrificial trench fill structure 374. For example, the sacrificial trench fill structures 374 may comprise undoped amorphous silicon, borosilicate glass, or organ silicate glass, the perforated bridge structures 378 may comprise boron-doped silicon or a metallic material, and the sacrificial backside opening fill structures 471 may comprise amorphous carbon or diamond-like carbon. In this case, the sacrificial backside opening fill structures 471 may be removed by ashing without removing the sacrificial trench fill structures 374 or the perforated bridge structures 378. All sidewalls of the first-tier backside trenches may be covered by a respective combination of a sacrificial trench fill structure 374 and a perforated bridge structure 378.

Figure 34A:
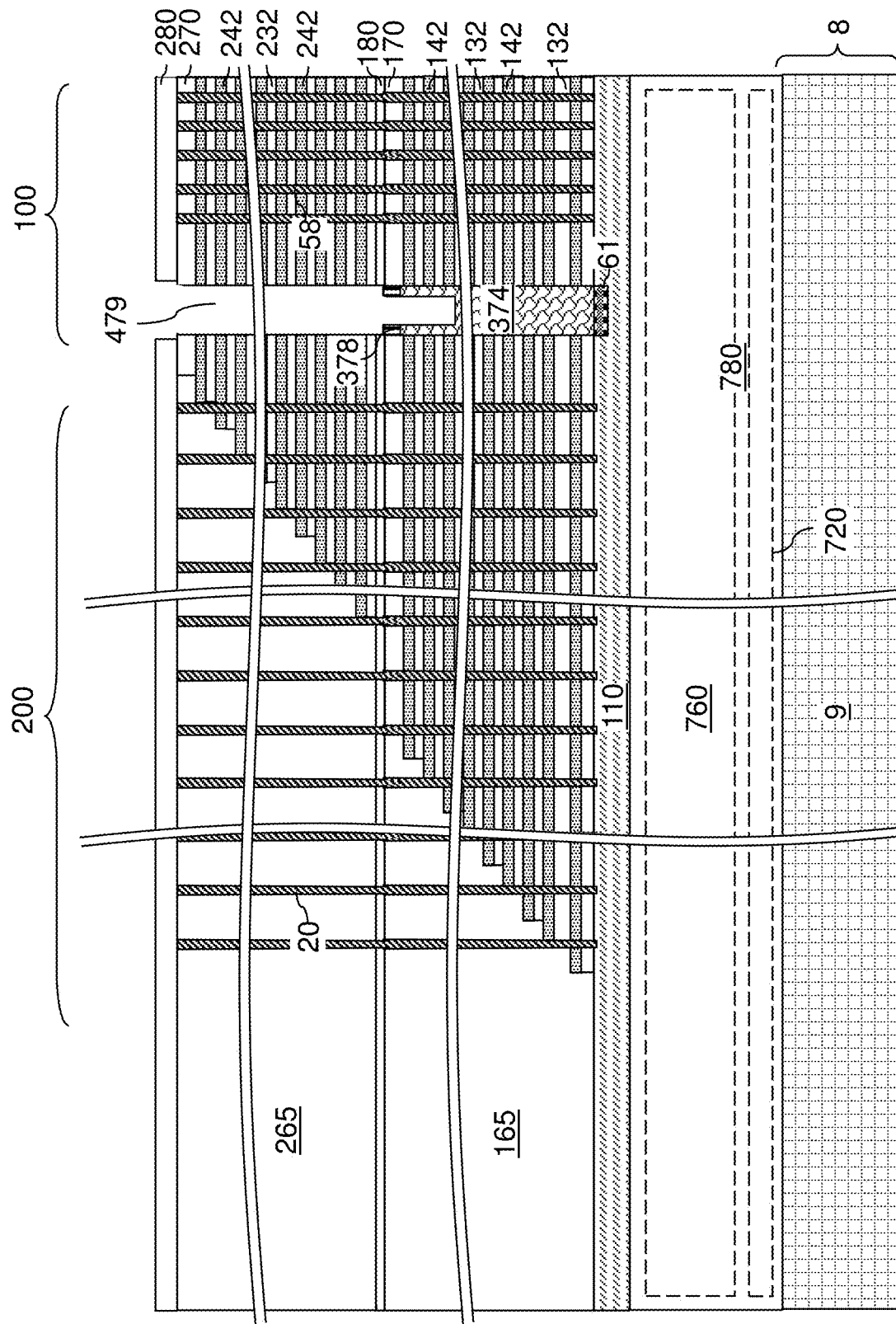
FIG. 34A is a vertical cross-sectional view of the second exemplary structure after formation of second-tier backside trenches according to the second embodiment of the present disclosure.
Figure 34B:
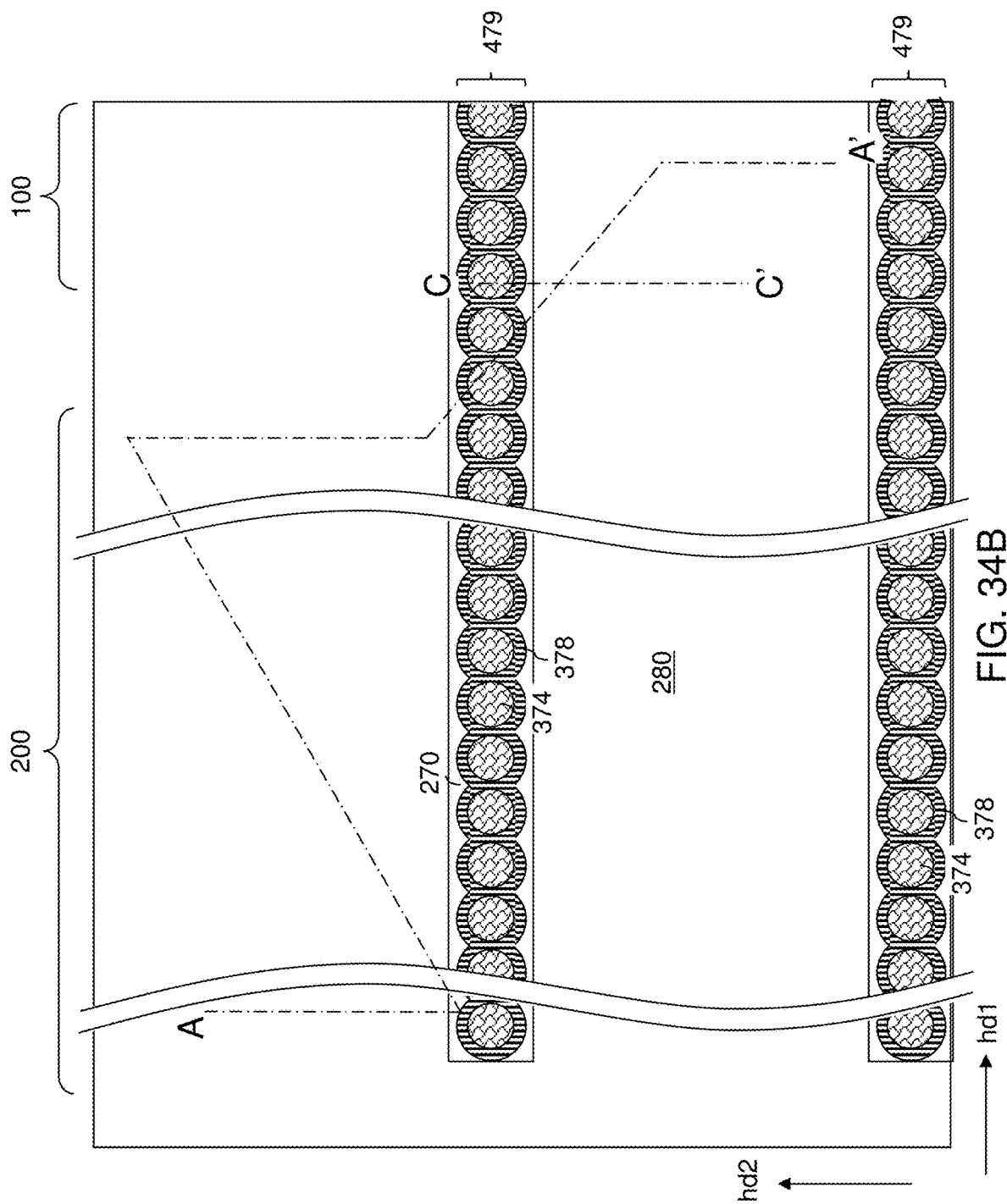
FIG. 34B is a top-down view of the second exemplary structure of FIG. 34A. The vertical plane A-A' is the plane of the vertical cross-sectional view of FIG. 34A.
Figure 34C:
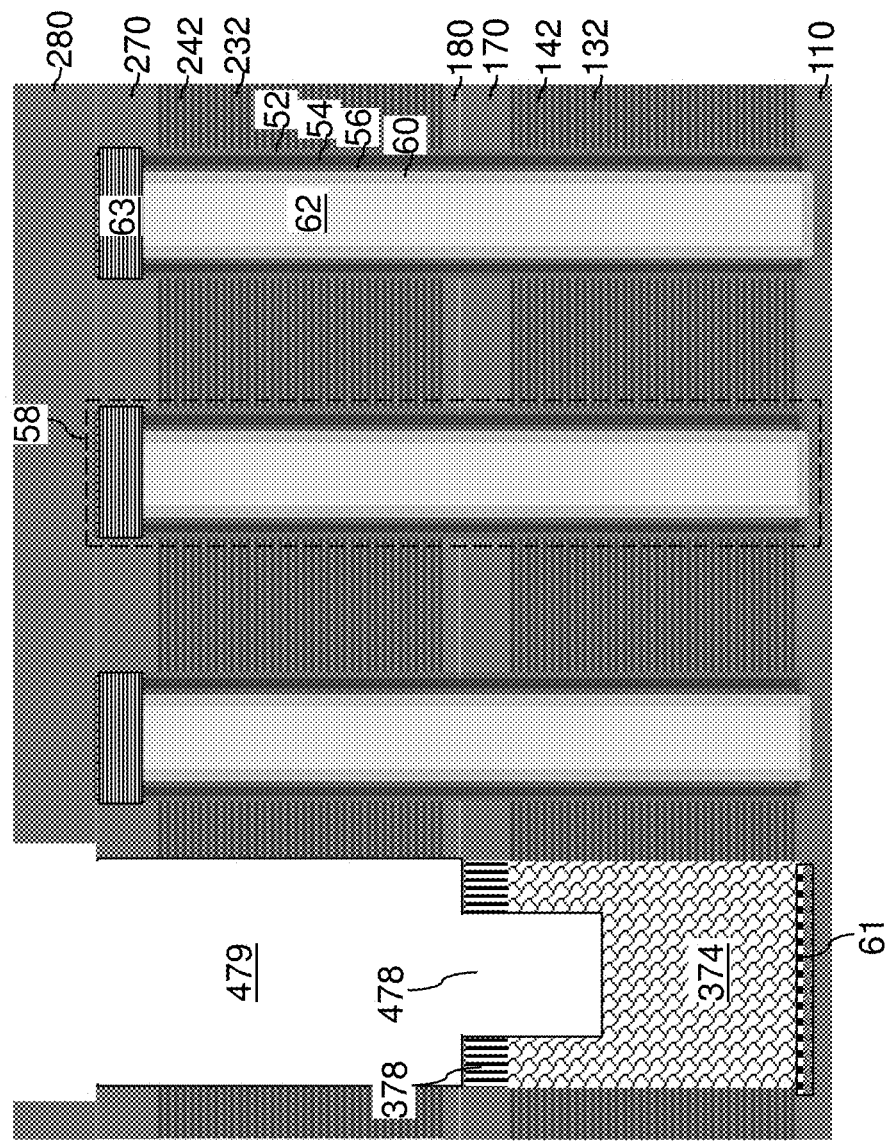
FIG. 34C is a vertical cross-sectional view of the second exemplary structure along the vertical plane C-C' of FIG. 34B.

Referring to FIGS. 34A-34C, a sequence of isotropic etch steps can be performed to laterally recess portions of the second vertically alternating sequence (232L, 242L) that are proximal to the second-tier backside openings 477. For example, a first isotropic etch step can be performed to laterally recess physically exposed sidewalls of the second continuous insulating layers 232L and the second continuous insulating cap layer 270L from around the second-tier backside openings 477, and a second isotropic etch process can be performed to laterally recess physically exposed sidewalls of the second continuous sacrificial material layers 242L. In an illustrative example, the second continuous insulating layers 232L comprise silicon oxide and the second continuous sacrificial material layers 242L comprise silicon nitride. In this case, the first isotropic etch step may be a wet etch step employing dilute hydrofluoric acid, and the second isotropic etch step may be a wet etch step employing hot phosphoric acid. The duration of the first isotropic etch step and the duration of the second isotropic etch step may be selected such that neighboring pairs of second-tier backside openings 477 merge within each row of second-tier backside openings 477 to form a respective second-tier backside trench 479. The contact-level dielectric layer 280 can be collaterally recessed during the first isotropic etch step and/or during the second isotropic etch step.

Generally, the second-tier backside openings 477 can be laterally expanded by at least one isotropic etch process. The discrete second-tier backside openings 477 in each row merge with each other to form the second-tier backside trenches 479. The second vertically alternating sequence (232L, 242L) can be divided into second-tier alternating stacks (232, 242) of second insulating layers 232 and second sacrificial material layers 242 by formation of the second-tier backside trenches 479. The second-tier alternating stacks (232, 242) laterally extend along a first horizontal direction hd1, and are laterally spaced apart among one another along a second horizontal direction hd2 by the second-tier backside trenches 479. The second continuous insulating cap layer 270L can be divided into a plurality of second insulating cap layers 270 overlying a respective one of the second-tier alternating stacks (232, 242). Each second-tier backside trench 479 may comprise a pair of laterally-undulating sidewalls that generally extend along the first horizontal direction hd1 and include a respective set of vertically-straight and laterally convex sidewall segments that are adjoined to each other.

A plurality of layer stacks (132, 142, 170, 180, 232, 242, 270, 280) can be formed over a semiconductor material layer 110. The layer stacks (132, 142, 170, 180, 232, 242, 270, 280) laterally extend along the first horizontal direction hd1, and are laterally spaced from each other along the second horizontal direction hd2 by the fill material stacks (374, 378) and the second-tier backside trenches 479. Each of the layer stacks (132, 142, 170, 180, 232, 242, 270, 280) comprises a first-tier alternating stack (132, 142) of first insulating layers 132 and first sacrificial material layers 142, a first insulating cap layer 170, an inter-tier dielectric layer 180, a second-tier alternating stack (232, 242) of second insulating layers 232 and second sacrificial material layers 242, a second insulating cap layer 270, and a contact-level dielectric layer 280. Each inter-level dielectric layer 180 may contact a top surface of a respective first-tier retro-stepped dielectric material portion 165, a top surface of a respective first insulating cap layer 170, a bottom surface of a respective second-tier retro-stepped dielectric material portion 265, and a bottom surface of a respective second-tier alternating stack (232, 242).

In one embodiment, each memory opening 49 vertically extends through a respective first-tier alternating stack (132, 142), a respective first insulating cap layer 170, a respective second-tier alternating stack (232, 242), and a respective second insulating cap layer 270. Memory opening fill structures 58 can be formed in the memory openings 49. Each of the memory opening fill structures 58 comprises a respective vertical stack of memory elements and a respective vertical semiconductor channel 60. Each first-tier retro-stepped dielectric material portion 165 may contact stepped surfaces of a respective one of the first-tier alternating stacks (132, 142). Each second-tier retro-stepped dielectric material portions 265 may contact stepped surfaces of a respective one of the second-tier alternating stacks (232, 242). In one embodiment, each top surface of the first-tier retro-stepped dielectric material portions 165 may be located within the horizontal plane including the top surfaces of the first insulating cap layers 170.

In one embodiment, the top surface of each perforated bridge structure 378 can be located within a horizontal plane including top surfaces of the first insulating cap layers 170. In one embodiment, the perforated bridge structures 378 contacts sidewalls of a respective pair of first insulating cap layers 170, and comprise a semiconductor material or a metallic material. In one embodiment, each perforated bridge structure 378 comprises a pair of laterally-undulating outer sidewalls including a respective set of vertically-straight and laterally convex sidewall segments that are adjoined to each other.

Figure 35A:
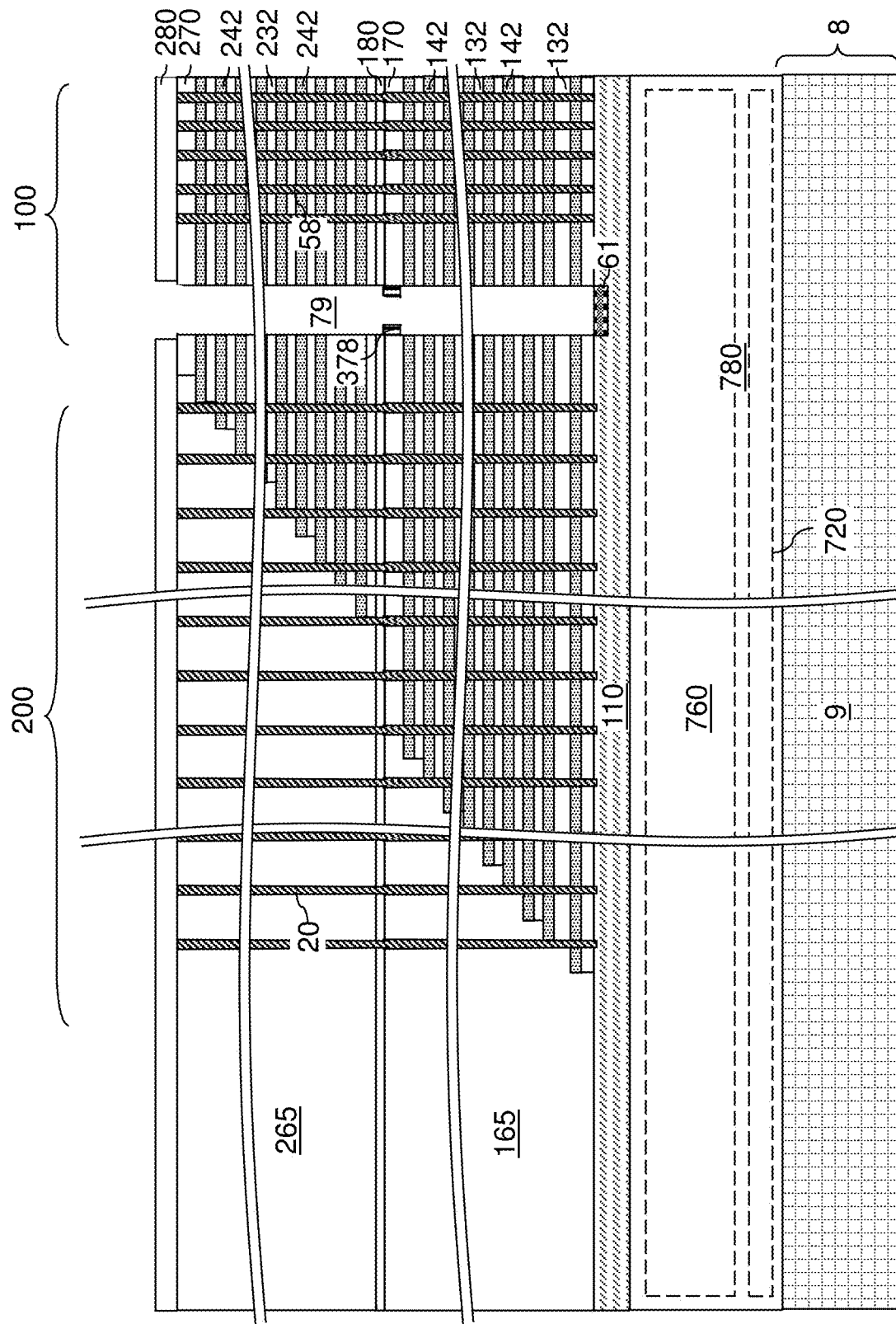
FIG. 35A is a vertical cross-sectional view of the second exemplary structure after removal of the first-tier sacrificial backside trench fill structures according to the second embodiment of the present disclosure.
Figure 35B:
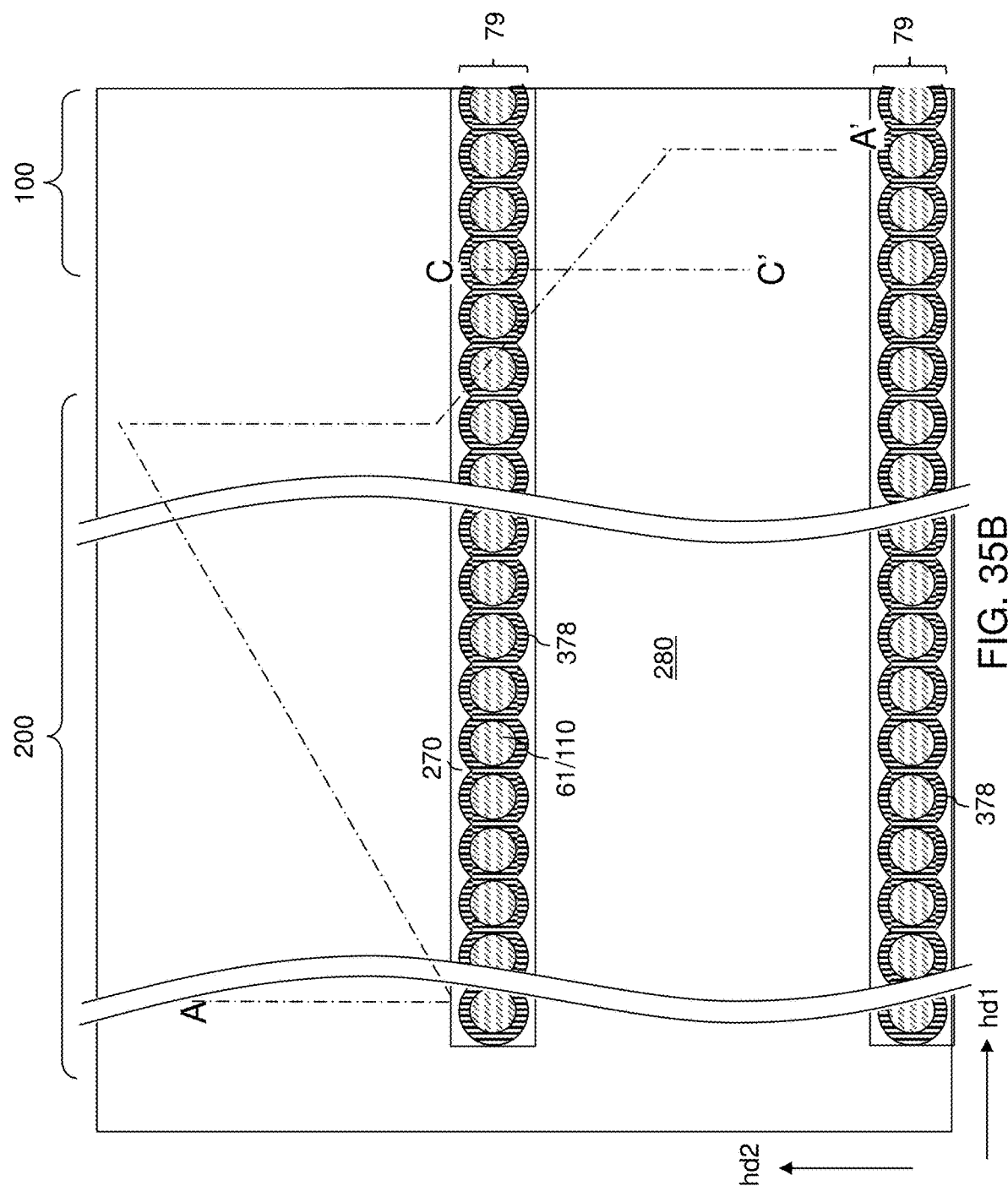
FIG. 35B is a top-down view of the second exemplary structure of FIG. 35A. The vertical plane A-A' is the plane of the vertical cross-sectional view of FIG. 35A.
Figure 35C:
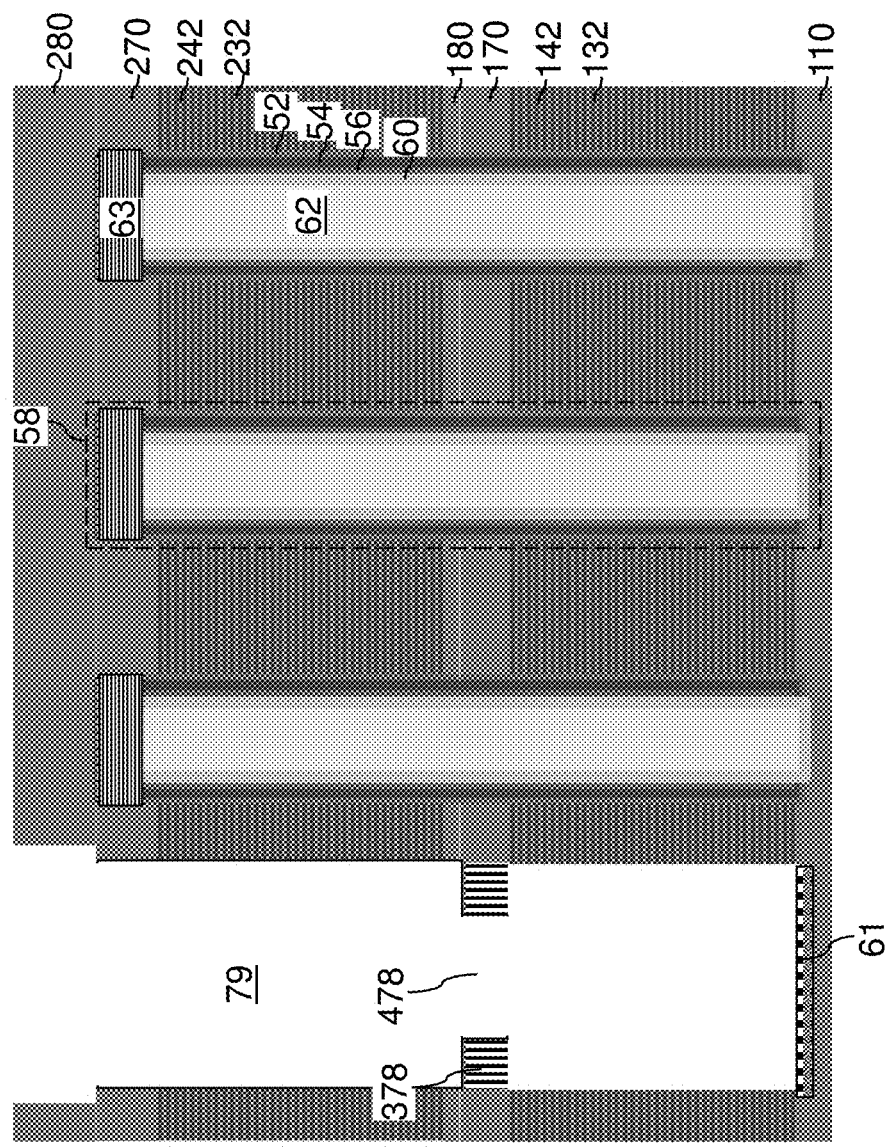
FIG. 35C is a vertical cross-sectional view of the second exemplary structure along the vertical plane C-C' of FIG. 35B.
Figure 36A:
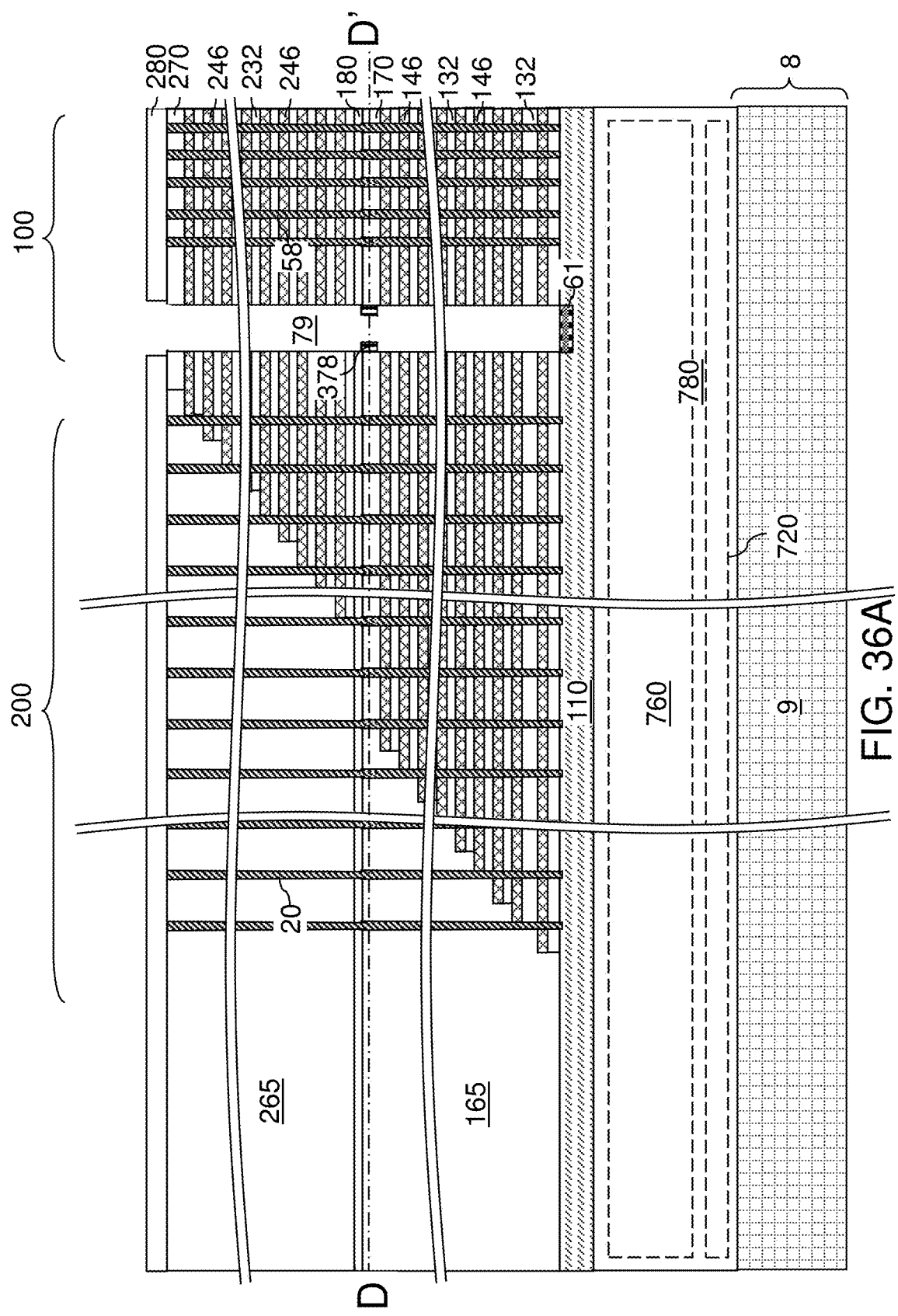
FIG. 36A is a vertical cross-sectional view of the second exemplary structure after replacement of sacrificial material layers with electrically conductive layers according to the second embodiment of the present disclosure.
Figure 36C:
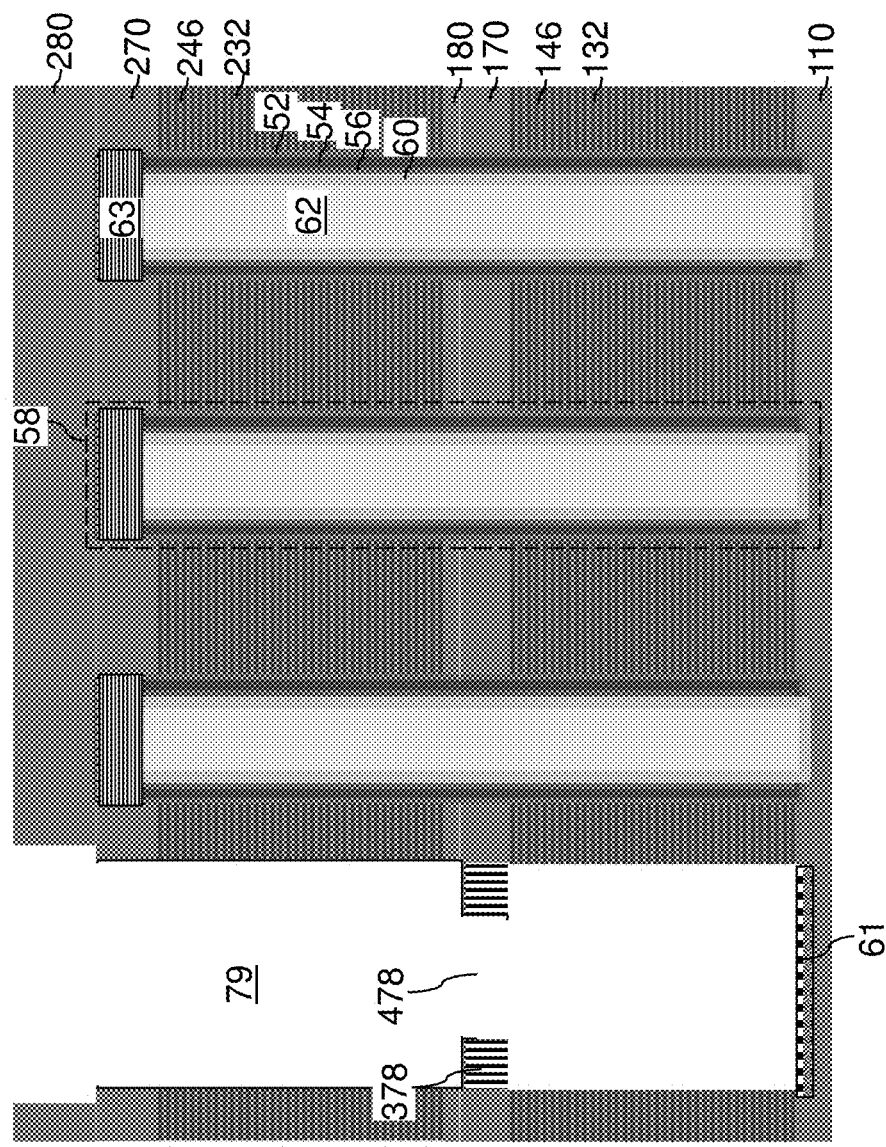
FIG. 36C is a vertical cross-sectional view of the second exemplary structure along the vertical plane C-C' of FIG. 36B.

Referring to FIGS. 35A-35C, the sacrificial trench fill structures 374 can be removed selective to the materials of the first-tier alternating stacks (132, 142), the second-tier alternating stacks (232, 242), the perforated bridge structures 378 and the semiconductor material layer 110. In one embodiment, the sacrificial trench fill structures 374 may comprise undoped amorphous silicon, and the perforated bridge structure 378 may comprise heavily boron-doped silicon including boron atoms at an atomic concentration greater than $1.0 \times 10^{18}/cm^3$, such as $1.0 \times 10^{19}/cm^3$ to $1.0 \times 10^{21}/cm^3$. In this case, a wet etch process employing tetramethylammonium hydroxide (TMAH) or trimethyl-2 hydroxyethyl ammonium hydroxide (TMY) may be performed to remove the sacrificial trench fill structures 374 selective to the perforated bridge structure 378. Generally, an isotropic etch process providing an etch chemistry that etches the material of the sacrificial trench fill structures 374 selective to the material of the perforated bridge structures 378 may be employed for selective removal of the sacrificial trench fill structures 374.

Each combination of a volume of a second-tier backside trench 479 and a volume of a first-tier backside trench 379 constitutes a backside trench 79, which is also referred to as an inter-tier backside trench 79. A perforated bridge structure 378 can be provided within each backside trench 79. Generally, the backside trenches 79 vertically extending through the first-tier alternating stacks (132, 142) and second-tier alternating stacks (232, 242) can be formed by removing the sacrificial trench fill structures 374 after formation of the second-tier backside trenches 479. In one embodiment, a bottom portion of each backside trench 79 that underlies a respective perforated bridge structure 378 comprises a pair of laterally-undulating sidewalls including a respective set of vertically-straight and laterally convex sidewall segments that are adjoined to each other. In one embodiment, the pair of laterally-undulating sidewalls of the bottom portion of each backside trench 79 may be vertically coincident with the pair of laterally-undulating outer sidewalls of the respective overlying perforated bridge structure 378.

Referring to FIGS. 36A-36D, the first sacrificial material layers 142 and the second sacrificial material layers 242 can be replaced with first electrically conductive layers 146 and second electrically conductive layers 246. For example, the processing steps of FIGS. 17 and 18 may be performed to replace the first sacrificial material layers 142 and the second sacrificial material layers 242 with the first electrically conductive layers 146 and the second electrically conductive layers 246, respectively.

Referring to FIGS. 37A-37F, an insulating material can be conformally deposited, for example, by a chemical vapor deposition process, and can be subsequently anisotropically etched to remove horizontally-extending portions of the deposited insulating material that are not masked by an overlying structure. The thickness of the deposited insulating material can be less than one-half of the minimum width of each backside trench 79 along the second horizontal direction hd2, and may be in a range from 1% to 30% of the minimum width of each backside trench 79 along the second horizontal direction hd2. In one embodiment, the insulating material may comprise a silicon-oxide based material such as undoped silicate glass or a doped silicate glass. Each remaining portion of the deposited insulating material that remains in a respective backside trench 79 constitutes a respective insulating spacer (74A, 74B, 74C).

The insulating spacers (74A, 74B, 74C) may comprise first insulating spacers 74A that are formed below the horizontal plane including the top surfaces of the perforated bridge structures 378. Each first insulating spacer 74A may contact an entirety of a bottom surface of a respective perforated bridge structure 378, and may contact at least a lower portion of each inner sidewall the respective perforated bridge structure 378 (i.e., a lower portion of each vertically-extending opening 478 within the respective perforated bridge structure 378). In one embodiment, each first insulating spacer 74A comprises a pair of laterally-undulating outer sidewalls including a respective set of vertically-straight and laterally convex sidewall segments that are adjoined to each other. In one embodiment, each first insulating spacer 74A may comprise tubular portions contacting sidewalls of the plurality of vertically-extending openings 478 in the respective perforated bridge structure 378.

The insulating spacers (74A, 74B, 74C) may also comprise second insulating spacers 74B that are formed above the horizontal plane including the top surfaces of the perforated bridge structures 378, and below the horizontal plane including the bottom surfaces of the contact-level dielectric layers 280. Each second insulating spacer 74B may contact a peripheral region of a top surface of a respective underlying perforated bridge structure 378. In one embodiment, each second insulating spacer 74B comprises a pair of laterally-undulating outer sidewalls including a respective set of vertically-straight and laterally convex sidewall segments that are adjoined to each other. In one embodiment, the second insulating spacer 74B and the first insulating spacer 74A within each backside trench 79 are two discrete insulating structures that comprise a same material, have a same lateral thickness, and are not in direct contact with each other.

The insulating spacers (74A, 74B, 74C) may also comprise third insulating spacers 74C that are formed in the line trenches 469 and located above the horizontal plane including the bottom surfaces of the contact-level dielectric layers 280. In one embodiment, each third insulating spacer 74C comprises a pair of laterally-straight outer sidewalls that laterally extend along the first horizontal direction hd1.

Optionally, at least one conductive material can be conformally deposited in unfilled volumes of the backside trenches 79. The at least one conductive material may comprise a metallic liner material (such as a conductive metallic nitride material) and at least one metallic fill material. Excess portions of the at least one conductive material can be removed from above the horizontal plane including the top surface of the contact-level dielectric layer 280 by a planarization process, which may employ a chemical mechanical polishing process and/or a recess etch process. Each remaining portion of the at least one conductive material in a respective backside trench 79 constitutes an optional backside contact via structure 76. The combination of all material portions that fill a backside trench 79 in addition to the perforated bridge structure 378 is herein referred to as a backside trench fill structure (74A, 74B, 74C, 76).

In one embodiment, a backside trench fill structure (74A, 74B, 74C, 76) located in each backside trench 79. The backside trench fill structure (74A, 74B, 74C, 76) comprises an optional backside contact via structure 76. The perforated bridge structure 378 may include a plurality of vertically-extending openings 478 through which cylindrical connection portions of the backside contact via structure 76 vertically extend.

Figure 37A:
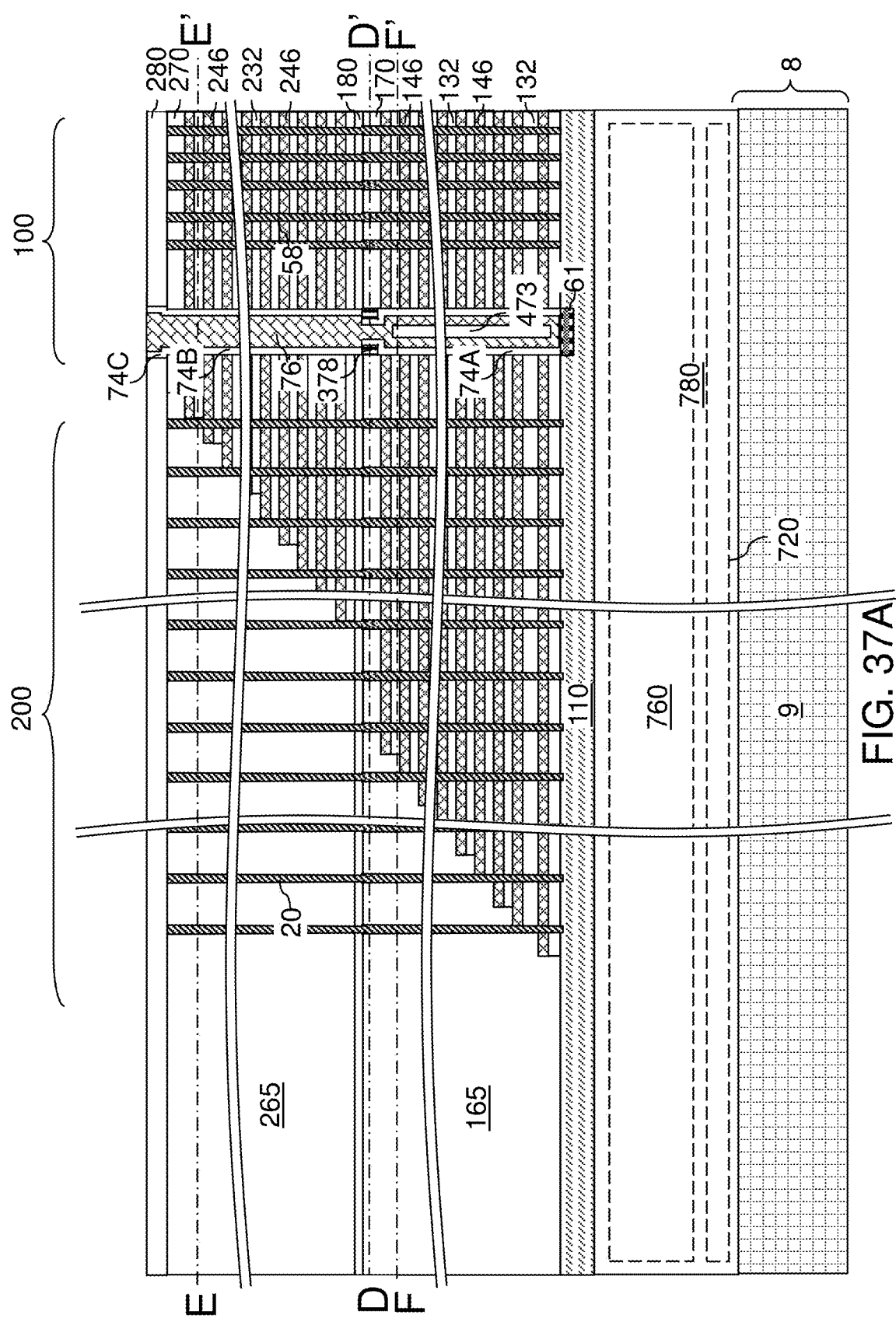
FIG. 37A is a vertical cross-sectional view of the second exemplary structure after formation of source regions and backside trench fill structures according to the second embodiment of the present disclosure.
Figure 37B:
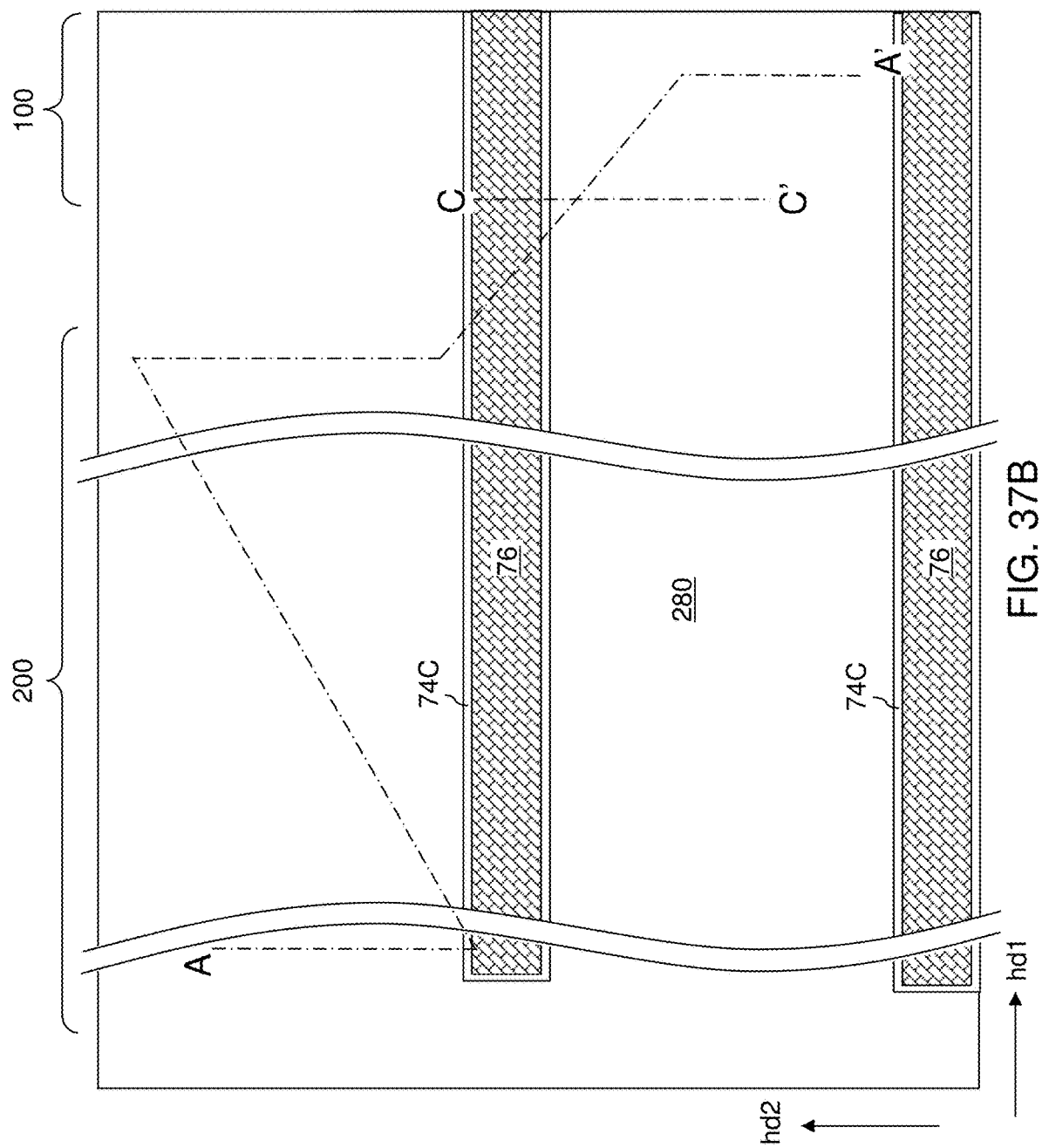
FIG. 37B is a top-down view of the second exemplary structure of FIG. 37A. The vertical plane A-A' is the plane of the vertical cross-sectional view of FIG. 37A.
Figure 37C:
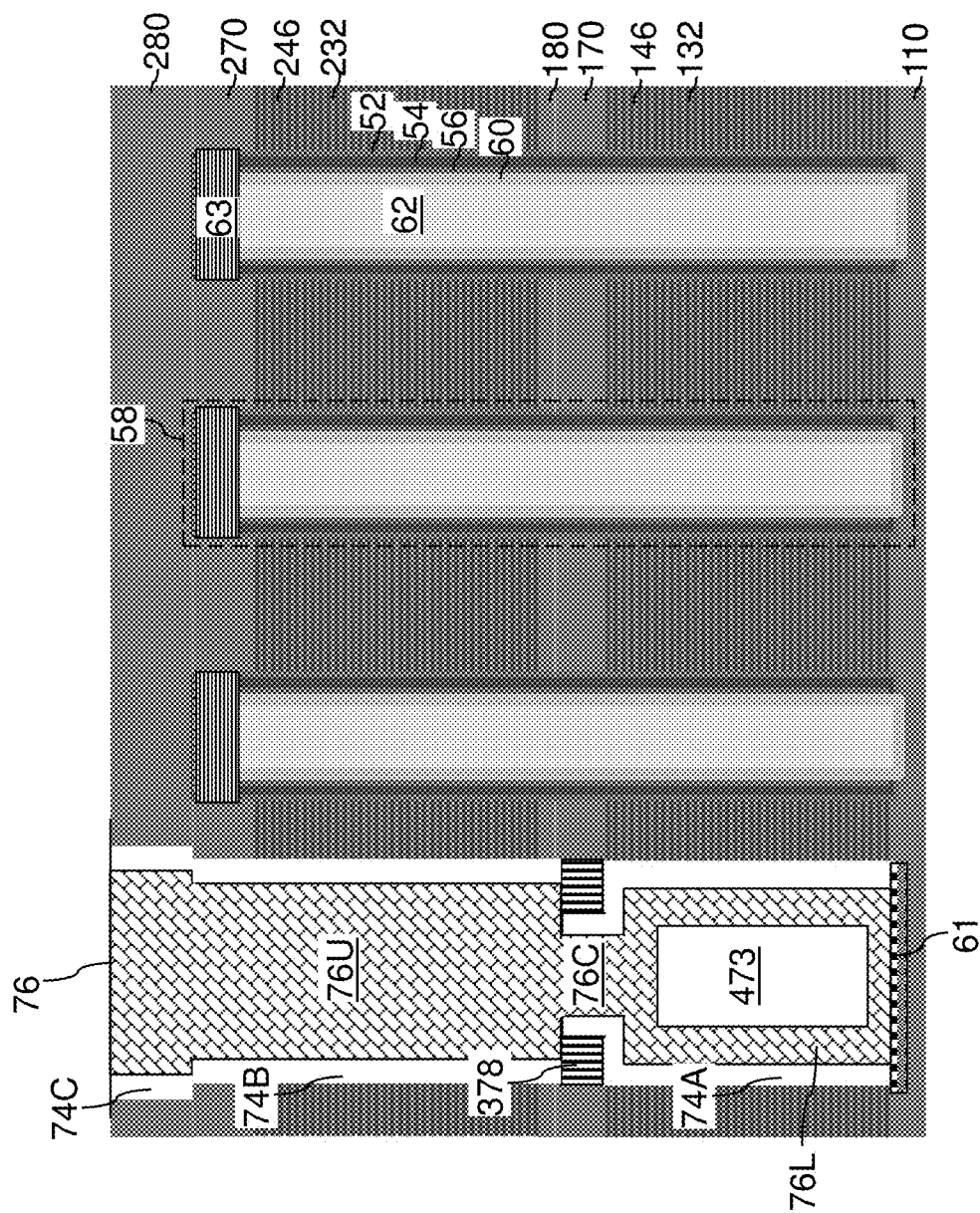
FIG. 37C is a vertical cross-sectional view of the second exemplary structure along the vertical plane C-C' of FIG. 37B.
Figure 37D:
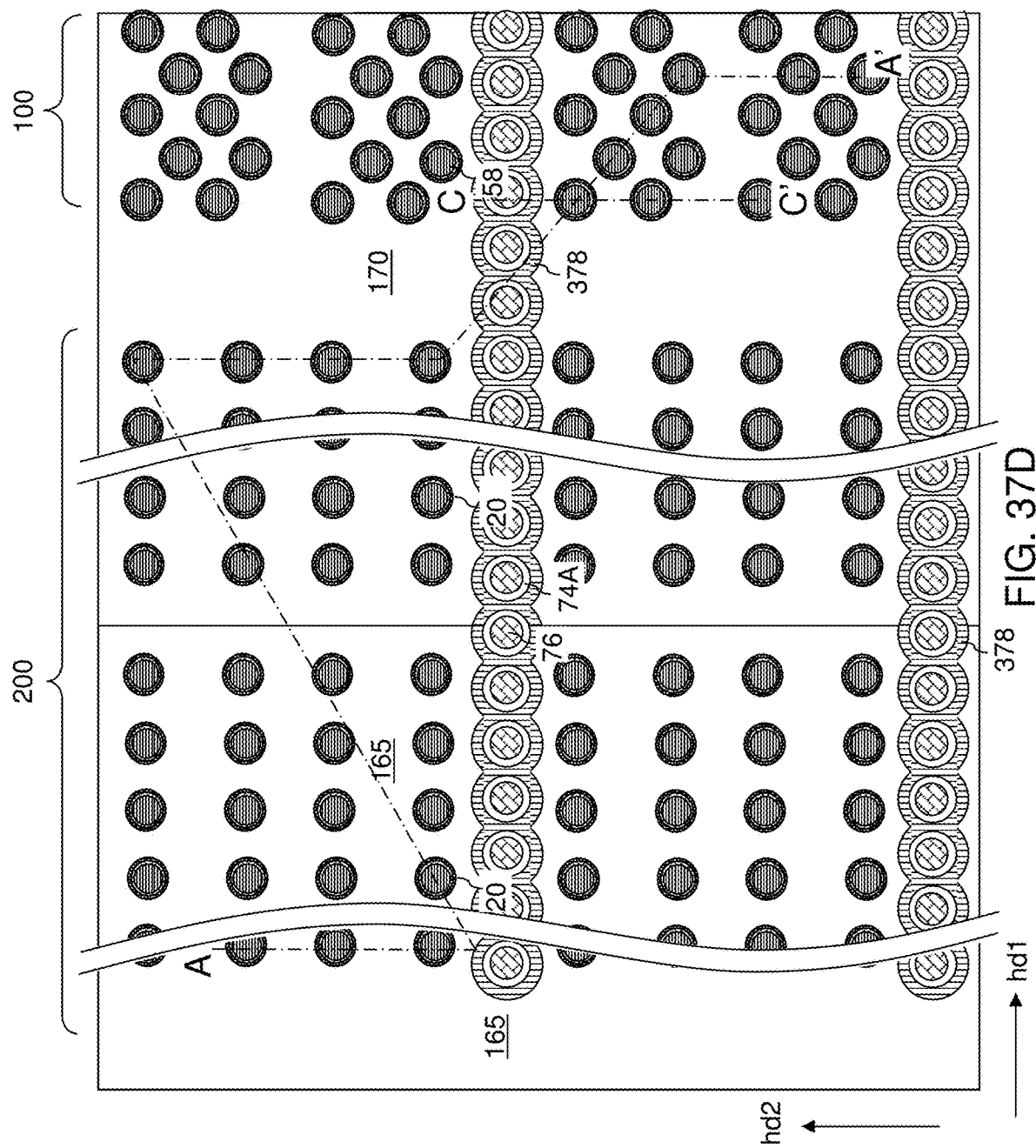
FIG. 37D is a horizontal cross-sectional view of the second exemplary structure along the horizontal plane D-D' of FIG. 37A.
Figure 37E:
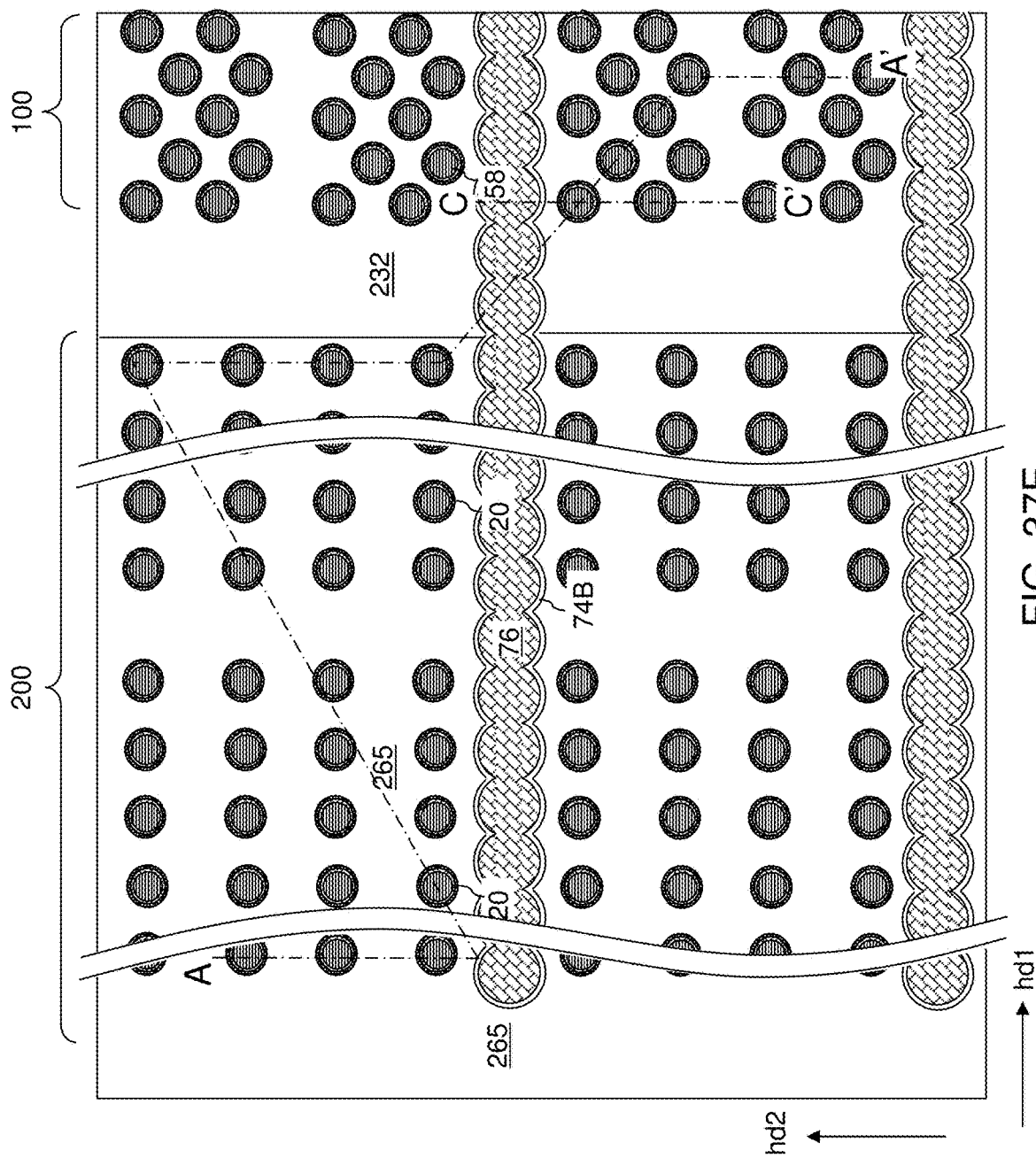
FIG. 37E is a horizontal cross-sectional view of the second exemplary structure along the horizontal plane E-E' of FIG. 37A.
Figure 37F:
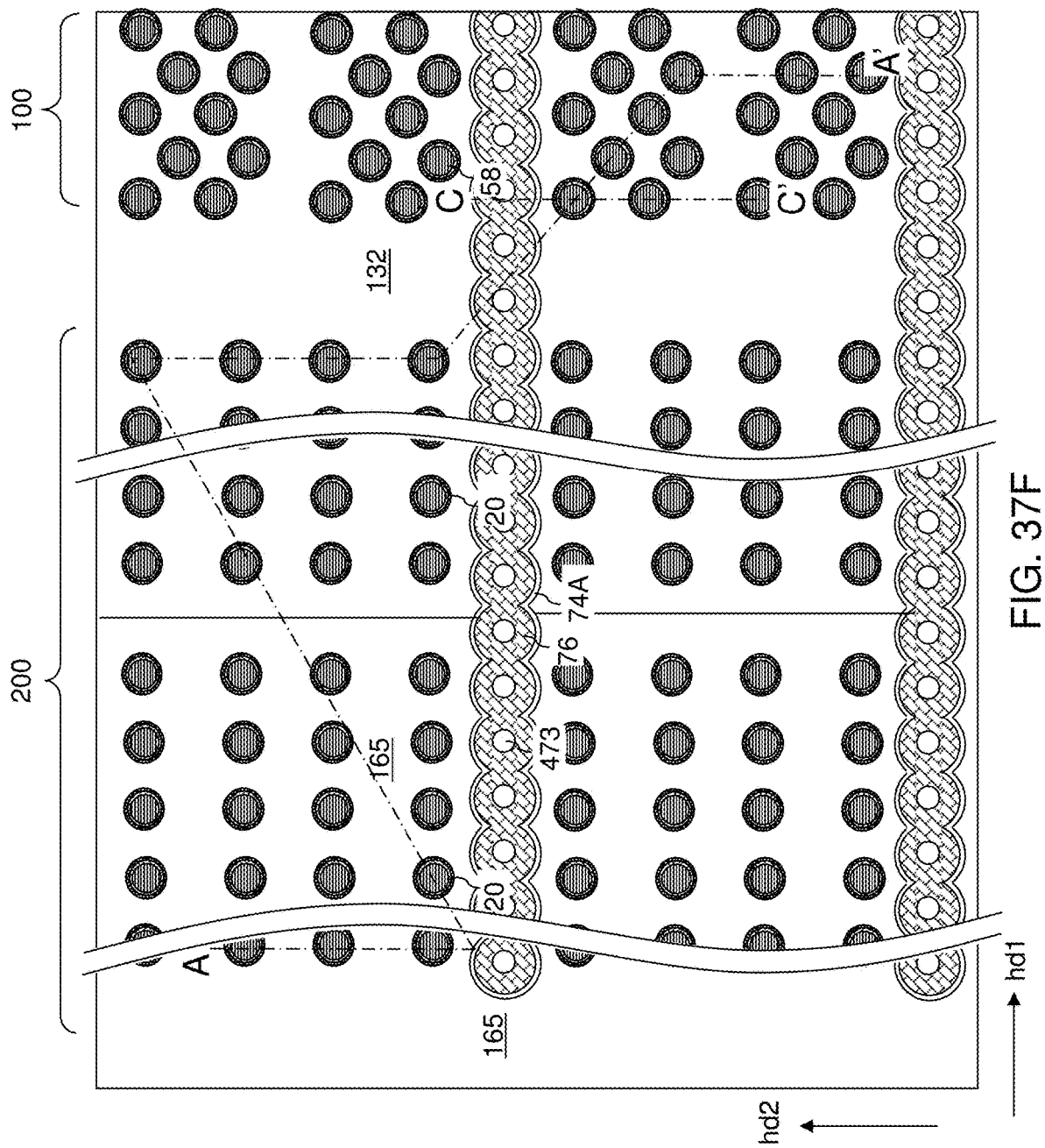
FIG. 37F is a horizontal cross-sectional view of the second exemplary structure along the horizontal plane F-F' of FIG. 37A.

In one embodiment shown in FIG. 37C, the backside contact via structure 76 comprises a lower backside contact via portion 76L located between the first-tier alternating stacks (132, 146) of a pair of layer stacks (132, 146, 170, 180, 232, 246, 270, 280), and an upper backside contact via portion 76U located between the second-tier alternating stacks (232, 246) of the pair of layer stacks (132, 146, 170, 180, 232, 246, 270, 280). In one embodiment, the lower backside contact via portion 76L is adjoined to bottom peripheries of sidewalls the cylindrical connection portions 76C of the backside contact via structure 76, and the upper backside contact via portion 76U is adjoined to top peripheries of the sidewalls of the cylindrical connection portions 76C of the backside contact via structure 76.

In one embodiment, the lower backside contact via portion 76L embeds a respective row of encapsulated cylindrical cavities (i.e., air gaps) 473 that are free of any solid material. Alternatively, the air gap in the lower backside contact via portion 76L may be omitted. In one embodiment, the upper backside contact via portion 76U is free of any encapsulated cavity (i.e., air gap) therein. In one embodiment, each backside trench fill structure (74A, 74B, 74C, 76) comprises a first insulating spacer 74A that laterally surrounds the lower backside contact via portion 76L of the backside contact via structure 76 and contacts an entirety of a bottom surface of the perforated bridge structure 378. In one embodiment, the first insulating spacer 74A comprises tubular portions contacting sidewalls of the plurality of vertically-extending openings 478 in the perforated bridge structure 378.

In one embodiment, each backside trench fill structure (74A, 74B, 74C, 76) further comprises a second insulating spacer 74B laterally surrounding a lower part of the upper backside contact via portion 76U of the backside contact via structure 76 and contacting a peripheral region of a top surface of the perforated bridge structure 378. In one embodiment, the second insulating spacer 74B and the first insulating spacer 74A are two discrete insulating structures that comprise a same material, have a same lateral thickness, and are not in direct contact with each other.

In one embodiment, each backside trench fill structure (74A, 74B, 74C, 76) further comprises a third insulating spacer 74C overlying the second insulating spacer 74B and laterally surrounding an upper part of the upper backside contact via portion 76U. In one embodiment, the second insulating spacer 74B comprises a pair of laterally-undulating outer sidewalls including a respective set of vertically-straight and laterally convex sidewall segments that are adjoined to each other, while the third insulating spacer 74C comprises a pair of laterally-straight outer sidewalls that laterally extend along the first horizontal direction hd1.

While the embodiment is described above in which the perforated bridge structures 378 have a same thickness throughout, embodiments are expressly contemplated herein in which an etch mask layer and an additional etch process are employed to increase the vertical recess distance for the sacrificial trench fill structures 174 in the staircase region 200 without increasing the vertical recess distance in the memory array region 100. In this case, one or more of the perforated bridge structures 378 may be formed with a thinner portion having a first thickness in the memory array region 100, and a thicker portion having a second thickness in the staircase region 200. The second thickness is greater than (e.g., 10% to 500%) the first thickness. Thus, each perforated bridge structures 378 may have a first thickness which is similar to the thickness of layer 170 in the memory array region 100 and a greater second thickness in the staircase region 200. In another alternative embodiment, the perforated bridge structures 378 are formed only in the staircase region 200 and are omitted in the memory array region 100.

Figure 37G:
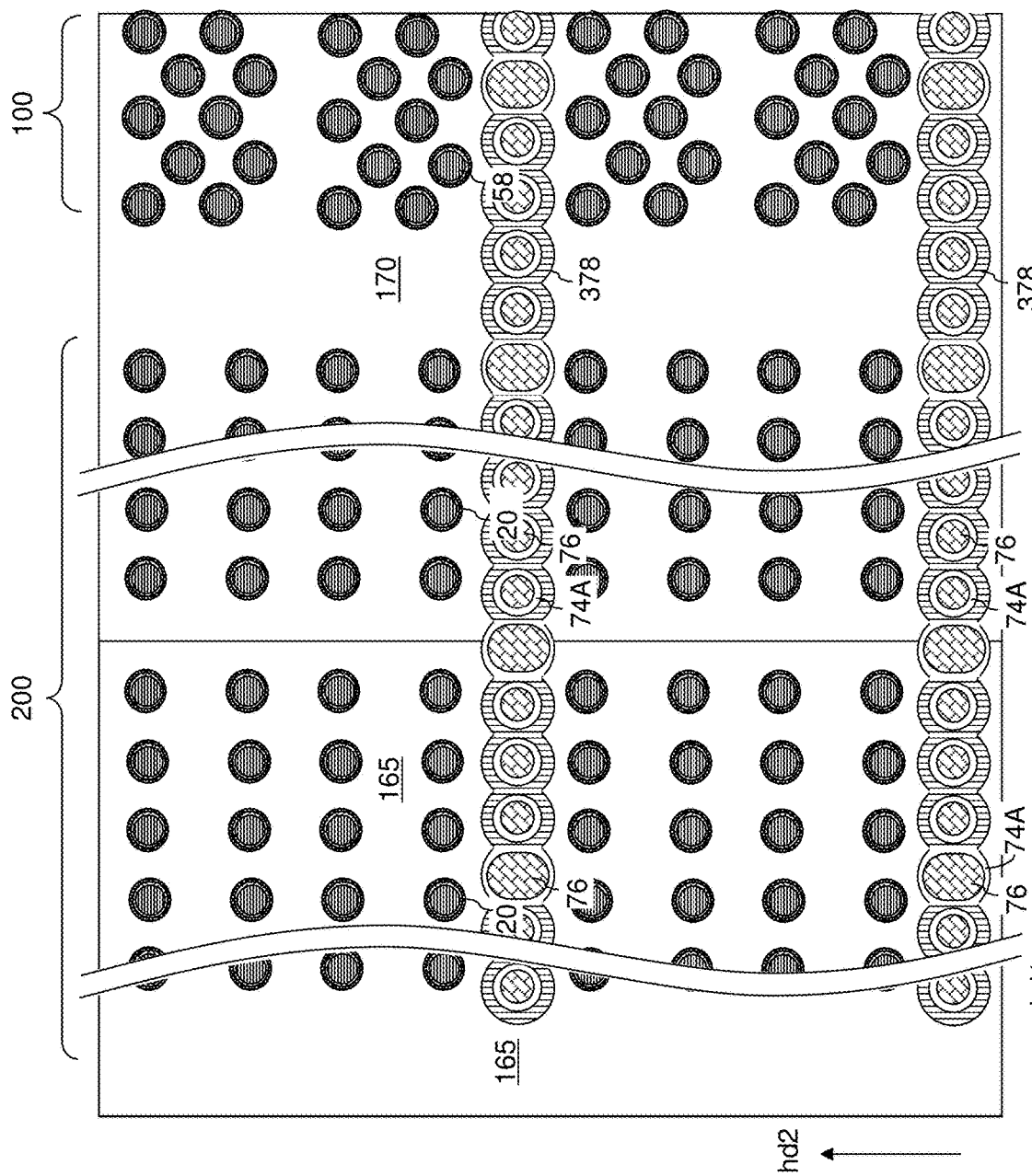
FIG. 37G is a horizontal cross-sectional view of an alternative embodiment of the second exemplary structure along a horizontal plane that corresponds to the horizontal plane D-D' of FIG. 37A.

Referring to FIG. 37G, an alternative embodiment of the second exemplary structure is illustrated, which may be provided by performing the processing steps described with reference to FIG. 26D in lieu of the processing steps described with reference to FIGS. 26A-26C. In this case, a plurality of perforated bridge structure 378 may be formed within each backside trench. A first insulating spacer 74A may contact sidewalls of a plurality of perforated bridge structures 378.

Figure 38:
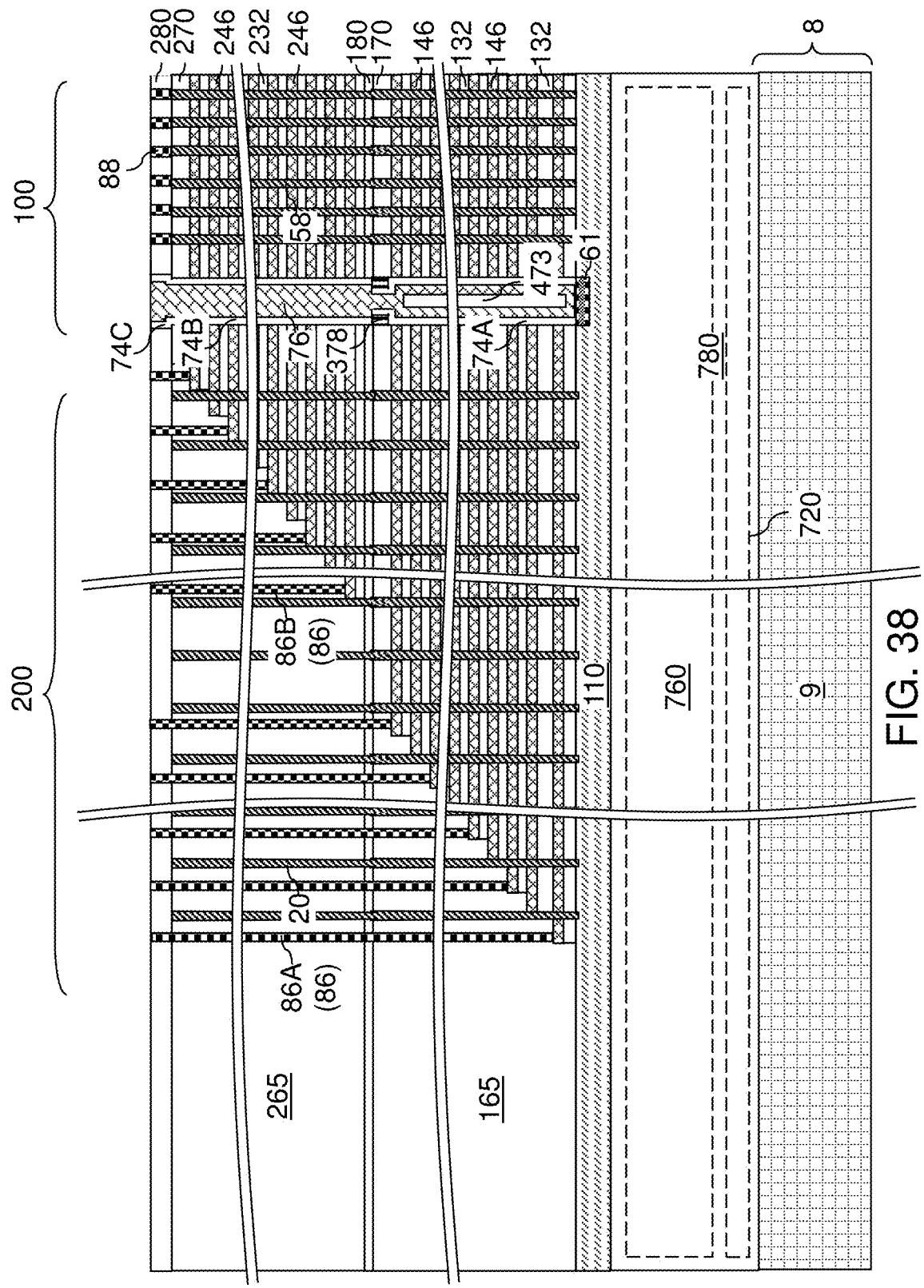
FIG. 38 is a vertical cross-sectional view of the second exemplary structure after formation of various contact via structures according to the second embodiment of the present disclosure.

Referring to FIG. 38, various additional contact via structures (88, 86) may be formed. The additional contact via structures (88, 86) may comprise drain contact via structures 88 that are formed through the contact-level dielectric layer 280 directly on a top surface of a respective one of the drain regions 63 in the memory opening fill structures 58. Further, the additional contact via structures (88, 86) may comprise layer contact via structures 86 that are formed through a contact-level dielectric layer 280 and a second retro-stepped dielectric material portion 265 and optionally through a first retro-stepped dielectric material portion 165, and directly on a top surface of a respective electrically conductive layer (146, 246). In one embodiment, a subset of the electrically conductive layers (146, 246) may be employed as word lines, and a subset of the layer contact via structures 86 that contact the word lines can be word line contact via structures. Additional dielectric material layers (which are also referred to as upper-level dielectric material layers) and additional metal interconnect structures (e.g., bit lines) may be formed above the contact-level dielectric material layers 280.

Referring to the first embodiment and FIGS. 1-20, a three-dimensional memory device comprises a pair of layer stacks (132, 146, 170, 232, 246) laterally extending along a first horizontal direction hd1, and laterally spaced from each other along a second horizontal direction hd2 by a backside trench 79, wherein each of the layer stacks (132, 146, 170, 232, 246) comprises a first-tier alternating stack (132, 146) of first insulating layers 132 and first electrically conductive layers 146, a first insulating cap layer 170 located over the first-tier alternating stack, and a second-tier alternating stack (232, 246) of second insulating layers 232 and second electrically conductive layers 246 located over the first insulating cap layer 270; memory openings 49 vertically extending through the pair of layer stacks (132, 146, 170, 232, 246); memory opening fill structures 58 located in the respective memory openings 49 and comprising a respective vertical stack of memory elements (e.g., portion of the memory material layer 54) and a respective vertical semiconductor channel 60; and a bridge structure 178 spanning an entire width of the backside trench 79 along the second horizontal direction hd2. A top surface of the bridge structure 178 is located below a top surface of the second-tier alternating stack (232, 246), and a bottom surface of the bridge structure 178 is located above a bottom surface of the first-tier alternating stack (132, 246).

In one embodiment, a backside trench fill structure (74, 76) is also located in the backside trench. A combination of the first insulating cap layers 170 and the backside trench fill structure (74, 76) embeds the bridge structure 178. In one embodiment, the bridge structure 178 comprises a respective pair of first sidewalls that contact the first insulating cap layers 178 within the pair of layer stacks (132, 146, 170, 232, 246), and comprises a respective top surface within a horizontal plane including top surfaces of the first insulating cap layers 170.

In one embodiment, the device includes a plurality of the bridge structures 178 in the back side trench 79. Each of the plurality of bridge structures 178 also comprises a respective pair of second sidewalls that are perpendicular to the first horizontal direction hd1 and contacts respective sidewall surface segments of the backside trench fill structure (74, 76). In one embodiment, each of the top surfaces of the plurality of bridge structures 178 contacts a respective bottom surface segment of the backside trench fill structure (74, 76).

In one embodiment, the backside trench fill structure (74, 76) comprises an insulating spacer 74 contacting lengthwise sidewalls of the pair of layer stacks (132, 146, 170, 232, 246) and laterally surrounding a backside contact via structure 76.

In one embodiment shown in FIG. 19C, the insulating spacer 74 comprises a plurality of upper insulating bridge portions 74U contacting a bottom surface of a respective one of the plurality of bridge structures 178. In one embodiment, the plurality of upper insulating bridge portions 74U have a same width along the first horizontal direction hd1 as a respective one of the plurality of bridge structures 178, and have a vertical thickness that is the same as a lateral thickness of vertically-extending portions of the insulating spacer 74. In one embodiment, the insulating spacer 74 comprises a plurality of lower insulating bridge portions 74L contacting a respective top surface segment of a semiconductor material layer 110 underlying the backside trench 79.

In one embodiment, the backside contact via structure 76 contacts a plurality of source regions 61 that are embedded within the semiconductor material layer 110. The plurality of source regions 61 are laterally spaced apart from each other by portions of the semiconductor material layer 110 that underlie the plurality of lower insulating bridge portions 74L of the insulating spacer 74.

In one embodiment, the pair of layer stacks further comprise a second insulating cap layer 270 and a contact-level dielectric layer 280 overlying second-tier alternating stack (232, 246); and the backside contact via structure 76 vertically extends from a first horizontal plane including a top surface of the semiconductor material layer 110 and to a second horizontal plane including top surfaces of the contact-level dielectric layers 280 of the layer stacks (132, 146, 170, 232, 246, 270, 280).

In one embodiment, the three-dimensional memory device further comprises: first-tier retro-stepped dielectric material portions 165 contacting stepped surfaces of a respective one of the first-tier alternating stacks (132, 146); and second-tier retro-stepped dielectric material portions 265 contacting stepped surfaces of a respective one of the second-tier alternating stacks (232, 246), wherein top surface of the first-tier retro-stepped dielectric material portions 165 are located within the horizontal plane including the top surfaces of the first insulating cap layers 170.

In one embodiment, each of the pair of layer stacks (132, 146, 170, 180, 232, 246, 270, 280) further comprises an inter-level dielectric layer 180 contacting a top surface of a respective first-tier retro-stepped dielectric material portion 165, a top surface of a respective first insulating cap layer 170, a bottom surface of a respective second-tier retro-stepped dielectric material portion 265, and a bottom surface of a respective second-tier alternating stack (232, 246).

In one embodiment, each of the first sidewalls of the plurality of bridge structures 178 has a respective bottom edge that is adjoined to a sidewall of a respective one of the first insulating cap layers 170. In one embodiment, each of the plurality of bridge structures 178 comprise a semiconductor material.

Referring to the second embodiment and FIGS. 21A-38, a three-dimensional memory device comprises: a pair of layer stacks (132, 146, 232, 246) laterally extending along a first horizontal direction hd1 and laterally spaced from each other along a second horizontal direction hd2 by a backside trench 79, wherein each of the pair of layer stacks (132, 146, 232, 246) comprises a first-tier alternating stack (132, 146) of first insulating layers 132 and first electrically conductive layers 146 and a second-tier alternating stack (232, 246) of second insulating layers 232 and second electrically conductive layers 246; memory openings 49 vertically extending through the pair of layer stacks; memory opening fill structures 58 located in the respective memory openings 49 and comprising a respective vertical stack of memory elements (e.g., portions of the memory layer 54) and a respective vertical semiconductor channel 60; and a perforated bridge structure 378 including a plurality of vertically-extending openings 478 located in the backside trench 79.

A backside trench fill structure (74, 76) is located in the backside trench 79. The backside trench fill structure comprises a backside contact via structure 76 containing cylindrical connection portions 76C which vertically extend through the vertically-extending openings 478 in the perforated bridge structure 378. In one embodiment, the backside contact via structure 76 comprises: a lower backside contact via portion 76L located between the first-tier alternating stacks (132, 146) of the pair of layer stacks; and an upper backside contact via portion 76U located between the second-tier alternating stacks (232, 246) of the pair of layer stacks. In one embodiment, the lower backside contact via portion 76L is adjoined to bottom peripheries of sidewalls the cylindrical connection portions 76C of the backside contact via structure 76; and the upper backside contact via portion 76U is adjoined to top peripheries of the sidewalls of the cylindrical connection portions 76C of the backside contact via structure 76.

In one embodiment, the lower backside contact via portion 76L embeds a respective row of air gaps 473. In one embodiment, the upper backside contact via portion 75U is free of any air gaps.

In one embodiment, the backside trench fill structure (74, 76) also includes a first insulating spacer 74A laterally surrounding the lower backside contact via portion 76L and contacting an entirety of a bottom surface of the perforated bridge structures 378. In one embodiment, the first insulating spacer 74A comprises tubular portions contacting sidewalls of the plurality of vertically-extending openings 478 in the perforated bridge structure 378.

In one embodiment, the backside trench fill structure (74, 76) also comprises a second insulating spacer 74B laterally surrounding a lower portion of the upper backside contact via portion 76U and contacting a peripheral region of a top surface of the perforated bridge structure 378. In one embodiment, the second insulating spacer 74B and the first insulating spacer 74A are two discrete insulating structures that comprise a same material, have a same lateral thickness, and are not in direct contact with each other.

In one embodiment, the backside trench fill structure (74, 76) also comprises a third insulating spacer 74C overlying the second insulating layer and laterally surrounding an upper portion of the upper backside contact via portion 76U.

The second insulating spacer 74B comprises a pair of laterally-undulating outer sidewalls including a respective set of vertically-straight and laterally convex sidewall segments that are adjoined to each other, while the third insulating spacer 74C comprises a pair of laterally-straight outer sidewalls that laterally extend along the first horizontal direction hd1.

In one embodiment, a top surface of the perforated bridge structure 378 is located in a first horizontal plane disposed below a top surface of the second-tier alternating stack (232, 246), and a bottom surface of the perforated bridge structure 378 is located in a second horizontal plane disposed above a bottom surface of the first-tier alternating stack (132, 146). In one embodiment, each of the pair of layer stacks further comprises a first insulating cap layer 170 located between a respective first-tier alternating stack (132, 146) and a respective second-tier alternating stack (232, 246), and a top surface of the perforated bridge structure 378 is located within a horizontal plane including top surfaces of the first insulating cap layers 170. In one embodiment, the perforated bridge structure 378 contacts sidewalls of the first insulating cap layers 170 and comprises a doped semiconductor material.

In one embodiment, the perforated bridge structure 378 comprises a pair of laterally-undulating outer sidewalls including a respective set of vertically-straight and laterally convex sidewall segments that are adjoined to each other. In one embodiment, a bottom portion of the backside trench 79 that underlies the perforated bridge structure 378 comprises a pair of laterally-undulating sidewalls including a respective set of vertically-straight and laterally convex sidewall segments that are adjoined to each other; and the pair of laterally-undulating sidewalls of the bottom portion of the backside trench 79 is vertically coincident with the pair of laterally-undulating outer sidewalls of the perforated bridge structure 378.

The various embodiments of the present disclosure may be employed to form bridge structures (178, 378) that provide lateral structural support for the insulating layers (132, 232) during replacement of the sacrificial material layers (142, 242) with electrically conductive layers (146, 246). Lateral movement of the insulating layers (132, 232) at the middle and bottom of the backside trenches 79 can be limited and/or controlled during the replacement process that forms the electrically conductive layers (146, 246) due to the presence of the bridge structures at the middle vertical level between the lower and the upper alternating stacks.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
a pair of layer stacks laterally extending along a first horizontal direction and laterally spaced from each other along a second horizontal direction by a backside trench, wherein each of the layer stacks comprises a first-tier alternating stack of first insulating layers and first electrically conductive layers, a first insulating cap layer located over the first-tier alternating stack, and a second-tier alternating stack of second insulating layers and second electrically conductive layers located over the first insulating cap layer;
memory openings vertically extending through the pair of layer stacks;
memory opening fill structures located in the respective memory openings and comprising a respective vertical stack of memory elements and a respective vertical semiconductor channel;
a bridge structure spanning an entire width of the backside trench along the second horizontal direction, wherein a top surface of the bridge structure is located in a first horizontal plane disposed below top surfaces of the second-tier alternating stacks, and a bottom surface of the bridge structure is located in a second horizontal plane disposed above bottom surfaces of the first-tier alternating stacks; and
a backside trench fill structure located in the backside trench,
wherein:
a combination of the backside trench fill structure and the first insulating cap layers embeds the bridge structure; and
the bridge structure comprises a pair of first sidewalls that contact the first insulating cap layers within the pair of layer stacks, and comprises a top surface located within a horizontal plane including top surfaces of the first insulating cap layers.

2. The three-dimensional memory device of claim 1, wherein a plurality of the bridge structures including the bridge structure and additional bridge structures are located in the backside trench, and each of the plurality of bridge structures comprises a respective pair of second sidewalls that are perpendicular to the first horizontal direction and contacts respective sidewall surface segments of the backside trench fill structure.

3. The three-dimensional memory device of claim 2, wherein each of the top surfaces of the plurality of bridge structures contacts a respective surface segment of the backside trench fill structure.

4. The three-dimensional memory device of claim 2, wherein the backside trench fill structure comprises an insulating spacer contacting lengthwise sidewalls of the pair of layer stacks and laterally surrounding a backside contact via structure.

5. The three-dimensional memory device of claim 4, wherein:
the insulating spacer comprises a plurality of upper insulating bridge portions contacting a bottom surface of a respective one of the plurality of bridge structures;
the plurality of upper insulating bridge portions have a same width along the first horizontal direction as a respective one of the plurality of bridge structures, and have a vertical thickness that is the same as a lateral thickness of vertically-extending portions of the insulating spacer; and
the insulating spacer comprises a plurality of lower insulating bridge portions contacting a respective top surface segment of a semiconductor material layer underlying the backside trench.

6. The three-dimensional memory device of claim 5, wherein:
the backside contact via structure contacts a plurality of source regions that are embedded within the semiconductor material layer; and
the plurality of source regions are laterally spaced apart from each other by portions of the semiconductor material layer that underlie the plurality of lower insulating bridge portions of the insulating spacer.

7. The three-dimensional memory device of claim 5, wherein:
each of the pair of layer stacks further comprise a respective second insulating cap layer and a respective contact-level dielectric layer overlying second-tier alternating stack; and
the backside contact via structure vertically extends from a third horizontal plane including a top surface of the semiconductor material layer and to a fourth horizontal plane including top surfaces of the contact-level dielectric layers of the pair of layer stacks.

8. The three-dimensional memory device of claim 7, further comprising:
first-tier retro-stepped dielectric material portions contacting stepped surfaces of a respective one of the first-tier alternating stacks; and
second-tier retro-stepped dielectric material portions contacting stepped surfaces of a respective one of the second-tier alternating stacks,
wherein top surfaces of the first-tier retro-stepped dielectric material portions are located within a horizontal plane including the top surfaces of the first insulating cap layers.

9. The three-dimensional memory device of claim 8, wherein each of the pair of layer stacks comprises an inter-level dielectric layer contacting a top surface of a respective first-tier retro-stepped dielectric material portion, a top surface of a respective first insulating cap layer, a bottom surface of a respective second-tier retro-stepped dielectric material portion, and a bottom surface of a respective second-tier alternating stack.

10. The three-dimensional memory device of claim 1, wherein each of the first sidewalls of the plurality of bridge structures has a respective bottom edge that is adjoined to a sidewall of a respective one of the first insulating cap layers.

11. The three-dimensional memory device of claim 1, wherein the bridge structure comprises a semiconductor material.

* * * * *